United States Patent
Anderson et al.

(10) Patent No.: US 11,592,469 B2
(45) Date of Patent: Feb. 28, 2023

(54) ATOM-BASED CLOSED-LOOP CONTROL FOR ELECTROMAGNETIC RADIATION MEASUREMENT, COMMUNICATIONS, AND INFORMATION PROCESSING

(71) Applicant: Rydberg Technologies Inc., Ann Arbor, MI (US)

(72) Inventors: David A. Anderson, Ann Arbor, MI (US); Georg Raithel, Ann Arbor, MI (US)

(73) Assignee: Rydberg Technologies Inc., Ann Arbor, MI (US)

(*) Notice: Subject to any disclaimer, the term of this patent is extended or adjusted under 35 U.S.C. 154(b) by 0 days.

(21) Appl. No.: 17/333,503

(22) Filed: May 28, 2021

(65) Prior Publication Data
US 2022/0196716 A1    Jun. 23, 2022

Related U.S. Application Data

(60) Provisional application No. 63/077,244, filed on Sep. 11, 2020, provisional application No. 63/032,041, filed on May 29, 2020.

(51) Int. Cl.
*G01R 29/08* (2006.01)
*G01R 29/10* (2006.01)

(52) U.S. Cl.
CPC ..... *G01R 29/0885* (2013.01); *G01R 29/0892* (2013.01); *G01R 29/10* (2013.01)

(58) Field of Classification Search
CPC . G01R 29/0885; G01R 29/0892; G01R 29/10
(Continued)

(56) References Cited

U.S. PATENT DOCUMENTS 9,970,973 B2    5/2018  Anderson et al.
10,509,065 B1 *  12/2019  Shaffer ............ G01R 29/0885
(Continued)

FOREIGN PATENT DOCUMENTS

WO    2016205330 A1    12/2016
WO    2019126038 A1     6/2019
WO    2020113147 A1     6/2020

OTHER PUBLICATIONS

Juhász, Bertalan, Eberhard Widmann, and S. Federmann. "Measurement of the ground-state hyperfine splitting of antihydrogen." Journal of Physics: Conference Series. vol. 335. No. 1. IOP Publishing, 2011. (Year: 2011).*
(Continued)

*Primary Examiner* — Christopher P McAndrew
(74) *Attorney, Agent, or Firm* — Sterne, Kessler, Goldstein & Fox P.L.L.C.

(57) ABSTRACT

A method for atom-based closed-loop control includes exciting atoms of a gas into one or more Rydberg states, applying one or more signal processing functions to the one or more Rydberg states, and regulating a characteristic of the applied one or more signal processing functions based on, at least in part, a response of the one or more Rydberg states to the one or more signal processing functions. A system for internal quantum-state-space interferometry includes an atomic receiver, an interferometric pathway, and a detector. The interferometer includes an atomic vapor with first atomic states and second atomic states. The interferometric pathway from RF phases between the first and second atomic states is closed by a quantum-state-space. The detector is configured to detect a readout of an interferometric signal. Embodiments include atom-based automatic level control, baseband processors, phase-locked loops, voltage transducers, raster RF imagers and waveform analyzers.

41 Claims, 55 Drawing Sheets

(58) Field of Classification Search
USPC .......................................................... 324/97
See application file for complete search history.

(56) References Cited

U.S. PATENT DOCUMENTS

| | | | |
|---|---|---|---|
| 10,823,775 | B2 | 11/2020 | Anderson et al. |
| 10,979,147 | B2 | 4/2021 | Gordon et al. |
| 2015/0192532 | A1* | 7/2015 | Clevenson ............ G01N 24/006 324/304 |
| 2016/0363617 | A1* | 12/2016 | Anderson .......... G01R 29/0885 |
| 2019/0187198 | A1* | 6/2019 | Anderson .......... G01R 29/0878 |
| 2020/0292606 | A1 | 9/2020 | Holloway et al. |
| 2021/0048465 | A1 | 2/2021 | Anderson et al. |

OTHER PUBLICATIONS

International Search Report and Written Opinion of the International Searching Authority for International Application No. PCT/US2021/034935, European Patent Office, Rijswijk, The Netherlands, dated Oct. 14, 2021, 11 pages.
Kumar et al., "Rydberg-atom based radio-frequency electrometry using frequency modulation spectroscopy in room temperature vapor cells," arxiv.org, 1702.0049v1, Cornell University Library, dated Feb. 2, 2017, XP0809955659, DOI: 10.1364/OE.25.008625, 18 pages.
Anderson et al., "A self-calibrating SI-traceable broadband Rydberg atom-based radio-frequency electric field probe and measurement instrument," dated Oct. 18, 2019, 12 pages.
Anderson et al., "Rydberg atoms for radio-frequency communications and sensing: atomic receivers for pulsed RF field and phase detection," dated Oct. 17, 2019, 10 pages.
Sapiro et al., "Time dependence of Rydberg EIT in pulsed optical and RF fields," dated Apr. 3, 2020, 10 pages.
Sapiro et al., "Atom-based optical RF-power/voltage transducer and sensor," dated Feb. 1, 2019, 1 page.
Anderson et al., "An atomic receiver for AM and FM radio communication," dated Aug. 26, 2018, 6 pages.
Simons et al., "Embedding a Rydberg Atom-Based Sensor into an Antenna for Phase and Amplitude Detection of Radio-Frequency Fields and Modulated Signals," dated Oct. 22, 2019, 10 pages.
Holloway et al., "A New Quantum-Based Power Standard: Using Rydberg Atoms for a SI-Traceable Radio-Frequency Power Measurement Technique in Rectangular Waveguides," dated Jun. 25, 2018, 4 pages.
Gordon et al., "Broadband Rydberg Atom-Based Electric-Field Probe: From Self-Calibrated Measurements to Sub-Wavelength Imaging," dated May 27, 2014, 13 pages.
Gordon et al., "Sub-Wavelength Imaging and Field Mapping via EIT and Autler-Townes Splitting In Rydberg Atoms," dated Apr. 1, 2014, 13 pages.
Anderson et al., "Atom radio-frequency interferometry," dated Oct. 26, 2020, 5 pages.
Holloway et al., "A Multiple-Band Rydberg-Atom Based Receiver/Antenna: AM/FM Stereo Reception," dated Mar. 2, 2019, 10 pages.
Fan et al., "Atom based RF electric field sensing," dated Sep. 9, 2015, 18 pages.
Simons et al., "A Rydberg Atom-Based Mixer: Measuring the Phase of a Radio Frequency Wave," dated Mar. 18, 2019, 4 pages.
Holloway et al., "High-resolution near-field imaging and far-field antenna measurements with atomic sensors," dated Aug. 17, 2018, 3 pages.
Holloway et al., "Detecting and Receiving Phase Modulated Signals with a Rydberg Atom-Based Mixer," dated Mar. 27, 2019, 6 pages.
Simons et al., "Applications with a Rydberg Atom-based Radio Frequency Antenna/Receiver," dated Sep. 2, 2019, 5 pages.
Simons et al., "Waveguide-integrated Rydberg Atom-based RF Field Detector for Near-field Antenna Measurements," dated Oct. 6, 2019, 4 pages.
Holloway et al., "Detecting and Receiving Phase-Modulated Signals With a Rydberg Atom-Based Receiver," dated Jul. 29, 2019, 5 pages.
Holloway et al., "Quantum Physics Meets Music: A "Real-Time" Guitar Recording Using Rydberg-Atoms and Electromagnetically Induced Transparency," dated Apr. 2, 2019, 5 pages.
Gordon et al., "Weak Electric-Field Detection with Sub-1 Hz Resolution at Radio Frequencies Using A Rydberg Atom-Based Mixer," dated Mar. 22, 2019, 5 pages.
Meyer et al., "Waveguide-coupled Rydberg spectrum analyzer from 0 to 20 GHz," dated Jan. 28, 2021, 10 pages.
Simons et al., "Rydberg Atom-based RF Power Measurements," dated Nov. 4, 2018, 4 pages.
Holloway et al., "Rydberg-Atoms Based Radio-Frequency Electric Field and Power Sensors for Quantum SI-Traceable Measurements," dated May 5, 2019, 2 pages.
Thaicharoen et al., "Electromagnetically induced transparency, absorption, and microwave-field sensing in a Rb vapor cell with a three-color all-infrared laser system," dated Dec. 26, 2019, 9 pages.
Paradis et al., "Atomic measurements of high-intensity VHF-band radio-frequency fields with a Rydberg vapor-cell detector," dated Jul. 30, 2019, 8 pages.
Thaicharoen et al., "Electromagnetically-induced transparency, absorption, and microwave field sensing in a Rb vapor cell with a three-color all-infrared laser system," dated May 27, 2019, 9 pages.
Kumar et al., "Atom-Based Sensing of Weak Radio Frequency Electric Fields Using Homodyne Readout," dated Feb. 20, 2017, 10 pages.
Carr et al., "Three-photon electromagnetically induced transparency using Rydberg states," dated Aug. 3, 2012, 4 pages.
Yoon-Seok Lee and Han Seb Moon, "Doppler-free three-photon coherence in Doppler-broadened diamond-type atomic system," dated Mar. 6, 2017, 11 pages.

* cited by examiner

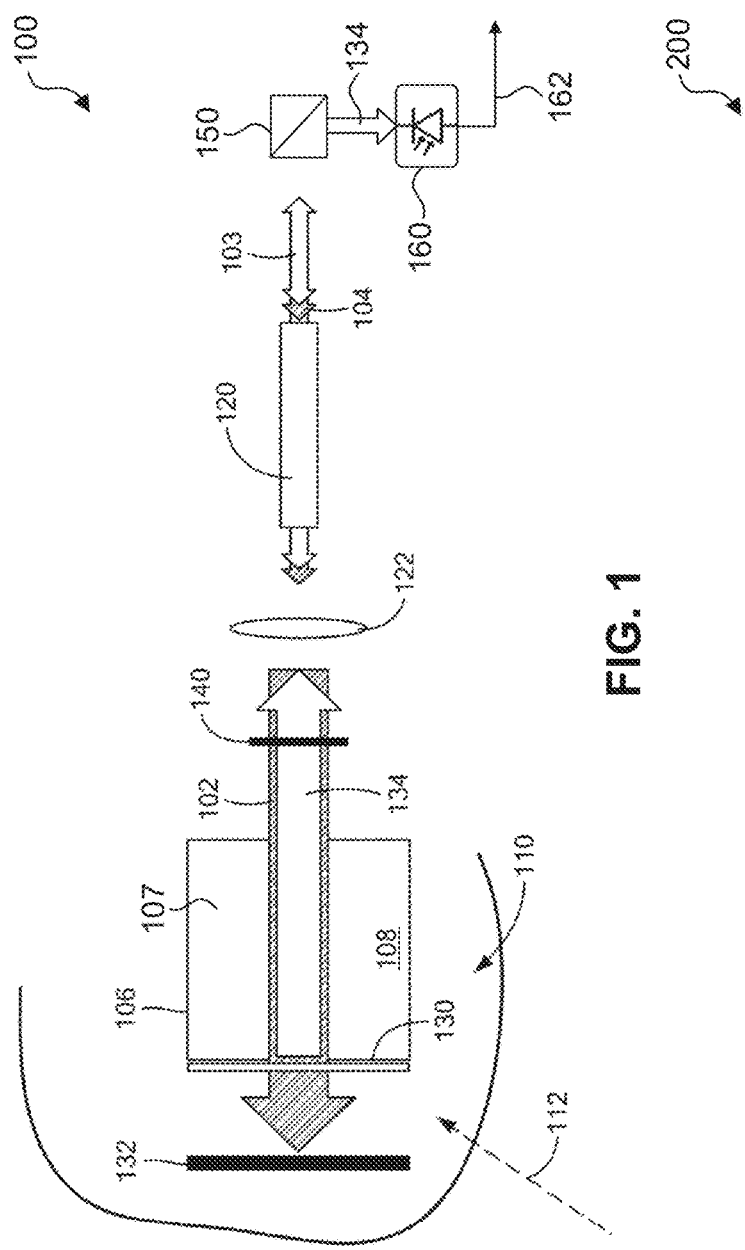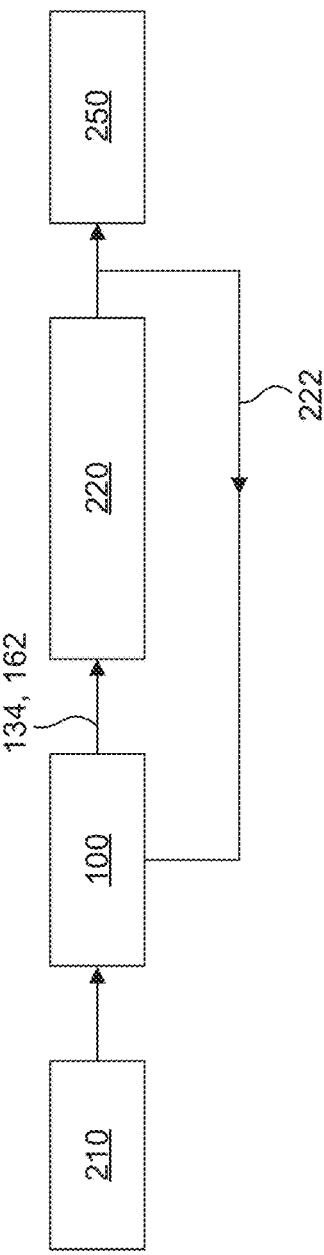

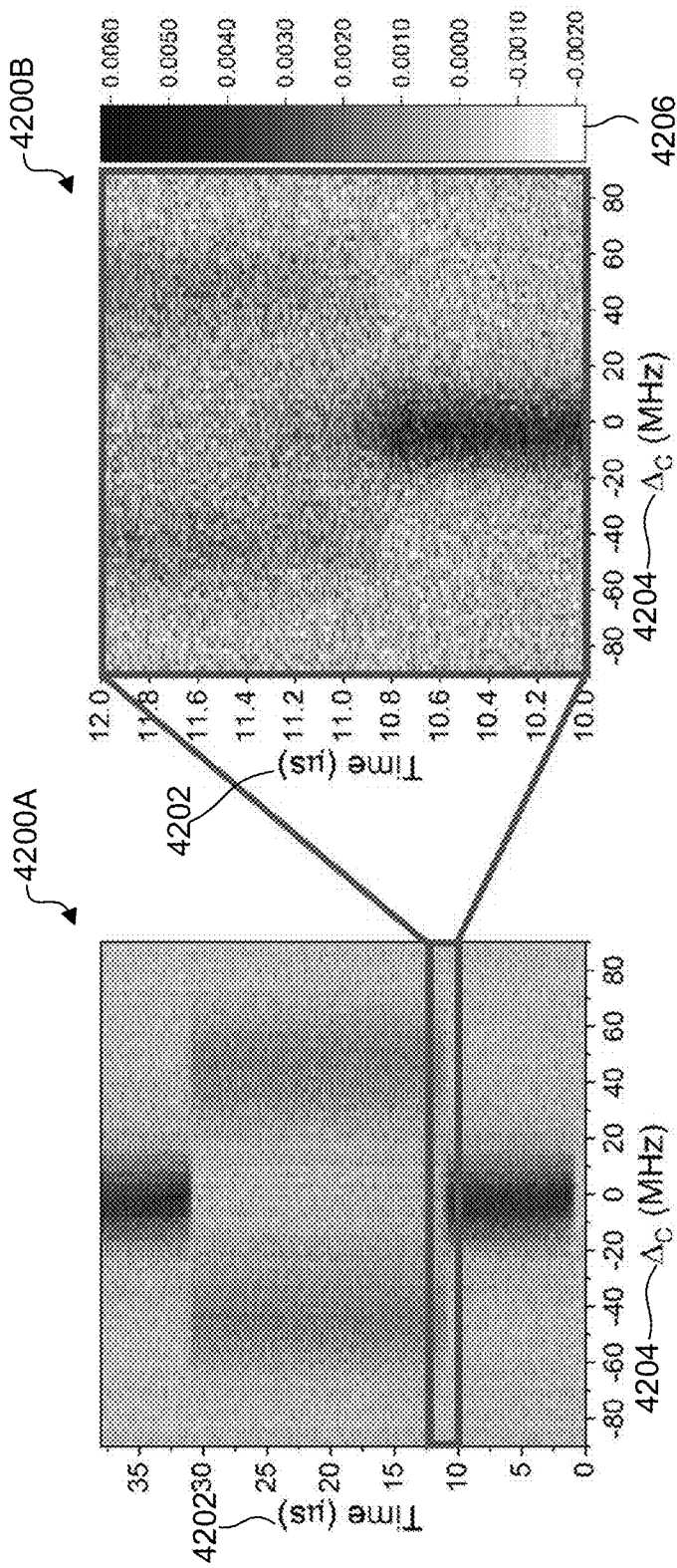

ATOM-BASED CLOSED-LOOP CONTROL FOR ELECTROMAGNETIC RADIATION MEASUREMENT, COMMUNICATIONS, AND INFORMATION PROCESSING

CROSS REFERENCE TO RELATED APPLICATIONS

This application claims priority to U.S. Provisional Application No. 63/032,041, filed May 29, 2020, and U.S. Provisional Application No. 63/077,244, filed Sep. 11, 2020, which are hereby incorporated herein in their entireties by reference.

FIELD

The present disclosure relates to atom-based apparatuses, systems, and methods, for example, atom-based closed-loop apparatuses, systems, and methods.

BACKGROUND

Sensors and measurement devices for electromagnetic (EM) radiation rely primarily on antenna technology. However, traditional antenna and/or solid-state technology imposes fundamental limits on the achievable accuracy, precision, and performance of EM probes and detectors. Atom-based quantum sensor technologies can achieve capabilities beyond traditional sensor technologies. In quantum physics, a Rydberg atom is an excited atom with one or more loosely bound electrons having a high principal quantum number that exhibits large polarizabilities and electric dipole moments. Atom-based quantum sensors utilizing individual atoms in highly-excited Rydberg states can provide improved sensing, measurement, and imaging for EM radiation measurement, communications, and/or information processing.

SUMMARY

Accordingly, there is a need to extend capabilities beyond those achievable with traditional sensor technologies and improve EM sensing, detection, measurement, imaging, reception, communications, and source generation with atom-based quantum sensor technologies.

In some embodiments, an atom-based closed-loop control system includes a compartment, a device, a detector, and a controller. In some embodiments, the compartment encloses a gas of excited atoms including one or more Rydberg states. In some embodiments, the device is configured to apply an input signal to the one or more Rydberg states. In some embodiments, the detector is configured to detect a response of the one or more Rydberg states due to an interaction of the one or more Rydberg states with electromagnetic radiation. In some embodiments, the controller is configured to adjust a characteristic of the applied input signal based on, at least in part, the detected response of the one or more Rydberg states to the electromagnetic radiation.

In some embodiments, the controller is further configured to adjust the characteristic of the applied input signal based on a characteristic of the electromagnetic radiation. In some embodiments, the characteristic of the electromagnetic radiation includes a frequency, an amplitude, a phase, a polarization, a power, a direction of arrival, an angle of arrival, and/or a combination thereof. In some embodiments, the controller is further configured to adjust a control signal and/or a processing signal based on the detected response of the one or more Rydberg states to the electromagnetic radiation.

In some embodiments, the controller is further configured to adjust the characteristic based on differential feedback between the detected response and a set point. In some embodiments, the controller is further configured to adjust the characteristic based on one or more detector sensitivity parameters.

In some embodiments, the detected response of the one or more Rydberg states is further based on a temperature of the gas, a pressure of the gas, an electric field applied to the gas, a magnetic field applied to the gas, and/or an auxiliary RF waveform applied to the gas. In some embodiments, the device includes a mechanical device, an electrical device, and/or an optical device.

In some embodiments, the applied input signal includes an electromagnetic field, an electric field, and/or magnetic field, and the characteristic includes a parameter of the applied electromagnetic, electric, and/or magnetic field. In some embodiments, the controller is further configured to automatically adjust the characteristic based on the detected response. In some embodiments, the controller includes hardware or software configured to automatically adjust the characteristic to a set point.

In some embodiments, the device includes an RF generator or source, and the applied input signal includes an RF electromagnetic wave, an RF electronic signal, an electric field, and/or a magnetic field. In some embodiments, the detected response includes an optical transmission, an optical absorption, or a scattered signal from the excited atoms.

In some embodiments, the device is further configured to apply a fiduciary RF electromagnetic wave or a reference local oscillator wave. In some embodiments, the applied input signal includes a plurality of fields for multi-field conditioning of the one or more Rydberg states. In some embodiments, the applied input signal includes a laser beam, and the characteristic includes a parameter of the laser beam.

In some embodiments, the characteristic and the detected response include phase-encoded signals. In some embodiments, the characteristic and the detected response are electronically synchronized, frequency-locked, and/or phase-locked.

In some embodiments, the controller is further configured to determine an electromagnetic spectrum. In some embodiments, the detected response is further based on a multi-dimensional Doppler-match of parameters of a plurality of laser beams for Doppler-free Rydberg spectroscopy in the gas of excited atoms at or near the homogenous Rydberg linewidth.

In some embodiments, a system for detecting a radio frequency (RF) signal includes a stripline, a device, a gas of excited atoms, a detector, and a controller. In some embodiments, the stripline is configured to receive an input RF signal and a reference signal. In some embodiments, the device is configured to apply the reference signal. In some embodiments, the gas of excited atoms includes one or more Rydberg states and is disposed within the stripline in a vacuum enclosure. In some embodiments, the detector is configured to detect a response of the one or more Rydberg states due to an interaction of the one or more Rydberg states with electromagnetic radiation inside or adjacent to the stripline based on the input RF signal and/or the applied reference signal. In some embodiments, the controller is configured to determine a parameter of the input RF signal based on, at least in part, the detected response of the one or more Rydberg states to the electromagnetic radiation. In some embodiments, the controller is configured to adjust a characteristic of the applied reference signal based on, at least in part, the detected response of the one or more Rydberg states to the electromagnetic radiation.

In some embodiments, the controller is further configured to adjust the characteristic of the applied reference signal based on a second characteristic of the electromagnetic radiation, the input RF signal, and/or the applied reference signal. In some embodiments, the second characteristic of the electromagnetic radiation, the input RF signal, and/or the applied reference signal includes a frequency, an amplitude, a phase, a polarization, a power, a direction of arrival, an angle of arrival, and/or a combination thereof. In some embodiments, the controller is further configured to adjust a control signal and/or a processing signal based on the detected response of the one or more Rydberg states to the electromagnetic radiation.

In some embodiments, the applied reference signal includes a reference RF signal. In some embodiments, the input RF signal includes an electrical signal, an optical signal, and/or an electromagnetic wave. In some embodiments, the stripline includes one or more electrodes, a waveguide, and/or a vapor cell compartment.

In some embodiments, the device includes a controller configured to vary the parameter of the input RF signal. In some embodiments, the reference signal includes a reference RF signal contained in a modulation of a parameter of a laser beam interacting with the one or more Rydberg states. In some embodiments, the stripline is further configured to receive one or more conditioning RF signals for multi-field conditioning of the one or more Rydberg states.

In some embodiments, the system for detecting a RF signal further includes a multiplexer configured to parallelize or multiplex one or more combinations of optical and RF electromagnetic fields, interferometric pathways, and/or interferometric signals of the one or more Rydberg states. In some embodiments, the multiplexer is configured to apply spatial, temporal, and/or frequency multiplexing. In some embodiments, the multiplexer is configured to provide increased detected RF bandwidth.

In some embodiments, the stripline includes a pair of electrodes and the parameter of the input RF signal is power or a field-equivalent voltage across the pair of electrodes. In some embodiments, the parameter of the input RF signal is the characteristic of the applied reference signal.

In some embodiments, the controller is further configured to determine an electromagnetic spectrum. In some embodiments, the controller is further configured to determine a power, a voltage, a communication signal, a direction of arrival, and/or a combination thereof.

In some embodiments, the detected response is further based on a multi-dimensional Doppler-match of parameters of a plurality of laser beams for Doppler-free Rydberg spectroscopy in the gas of excited atoms at or near the homogenous Rydberg linewidth. In some embodiments, the multi-dimensional Doppler-match of parameters of the plurality of laser beams includes at least two laser beams arranged with angles to suppress Doppler shifts in one, two, and/or three dimensions. In some embodiments, three laser beams are non-collinear to achieve a Doppler-match in two degrees of freedom. In some embodiments, four laser beams are non-collinear to achieve a Doppler-match in three degrees of freedom.

In some embodiments, a method for atom-based closed-loop control includes exciting atoms of a gas into one or more Rydberg states, applying one or more signal processing functions to the one or more Rydberg states, and regulating a characteristic of the applied one or more signal processing functions based on, at least in part, a response of the one or more Rydberg states to the one or more signal processing functions.

In some embodiments, the one or more signal processing functions includes a phase-locked loop. In some embodiments, the one or more signal processing functions includes a Costas loop. In some embodiments, the characteristic includes an electromagnetic field frequency, an amplitude, a polarization, a phase, and/or some combination thereof. In some embodiments, the one or more signal processing functions includes an injection lock with an injection locked oscillator (ILO) for radio frequency. In some embodiments, exciting the atoms includes exciting the atoms into a low-lying excited state. In some embodiments, the characteristic includes a laser frequency, phase, an amplitude, and/or a polarization that is involved in exciting or interacting with the atoms. In some embodiments, the one or more signal processing functions includes an automatic level control of a modulated signal from the response of the one or more Rydberg states. In some embodiments, the regulating includes achieving baseband or modulated signal processing for the retrieval of analog or digital information from the response of the one or more Rydberg states.

In some embodiments, a system for quantum-state-space interferometry includes an atomic receiver including an atomic vapor with first atomic states and second atomic states, an interferometric pathway, and a detector. The first atomic states are coupled by radio frequency electromagnetic fields (RF-EM) modulated at a first radio frequency (RF). The second atomic states are coupled by optical electromagnetic fields (O-EM) modulated at a second radio frequency (RF). The interferometric pathway of RF phases between the first and second atomic states is closed by a quantum-state-space. The detector is configured to detect a readout that includes an interferometric signal from the quantum-state-space. The detected readout is configured to provide RF interferometry in optical and/or quantum domains. The system may be described as atom RF interferometry. The phase, as well as amplitude, of either the RF or O-EM fields may be detected and measured for implementation in optical sensing of RF phase or detection of optical RF phase mediated by an atom RF interferometer.

In some embodiments, RF includes a range from DC (zero hertz) to THz (terahertz, or $10^{12}$ hertz). In some embodiments, O-EM includes a range of colors from ultraviolet to infrared wavelengths. In some embodiments, the second atomic states include at least one Rydberg state. In some embodiments, the interferometric pathway of the RF phases is configured to be modified by changes in an atom, an atom excitation, an interaction of the first atomic states with other atoms, an interaction of the second atomic states with other atoms, the first atomic states, the second atomic states, the RF-EM, the O-EM, another external field, perturbation, and/or some combination thereof.

In some embodiments, the system further includes a transceiver coupled to the detector and configured to transmit and/or receive a communication signal. In some embodiments, the interferometric signal includes optical detection, measurement, and/or imaging of a phase, a frequency, an amplitude, a polarization, a direction or angle of arrival of an RF electromagnetic wave, and/or some combination thereof. In some embodiments, the readout of the interferometric signal includes an electromagnetic, an optical, a charge, or an electronic signal.

In some embodiments, a method for performing quantum-state-space interferometry includes coupling first atomic states by RF-EM modulated at a first RF, coupling second atomic states by O-EM modulated at a second RF, forming an interferometric pathway of RF phases between the first and second atomic states closed by a quantum-state-space, and detecting an interferometric signal from the quantum-state-space.

In some embodiments, the method further includes parallelizing or multiplexing one or more combinations of optical and radio frequency electromagnetic fields, interferometric pathways, and/or interferometric signals. In some embodiments, the multiplexing includes spatial and temporal multiplexing. In some embodiments, the detecting includes an optical interferometric signal carrying a radio frequency modulation, information, or a communication signal.

In some embodiments, a system for atom-based RF signal waveform detection, imaging, and/or processing includes a gas of excited atoms comprising one or more Rydberg states, an RF signal waveform interacting with the gas of excited atoms, and a detector configured to detect a readout from the gas of excited atoms based on the RF signal waveform. The detected readout is configured to provide a characteristic of the RF signal waveform.

In some embodiments, the readout includes a time domain signal or a frequency domain signal. In some embodiments, the system further includes a processor coupled to the detector, the processor configured to analyze modulated RF signals and wave patterns of the detected readout comprising communication protocols, Doppler shifts, and/or frequency chirps.

In some embodiments, a method for atom-based RF signal detection, receiving, imaging, and processing includes exciting atoms of a gas into one or more Rydberg states, interacting at least one applied electromagnetic field with the excited atoms of the gas to form structured Rydberg levels, interacting at least one RF signal wave with the structured Rydberg levels, and detecting at least one RF signal wave from the excited atoms.

In some embodiments, the method further includes analyzing modulated radio frequency signals and wave patterns comprising communication protocols, Doppler shifts, and frequency chirps.

In some embodiments, a system for detecting an RF signal includes an atomic gas contained within an RF stripline in a vacuum enclosure, or an RF stripline contained within an atomic gas, electrical feedthroughs coupled to the stripline and configured to inject one or more RF signals into the stripline, and a detector configured to detect a readout of an atomic response to an RF signal in the stripline. The detected readout is configured to increase a detection sensitivity of the RF signal, provide a means to apply one or more RF fields including for structuring Rydberg levels and for employing RF phase sensing and interferometry, and for integration into traditional RF electronics systems.

In some embodiments, an atom-based closed-loop control system includes an atomic receiver, a control signal, and a feedback loop. The atomic receiver is configured to receive an input signal and includes one or more Rydberg atoms. The control signal is based on a response of the one or more Rydberg atoms to the input signal. The feedback loop is coupled to the control signal and the atomic receiver. The feedback loop regulates one or more process variables of the atomic receiver to a predetermined state or set point.

In some embodiments, an atomic automatic level control (AALC) system includes an atomic receiver, a control signal, and a controller. The atomic receiver is configured to receive an input signal and includes one or more Rydberg atoms. The control signal is based on a response of the one or more Rydberg atoms to the input signal and includes a baseband signal and/or a carrier signal. The controller is coupled to the control signal and the atomic receiver and is configured to adjust one or more laser parameters based on the carrier signal for automatic level control of the baseband and/or carrier signal.

In some embodiments, an atomic phase-locked loop (PLL) system includes an atomic receiver, a feedback signal, and an oscillator. The atomic receiver is configured to receive an input signal and one or more reference signals, and the atomic receiver includes one or more Rydberg atoms. The feedback signal is based on a response of the one or more Rydberg atoms to the input signal and the one or more reference signals. The oscillator is coupled to the feedback signal and the atomic receiver and is configured to adjust a frequency and/or a phase of the one or more reference signals to form a phase-locked loop.

In some embodiments, a quantum-state-space interferometer includes an atomic receiver, a closed internal-state interferometric loop, and a detector. The atomic receiver is configured to receive a first input signal and a second input signal, and the atomic receiver includes one or more Rydberg atoms. The closed internal-state interferometric loop is based on a first coupling of the first input signal and the one or more Rydberg atoms and a second coupling of the second input signal and the one or more Rydberg atoms. The detector is configured to detect an optical readout based on a response of the one or more Rydberg atoms to the first and second input signals. The second input signal includes a modulated optical beam.

In some embodiments, an atomic transducer includes an antenna, a connector, an atomic receiver, and a detector. The antenna is configured to collect an input signal. The connector is coupled to the antenna and is configured to transfer the input signal. The atomic receiver is coupled to the connector via electrodes and is configured to receive the input signal, and the atomic receiver includes one or more Rydberg atoms. The detector is configured to detect a readout based on a response of the one or more Rydberg atoms to the input signal. The antenna, the connector, the atomic receiver, and the detector form a single unit.

In some embodiments, an atomic receiver with antenna includes an antenna, an atomic receiver, an optical input/output (I/O), and an electrical I/O. The antenna is configured to collect an input signal. The atomic receiver is coupled to the antenna and is configured to receive the input signal, and the atomic receiver includes one or more Rydberg atoms. The optical I/O is coupled to the atomic receiver, and the optical I/O includes an atom-based closed-loop feedback control based on a response of the one or more Rydberg atoms to the input signal. The electrical I/O is coupled to the atomic receiver, and the electrical I/O includes an atom-based closed-loop feedback control based on a response of the one or more Rydberg atoms to the input signal.

In some embodiments, an atomic imager includes an atomic receiver, an opto-electronic converter, and a signal processor. The atomic receiver is configured to receive an input signal, and the atomic receiver includes one or more Rydberg atoms. The opto-electronic converter is coupled to the atomic receiver and is configured to receive an optical readout from the atomic receiver. The optical readout has an atom-based closed-loop feedback control based on a response of the one or more Rydberg atoms to the input signal. The signal processor is coupled to the opto-electronic converter and is configured to receive an electrical readout from the opto-electronic converter. The electrical readout includes an atom-based closed-loop feedback control based on a response of the one or more Rydberg atoms to the input signal.

In some embodiments, an atomic hybrid detector with stripline includes an asymmetric, symmetric, or two-electrode stripline and an atomic receiver. The stripline is configured to receive an input signal and a reference signal, and the stripline includes a first electrode and a second electrode, both connected to a symmetric pair of separated RF connectors. The atomic vapor is disposed between the first and second electrodes connected to the pair of RF connectors, and the atomic receiver includes one or more Rydberg atoms. The stripline is configured to increase a local field by compression of the input and reference signals in the atomic receiver to provide an optical readout based on a response of the one or more Rydberg atoms to the input and/or reference signal.

In some embodiments, an atomic hybrid detector with one or more striplines with one or a plurality of RF connectors is configured for homodyne amplitude and phase measurement, heterodyne amplitude and phase measurement, heterodyne parametric signal amplification, communications and radio signal reception and processing. In some embodiments, the atomic hybrid detector can be configured as a spectrum analyzer.

In some embodiments, a multi-field conditioning system includes an atomic receiver and a detector. The atomic receiver is configured to receive an input signal, a reference signal, and a conditioning signal, and the atomic receiver includes one or more Rydberg atoms. The detector is configured to detect a readout based on a response of the one or more Rydberg atoms to the input and reference signals. The conditioning signal is configured to condition a Rydberg level structure of the one or more Rydberg atoms for resonant detection of the input signal.

In some embodiments, a Rydberg field probe includes a probe, an atomic receiver, a detector, and a control unit. The probe includes a probe tip. The atomic receiver is disposed within the probe tip and is configured to receive an input signal, and the atomic receiver includes one or more Rydberg atoms. The detector is configured to detect a readout based on a response of the one or more Rydberg atoms to the input signal. The control unit is coupled to the probe and the detector, and the control unit is configured to provide control signals to the atomic receiver and receive the detected readout. The probe, the detector, and control unit can be portable.

In some embodiments, an atomic waveform sampler and spectrum analyzer includes an atomic receiver and a photodetector array. The atomic receiver is configured to receive an input signal and a site-selective signal, and the atomic receiver includes one or more Rydberg atoms. The photodetector array is configured to detect an optical readout based on a response of the one or more Rydberg atoms to the input and site-selective signals generated by a spatially- or time-varying perturbation in the atom sample. The photodetector array is configured to perform spatial and/or temporal multiplexing of the detected optical readout to provide a sampled waveform based on the input signal. In some embodiments, the atoms may provide instantaneous bandwidths of up to 10 MHz or higher that are multiplexed up to 1 GHz or higher.

In some embodiments, an atom-based raster imager for RF-EM field and phase at high-speed and high-resolution includes an atomic vapor, raster-scanned O-EM laser beam, and detector. The raster imager is configured to spatially-scan an O-EM beam to selectively read out the phase and amplitude of one or more RF-EM fields emitted one or more sources, such as an antenna or antenna array, from Rydberg atoms located in 1D or 2D. The raster imager has capabilities including sub-wavelength spatial imaging over distances and areas larger than that allowed by the O-EM beam sizes, which are typically limited to ~1 mm or less due to requirements of high coupler Rabi frequencies in Rydberg spectroscopy, far-sub-wavelength resolution of microwave phase and amplitude within the O-EM beam at selectable regions in space, and a physical separation between front-end detector atoms and back-end laser-source and other hardware for remote sensing and imaging, such as for microwave measurement and imaging inside anechoic chambers, at base-stations, or other distant locations. Atom-based electromagnetic field and phase imaging has been previously described in U.S. application Ser. No. 16/222,384, filed Dec. 17, 2018, which is hereby incorporated herein in its entirety by reference.

In some embodiments, the atom-based raster imager can be effected by a geometrical scan of one or more optical imaging beams using an electro-optic or opto-mechanic scanning element. In some embodiments, subgroups of pixels can be interrogated in parallel (e.g., simultaneously). In some embodiments, subgroups of pixels can be interrogated in a combination of scans and parallel operations. In some embodiments, the scans can be effected by opto-mechanical, electro-optic, and/or MEMS-type actuators.

In some embodiments, an atom-based RF-EM source and transceiver includes an atomic pump medium excited to one or more Rydberg states, one or more EM cavities, and RF-EM field output and an atomic receiver.

Further features and exemplary aspects of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

FIG. 1 is a schematic cross-sectional illustration of an atomic receiver, according to an exemplary embodiment.

FIG. 2 is a schematic illustration of an atom-based closed-loop control system, according to an exemplary embodiment.

FIGS. 42A and 42B are plots of EIT transmission over time as a function of coupler-laser frequency for an RF pulse on resonance, according to an exemplary embodiment.

Figure 3A:
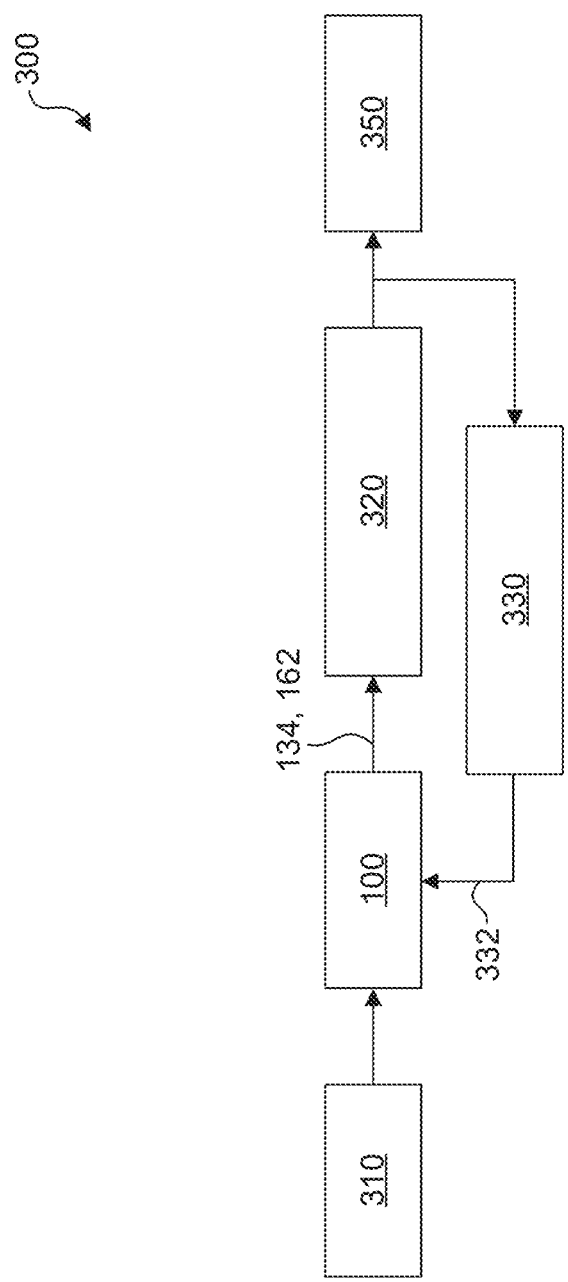
FIGS. 3A and 3B are schematic illustrations of an atomic automatic level control (AALC) system, according to exemplary embodiments.

The features and exemplary aspects of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this present disclosure. The disclosed embodiment(s) merely exemplify the present disclosure. The scope of the disclosure is not limited to the disclosed embodiment(s). The present disclosure is defined by the claims appended hereto.

The embodiment(s) described, and references in the specification to "one embodiment," "an embodiment," "an example embodiment," "an exemplary embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, +2%, +5%, ±10%, or ±15% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Aspect 1 of the description—An atom-based closed-loop control system including: a compartment enclosing a gas of excited atoms including one or more Rydberg states; a device configured to apply an input signal to the one or more Rydberg states; a detector configured to detect a response of the one or more Rydberg states due to an interaction of the one or more Rydberg states with electromagnetic radiation; and a controller configured to adjust a characteristic of the applied input signal based on, at least in part, the detected response of the one or more Rydberg states to the electromagnetic radiation.

Aspect 2 of the description—The system of aspect 1, wherein the controller is further configured to adjust the characteristic of the applied input signal based on a characteristic of the electromagnetic radiation.

Aspect 3 of the description—The system of aspect 2, wherein the characteristic of the electromagnetic radiation includes a frequency, an amplitude, a phase, a polarization, a power, a direction of arrival, an angle of arrival, and/or a combination thereof.

Aspect 4 of the description—The system of aspect 1, wherein the controller is further configured to adjust a control signal and/or a processing signal based on the detected response of the one or more Rydberg states to the electromagnetic radiation.

Aspect 5 of the description—The system of aspect 1, wherein the controller is further configured to adjust the characteristic based on differential feedback between the detected response and a set point.

Aspect 6 of the description—The system of aspect 1, wherein the controller is further configured to adjust the characteristic based on one or more detector sensitivity parameters.

Aspect 7 of the description—The system of aspect 1, wherein the detected response of the one or more Rydberg states is further based on a temperature of the gas, a pressure of the gas, an electric field applied to the gas, a magnetic field applied to the gas, and/or an auxiliary RF waveform applied to the gas.

Aspect 8 of the description—The system of aspect 1, wherein the device includes a mechanical device, an electrical device, and/or an optical device.

Aspect 9 of the description—The system of aspect 1, wherein: the applied input signal includes an electromagnetic field, an electric field, and/or magnetic field, and the characteristic includes a parameter of the applied electromagnetic, electric, and/or magnetic field.

Aspect 10 of the description—The system of aspect 1, wherein the controller is further configured to automatically adjust the characteristic based on the detected response.

Aspect 11 of the description—The system of aspect 1, wherein the controller includes hardware or software configured to automatically adjust the characteristic to a set point.

Aspect 12 of the description—The system of aspect 1, wherein: the device includes an RF generator or source, and the applied input signal includes an RF electromagnetic wave, an RF electronic signal, an electric field, and/or a magnetic field.

Aspect 13 of the description—The system of aspect 1, wherein the detected response includes an optical transmission, an optical absorption, or a scattered signal from the excited atoms.

Aspect 14 of the description—The system of aspect 1, wherein the device is further configured to apply a fiduciary RF electromagnetic wave or a reference local oscillator wave.

Aspect 15 of the description—The system of aspect 1, wherein the applied input signal includes a plurality of fields for multi-field conditioning of the one or more Rydberg states.

Aspect 16 of the description—The system of aspect 1, wherein: the applied input signal includes a laser beam, and the characteristic includes a parameter of the laser beam.

Aspect 17 of the description—The system of aspect 1, wherein the characteristic and the detected response includes phase-encoded signals.

Aspect 18 of the description—The system of aspect 1, wherein the characteristic and the detected response are electronically synchronized, frequency-locked, and/or phase-locked.

Aspect 19 of the description—The system of aspect 1, wherein the controller is further configured to determine an electromagnetic spectrum.

Aspect 20 of the description—The system of aspect 1, wherein the detected response is further based on a multidimensional Doppler-match of parameters of a plurality of laser beams for Doppler-free Rydberg spectroscopy in the gas of excited atoms at or near the homogenous Rydberg linewidth.

Aspect 21 of the description—A system for detecting a radio frequency (RF) signal, the system including: a stripline configured to receive an input RF signal and a reference signal; a device configured to apply the reference signal; a gas of excited atoms including one or more Rydberg states and disposed within the stripline in a vacuum enclosure; a detector configured to detect a response of the one or more Rydberg states due to an interaction of the one or more Rydberg states with electromagnetic radiation inside or adjacent to the stripline based on the input RF signal and/or the applied reference signal; and a controller configured to: determine a parameter of the input RF signal based on, at least in part, the detected response of the one or more Rydberg states to the electromagnetic radiation, and adjust a characteristic of the applied reference signal based on, at least in part, the detected response of the one or more Rydberg states to the electromagnetic radiation.

Aspect 22 of the description—The system of aspect 21, wherein the controller is further configured to adjust the characteristic of the applied reference signal based on a second characteristic of the electromagnetic radiation, the input RF signal, and/or the applied reference signal.

Aspect 23 of the description—The system of aspect 22, wherein the second characteristic of the electromagnetic radiation, the input RF signal, and/or the applied reference signal includes a frequency, an amplitude, a phase, a polarization, a power, a direction of arrival, an angle of arrival, and/or a combination thereof.

Aspect 24 of the description—The system of aspect 21, wherein the controller is further configured to adjust a control signal and/or a processing signal based on the detected response of the one or more Rydberg states to the electromagnetic radiation.

Aspect 25 of the description—The system of aspect 21, wherein the applied reference signal includes a reference RF signal.

Aspect 26 of the description—The system of aspect 21, wherein the input RF signal includes an electrical signal, an optical signal, and/or an electromagnetic wave.

Aspect 27 of the description—The system of aspect 21, wherein the stripline includes one or more electrodes, a waveguide, and/or a vapor cell compartment.

Aspect 28 of the description—The system of aspect 21, wherein the device includes a controller configured to vary the parameter of the input RF signal.

Aspect 29 of the description—The system of aspect 21, wherein the reference signal includes a reference RF signal contained in a modulation of a parameter of a laser beam interacting with the one or more Rydberg states.

Aspect 30 of the description—The system of aspect 21, wherein the stripline is further configured to receive one or more conditioning RF signals for multi-field conditioning of the one or more Rydberg states.

Aspect 31 of the description—The system of aspect 21, further including a multiplexer configured to parallelize or multiplex one or more combinations of optical and RF electromagnetic fields, interferometric pathways, and/or interferometric signals of the one or more Rydberg states.

Aspect 32 of the description—The system of aspect 31, wherein the multiplexer is configured to apply spatial, temporal, and/or frequency multiplexing.

Aspect 33 of the description—The system of aspect 31, wherein the multiplexer is configured to provide increased detected RF bandwidth.

Aspect 34 of the description—The system of aspect 21, wherein the stripline includes a pair of electrodes and the parameter of the input RF signal is power or a field-equivalent voltage across the pair of electrodes.

Aspect 35 of the description—The system of aspect 21, wherein the parameter of the input RF signal is the characteristic of the applied reference signal.

Aspect 36 of the description—The system of aspect 21, wherein the controller is further configured to determine an electromagnetic spectrum.

Aspect 37 of the description—The system of aspect 36, wherein the controller is further configured to determine a power, a voltage, a communication signal, a direction of arrival, and/or a combination thereof.

Aspect 38 of the description—The system of aspect 21, wherein the detected response is further based on a multi-dimensional Doppler-match of parameters of a plurality of laser beams for Doppler-free Rydberg spectroscopy in the gas of excited atoms at or near the homogenous Rydberg linewidth.

Aspect 39 of the description—The system of aspect 38, wherein the multi-dimensional Doppler-match of parameters of the plurality of laser beams includes at least two laser beams arranged with angles to suppress Doppler shifts in one, two, and/or three dimensions.

Aspect 40 of the description—The system of aspect 39, wherein three laser beams are non-collinear to achieve a Doppler-match in two degrees of freedom or four laser beams are non-collinear to achieve a Doppler-match in three degrees of freedom.

Aspect 41 of the description—A method for atom-based closed-loop control, the method including: exciting atoms of a gas into one or more Rydberg states; applying one or more signal processing functions to the one or more Rydberg states; and regulating a characteristic of the applied one or more signal processing functions based on, at least in part, a response of the one or more Rydberg states to the one or more signal processing functions.

Aspect 42 of the description—The method of aspect 41, wherein the one or more signal processing functions includes a phase-locked loop.

Aspect 43 of the description—The method of any one of the preceding aspects, wherein the one or more signal processing functions includes a Costas loop.

Aspect 44 of the description—The method of any one of the preceding aspects, wherein the characteristic includes an electromagnetic field frequency, an amplitude, a polarization, a phase, and/or some combination thereof.

Aspect 45 of the description—The method of any one of the preceding aspects, wherein the one or more signal processing functions includes an injection lock.

Aspect 46 of the description—The method of any one of the preceding aspects, wherein exciting the atoms includes exciting the atoms into a low-lying excited state.

Aspect 47 of the description—The method of any one of the preceding aspects, wherein the characteristic includes a laser frequency, an amplitude, and/or a polarization that is involved in exciting or interacting with the atoms.

Aspect 48 of the description—The method of any one of the preceding aspects, wherein the one or more signal processing functions includes an automatic level control of a modulated signal from the response of the one or more Rydberg states.

Aspect 49 of the description—The method of any one of the preceding aspects, wherein the regulating includes achieving baseband or modulated signal processing for the retrieval of analog or digital information from the response of the one or more Rydberg states.

Aspect 50 of the description—A system for internal quantum-state-space interferometry, the system including: an atomic receiver including an atomic vapor with first atomic states and second atomic states, wherein the first atomic states are coupled by radio frequency electromagnetic fields (RF-EM) modulated at a first radio frequency (RF) and the second atomic states are coupled by optical electromagnetic fields (O-EM) modulated at a second radio frequency (RF); an interferometric pathway of RF phases between the first and second atomic states closed by a quantum-state-space; and a detector configured to detect a readout of an interferometric signal from the quantum-state-space, wherein the detected readout is configured to provide RF interferometry in optical and/or quantum domains.

Aspect 51 of the description—The system of aspect 50, wherein the first and second radio frequencies include a range from DC to THz.

Aspect 52 of the description—The system of any one of the preceding aspects, wherein the second atomic states include at least one Rydberg state.

Aspect 53 of the description—The system any one of the preceding aspects, wherein the interferometric pathway of the RF phases is configured to be modified by changes in an atom, an atom excitation, an interaction of the first atomic states with other atoms, an interaction of the second atomic states with other atoms, the first atomic states, the second atomic states, the RF-EM, the O-EM, and/or some combination thereof.

Aspect 54 of the description—The system any one of the preceding aspects, further including a transceiver coupled to the detector and configured to transmit and/or receive a communication signal.

Aspect 55 of the description—The system any one of the preceding aspects, wherein the interferometric signal includes optical detection, measurement, and/or imaging of a phase, a frequency, an amplitude, a polarization, a direction of an RF electromagnetic wave, and/or some combination thereof.

Aspect 56 of the description—The system any one of the preceding aspects, wherein the readout of the interferometric signal includes an electromagnetic, an optical, a charge, or an electronic signal.

Aspect 57 of the description—A method for performing quantum-state-space interferometry, the method including: coupling first atomic states by radio frequency electromagnetic fields (RF-EM) modulated at a first radio frequency (RF); coupling second atomic states by optical electromagnetic fields (O-EM) modulated at a second frequency (RF); forming an interferometric pathway of RF phases between the first and second atomic states closed by a quantum-state-space; and detecting an interferometric signal from the quantum-state-space.

Aspect 58 of the description—The method of aspect 57, further including parallelizing or multiplexing one or more combinations of optical and radio frequency electromagnetic fields, interferometric pathways, and/or interferometric signals.

Aspect 59 of the description—The method of aspect 58, wherein the multiplexing includes spatial and/or temporal multiplexing.

Aspect 60 of the description—The method of any one of the preceding aspects, wherein the detecting includes an optical interferometric signal carrying a radio frequency modulation, information, or a communication signal.

Aspect 61 of the description—A system for atom-based radio frequency (RF) signal waveform detection, imaging, and/or processing, the system including: a gas of excited atoms including one or more Rydberg states; an RF signal waveform interacting with the gas of excited atoms; and a detector configured to detect a readout from the gas of excited atoms based on the RF signal waveform, wherein the detected readout is configured to provide a characteristic of the RF signal waveform.

Aspect 62 of the description—The system of aspect 61, wherein the readout includes a time domain signal or a frequency domain signal.

Aspect 63 of the description—The system of any one of the preceding aspects, further including a processor coupled to the detector, wherein the processor is configured to analyze modulated RF signals and wave patterns of the detected readout including communication protocols, Doppler shifts, and/or frequency chirps.

Aspect 64 of the description—A method for atom-based radio frequency (RF) signal detection, receiving, imaging, and processing, the method including: exciting atoms of a gas into one or more Rydberg states; interacting at least one electromagnetic field with the excited atoms of the gas to form structured Rydberg levels; interacting at least one RF signal wave with the structured Rydberg levels; and detecting at least one RF signal wave from the excited atoms.

Aspect 65 of the description—The method of aspect 64, further including analyzing modulated radio frequency signals and wave patterns including communication protocols, Doppler shifts, and frequency chirps.

Aspect 66 of the description—A system for detecting a radio frequency (RF) signal, the system including: an atomic gas contained within an RF stripline in a vacuum enclosure; electrical feedthroughs coupled to the stripline and configured to inject one or more RF signals into the stripline; and a detector configured to detect a readout of an atomic response to an RF signal in the stripline, wherein the detected readout is configured to increase a detection sensitivity of the RF signal.

Aspect 67 of the description—An atom-based closed-loop control system including: an atomic receiver configured to receive an input signal, wherein the atomic receiver includes one or more Rydberg atoms; a control signal based on a response of the one or more Rydberg atoms to the input signal; and a feedback loop coupled to the control signal and the atomic receiver, wherein the feedback loop regulates one or more process variables of the atomic receiver to a predetermined state or set point.

Aspect 68 of the description—An atomic automatic level control (AALC) system including: an atomic receiver configured to receive an input signal, wherein the atomic receiver includes one or more Rydberg atoms; a control signal based on a response of the one or more Rydberg atoms to the input signal, wherein the control signal includes a baseband signal and a carrier signal; and a controller coupled to the control signal and the atomic receiver, wherein the controller is configured to adjust one or more laser parameters based on the carrier signal for automatic level control of the baseband signal.

Aspect 69 of the description—An atomic phase-locked loop (PLL) system including: an atomic receiver configured to receive an input signal and one or more reference signals, wherein the atomic receiver includes one or more Rydberg atoms; a feedback signal based on a response of the one or more Rydberg atoms to the input signal and the one or more reference signals; and an oscillator coupled to the feedback signal and the atomic receiver, wherein the oscillator is configured to adjust a frequency and/or a phase of the one or more reference signals to form a phase-locked loop.

Aspect 70 of the description—A quantum-state-space interferometer including: an atomic receiver configured to receive a first input signal and a second input signal, wherein the atomic receiver includes one or more Rydberg atoms; a closed interferometric loop based on a first coupling of the first input signal and the one or more Rydberg atoms and a second coupling of the second input signal and the one or more Rydberg atoms; and a detector configured to detect an optical readout based on a response of the one or more Rydberg atoms to the first and second input signals, wherein the second input signal includes a modulated optical beam.

Aspect 71 of the description—An atomic transducer including: an antenna configured to collect an input signal; a connector coupled to the antenna and configured to transfer the input signal; an atomic receiver coupled to the connector via electrodes and configured to receive the input signal, wherein the atomic receiver includes one or more Rydberg atoms; and a detector configured to detect a readout based on a response of the one or more Rydberg atoms to the input signal, wherein the antenna, the connector, the atomic receiver, and the detector include a single unit.

Aspect 72 of the description—An atomic receiver with antenna including: an antenna configured to collect an input signal; an atomic receiver coupled to the antenna and configured to receive the input signal, wherein the atomic receiver includes one or more Rydberg atoms; an optical input/output (I/O) coupled to the atomic receiver, wherein the optical I/O includes an atom-based closed-loop feedback control based on a response of the one or more Rydberg atoms to the input signal; and an electrical I/O coupled to the atomic receiver, wherein the electrical I/O includes an atom-based closed-loop feedback control based on a response of the one or more Rydberg atoms to the input signal.

Aspect 73 of the description—An atomic imager including: an atomic receiver configured to receive an input signal, wherein the atomic receiver includes one or more Rydberg atoms; an opto-electronic converter coupled to the atomic receiver and configured to receive an optical readout from the atomic receiver, wherein the optical readout includes an atom-based closed-loop feedback control based on a response of the one or more Rydberg atoms to the input signal; and a signal processor coupled to the opto-electronic converter and configured to receive an electrical readout from the opto-electronic converter, wherein the electrical readout includes an atom-based closed-loop feedback control based on a response of the one or more Rydberg atoms to the input signal.

Aspect 74 of the description—An atomic hybrid detector with stripline including: a symmetric stripline configured to receive an input signal and a reference signal, wherein the symmetric stripline includes a first electrode and a second electrode; and an atomic receiver disposed between the first and second electrodes, wherein the atomic receiver includes one or more Rydberg atoms, wherein the symmetric stripline is configured to increase a local field compression of the input and reference signals in the atomic receiver to provide an optical readout based on a response of the one or more Rydberg atoms to the input signal.

Aspect 75 of the description—A multi-field conditioning system including: an atomic receiver configured to receive an input signal, a reference signal, and a conditioning signal, wherein the atomic receiver includes one or more Rydberg atoms; and a detector configured to detect a readout based on a response of the one or more Rydberg atoms to the input and reference signals, wherein the conditioning signal is configured to condition a Rydberg level structure of the one or more Rydberg atoms for resonant detection of the input signal.

Aspect 76 of the description—A Rydberg field probe including: a probe including a probe tip; an atomic receiver disposed within the probe tip and configured to receive an input signal, wherein the atomic receiver includes one or more Rydberg atoms; a detector configured to detect a readout based on a response of the one or more Rydberg atoms to the input signal; and a control unit coupled to the probe and the detector, wherein the control unit is configured to provide control signals to the atomic receiver and receive the detected readout, wherein the probe, the detector, and control unit are portable.

Aspect 77 of the description—An atomic waveform sampler and spectrum analyzer including: an atomic receiver configured to receive an input signal and a site-selective signal, wherein the atomic receiver includes one or more Rydberg atoms; and a photodetector array configured to detect an optical readout based on a response of the one or more Rydberg atoms to the input and site-selective signals, wherein the photodetector array is configured to perform spatial and/or temporal multiplexing of the detected optical readout to provide a sampled waveform based on the input signal.

Atom-based quantum sensor technologies afford capabilities beyond those achievable with traditional sensor technologies. Advances in exploiting properties of individual atoms in Rydberg states using electromagnetically induced transparency (EIT) in atomic gases, has afforded novel capabilities, for example, in electromagnetic radiation sensing (e.g., detection, measurement, imaging, reception, analog/digital communications, etc.), as well as source generation.

For radio frequency (RF) applications, Rydberg atom-based electromagnetic (EM) radiation detection can provide a combination of performance capabilities beyond what is possible with traditional antenna and other solid-state RF detectors, for example, ultra-broadband RF detection from DC to sub-THz, dynamic field ranges exceeding 120 dB (e.g., from field detection thresholds below 10 mV/m to high-intensity RF fields exceeding 5 kV/m with atomic ionization limits at the MV/m level), and high-resolution RF amplitude, phase, and polarization measurement and imaging.

Over a wide range RF field amplitude and frequency, the Rydberg-based measurement method is rooted in physics models of the atom-field interaction that are dependent on invariable atomic parameters and fundamental constants. This enables self-calibrated electric field measurements directly traceable to Planck's constant ($h=6.62607015 \times 10^{-34}$ J·s), with atomic RF electric field measurement uncertainties reaching below 1%. This is an improvement of nearly an order of magnitude over existing antenna standards, holding promise to become a new global atomic RF measurement standard at National Metrology Institutes worldwide.

Hybrid devices combining traditional RF technologies with Rydberg atom-based EIT detection for enhanced capabilities and novel application in RF sensing and metrology can also be realized, for example, Rydberg-EIT-based communications, including both analog amplitude and frequency modulation and digital communication, as well as pulsed RF detection and measurement.

Advances to-date using Rydberg atom gases and EIT for electromagnetic sensing have been based on obtaining an optical (or electrical) readout (e.g., output signal and/or signal beam) of the atomic response to an external electromagnetic radiation field, and obtaining from this readout information on the external field of interest or a relative change in a parameter of the external field.

As described herein "readout" is an optical and/or electrical output signal from one or more Rydberg levels (e.g., in an atomic vapor or atomic cell) due to a response of the one or more Rydberg levels to an external EM radiation field (e.g., RF and/or modulated optical field). For example, an "optical readout" can include a laser beam or optical signal beam from the one or more Rydberg levels due to a response of the one or more Rydberg levels to an external EM radiation field (e.g., RF and/or modulated optical field), and that "optical readout" can be detected by a detector (e.g., via an optical detector) and/or transferred and/or converted to an "electrical readout" (e.g., via an opto-electronic detector).

The present disclosure demonstrates and develops atom-based closed-loop apparatuses, systems, and methods for electromagnetic sensing based on using the readout of the atomic response, or a derivative thereof, to regulate the atomic readout process itself and provide a readout signal for autonomous or semi-autonomous operation with minimal or no human interaction.

The atom-based closed-loop includes of a set of hardware and/or software functions that can regulate a process variable (e.g., a characteristic of a process) to a desired state or set point based on a response of a quantum system or atomic gas. The atom-based closed-loop enables the ability to automate sub-functions that can operate Rydberg atom-based devices. For example, a laser-frequency tracking (e.g. a "detection") of an atomic resonance by atoms caused by changing external electromagnetic radiation environments. Further, the atom-based closed-loop can provide new or enhanced performance capabilities in atom-based devices, for example, implementing atomic phase-locked loops (PLLs) and RF frequency tuners.

This disclosure pertains to atom-based closed-loop apparatuses, systems, and methods for electromagnetic radiation measurement, communications, and information processing. For example, an atom-based closed-loop control system includes a set of hardware and software functions that automatically regulate a process variable (e.g., a characteristic of a process) to a desired state or set point based on a response of a quantum system or atomic gas with no human interaction. The atom-based closed-loop control can provide new or enhanced performance capabilities in atom-based devices.

Implementations of the atom-based closed-loop control apparatuses, systems, and methods pertaining to, for example, electromagnetic radiation sensing, measurement, imaging, modulated signal reception, demodulation, and processing with atoms are described in the following embodiments. Exemplary embodiments include an atom-based PLL, an in-phase and quadrature (I/Q) frequency- and phase-recovery loop (Costas loop), atom-based injection locking, automatic baseband level control, modulated baseband processing, and automatic spectral line tracking for atom-based devices.

Implementations in atom-based device hardware automation are also presented, for example, laser frequency and power regulation. Further, a quantum-state-space interferometer for RF interferometry (DC to THz) in the optical and/or quantum domains is described and demonstrated. Methods and processes combining atom-based closed-loop control with quantum-state-space interferometry, also referred to as atom RF interferometry, are described, for example, RF photonics and optical communications, as well as sub-wavelength near-field RF phase and amplitude measurement and imaging, direction finding (RF angle of arrival) and radar with Rydberg atom-based RF phase detection Various related concepts, methods, processes, and systems based on atoms are also presented, for example, atomic automatic level control (AALC), baseband processing, atomic modems (AMODEMs), atom-based RF amplitude, frequency, and/or phase (e.g., for power and/or voltage transducers), and atomic standards. Devices and implementations of atom-based closed-loop control can include, for example, an atom-based electromagnetic receiver with antenna feed, an atom-based electromagnetic imager/detector with closed-loop controls for autonomous operations, a hybrid atom-based detector with a stripline (e.g., for implementation of field compression, multi-field conditioning, parametric amplification, super-heterodyning, etc.), and an RF waveform sampler and/or spectrum analyzer (e.g., based on atoms using spatial and/or temporal multiplexing of atomic responses to electromagnetic fields).

This disclosure also pertains in part to an AMODEM, for example, including an AALC and/or atomic baseband processor (ABP) for conversion and transmission of analog or digital information using RF-optical or RF-electrical transduction in an atomic gas.

In the entirety of this disclosure, "RE" may refer to EM radiation at frequencies from DC to THz and "optical" may refer to EM radiation at frequencies above THz to the ultraviolet (e.g., PHz).

Unlike traditional antenna and receiver technology, atomic receivers include RF amplitude, frequency, and phase domains that are specific to the spectroscopic response of an atom (e.g., Rydberg) to an incident EM wave. Further, atomic receivers correspond to different receiver operating parameters, for example, laser frequency and power. For example, when retrieving a modulated RF signal, a carrier amplitude of the incident modulated RF field may vary at the location of the receiver, for example, due to changes in atmospheric attenuation, relative distance between source and receiver, etc. These variations can shift or alter a position of the Rydberg line or laser-frequency operating point on the Rydberg line. To account for this, the laser frequency would need to be regulated according to the atomic response (e.g. an AC shift of the line due to carrier field changes) to maintain the receiver sensitivity to the signal.

An exemplary implementation of an atom-based closed-loop control is an AALC that controls or maintains the output signal level of an atomic receiver. The AALC operates by extracting from the atomic response a signal strength of the incident electromagnetic RF wave and automatically adjusting receiver parameters (e.g., laser frequency, etc.) to maintain an operating point and baseband signal output level within an acceptable range.

In another atom-based closed-loop control exemplary implementation, an ABP can manage baseband processing functions of atomic receivers (e.g., processing of atomic and optical outputs, extraction of RF waveforms, extraction of signal information from the atomic and optical outputs, etc.). For example, the ABP can extract signal information from the atomic and/or optical outputs by demodulation, for example, analog demodulation (e.g., amplitude demodulation (AM), frequency demodulation (FM), phase demodulation (PM), quadrature amplitude demodulation (QAM), etc.), digital demodulation (e.g., frequency-shift keying (FSK), asymmetric frequency-shift keying (AFSK), phase-shift keying (PSK), QAM, etc.), hierarchical demodulation (e.g., QAM, etc.), spread spectrum waveforms, etc.

The ABP can also, for example, provide feedback on reference RF modulation parameters for a local oscillator (e.g., voltage-controlled oscillator (VCO), etc.) implemented in, for example, holographic/heterodyne RF reception for demodulation of the signal RF wave, channel selection, analog (e.g., atomic/spectroscopic) and/or digital encoding/decoding, filtering, etc. Holographic/heterodyne RF reception from an atom-based device has been previously described in U.S. application Ser. No. 16/222,384, filed Dec. 17, 2018, which is hereby incorporated herein in its entirety by reference.

Unlike classical baseband processors, the ABP can perform operations (1) with the atomic medium itself (e.g., direct atom-mediated demodulation of the baseband from the modulated RF carrier prior to conversion to or demodulation of the electrical signal), (2) electronically by analog or digital signal processing of the electronic signal from the atom-EM interaction, or (3) with a combination of the two. Generally, in atomic receivers and transceivers, RF carrier detection and baseband modulation/demodulation can occur in the atomic and optical domains as well as in the electronic domain. As a result, specific tasks and controls by an AMODEM can be shared and synchronized between the AALC and ABP.

FIG. 1 shows a diagram of atomic receiver 100. In some embodiments, atomic receiver 100 can include atomic cell 106 enclosing atoms 107 (e.g., Rydberg atoms) as described in U.S. application Ser. No. 16/222,384, filed Dec. 17, 2018, and International Appl. No. PCT/US2018/066006, filed Dec. 17, 2018, which are hereby incorporated herein in their entireties by reference.

FIG. 2 shows a diagram of atom-based closed-loop control system 200. Atom-based closed-loop control system 200 can generate control signal 220 from the response of atoms 107 in atomic receiver 100 to one or a plurality of input signals 210 (e.g., RF signals). Control signal 220 regulates a process variable 222 that in turn feeds back to atomic receiver 100, closing the loop. Atom-based closed-loop control system 200 can produce output signal 250, based on the response of atoms 107 of atomic receiver 100, that contains information about input signal 210.

Figure 3B:
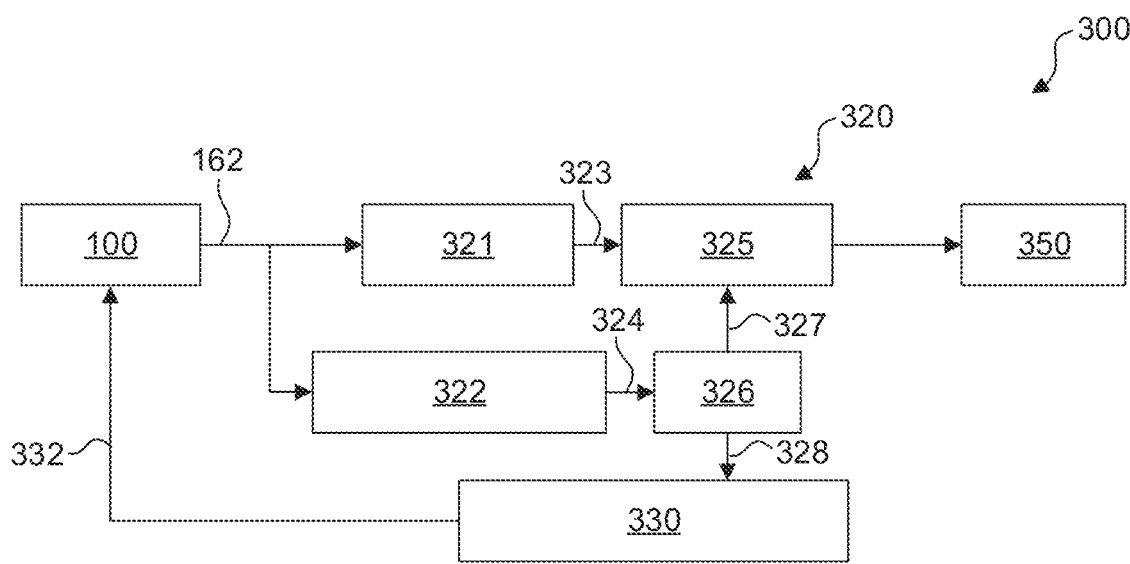
Figure 3C:
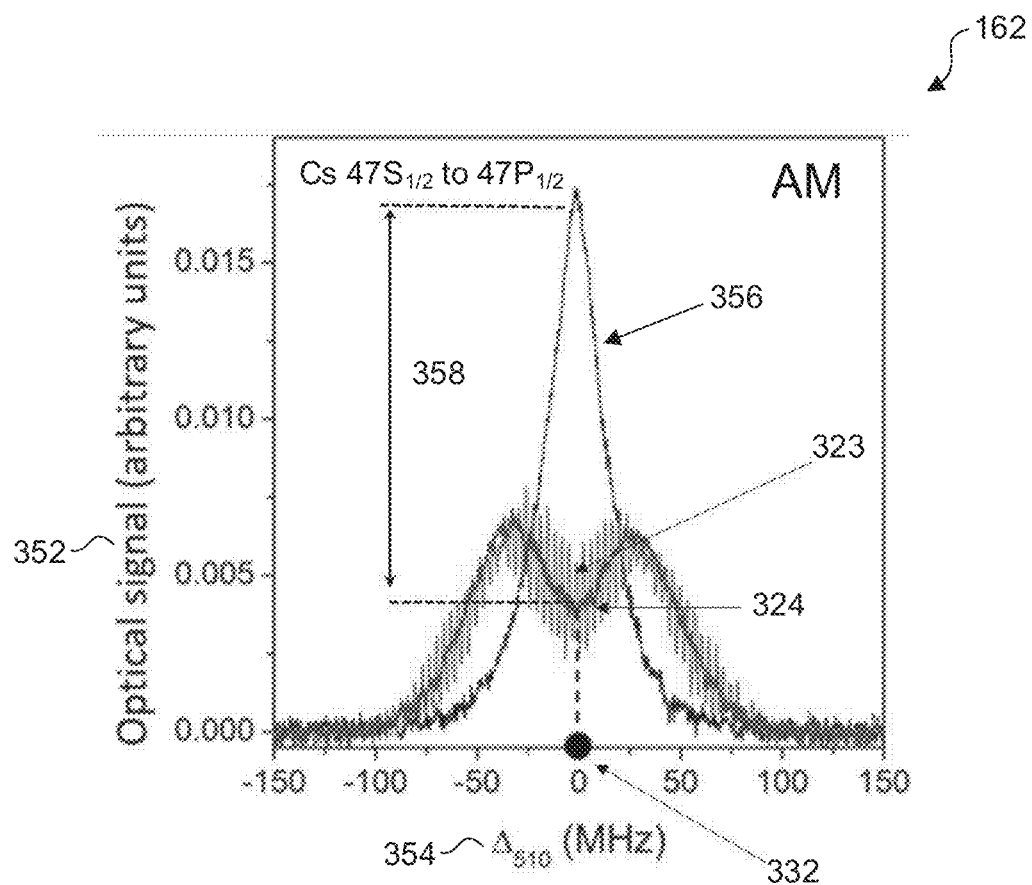
FIG. 3C is a plot of an electrical readout of the AALC system shown in FIG. 3B, according to an exemplary embodiment.

FIG. 3A illustrates a general exemplary implementation of AALC system 300 for automatic laser parameter adjustment (e.g., frequency and/or power) for atom-based device operation based on control signal 320 from a response of atomic receiver 100 to input signal 310. FIGS. 3B and 3C show exemplary implementations of AALC system 300 with automatic laser parameter adjustment for atomic automatic level control in AM baseband reception in atomic receiver 100.

Figure 4A:
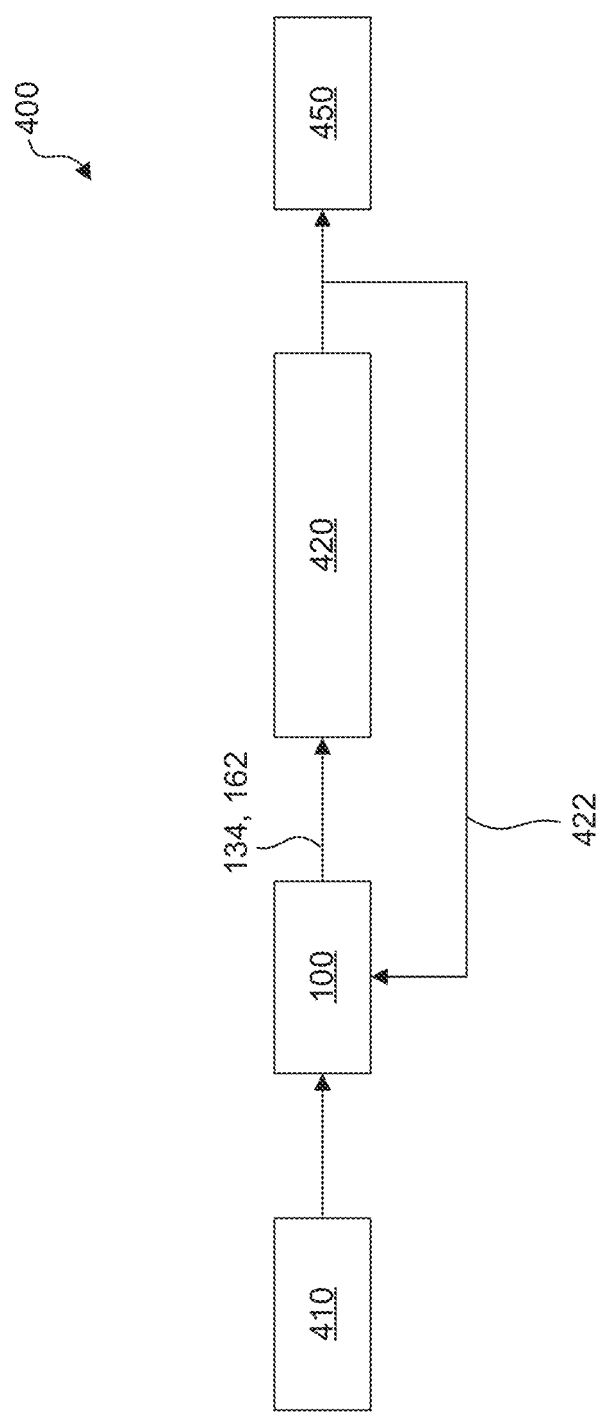
FIGS. 4A-4C are schematic illustrations of an atomic phase-locked loop (PLL) system, according to exemplary embodiments.
Figure 4B:
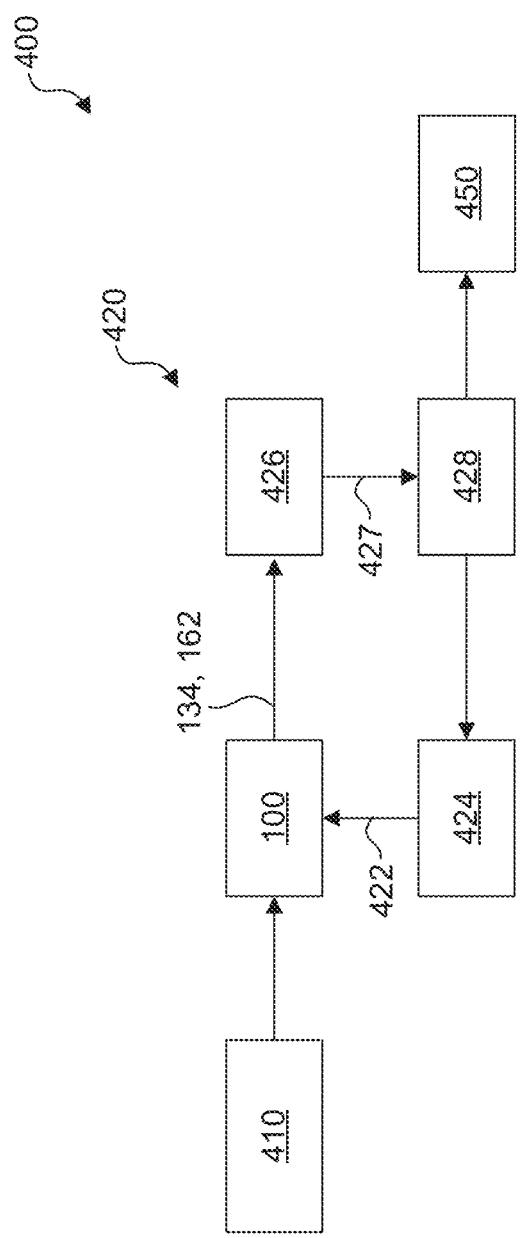
Figure 4C:
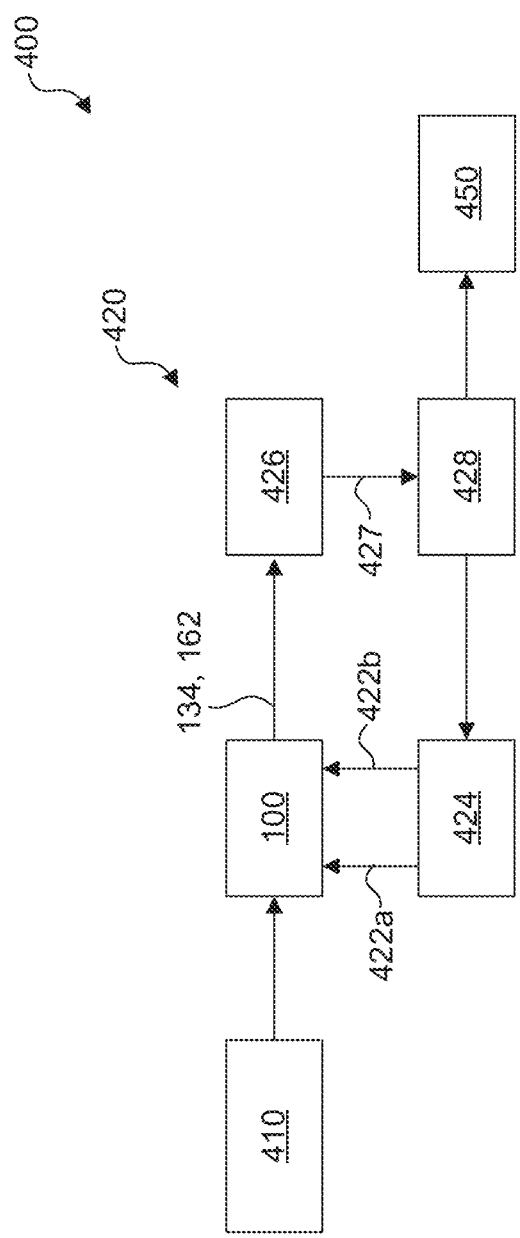

FIGS. 4A-4C show exemplary implementations of atomic PLL system 400, for example, automatic frequency and/or output level control, a PLL, and a Costas loop, respectively.

Figure 5A:
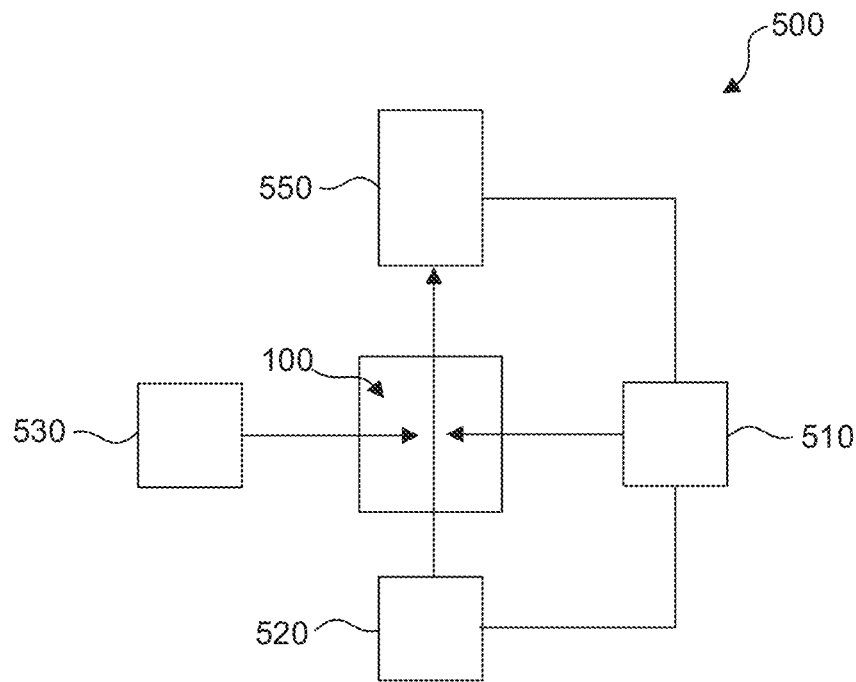
FIGS. 5A and 5B are schematic illustrations of a quantum-state-space interferometer, according to exemplary embodiments.
Figure 5B:
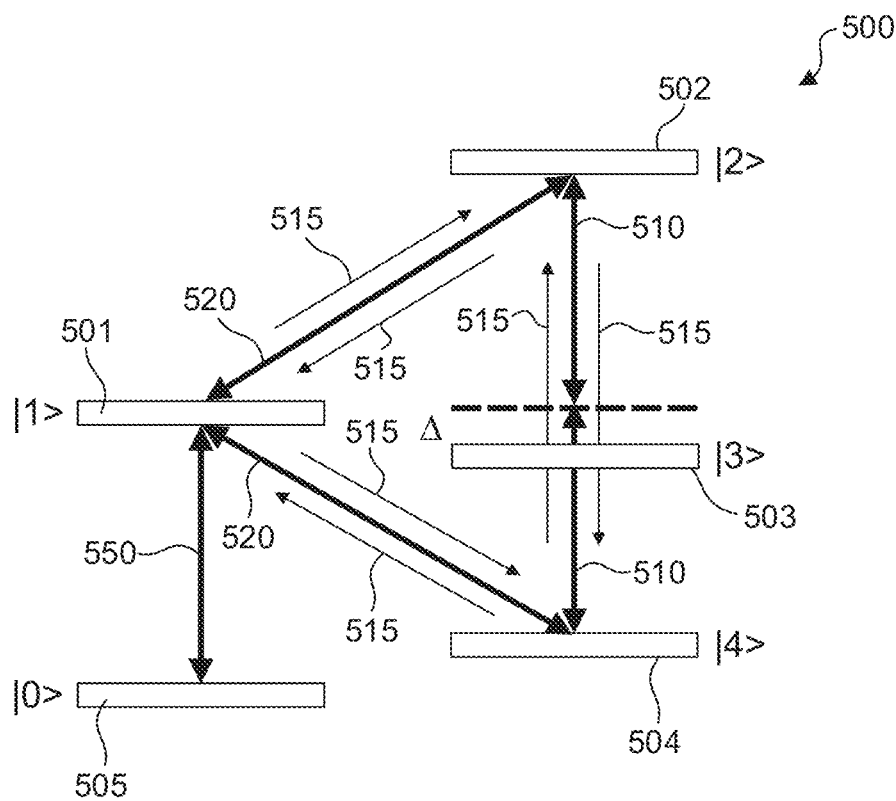
Figure 5C:
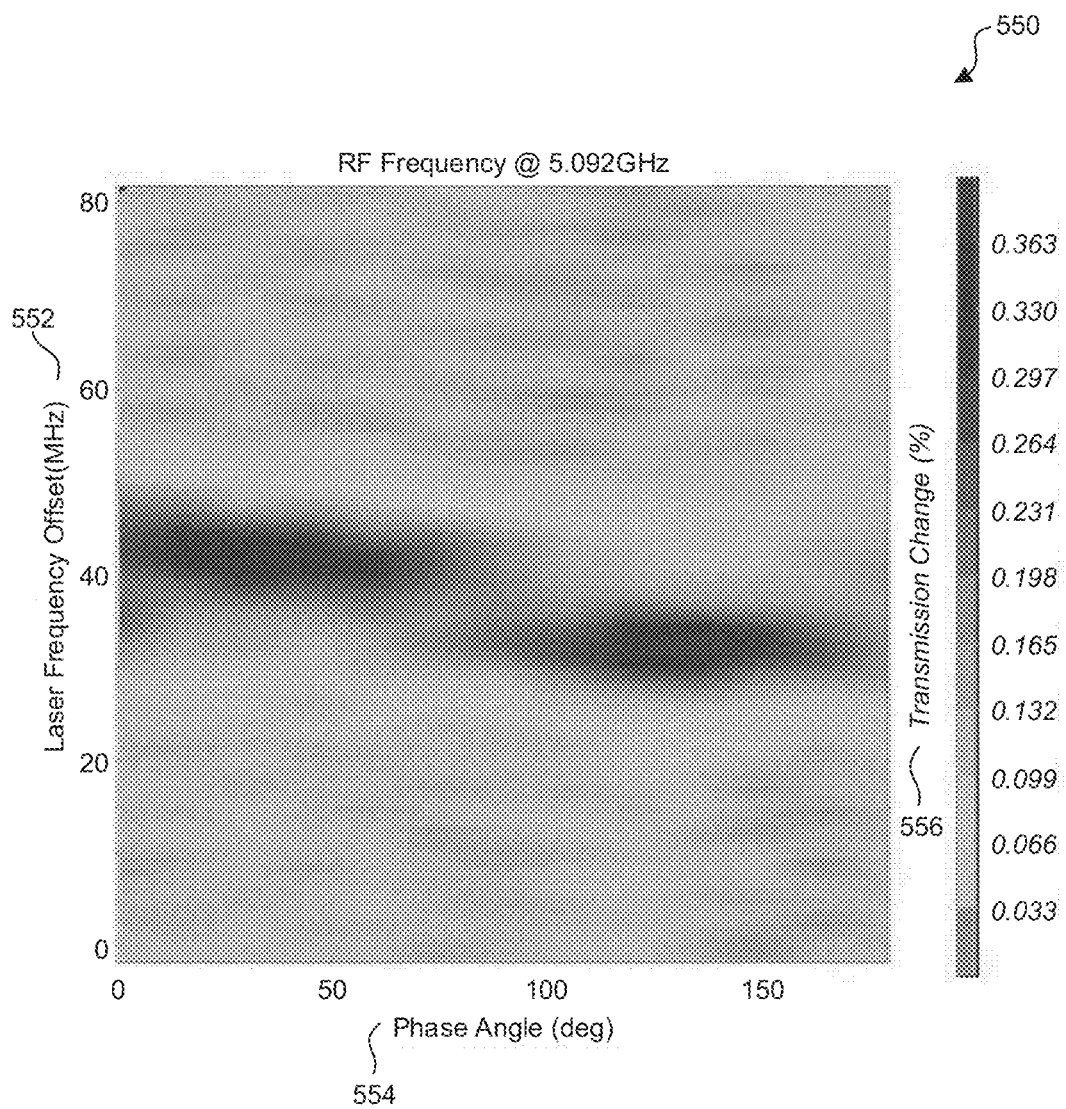
FIG. 5C is a plot of an optical readout of the quantum-state-space interferometer shown in FIGS. 5A and 5B, according to an exemplary embodiment.

FIGS. 5A-5C show exemplary implementations of quantum-state-space interferometer 500, for example, quantum-state-space optical RF interferometry and optical detection and measurement of RF phase using Rydberg EIT in atomic receiver 100 with a cesium atomic vapor.

FIGS. 6A-6D show exemplary implementations of atomic transducer 600 (e.g., RF-power/voltage transducer and sensor).

Figure 7:
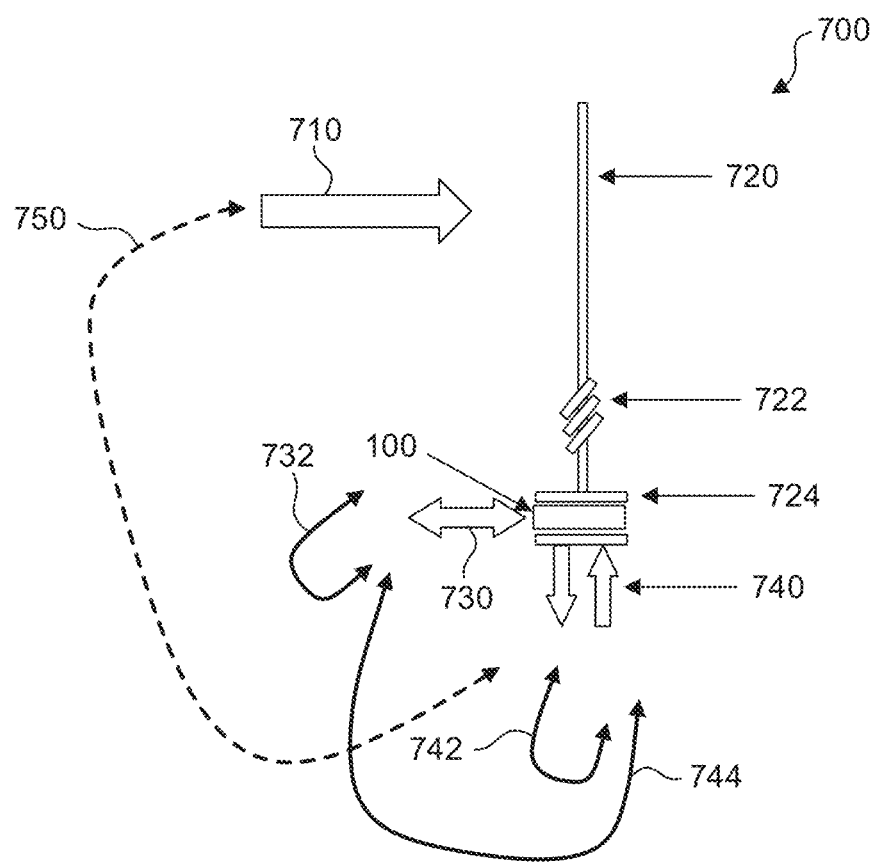
FIG. 7 is a schematic illustration of an atomic receiver with antenna, according to an exemplary embodiment.

FIG. 7 shows an exemplary implementation of atomic receiver with antenna 700 (e.g., RF receiver) with closed-loop controls.

Figure 8:
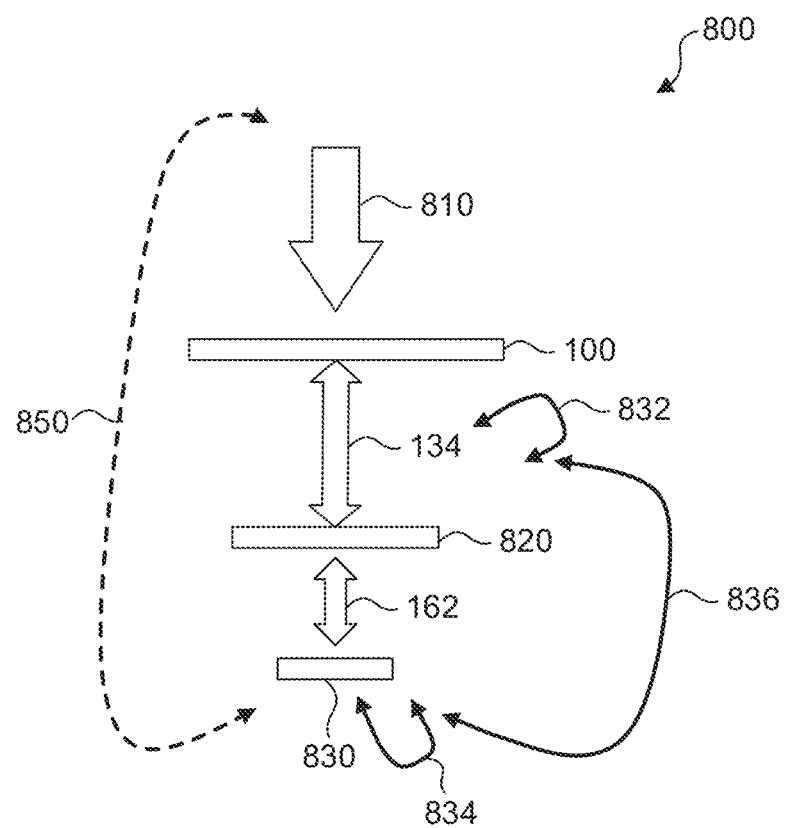
FIG. 8 is a schematic illustration of an atomic imager, according to an exemplary embodiment.

FIG. 8 shows an exemplary implementation of atomic imager 800 (e.g., RF imager/detector) with closed-loop controls.

Figure 9A:
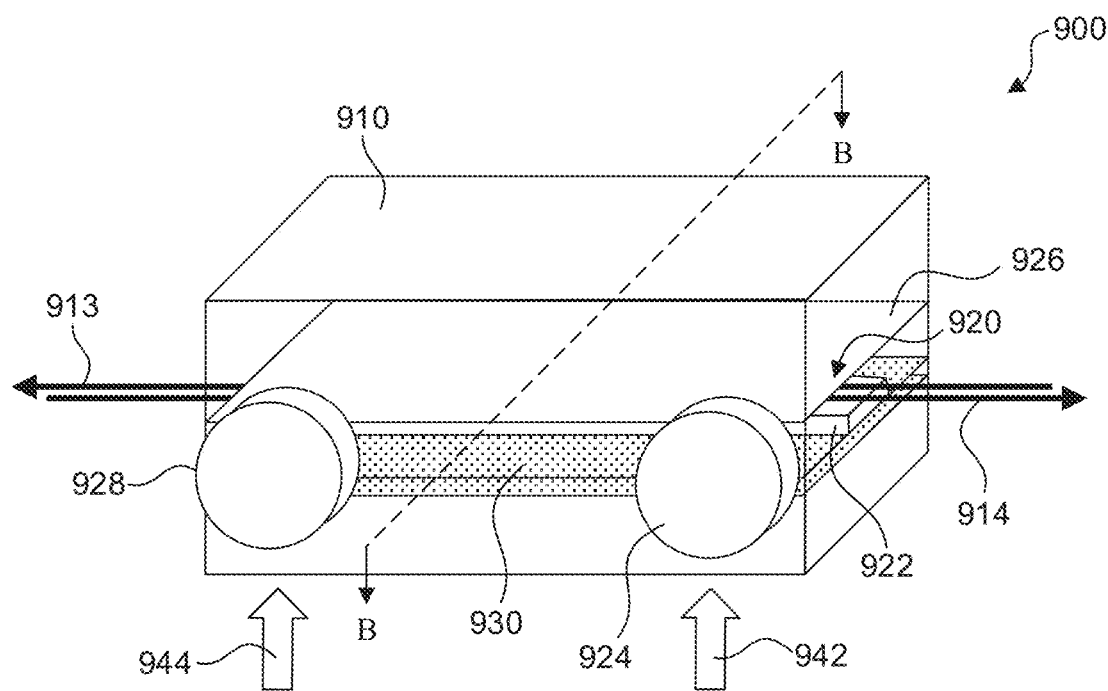
FIGS. 9A and 9B are schematic illustrations of an atomic hybrid detector with stripline, according to exemplary embodiments.
Figure 9B:
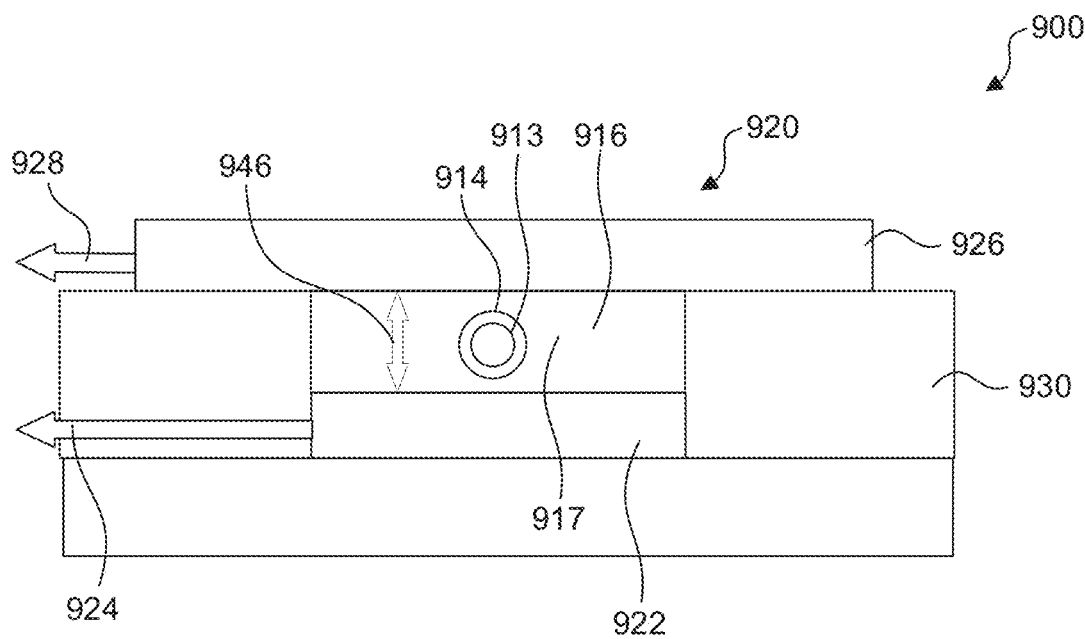

FIGS. 9A and 9B show exemplary implementations of atomic hybrid detector with stripline 900 incorporating symmetric stripline 920 suitable for field compression and increased RF detection sensitivity with atom-based control-loop(s) for implementation of, for example, PLLs, AALCs, multi-field conditioning, etc.

Figure 10A:
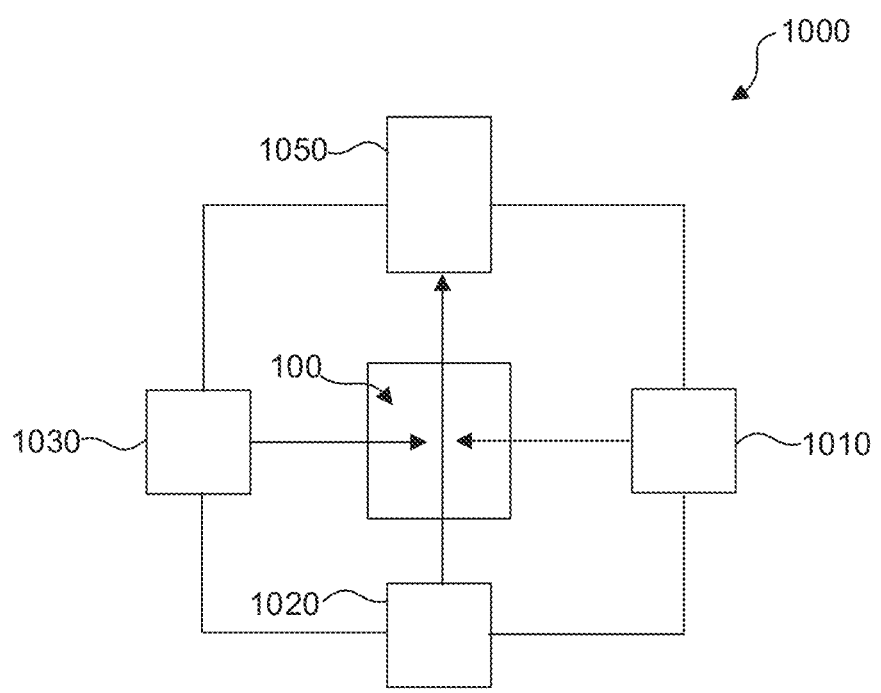
FIG. 10A is a schematic illustration of a multi-field conditioning system, according to an exemplary embodiment.
Figure 10B:
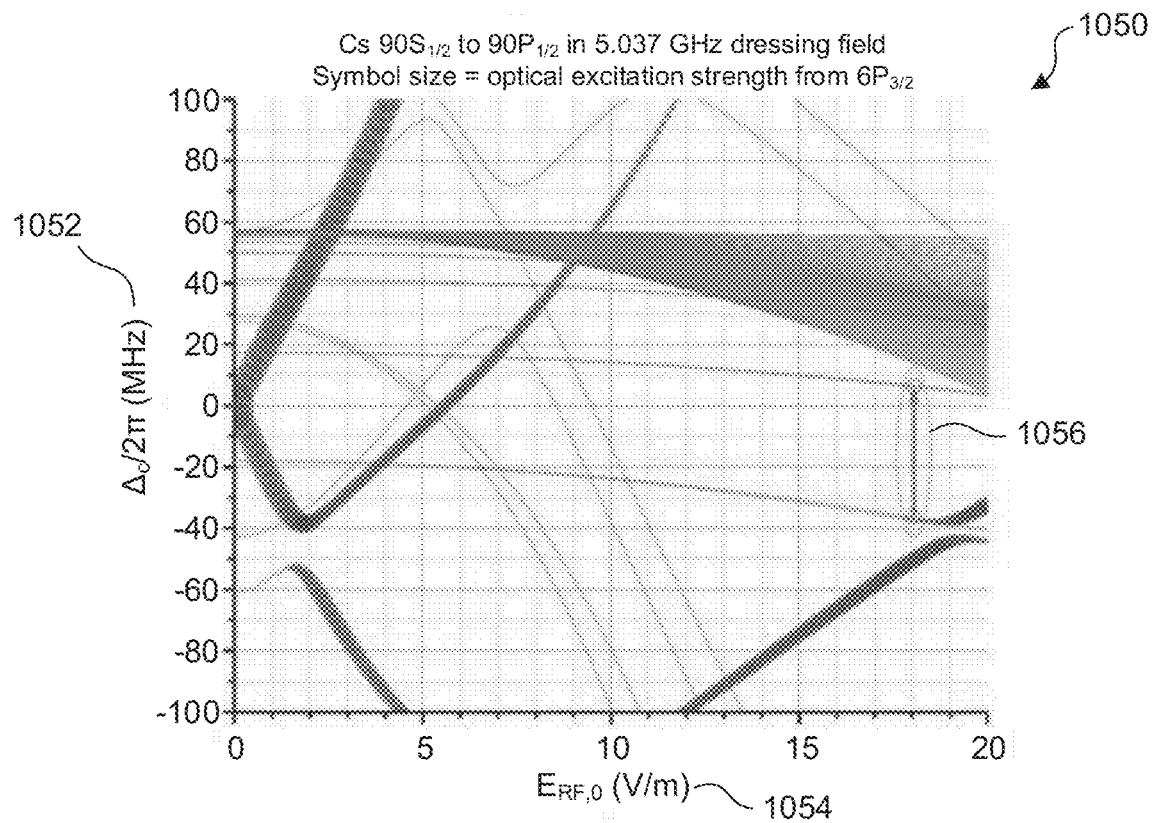
FIG. 10B is a plot of optical excitation strength from an optical readout of the multi-field conditioning system shown in FIG. 10A, according to an exemplary embodiment.
Figure 10C:
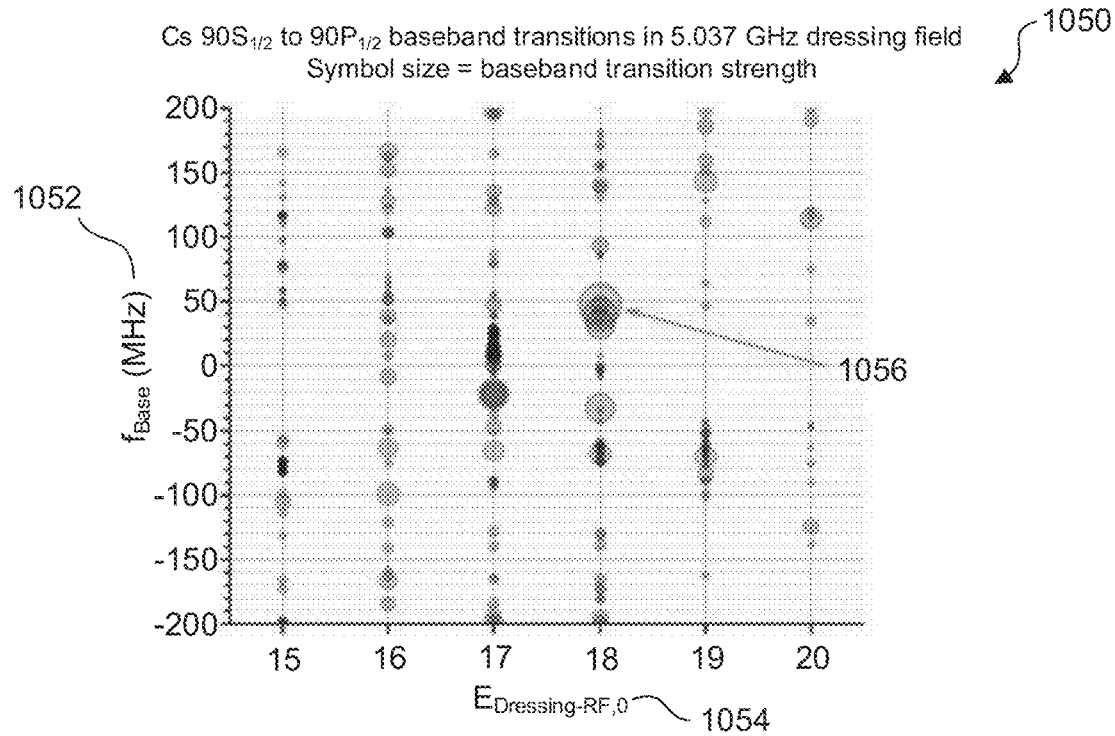
FIG. 10C is a plot of baseband transition strength from an optical readout of the multi-field conditioning system shown in FIG. 10A, according to an exemplary embodiment.

FIGS. 10A-10C show exemplary implementations of multi-field conditioning system 1000 for multi-field engineering/conditioning of Rydberg levels for atom-based RF signal reception for high-sensitivity long-wavelength (e.g., less than 3 cm) RF reception and reception/imaging of complex RF signal transmissions.

FIGS. 11A-11F show exemplary implementations of Rydberg field probe 1100 for RF waveform imaging and detection with atom-based closed-loop control.

Figure 12:
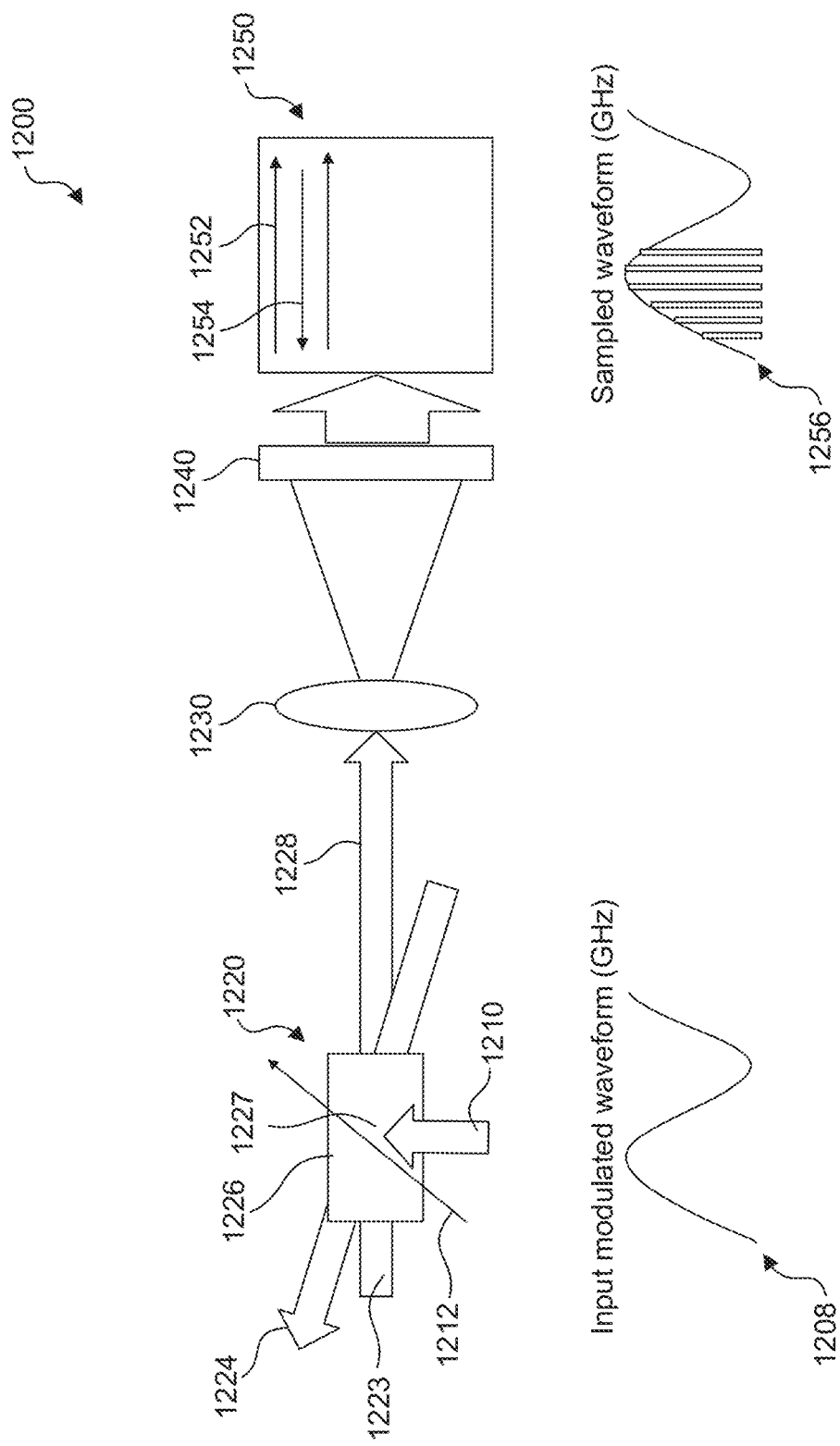
FIG. 12 is a schematic illustration of an atomic waveform sampler, according to an exemplary embodiment.

FIG. 12 shows an exemplary implementation of atomic waveform sampler 1200 for RF waveform sampling or spectrum analyzing based on atoms using spatial and/or temporal multiplexing of atomic responses to electromagnetic fields.

Figure 13A:
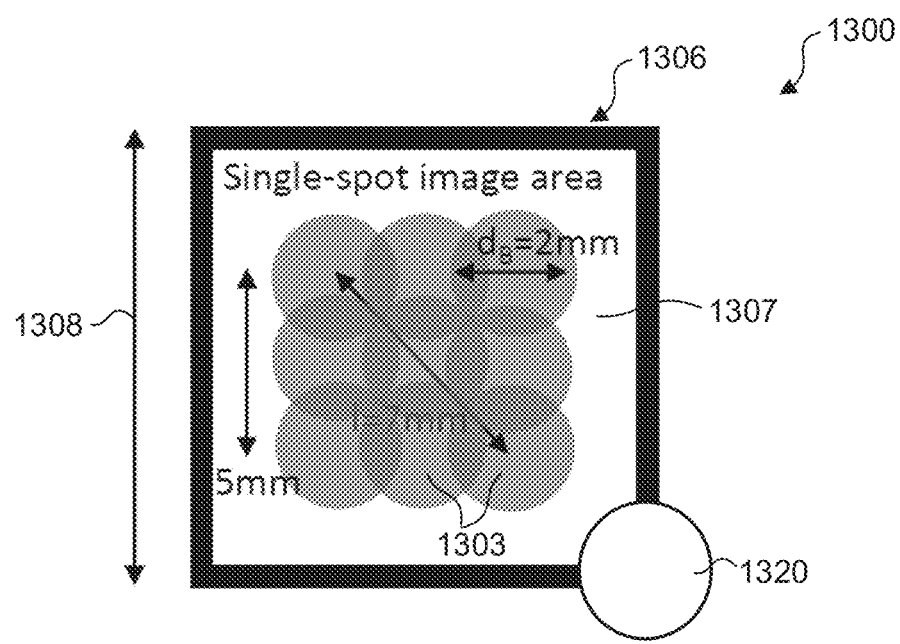
FIGS. 13A and 13B are schematic illustrations of an atomic raster imager, according to exemplary embodiments.
Figure 13B:
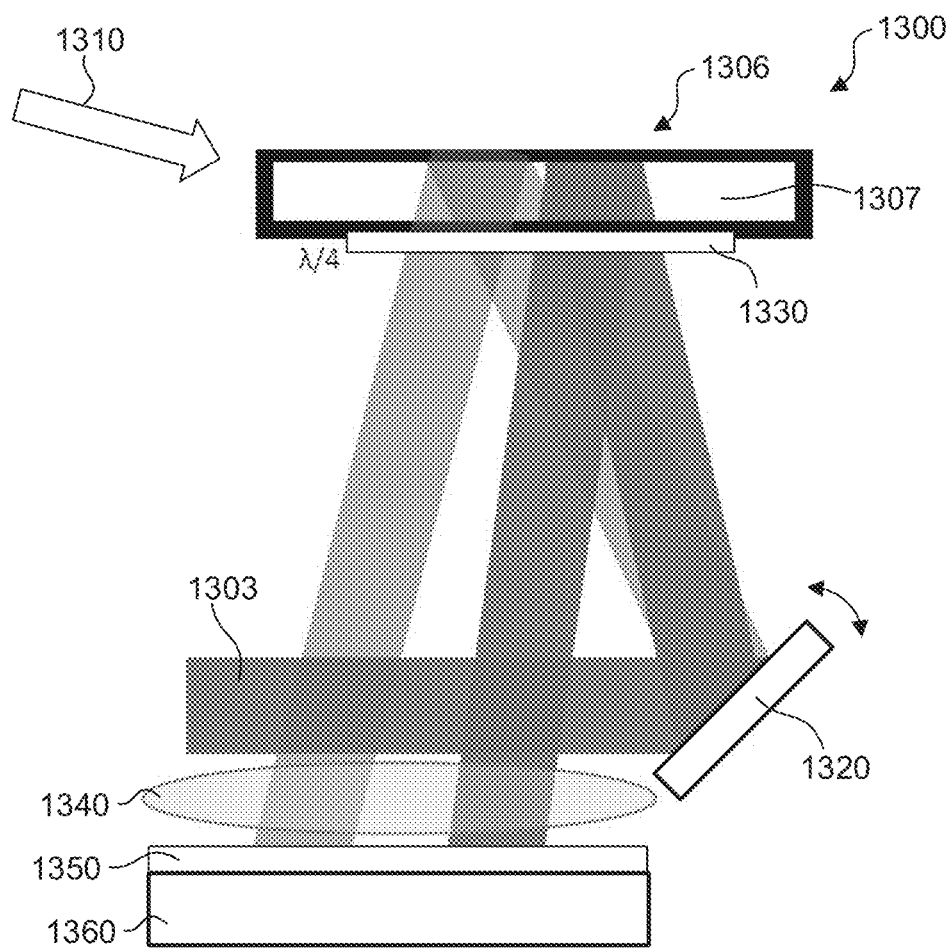

FIGS. 13A and 13B show an exemplary implementation of atomic raster imager 1300 for spatially scanning (e.g., rastering) an O-EM beam to selectively read out a phase and/or an amplitude of one or more input RF-EM fields from an atomic cell (e.g., from Rydberg atoms located in 1D or 2D). FIG. 13A shows a partial top view of atomic raster imager 1300 and FIG. 13B shows a cross-sectional view of atomic raster imager 1300.

Exemplary Atomic Receiver

FIG. 1 illustrates atomic receiver 100, according to various exemplary embodiments. Atomic receiver 100 can be configured to detect an incident EM field (e.g., RF/microwave field) and output a readout signal based on an interaction of the incident EM field with one or more atoms (e.g., Rydberg atom) in atomic receiver 100. As shown in FIG. 1, atomic receiver 100 can include entrance port 102, probe laser beam 103, coupler laser beam 104, atomic cell 106, active measurement volume 110, fiber 120, lens 122, dichroic mirror 130, beam block 132, signal beam 134, quarter-wave plate 140, polarizing optic 150, and/or detector (e.g., photodiode) 160. In some embodiments, atomic cell 106 can enclose atoms 107 (e.g., Rydberg atoms) in vapor cell volume 108 as described in U.S. application Ser. No. 16/222,384, filed Dec. 17, 2018 (now issued as U.S. Pat. No. 10,823,775), and International Appl. No. PCT/US2018/066006, filed Dec. 17, 2018, which are hereby incorporated herein in their entireties by reference.

In accordance with certain embodiments of the present disclosure, a single-sided optically-coupled RF sensing element (otherwise referred to herein as "atomic receiver," "cell," "vapor cell," and "atomic vapor cell") is provided, and designated generally by numeral 100 and is described with reference to FIG. 1. The pen-like linear sensor design depicted in FIG. 1 affords the use of a single entrance port 102 to fiber-optically couple the probe laser beam 103 and coupler laser beam 104 into and out of vapor cell volume 108 contained within atomic cell 106. Vapor cell volume 108 contains an atomic or molecular gas (e.g., cesium (Cs), rubidium (Rb), etc.). A region of gas within vapor cell volume 108 is probed by probe laser beam 103 and coupler laser beam. In some embodiments, atoms 107 can include one or more highly-excited Rydberg atoms. In some embodiments, probe laser beam 103 can have an optical wavelength (k) of about 780 nm and coupler laser beam 104 can have an optical wavelength (k) of about 480 nm.

With atomic receiver 100 entering active measurement volume 110 from a single side, the configuration of FIG. 1 leaves active measurement volume 110 unobstructed with respect to incident EM field 112 (e.g., RF/microwave field) from all sides except one. In some embodiments, as shown in FIG. 1, linearly-polarized probe and coupler laser beams 103, 104 are sent through a single polarization-maintaining fiber 120 and collimated by lens 122 to a full-width-at-half-maximum (FWHM) of approximately 200 m in atomic cell 106. Probe and coupler laser beams 103, 104 co-propagate through atomic cell 106, where probe laser beam 103 is then selectively retro-reflected back through atomic cell 106 by dichroic mirror 130 (e.g., short-pass dichroic mirror coating) while coupler laser beam 104 passes through and is blocked by beam block 132 (e.g., thin dielectric absorber beam block).

Signal beam 134 (e.g., retro-reflected probe beam) retraces its path, overlapping the outgoing coupler laser beam 104, and is re-coupled back into fiber 120 by lens 122. In some embodiments, quarter-wave plate 140 can be positioned before the retro-reflection (e.g., between lens 122 and atomic cell 106 in FIG. 1) to ensure that the linearly polarized in-going probe laser beam 103 is rotated by 90 degrees on signal beam 134 (e.g., retro-reflected out-going beam) so that signal beam 134 can be selectively split off with a polarization-selective element 150 (e.g., a polarizing beamsplitter) for readout (e.g., optical readout, electrical readout, etc.) after the polarization-maintaining fiber 120. For example, atomic receiver 100 can output signal beam 134 as an optical input signal (e.g., optical readout) to another device and/or system. For example, as shown in FIG. 1, detector (e.g., photodiode) 160 can receive signal beam 134 and output an electrical signal 162 (e.g., electrical readout) based on the received optical signal (e.g., signal beam 134).

Atomic receiver 100 as depicted in FIG. 1 can provide several advantages in comparison to other implementations of vapor cell EIT. First, the linear single-sided design allows for small, low-profile probe tips and sensor elements that have a small dielectric footprint. The design also eliminates the need for any optical elements to redirect the optical beams out of the fiber and into the cell. Utilizing a single lens for input and output coupling of larger beam diameters as compared to other implementations of vapor cell EIT can improve measurement precision and sensitivity by affording less interaction-time broadening and higher achievable spectroscopic resolution, as well as improved operational stability by reducing the device sensitivity to misalignment by back-coupling the readout probe beam into the same fiber.

Exemplary Atom-Based Closed-Loop Control Systems and Methods

FIG. 2 illustrates atom-based closed-loop control system 200, according to various exemplary embodiments. Atom-based closed-loop control system 200 can be configured to automatically regulate one or more process variables 222 to a desired state(s) or set point(s) based on a response of atoms 107 of atomic receiver 100. Atom-based closed-loop control system 200 can be further configured to produce output signal 250, based on the response of atoms 107 of atomic receiver 100, that contains information about input signal 210 (e.g., EM/RF field).

As shown in FIG. 2, atom-based closed-loop control system 200 can include input signal 210 (e.g., EM/RF field), atomic receiver 100 with optical readout 134 and/or electrical readout 162, control signal 220, process variable 222, and/or output signal 250 (e.g., EM/RF field). In some embodiments, process variable 222 can include frequency, amplitude, polarization, phase, power, and/or some combination thereof. For example, process variable 222 can include a laser process variable (e.g., probe laser beam 103, coupler laser beam 104, etc.), an EM field (e.g., RF) process variable (e.g., input signal 210, etc.), and/or some combination thereof.

In some embodiments, atom-based closed-loop control system 200 can include RF input signal 210 and RF output signal 250. For example, atom-based closed-loop control system 200 can automatically regulate one or more process variables 222 to a desired state(s) or set point(s) based on a response of atoms 107 of atomic receiver 100 to realize RF output signal 250 rendering information about RF input signal 210.

In atomic receivers (e.g., atomic receiver 100), there exist RF carrier amplitude, frequency, and phase domains that are specific to the spectroscopic response of the atom (e.g., atoms 107) to the incident wave (e.g., RF input signal 210) and that correspond to different linearity ranges, laser, and/or hardware operating parameters. In an exemplary embodiment, atom-based closed-loop control system 200 can employ a spectroscopic atomic response such that, for a weak carrier wave (e.g., RF input signal 210), atom-based closed-loop control system 200 can operate laser frequency (e.g., probe laser beam 103) of atomic receiver 100 at an operating point where the baseband sensitivity is maximal. For example, as the carrier field increases, atom-based closed-loop control system 200 can automatically adjust the operating point of laser frequency (e.g., probe laser beam 103) of atomic receiver 100, via control signal 220 and process variable 222 feedback loop, to where the same baseband sensitivity remains maximal. In such a way, atom-based closed-loop control system 200 can increase baseband bandwidth, sensitivity, and/or dynamic range.

In some embodiments, other parameters of atomic receiver 100 can also be adjusted by atom-based closed-loop control system 200 to retrieve and control baseband signal levels for RF carrier field amplitude-, frequency-, and/or phase-dependent spectral responses. For example, atom-based closed-loop control system 200 can adjust laser center frequency, laser modulation, RF modulation, AM, FM, PM, power, atomic gas temperature and/or density, amplifier gain in the electronic baseband processing components, and/or some combination thereof.

In some embodiments, atom-based closed-loop control system 200 can provide control of parameters of atomic receiver 100 for simultaneous signal retrieval on one or multiple carrier waves. In some embodiments, atom-based closed-loop control system 200 can control laser parameter (e.g., amplitude, frequency, phase) modulation, shifting, switching, spatial multiplexing and/or frequency multiplexing (e.g., to access different atoms or atomic states in multi-channel signal receiving operations), and/or some combination thereof.

In some embodiments, atomic receiver 100 can include an aerogel atomic vapor cell for atomic electromagnetic field sensing applications. For example, atomic cell 106 of atomic receiver 100 can incorporate atoms 107 (e.g., atomic gas or vapor) within an aerogel to provide storage of atoms 107 in an optically transparent medium. In some embodiments, the aerogel of atomic cell 106 can be configured for Rydberg spectroscopy with minimal variation of the permittivity of the material at RF wavelengths across the structure. In some embodiments, the aerogel of atomic cell 106 can be configured to provide structural stability for embedded applications.

Exemplary Atomic Automatic Level Control (AALC) Systems and Methods

FIGS. 3A-3C illustrate AALC system 300, according to an exemplary embodiment. AALC system 300 can be configured to provide atom-based device operation and automatic level control in atomic receiver 100. AALC system 300 can be further configured to adjust baseband signal 323 and automatically adjust laser parameter 332 (e.g., frequency and/or power) for automatic level control in AM baseband signal reception. In some embodiments, AALC system 300 can include an atomic receiver as described in "An atomic receiver for AM and FM radio communication," David A. Anderson et al., arXiv:1808.08589v1, pages 1-6, published Aug. 26, 2018 (see Appendix L), which is hereby incorporated herein in its entirety by reference. In some embodiments, AALC system 300 can be similar to atom-based closed-loop control system 200 shown in FIG. 2.

As shown in FIG. 3A, AALC system 300 can include input signal 310 (e.g., EM/RF field), atomic receiver 100 with optical readout 134 and/or electrical readout 162, control signal 320, laser controller 330, laser process variable 332 (e.g., frequency and/or power), and/or output signal 350 (e.g., EM/RF field). In some embodiments, laser controller 330 can receive control signal 320 and adjust one or more laser process variables 332, for example, laser frequency and laser power (e.g., probe laser beam 103, coupler laser beam 104, etc.). In some embodiments, control signal 320 can be from the response of atoms 107 of atomic receiver 100 to input signal 310. For example, laser frequency 332 can be adjusted by laser controller 330 for automatic level control in AM baseband signal reception using atomic receiver 100.

As shown in FIG. 3B, control signal 320 can include high-pass filter 321, low-pass filter 322, baseband signal 323, carrier signal 324, amplifier 325 (e.g., gain), linearizer 326 (e.g., increase efficiency and/or power), and/or linearized baseband signal 327, 328. In some embodiments, linearizer 326 can send linearized baseband signal 327 to amplifier 325 and linearized baseband signal 328 to laser controller 330.

AALC system 300 can accept electrical readout 162 from signal beam 134 of atomic receiver 100 (e.g., via detector (e.g., photodiode) 160). In some embodiments, electrical signal 162 can be obtained directly from detector (e.g., photodiode) 160 of atomic receiver 100 or after additional signal pre-amplification or conditioning. AALC system 300 can split electrical readout 162 into high-pass (AC) filter 321 and low-pass (DC) filter 322 to isolate baseband signal 323 (AC) and carrier signal 324 (DC) components, respectively. In some embodiments, electrical readout 162 (e.g., optical input signal) can be from signal beam 134 of atomic receiver 100, as illustrated in FIG. 3C, for a fixed laser operating point 332, for example, at $\Delta_{510}=0$ MHz (e.g., laser detuning $\Delta_{510}$ of cesium (Cs) $47S_{1/2}$ to $47P_{1/2}$ resonance, 37.4 GHz). For example, electrical readout 162 can be filtered into separate signal channels, baseband signal 323 and carrier signal 324, by high-pass filter 321 and low-pass filter 322, respectively.

In some embodiments, carrier signal 324 can be sent through linearizer 326 to convert the non-linear carrier signal 324 across different carrier strength domains of the atomic response into amplifier 325 for regulation of baseband signal 323 at the output amplification stage (e.g., gain regulation). For example, linearizer 326 can receive carrier signal 324 and look up a carrier-dependent baseband gain (e.g., change in carrier signal 358) that can yield an increased amplifier performance (e.g., linearized baseband signal 327) in baseband signal 323, which can effect automatic level control (ALC).

As shown in FIG. 3C, electrical readout 162 can include baseband signal 323, carrier signal 324, laser operating point 332, measured optical signal 352, laser detuning 354, Rydberg spectroscopic line 356, and/or change in carrier signal 358. Electrical readout 162 shows optical signal 352 (e.g., amplitude) versus laser detuning 354 centered on a Cs $47S_{1/2}$ Rydberg EIT line in atomic receiver 100. Three outputs 356, 324, 323 versus the frequency offset 354 (e.g., laser detuning) of one of the atomic-probe lasers 103, 104 are shown: Rydberg spectroscopic line without RF (black), labeled 356; Rydberg spectroscopic line with an unmodulated 37.4 GHz RF carrier at a fixed field strength resonant with the Cs $47S_{1/2}$ to $47P_{1/2}$ transition 232 (blue), labeled 324; and Rydberg spectroscopic line with the carrier amplitude modulated (AM) at baseband frequency of 1 kHz at a modulation depth of +/−25% 222 (red), labeled 323. The black dot denotes a laser-frequency operating point 332. The change in carrier signal 358 at the center laser-frequency point 332 due to input signal 310 (e.g., a carrier RF signal) with, for example, an electric field of 5.9 V/m is also indicated.

In an exemplary embodiment, AALC system 300 can be used for AM audio receiving, for example, on a 37.4 GHz carrier using atomic receiver 100 operating on a cesium (Cs) $47S_{1/2}$ to $47P_{1/2}$ Rydberg transition. For example, as shown in FIG. 3C, electrical readout 162 can be from the optical readout (e.g., signal beam) 134 of atomic receiver 100 (e.g., a room-temperature Cs atomic vapor-cell receiver) operating at a fixed laser power as a function of laser frequency (e.g., via laser controller 330) for a specified 37.4 GHz RF carrier field and AM transmitted 1 kHz baseband signal.

Exemplary Atomic Phase-Locked Loop (PLL) Systems and Methods

FIGS. 4A-4C illustrate atomic PLL system 400, according to various exemplary embodiments. Atomic PLL system 400 can be configured to provide automatic frequency and/or output level control to oscillator 420. Atomic PLL system 400 can be further configured to form a phase-locked loop (PLL) for synchronous FM and/or PM signal reception. Atomic PLL system 400 can be further configured to form a Costas loop for carrier frequency and phase recovery.

As shown in FIG. 4A, atomic PLL system 400 can include input signal 410 (e.g., EM/RF field), atomic receiver 100 with optical readout 134 and/or electrical readout 162, oscillator 420, oscillator variable 422, and/or output signal 450 (e.g., voltage signal). In some embodiments, oscillator 420 can be a voltage-controlled oscillator (VCO). In some embodiments, oscillator variable 422 can include frequency, amplitude, voltage, phase, power, and/or some combination thereof. For example, oscillator variable 422 can include a frequency, an amplitude, a voltage, and/or some combination thereof.

In some embodiments, atomic PLL system 400 can include RF input signal 410 and voltage output signal 450. For example, atomic PLL system 400 can automatically regulate one or more oscillator variables 422 to a desired state(s) or set point(s) based on a derived response of atoms 107 of atomic receiver 100 to realize voltage output signal 450 rendering information about RF input signal 410.

As shown in FIG. 4B, oscillator 420 can include reference wave 422, VCO 424, amplifier 426, difference signal 427, and/or filter 428. In some embodiments, oscillator 420 can be configured to form a PLL for synchronous frequency-modulated or phase-modulated signal reception. Input signal 410 can be defined as $S(t)=E_s \cos[\omega_s t+\theta_s(t)]$ with $d/dt\theta_s(t)=2\pi k_s m_s(t)$, where $m_s(t)$=phase change/modulation. Reference wave 422 can be defined as $r(t)=E_r \cos[\theta_r t+\theta_r(t)]$ with $d/dt\theta_r(t)=2\pi k_r v_r(t)$, where $v_r(t)=A_G A_{in} \cos[(\Phi(t)]$. Input signal 410 and reference wave 422 can interact with atoms 107 of atomic receiver 100, which can be defined as $a(t)=S(t)+r(t)=E\sim(E_s E_r)^{1/2}$, which is the parametric gain of atoms 107 (e.g., amplified using a parametric nonlinearity and a pump wave). For example, atoms 107 under the influence of input signal 410 and reference wave 422 can operate as an optical parametric oscillator (e.g., harmonic oscillator whose parameters oscillate in time)

Optical readout 134 (e.g., a(t)) from atoms 107 contains the difference phase/frequency of S(t) and r(t), defined as v(t). Optical readout 134 can be converted to electrical readout 162 by photodetector 160 of atomic receiver 100. Electrical readout 162 can be defined as $e(t)=A_{in}\cos[\Phi(t)]$ with $A_{in}=A(E_s E_r)^{1/2}+Ai$ and $(\Phi t)=\theta_s(t)-\theta_r(t)-\pi/2$, where A=electric field (E) to voltage (V) factor and Ai=signal-to-noise ratio (SNR) from other atom readout methods. Amplifier 426 can be defined as $A_G$, which is the gain. Difference signal 427 can be defined as $v(t)=A_G A_{in} \cos[\Phi(t)]$. Difference signal 427 can be sent to filter 428 (e.g., a loop filter, an adaptive loop filter, a bandpass filter, a notch filter, etc.), which processes difference signal 427 for regulation of the phase (or frequency) of voltage-controlled oscillator (VCO) 424. VCO 424 in turn controls reference wave 422 phase (or frequency) at atoms 107, thereby closing the loop. The closed loop out locked output signal 450 can be defined as $V_{out}(t)=(K/2\pi k_r)\cdot\cos[(D(t)]=(k_s/k_r)\cdot m_s(t)$, where $K=2\pi k_r A_G A_{in}$ (e.g., loop gain).

In some embodiments, filter 428 can provide various outputs, for example, channel-selectable band-passed AC outputs for analog or digitized VCO-regulation signals, baseband modulation signals (e.g. AFSK, FSK, PSK, etc.) contained in input signal 410, S(t), lower-frequency AC output for regulation of laser frequency to track the atomic spectral line and/or maintain/level baseband readout for variations in S(t) and r(t), other peripheral atom-based closed-loops, and/or some combination thereof.

In some embodiments, VCO 424 can have an adjustable output level and can regulate reference wave 422 amplitude ($E_r$) for parametric amplification of input signal 410, S(t), in a closed-control loop. This parametric amplification (e.g., amplified using a parametric nonlinearity and a pump wave) can be regulated, for example, by the signal strength of electrical readout 162, e(t), the optical laser frequency/power, and/or any combination of these and other regulation signals.

In some embodiments, atomic PLL system 400 can include variations and adaptations, for example, incorporating analog and/or digital filtering and/or analog and/or digital baseband signal processing at the location of atoms 107 by regulating process variables, for example, the amplitude, polarization, frequency, and/or phase of the laser (e.g., probe laser beam 103) and/or additional external DC or AC electromagnetic fields (e.g., input signal 410) interacting with atoms 107.

In some embodiments, a (square law) photodetector (e.g., detector (e.g., photodiode) 160) can convert the optical power change (e.g., proportional to $E^2$ at atoms 107) into electrical readout 162 (e.g., electronic error signal e(t)). Thus, the photodetector output (e.g., $e(t)\sim E^2$ and $A_{in}$) can be modified accordingly. In some embodiments, an atomic response to an S(t) and r(t) with, for example, a 1 kHz frequency difference can be subject to VCO 424 control and can entice an interferometric response from atoms 107. In some embodiments, as shown in FIG. 4C, VCO 424 can include reference wave 422a and second reference wave 422b.

As shown in FIG. 4C, oscillator 420 can include reference wave 422a, second reference wave 422b, VCO 424, amplifier 426, difference signal 427, and/or filter 428. In some embodiments, oscillator 420 can be configured to form a Costas loop for carrier frequency and phase recovery. In some embodiments, atomic PLL system 400 can provide injection locking in atoms 107 (e.g., second oscillator can capture first oscillator so both have identical frequencies). For example, input signal 410 and reference wave 422a can undergo injection locking in atoms 107 due to strong coupling and similar reference frequencies.

In some embodiments, input signal 410 can be demodulated by atoms 107 (e.g., mixed-down and low-pass filtered) with both in-phase (I) and quadrature/out-of-phase (Q) waves r(t) and $r_2(t)$, respectively, generated by VCO 424. Optical readout 134 from atoms 107 containing the I/Q demodulated signals can be detected by photodetector 160. Photodetector 160 combines the signals to generate the control signal for the VCO 424 input signal, closing the loop.

In some embodiments, atomic PLL system 400 can be similar to atomic PLL system 400 shown in FIG. 4B with the addition of second reference wave 422b. For example, input signal 410 can be defined as $S(t)=E_s \cos[\omega_s t+\theta_s(t)]$ with $d/dt\theta_s(t)=2\pi k_s m_s(t)$, where $m_s(t)$=phase change/modulation, reference wave 422a can be defined as $r(t)=E_r \cos[\omega_r t+\theta_r(t)]$ with $d/dt\theta_r(t)=2\pi k_r v_r(t)$, where $v_r(t)=A_G A_{in} \cos[\Phi(t)]$, and second reference wave 422b can be defined as $r_2(t)=E_{r2} \sin[\omega_r t+\theta_r(t)]$. Input signal 410, reference wave 422a, and second reference wave 422b can interact with atoms 107 of atomic receiver 100, which can be defined as $a_r(t)=S(t)+r(t)+r_2(t)=E \sim (E_s(E_r E_{r2})^{1/2})^{1/2}$, which is the parametric gain of atoms 107. Optical readout 134 (e.g., $a_r(t)$) from atoms 107 contains the difference phase/frequency of S(t), r(t), and $r_2(t)$, defined as $v_r(t)$. Optical readout 134 can be converted to electrical readout 162 by photodetector 160 of atomic receiver 100, and electrical readout 162 can be defined as $e_r(t)=A_{in} \cos[\Phi(t)]\sin[\Phi(t)]=(\frac{1}{2})A_{in}^2 \sin[2\Phi(t)]$ with $A_{in}=A \cdot (E_s(E_r E_{r2})^{1/2})^{1/2}+Ai$ and $\Phi(t)=\theta_s(t)-\theta_r(t)-\pi/2$. Amplifier 426 can be defined as $A_G$, which is the gain. Difference signal 427 can be defined as $v_r(t)=(\frac{1}{2})A_G A_{in}^2 \sin[2\Phi(t)]$. Difference signal 427 can be sent to filter 428 (e.g., equivalent to a specialized loop filter), which processes difference signal 427 for regulation of the phase (or frequency) of VCO 424. VCO 424 in turn controls reference wave 422a and second reference wave 422b phase (or frequency) at atoms 107, thereby closing the loop.

In some embodiments, employing the principle of atomic PLL system 400 described above, injection locking (e.g., second oscillator capturing first oscillator so both have identical frequencies) of two signals (e.g., S(t), r(t), $r_2(t)$) mediated by the atomic response in a closed-loop follows naturally. For example, injection locking and/or injection pulling can occur between the two signals S(t) and r(t) such that atomic PLL system 400 locks and/or pulls the frequency of r(t) to match that of S(t) by means of the atomic response. As an injection lock, pulling and pushing of the S(t) and r(t) signal frequencies result due to cross-coupling of the two oscillators by atoms 107 and the parameters of filter 428 in atomic PLL system 400.

Exemplary Quantum-State-Space Interferometer

FIGS. 5A-5C illustrate quantum-state-space interferometer 500, according to various exemplary embodiments. Quantum-state-space interferometer 500 can be configured to provide radio frequency (DC to THz) interferometry in the optical and/or quantum domains. Quantum-state-space interferometer 500 can be further configured to provide optical RF phase sensing and measurement with Rydberg atom vapors. In some embodiments, quantum-state-space interferometer 500 can use a fiduciary reference phase (e.g., by a second electromagnetic wave, for example, RF wave or optical beam with RF phase modulation) and an atomic gas for RF phase detection as described in International Appl. No. PCT/US2018/066006, filed Dec. 17, 2018, which is hereby incorporated herein in its entirety by reference.

As shown in FIG. 5A, quantum-state-space interferometer 500 can include first input signal 510 (e.g., EM/RF field), atomic receiver 100, second input signal 520 (e.g., EM/RF-modulated optical beam), third input signal 530 (e.g., EM/RF field or EM/RF-modulated optical beam), and/or optical readout 550. In some embodiments, quantum-state-space interferometer 500 can utilize an all-optical RF phase sensing: optical RF phase detection can employ a closed, interferometric loop within the internal state space of the atoms. For example, driving fields can be modulated light fields (e.g., second input signal 520) with a reference phase (e.g., predetermined or selected), and an external RF field of interest (e.g., first input signal 510), whose phase and amplitude is to be detected or measured. The closed interferometric loop exhibits quantum interference between two optical excitation pathways (e.g., interferometric pathways of RF phases 515) within the Rydberg state space. The EIT response of the atoms is, therefore, sensitive to signal phase and amplitude, enabling an all-optical readout (e.g., optical readout 550) of RF phase and amplitude.

In some embodiments, second input signal 520 can include an RF wave that is modulated onto an optical phase (e.g., RF modulated probe laser beam 103). In some embodiments, quantum-state-space interferometer 500 can be based on the interaction of first RF wave 510 and second fiduciary RF wave 520 with atoms 107 of atomic receiver 100 to produce optical readout 550 from atoms 107.

In some embodiments, closed-loop control can be implemented between different combinations of atomic receiver 100, optical readout 550, first input signal 510, and/or second input signal 520 for different purposes. For example, an atom-based PLL (e.g., similar to atomic PLL system 400 shown in FIGS. 4A-4C) can be realized by controlling the RF-phase modulation of the optical beam of second input signal 520 with a VCO-driven signal (e.g., reference wave 422 from VCO 424) regulated by a control signal derived from optical readout 550 from atomic receiver 100. For example, as shown in FIG. 5A, RF signal of first input signal 510 can be regulated by optical readout 550 from atomic receiver 100. In some embodiments, RF signal of first input signal 510, RF signal of second input signal 520, and/or other signal fields can regulate and/or synchronize with one another and/or with optical readout 550 providing an output from the loop. For example, as shown in FIG. 5A, quantum-state-space interferometer 500 can include third input signal 530 that can interact with atoms 107 of atomic receiver 100.

As shown in FIG. 5B, quantum-state-space interferometer 500 can utilize first atomic state |1> 501, second atomic state |2> 502, third atomic state |3> 503, fourth atomic state |4> 504, and/or zeroth atomic state |0> 505. Atomic states |2> and |3> 502, 503 and atomic states |3> and |4> 503, 504 are electric-dipole coupled by radio-frequency electromagnetic fields (e.g., first input signal 510), respectively. Atomic states |1> and |2> 501, 502 and atomic states |1> and |4> 501, 504 are coupled by optical electromagnetic fields that are phase-modulated near the radio-frequency (e.g., second input signal 520), respectively. Interferometric pathways of the RF phases 515 closed by the quantum-state-space are formed between atomic states |1> 501, |2> 502, and |4> 504 (e.g., |1> to |2>, |1> to |4>, |2> to |1>, |2> to |4>, |4> to |1>, |4> to |2>). An optical field coupling atomic states |0> to |1>

(e.g., optical readout 134 of atomic receiver 100) can provide optical readout 550 from quantum-state-space interferometer 500.

As shown in FIG. 5C, optical readout 550 can include laser frequency offset 552, phase angle 554, and/or transmission change 556. In some embodiments, as shown in FIG. 5C, quantum-state-space interferometer 500 can employ the optical domain for all-optical detection of RF phase and frequency (e.g. applications in RF domain) and/or optical RF phase and frequency detection (e.g. applications in optical domain). For example, RF reference phase is mediated via modulated laser beams (e.g., second input signal 520), as opposed to via an RF reference wave.

In some embodiments, optical readout 550 can provide optical detection and measurement of the phase of an RF field. For example, as shown in FIG. 5C, a plot shows the optical (EIT) readout 550 from Cs Rydberg atoms in a vapor cell with an external 5 GHz RF signal field applied versus optical laser frequency (vertical axis) and optical RF phase at 5 GHz, generated by electro-optic phase modulation of the optical laser beam (horizontal axis). The plot shows that the optical (EIT) readout 550 at certain fixed frequencies of the EIT laser (e.g., probe laser beam 103) exhibits a strong modulation that reveals the phase of the RF-modulated optical phase relative to the fixed external RF phase. Equivalently, the external RF phase changes can be detected relative to a fixed RF-modulated optical phase.

In some embodiments, quantum-state-space interferometer 500 can utilize the susceptibility of Rydberg atoms to RF electric fields across the electromagnetic spectrum, from DC to THz, to realize new capabilities in RF and atom-based quantum RF field sensors and devices. For example, quantum-state-space interferometer 500 can be configured as an all-optical RF phase detector based on Rydberg atom vapors. In some embodiments, quantum-state-space interferometer 500 can provide RF E-field standards with broadband SI-traceable absolute (atomic) standards for RF electric fields at national metrology institutes. For example, quantum-state-space interferometer 500 can be implemented in commercial RF detection and measurement instrumentation (e.g., near-/far-field mapping, synthetic aperture radar (SAR), communications, phased-array antenna characterization, 5G receivers, phase sensing, heterodyne methods, phase referencing, parametric amplification, etc.).

In some embodiments, quantum-state-space interferometer 500 can employs an effective RF reference via a suitable electro-optic modulation of the laser beams used to read out the Rydberg atoms' response to the field to be measured. For example, the laser fields that are modulated are employed in Rydberg atom RF sensing (e.g., atomic receiver 100), providing an efficient means to use the same optical fields as a carrier for the RF reference to the atoms and removes the need for any an external RF source such as an antenna. In some embodiments, quantum-state-space interferometer 500 can provide a phase-stable, interference-free RF reference wave to the atoms. For example, quantum-state-space interferometer 500 can operate without an antenna.

In some embodiments, quantum-state-space interferometer 500 can include optical RF phase referencing that is spatially selective on sub-mm length scales. For example, a dense grid of sensor atoms (e.g., atoms 107) can be probed with optical-reference beams (e.g., second input signal 520) that vary from one grid-point to the next. In some embodiments, quantum-state-space interferometer 500 can include optical spatial resolution for broadband RF phase and amplitude sensing. For example, quantum-state-space interferometer 500 can implement parallelization and/or miniaturization based on the optical spatial resolution.

Exemplary Atomic Transducer

FIGS. 6A-6D illustrate atomic transducer 600, according to various exemplary embodiments. Atomic transducer 600 can be configured to detect and measure an incident EM field (e.g., RF field) based on atomic spectroscopy of field-sensitive atomic states in atomic receiver 100 or a physical quantity derived from the measurement of an RF field such as a DC or AC voltage across parallel-plate electrodes 620 that are precisely positioned at a fixed, known distance. The electrode distance can be actively stabilized to an accurately and precisely known set distance by an optical interferometric positioning system to an atomic transition wavelength of a reference laser, leading to an all-atomic voltage standard. Atomic transducer 600 can be further configured to provide ultra-high bandwidth (e.g., DC to THz) and absolute (atomic) measurement of RF power and/or voltage. Atomic transducer 600 can be further configured to provide high-sensitivity RF signal detection in a compact unit, for example, readily adaptable to a variety of RF receivers and circuitry. Atomic transducer 600 can be further configured to provide voltage or power measurements and standards traceable to atomic properties and fundamental constants.

Figure 6A:
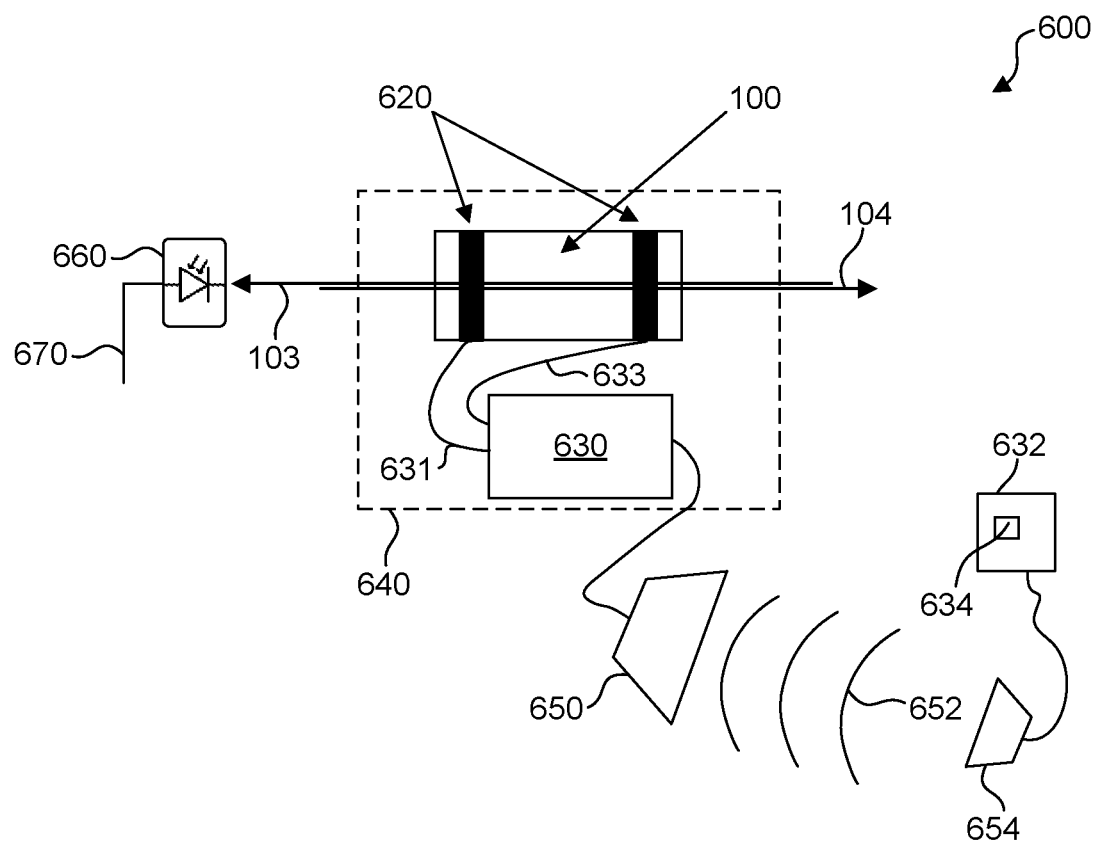
FIGS. 6A and 6B are schematic illustrations of an atomic transducer, according to exemplary embodiments.

As shown in FIG. 6A, atomic transducer 600 can include atomic receiver 100, electrodes 620, connector 630, absorber 640, antenna 650 for detecting radiation 652, detector (e.g., photodiode) 660, and/or electrical readout 670. In some embodiments, atomic receiver 100 of atomic transducer 600 can include a small, cylindrical cesium (Cs) vapor cell (e.g., similar to atomic cell 106) with integrated internal electrodes 620, for example, with wire connections to connector 630. In some embodiments, electrodes 620 can be thick rings (e.g., 0.5 mm thick) spaced apart (e.g., 4 mm separation), and each fused to the cell body (e.g., atomic cell 106), for example, one electrode side can be disposed on an interior side of the cell and another electrode side can be disposed on an exterior side of the cell (e.g., outside the cell window). For example, the total path length through the cell can be about 5 mm. In some embodiments, inner and outer diameters of the cell can be about 3.4 mm and 5 mm, respectively, while inner and outer diameters of electrode rings 620 can be about 2 mm and 5 mm, respectively. For example, two 0.7-mm thick ring electrodes 620 can be embedded within the vapor cell and provide external electrical connections to connector 630 (e.g., an SMA connector).

In some embodiments, detection of radiation 652 (e.g., microwaves) can be performed via spectroscopic measurements of Autler-Townes (AT) splitting (e.g., dynamic Stark effect) in atomic receiver 100. AT splitting occurs when an oscillating electric field (e.g., laser) is tuned to a resonance (or near resonance) of a spectral line, which changes (e.g., splits) the shape of the absorption/emission spectra. For example, probe laser beam 103, with a wavelength ($\lambda$) of about 852 nm, a power of about 8 mW, and a FWHM of about 333 microns, counter-propagates with coupler laser beam 104, with a wavelength (k) of about 510 nm, a power of about 100 mW, and a FWHM of about 394 microns. Probe laser beam 103 can be tuned to the $6_{1/2}$ F=4→$6P_{3/2}$ F'=5 cycling transition while coupler laser beam 104 is scanned across the $6P_{3/2}$→$39D_{5/2}$ transition. This beam configuration induces EIT in atomic receiver 100, which can be read out (e.g., electrical readout 670) by monitoring the absorption on probe laser beam 103 using detector (e.g., photodiode)

660. The presence of 12.599 GHz microwaves 652, resonant to the $39D_{5/2} \rightarrow 40P_{3/2}$ transition, can induce AT splitting in the spectroscopic signal.

In some embodiments, microwaves 652 can be generated by signal generator 632 and transmitted by microwave horn antenna 654. In some embodiments, microwave amplifier 634 (e.g., 45 dB) can be inserted in the line before microwave horn 654 for most measurements. For example, signal generator 632 output can be set to −4 dBm (near the saturation point of amplifier 634). In some embodiments, amplifier 634 can be omitted. For example, signal generator 632 output can be set to +24 dBm.

In some embodiments, microwaves 652 can propagate through free space where they can be detected by a second, receiving antenna 650. As shown in FIG. 6A, antenna 650 can be connected to electrodes 620 in atomic receiver 100 (e.g., Cs vapor cell) via connector 630 (e.g., an SMA cable). In some embodiments, atomic receiver 100 can be placed inside absorber 640 (e.g., a box of microwave-absorbing foam) to shield the atomic Cs vapor from external microwaves incident onto the vapor cell, for example, such that only microwaves 652 collected by the receiving horn 650 and transmitted through the SMA cable 630 are introduced into the atomic vapor.

Figure 6B:
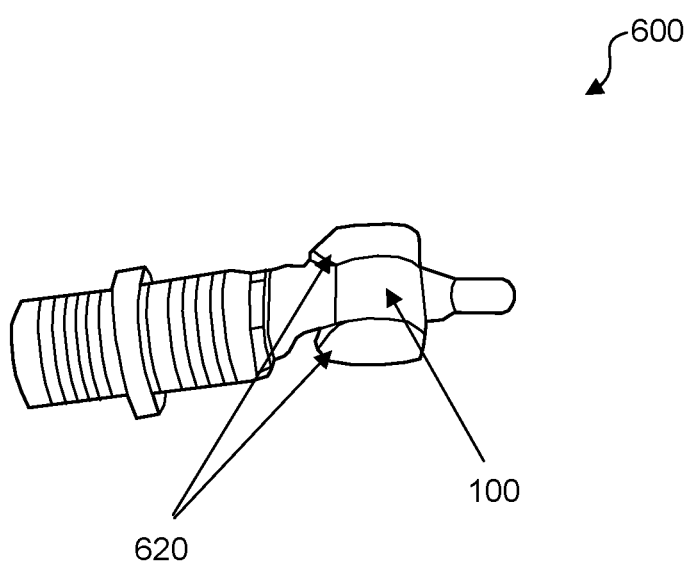

As shown in FIG. 6B, atomic transducer 600 can be implemented in a compact unit. For example, atomic receiver 100 can be integrated with connector 630, for example, an SMA connector. In some embodiments, for the connection, a wire is wrapped around the outer perimeter of each electrode 620 and glued in place using conductive ink. For example, the wire attached to one electrode 620 can be connected to signal pin 631 while the other is connected to ground pin 633 of the SMA connector 630.

In some embodiments, atomic transducer 600 can include an atom-based optical RF-power/voltage transducer and sensor and remote detection. In some embodiments, atomic transducer 600 can employ an atomic vapor integrated with electrodes 620, RF waveguides, or similar structures, for the insertion and/or field-mode compression of RF signals of interest into the vapor from which the RF electric field is detected or measured via spectroscopy of field-sensitive atomic states. In some embodiments, atomic transducer 600 can provide direct conversion of RF electrical signals to an atom-mediated readout 670. In some embodiments, atomic transducer 600 can provide ultra-high bandwidth (DC to THz) absolute (atomic) measurement of RF power or voltage. In some embodiments, atomic transducer 600 can provide high-sensitivity RF signal detection in a compact unit that is readily adaptable to a variety of RF receivers and circuitry. In some embodiments, atomic transducer 600 can be employed in remote detection of microwaves 652. For example, as shown in FIG. 6A, atomic receiver 100 can be comprised of a cesium vapor cell with integrated electrodes 620 attached directly, via SMA cables 631, 633, to a microwave horn receiving antenna 650. For example, the spectroscopic Rydberg EIT readout 670 of the vapor cell can be used to determine the field-equivalent power of the microwaves 652 detected by the horn 650.

Figure 6C:
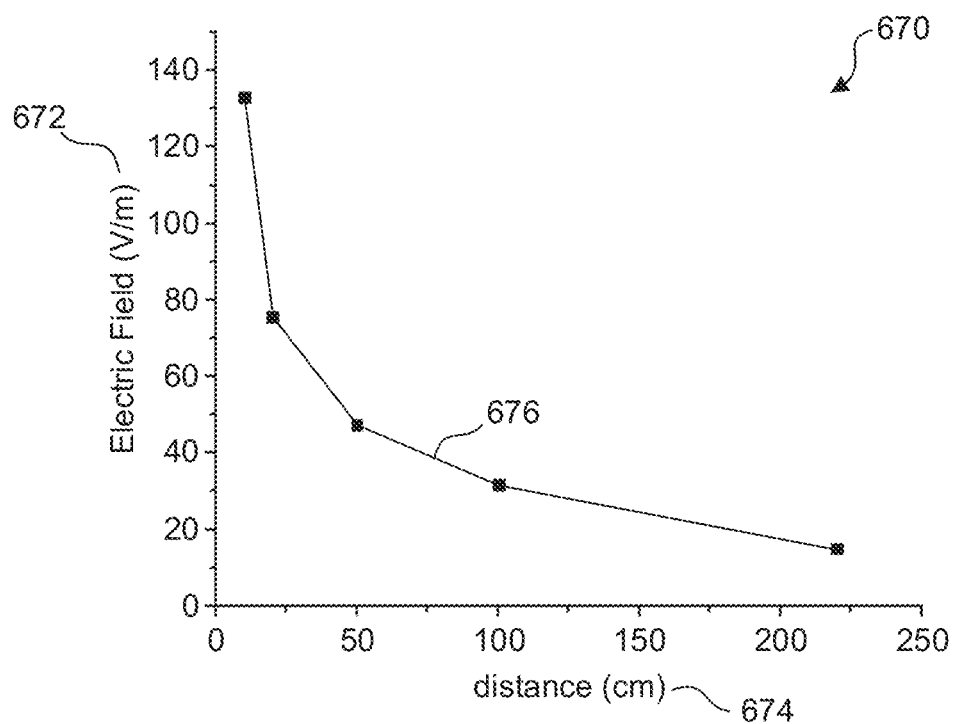
FIG. 6C is a plot of electric field dependence as a function of distance from an electrical readout of the atomic transducer shown in FIGS. 6A and 6B, according to an exemplary embodiment.

As shown in FIG. 6C, electrical readout 670 of atomic transducer 600 can detect electric field dependence 676 of atomic transducer 600 as a function of distance 674 between transmitting antenna 654 and receiving antenna 650 to test the remote detection of atomic transducer 600. For example, receiving antenna 650 can be mounted in a fixed position and connected to the vapor cell electrodes 620 with an SMA cable 630, while transmitting antenna 654 can be on a moveable stand, aimed directly at receiving antenna 650. Distance 674 can be varied between the two horns 650, 654, for example, from 10 cm to 220 cm. AT splitting can be detected in atomic receiver 100, and based on the splitting the microwave power transmitted to atomic receiver 100 by the receiving antenna 650 can be calculated. As shown in FIG. 6C, electric field 672 falls off with increased distance 674, as expected (e.g., Coulomb's inverse-square law: $E \sim 1/d^2$).

Figure 6D:
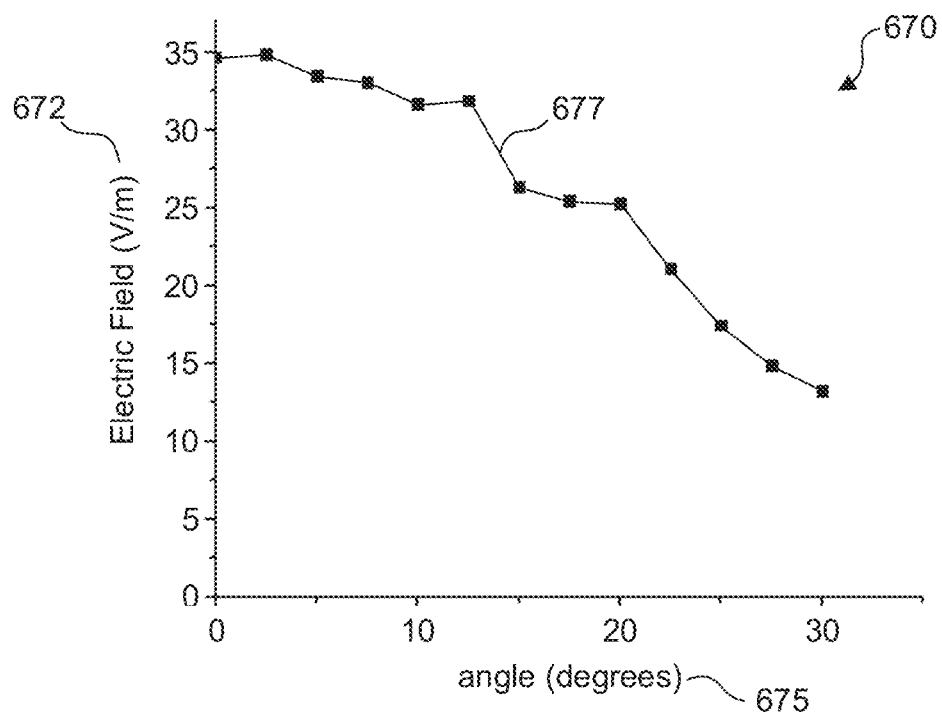
FIG. 6D is a plot of electric field dependence as a function of angle tilt from an electrical readout of the atomic transducer shown in FIGS. 6A and 6B, according to an exemplary embodiment.

As shown in FIG. 6D, electrical readout 670 of atomic transducer 600 can detect electric field dependence 677 of atomic transducer 600 as a function of angle of tilt 675 between transmitting antenna 654 and receiving antenna 650 to test the directional dependence of atomic transducer 600. For example, zero degrees is taken to be when the antennas 650, 654 are aligned with each other, and the microwave horn antennas 650, 654 are placed 100 cm apart. Transmitting horn 654 can be aligned with respect to receiving horn 650 so that they are approximately co-axial and then adjusted until a maximum in the detected microwaves is seen, indicating perfect alignment between the antennas (e.g., this is taken to be 0 degrees tilt between the antennas). Transmitting antenna 654 can then be rotated along the axis of polarization of the microwaves in steps of 2.5 degrees, from 0 degrees to 90 degrees. Detected angular dependence 677 falls off as transmitting antenna 654 is tilted away from receiving antenna 650, as expected (e.g., directionality of radiation pattern: E~tilt angle, maximum at 0 degrees).

In some embodiments, AT splitting can be observed at up to 55 degrees of tilt 675 between the antennas 650, 654, but for tilt angles past 30 degrees the splitting can be too small to derive an accurate field measurement. For example, this low-splitting can be due to the particular Cs (vapor) transition chosen. In some embodiments, a higher n-state can be chosen for accurate measurement of weaker microwave fields.

In some embodiments, with a separation of 100 cm between antennas 650, 654, a piece of pressboard (e.g., 25 mm thick and much larger than the antenna aperture in area) can be placed a few centimeters in front of transmitting antenna 654 (e.g., simulating microwave transmission through a wall). For example, without the pressboard, an electric field of 31.7 V/m can be measured, while with the pressboard, an electric field of 24.8 V/m can be measured, indicating the pressboard attenuates the field by 22% but does not prevent detection. In some embodiments, atomic transducer 600 can detect microwaves even transmitted through walls.

In some embodiments, comparison can be made between detection of microwaves 652 on receiving antenna 650 and detection of microwaves 652 incident directly on atomic receiver 100. For example, amplifier 634 can be removed from microwave transmission system 632, and transmitting antenna 654 can be placed 10 cm from receiving antenna 650 in order to measure electric field 672. Then, cell electrodes 620 can be disconnected from receiving antenna 650, microwave-absorbing foam 640 can be removed, and transmitting antenna 654 can be placed 10 cm from atomic receiver 100. Measurements can be taken with transmitting antenna 654 oriented so that the microwave polarization is both parallel and perpendicular to the axis of atomic receiver 100. In the case of antenna-to-antenna transmission, an electric field of 21.7 V/m is measured. With the microwaves directly incident on atomic receiver 100, a microwave field of 19.4 V/m is measured with the polarization parallel to the axis of electrodes 620, while a microwave field of 47.0 V/m is measured with the polarization perpendicular to the axis of electrodes 620.

In some embodiments, assuming the microwave signal is transmitted through the SMA cable 630 and then into atomic receiver 100, using electrodes 620 as miniature antennas, the polarization in this case would be perpendicular to the axis of the cell, thus making the perpendicular-polarization measurement a more apt comparison to the antenna-to-antenna measurement. For example, about 46% of the microwave power incident on receiving horn 650 can be detected by the Cs atoms in atomic receiver 100.

In some embodiments, a comparison measurement can be taken with transmitting antenna 654 directly against receiving antenna 650 (e.g., an electric field of 75.0 V/m is measured). Then, both antennas 650, 654 can be disconnected, and electrodes 620 can be connected directly to signal generator 632 via a microwave cable, an SMA barrel, an SMA cable, and finally the SMA connector 630 attached to the electrodes. In this direction connect, an electric field of 166.9 V/m is measured. This indicates 45% of the microwave power incident on receiving horn 650 is detected, consistent with the previous measurement.

In some embodiments, atomic transducer 600 with integrated electrodes 620 can be used for direct measurement of microwaves from a source, without the need of intermediate free-space transmission or detection. For example, atomic transducer 600 can include a microwave isolator to account for impedance-matching.

Exemplary Atomic Receiver with Antenna

FIG. 7 illustrates atomic receiver with antenna 700, according to various exemplary embodiments. Atomic receiver with antenna 700 can be configured to provide electromagnetic (e.g., RF) field collection and/or field compression with atom-based closed-loop controls (e.g., atomic PLL, AALC, ABP, etc.) for autonomous operations. Atomic receiver with antenna 700 can be further configured to provide atomic readout parameters (e.g., atomic transitions, laser frequencies, powers, schemes, etc.). In some embodiments, atomic receiver with antenna 700 can include atom-based RF amplitude and phase detection as described in International Appl. No. PCT/US2018/066006, filed Dec. 17, 2018, which is hereby incorporated herein in its entirety by reference.

As shown in FIG. 7, atomic receiver with antenna 700 can include input signal 710 (e.g., EM/RF field), atomic receiver 100, antenna 720, optical I/O 730, and/or electrical I/O 740. Atomic receiver with antenna 700 can include three operational sections: (1) field collection (e.g., antenna 720), (2) field compression (e.g., reduced cross-section in cable and/or stripline through which signal propagates, for example, atomic hybrid detector with stripline 900 as shown in FIGS. 9A and 9B), and (3) atomic readout parameters (e.g., atomic transitions, laser frequencies, powers, schemes, etc.).

In some embodiments, atomic receiver with antenna 700 can include optical coupling 732, electrical coupling 742, opto-electronic coupling 744, and/or source coupling 750, for example, based on atom-based closed-loop controls (e.g., atomic PLL, AALC, ABP, etc.) to improve signal response, precision, and accuracy for detection, communication, and processing of input signal 710. In some embodiments, antenna 720 can include inductor 722 (e.g., coil) and/or compressor 724 (e.g., capacitor, electrical feed) to improve signal reception. In some embodiments, electrical I/O 740 can include additional inputs and/or outputs to and/or from atomic receiver 100 (e.g., reference local oscillators, DC offset, electrical readout from atoms, digital signal processor, CPU, etc.).

In some embodiments, optical I/O 730 can be coupled to optical coupling 732 and/or opto-electronic coupling 744 to improve signal detection via atom-based closed-loop control systems and methods, as described herein. In some embodiments, electrical I/O 740 can be coupled to electrical coupling 742 and/or opto-electronic coupling 744 to improve signal detection via atom-based closed-loop control systems and methods, as described herein. In some embodiments, input signal 710 can be coupled to source coupling 750 to improve signal detection via atom-based closed-loop control systems and methods, as described herein.

Exemplary Atomic Imager

FIG. 8 illustrates atomic imager 800, according to various exemplary embodiments. Atomic imager 800 can be configured to provide electromagnetic (e.g., RF) field detection and/or field imaging with atom-based closed-loop controls (e.g., atomic PLL, AALC, ABP, etc.) for autonomous operations. In some embodiments, atomic imager 800 can include atom-based RF imaging as described in International Appl. No. PCT/US2018/066006, filed Dec. 17, 2018, which is hereby incorporated herein in its entirety by reference.

As shown in FIG. 8, atomic imager 800 can include input signal 810 (e.g., EM/RF field), atomic receiver 100, optical readout 134, opto-electronic converter 820 (e.g., CCD, CMOS, photodetector, etc.), and/or signal processor 830 (e.g., microprocessor, imbedded processor, special or general CPU, etc.). In some embodiments, atomic imager 800 can include optical coupling 832, electrical coupling 834, opto-electronic coupling 836, and/or source coupling 850, for example, based on atom-based closed-loop controls (e.g., atomic PLL, AALC, ABP, etc.) to improve signal response, precision, and accuracy for detection and imaging of input signal 810.

In some embodiments, optical readout 134 can be coupled to optical coupling 832 and/or opto-electronic coupling 836 to improve signal detection and/or imaging via atom-based closed-loop control systems and methods, as described herein. In some embodiments, electrical readout 162 can be coupled to electrical coupling 834 and/or opto-electronic coupling 836 to improve signal detection and/or imaging via atom-based closed-loop control systems and methods, as described herein. In some embodiments, input signal 810 can be coupled to source coupling 850 to improve signal detection and/or imaging via atom-based closed-loop control systems and methods, as described herein.

Exemplary Atomic Hybrid Detector With Stripline

FIGS. 9A and 9B illustrate atomic hybrid detector with stripline 900, according to various exemplary embodiments. FIG. 9B is a schematic cross-sectional illustration of atomic hybrid detector with stripline 900 shown in FIG. 9A. Atomic hybrid detector with stripline 900 can be configured to increase field compression and increase detection sensitivity with atom-based closed-loop controls (e.g., atomic PLL, AALC, ABP, etc.) for multi-field conditioning. Atomic hybrid detector with stripline 900 can be further configured to maximize a ratio of peak intensity along a cross-section of cable and/or power transmitted (e.g., reduce the cable cross-section) and produce stronger local fields in spectroscopic cell 910. In some embodiments, atomic hybrid detector with stripline 900 can be configured as a spectrum analyzer, for example, based on homodyne measurements (e.g., phase, amplitude, frequency, polarization, etc.), heterodyne measurements (e.g., phase, amplitude, frequency, polarization, etc.), heterodyne parametric signal amplification, processing, atoms using spatial and/or temporal multiplexing of atomic responses to electromagnetic fields (e.g., similar to atomic waveform sampler 1200 shown in FIG. 12), and/or multiplexing of optical beams for atomic readout (e.g., similar to atomic waveform sampler 1200 shown in FIG. 12). Multiplexing and/or modulation of optical beams may, for example, be implemented using a spatial light modulator or adaptic optics.

As shown in FIGS. 9A and 9B, atomic hybrid detector with stripline 900 can include spectroscopic cell 910 (e.g., similar to atomic cell 106 or atomic receiver 100 shown in FIG. 1.), probe laser beam 913 (e.g., similar to probe laser beam 103 shown in FIG. 1), coupler laser beam 914 (e.g., similar to coupler laser beam 104 shown in FIG. 1), atomic cell 916 (e.g., similar to atomic cell 106 shown in FIG. 1), atoms 917 (e.g., similar to atoms 107 shown in FIG. 1), stripline 920, and/or insulator 930 (e.g., glass). Stripline 920 can include trace electrode 922, trace input 924 (e.g., RF input signal), ground electrode 926, and ground input 928 (e.g., RF reference signal). Input signal 942 (e.g., EM/RF input field) can be coupled to trace input 924 and reference signal 944 (e.g., EM/RF reference field) can be coupled to ground input 928. Stripline 920 can be configured to increase or maximize induced field 946 in atomic cell 916 between trace electrode 922 and ground electrode 926. In some embodiments, as shown in FIG. 9B, stripline 920 can be symmetric.

In some embodiments, input signal 942 can be received from an antenna. In some embodiments, reference signal 944 can include an RF reference signal and/or additional signals for multi-field conditioning. In some embodiments, trace input 924 and ground input 928 can be inductively coupled to input signal 942 and reference signal 944, respectively, in order to reduce (e.g., eliminate) electrical connection (e.g., conduction) between atomic readout (e.g., similar to readout 134, 162 of atomic receiver 100) and input signal 942 and/or external RF electronics.

In some embodiments, atomic hybrid detector with stripline 900 can include a symmetric stripline 920 with an atomic gas 917 embedded for optical readout from the atoms 917 of field parameters of signals (e.g., input signal 942, reference signal 944) injected into the stripline 920. For example, stripline 920 can increase field compression (e.g., induced field 946) at the location of the detector atoms 917 for a given input signal into the stripline 920. In some embodiments, optical readout signals (e.g., similar to optical readout 134 of atomic receiver 100) from the atoms 917 can be converted to electronic signals by a photodetector (e.g., similar to detector (e.g., photodiode) 160 and electrical readout 162). For example, the electronic signals can be used to realize atom-based control-loop(s) for implementation of, for example, PLLs, AALCs, and/or multi-field conditioning.

Exemplary Multi-Field Conditioning Systems and Methods

FIGS. 10A-10C illustrate multi-field conditioning system 1000, according to various exemplary embodiments. Multi-field conditioning system 1000 can be configured to provide multi-field engineering and/or conditioning of Rydberg levels for atom-based RF signal reception, for example, high-sensitivity long-wavelength (<c/10 GHz) RF reception and reception of complex RF signal transmissions (e.g., spread spectrum schemes). Multi-field conditioning system 1000 can be further configured to structure the Rydberg level structure and corresponding available atomic dipole RF resonances, for example, in order to be suitable for the type of input signal (e.g., EM/RF field) to be detected and/or received. Multi-field conditioning system 1000 can be further configured to provide at least one additional EM field to the EIT and RF signal fields. In some embodiments, multi-field conditioning system 1000 can use a fiduciary reference phase (e.g., by a second electromagnetic wave, for example, RF wave or optical beam with RF phase modulation) and an atomic gas for RF phase detection as described in International Appl. No. PCT/US2018/066006, filed Dec. 17, 2018, which is hereby incorporated herein in its entirety by reference.

As shown in FIG. 10A, multi-field conditioning system 1000 can include first input signal 1010 (e.g., EM/RF field), atomic receiver 100, second input signal 1020 (e.g., EM/RF field or EM/RF-modulated optical beam or O-EM optical beam), third input signal 1030 (e.g., EM/RF field or EM/RF-modulated optical beam), and/or optical readout 1050. In some embodiments, third input signal 1030 can comprise one or more additional fields that could be DC or AC, depending on the application. In some embodiments, a device (e.g., a detector, a receiver, an imager, etc.) can be regulated by the response of atomic receiver 100 to additional field parameters of third input signal 1030 (e.g., amplitude, phase, frequency, polarization, etc.) and/or those of third input signal 1030 in an atom-based closed-loop (e.g., PLL, AALC, ABP, etc.).

In some embodiments, a microwave field (e.g., third input signal 1030) couples two Rydberg levels and its E-field level can be used to control the AT splitting of the two resulting dressed states. For example, as the E-field of this control microwave field (e.g., third input signal 1030) is varied, the transition frequency between one of the controlled AT-split states (e.g., a S and P mixed state) and another nearby Rydberg state (e.g., a D state) similarly varies and can be tuned to resonantly couple an RF signal field (e.g., second input signal 1020) of longer (or shorter) wavelength than the control microwave field (e.g., third input signal 1030). In some embodiments, one can choose states and/or control field properties (e.g., large field amplitudes) to mix states in the Floquet regime (e.g., many-body localization) for more avoided crossing and a richer RF-transition level-structure. For example, one can choose states and/or control field properties such that the transition frequency is small, reaching a minimum at an avoided crossing of the AT state and another state.

In some embodiments, third input signal 1030 (e.g., control microwave field) can prepare and control the atomic level structure for reception on a desired RF carrier frequency. For example, as shown in FIGS. 10B and 10C, multi-field conditioning system 1000 can use a strong microwave field at a frequency of 5.037 GHz resonant on a strong microwave dipole transition in Cs in order to generate a rich level structure in atomic receiver 100 with electric-dipole resonances between Floquet states at much longer wavelengths. In some embodiments, multi-field conditioning system 1000 can condition the quantum structure of Rydberg atoms to enable high-sensitivity reception of low-frequency RF (MHz) fields with Rydberg states at moderate quantum numbers, accessible to laser preparation in alkali vapor cells. For example, as shown in FIGS. 10B and 10C, the RF (MHz) transition frequency 1052 can be tuned or selected by varying the electric field strength of the conditioning microwave (GHz) field (e.g., third input signal 1030), where a change in microwave field amplitude along the x-axis (e.g., electric field of the dressing field amplitude 1054) yields a change in RF resonance frequencies 1052 between the Floquet Rydberg levels prepared by the microwave dressing field. In some embodiments, a launch level for RF reception can be selected by choosing the appropriate laser frequency 1052 of the Rydberg-atom excitation laser (y-axis).

As shown in FIG. 10B, optical readout 1050 of multi-field conditioning system 1000 can include a Floquet level structure set up, for example, in a rubidium vapor using a 5.037-GHz dressing field. Rydberg levels in the vicinity of the $90S_{1/2}$ level can have the displayed Floquet level structure, which can be used as an operating platform for resonant RF reception at wavelengths much longer than that of the dressing field. As shown in FIG. 10C, optical readout 1050 of multi-field conditioning system 1000 can include frequencies 1052 and line strengths for RF field reception (dot size) versus the electric field of the dressing field amplitude 1055. It is seen that the Floquet level structure offers multiple strong RF transitions (e.g., transition 1056) in the sub-200 MHz range that are frequency-tunable via the dressing field amplitude.

In some embodiments, control fields (e.g., third input signal 1030) of multi-field conditioning system 1000 can serve as process variables in atom-based closed-loop and synchronous communications schemes with atom-based receivers. For example, in the implementation described above and shown in FIGS. 10B and 10C, the control field strength process variable can switch dynamically between two or more E-field values to resonantly tune the atomic states to two or more RF carrier frequencies in the sub-GHz frequency range based on, for example, a preset algorithm or the atomic response itself for implementation of an atomic receiver in synchronous frequency-hopping spread spectrum reception. For example, a laser frequency for an optical EIT readout 1050 of the atomic response to the RF signal field can track the line during switching/hopping to different control microwave E-fields using an atom-based closed-loop to maintain an operating point (e.g., atom-based feedback, PLL, AALC, ABP, laser controller 330, VCO 424, etc.) on the required Rydberg line for continuous reception of the transmitted signals.

In some embodiments, multi-field conditioning system 1000 can include RF signal phase/frequency reception (e.g., first and second input signals 1010, 1020) with the addition of a fiduciary reference RF signal field (e.g., third input signal 1030) as an applied local oscillator for carrier selection, channel tuning, parametric amplification, and/or some combination thereof. For example, multi-field conditioning system 1000 can utilize atom-based closed-loop control (e.g., PLL, AALC, ABP, etc.).

Exemplary Rydberg Field Probe

FIGS. 11A-11F illustrate Rydberg field probe 1100, according to various exemplary embodiments. Rydberg field probe 1100 can be configured to provide a Rydberg atom-based RF signal waveform imager and receiver with closed-loop control for RF waveform imaging and detection. Rydberg field probe 1100 can be further configured to be a portable Rydberg atom-based RF electric (E) field probe and control unit for intrinsic absolute-standard (atomic) broadband RF E-field measurements from MHz to sub-THz over a wide dynamic range using a single sub-wavelength detector. In some embodiments, Rydberg field probe 1100 can include a Rydberg field probe and control unit as described in "A self-calibrating SI-traceable broadband Rydberg atom-based radio-frequency electric field probe and measurement instrument," David A. Anderson et al., arXiv:1910.07107v2, pages 1-12, published Oct. 18, 2019 (see Appendix A), which is hereby incorporated herein in its entirety by reference.

Figure 11A:
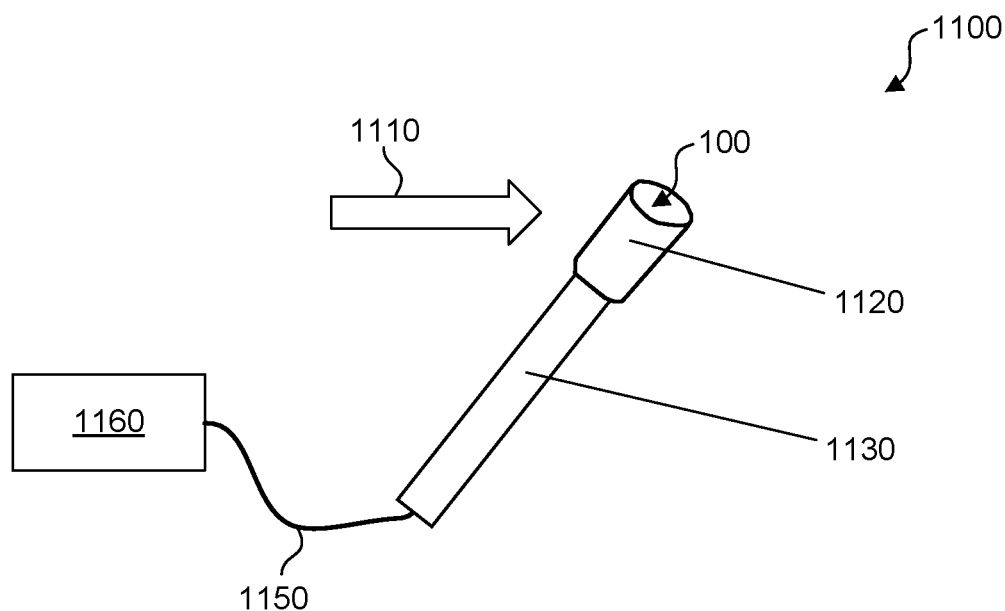
FIGS. 11A and 11B are schematic illustrations of a Rydberg field probe, according to exemplary embodiments.
Figure 11B:
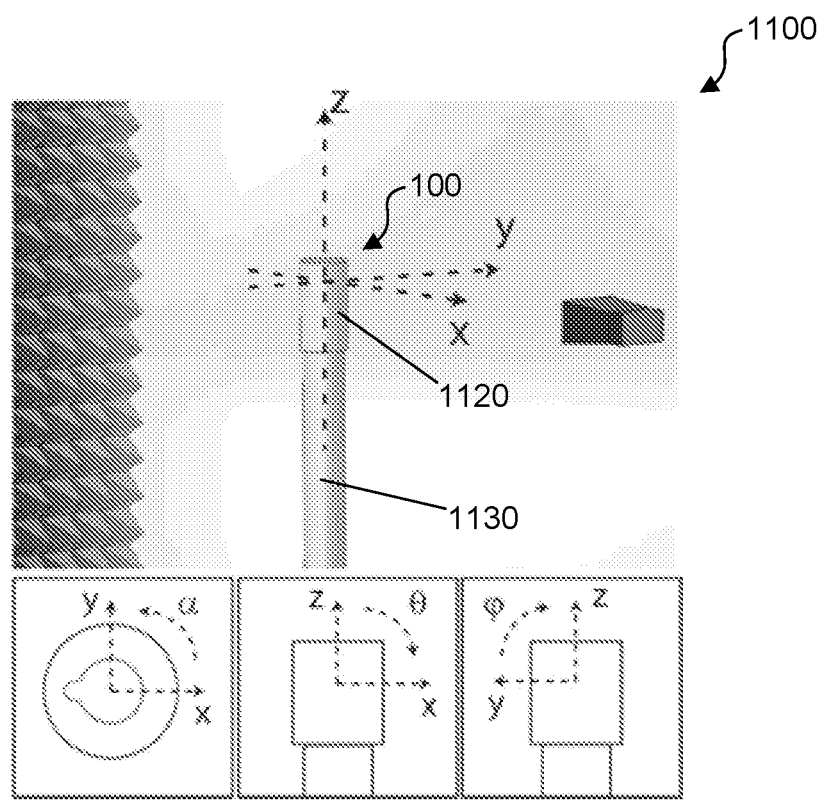

As shown in FIGS. 11A and 11B, Rydberg field probe 1100 can include input signal 1110 (e.g., EM/RF field), atomic receiver 100, probe tip 1120, probe housing 1130, readout 1150 (e.g., fiber-optic cable), and/or control unit 1160. Rydberg field probe 1100 can be based on a method for RF E-field measurements using optical EIT readout of spectral signatures from RF-field-sensitive Rydberg atoms in an atomic vapor (e.g., atomic receiver 100). Rydberg field probe 1100 can be a portable probe comprised of a miniature atomic vapor cell sensing element (e.g., atomic receiver 100) that is unilaterally fiber-coupled and enclosed in a rugged housing 1130 with a small dielectric footprint. In some embodiments, Rydberg field probe 1100 can be connected by a fiber-linked cable (e.g., several meters long) to a portable control unit 1160 (e.g., mainframe) containing all lasers and optoelectronics for Rydberg field probe 1100 operation and RF E-field readout 1150 via a software user interface.

In some embodiments, Rydberg field probe 1100 can provide high-precision self-calibrated broadband RF E-field measurements. For example, Rydberg field probe 1100 can employ the spectroscopic readout 1150 from atomic receiver 100 (e.g., in probe tip 1120), RF-field-free atomic references, and active laser-frequency calibration to ensure high accuracy in the spectroscopic output for atomic RF E-field measurements (e.g., reaching uncertainties below 1%).

Figure 11C:
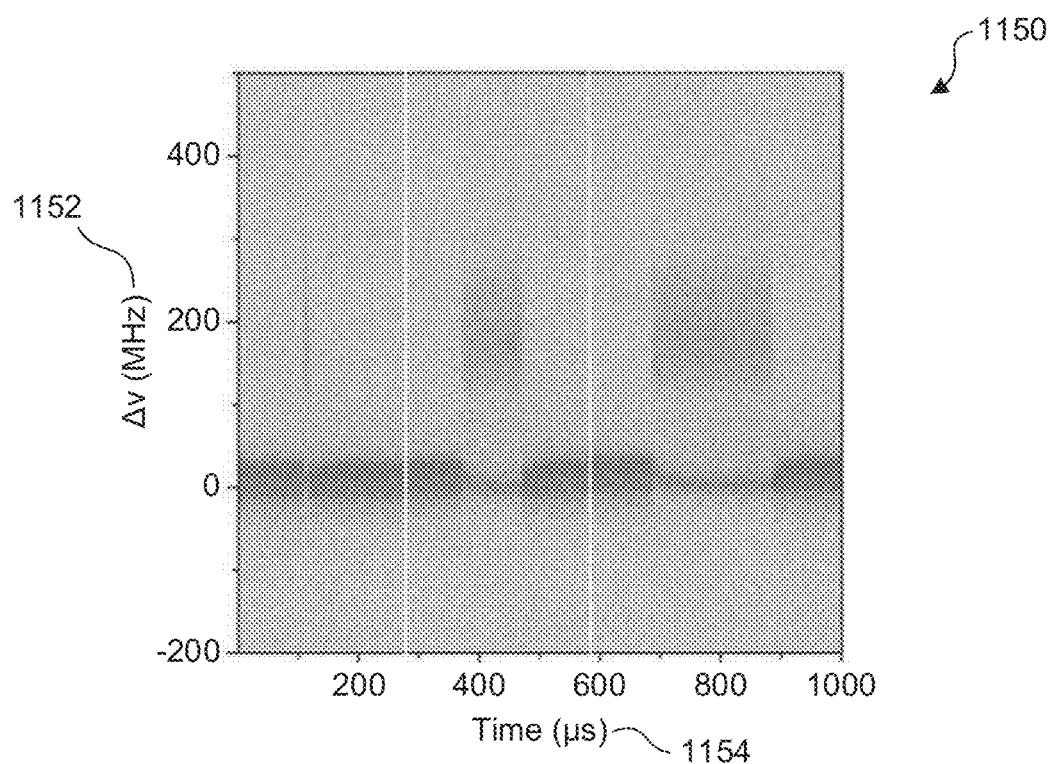
FIG. 11C is a plot of a time domain signal from a readout of the Rydberg field probe shown in FIGS. 11A and 11B, according to an exemplary embodiment.
Figure 11D:
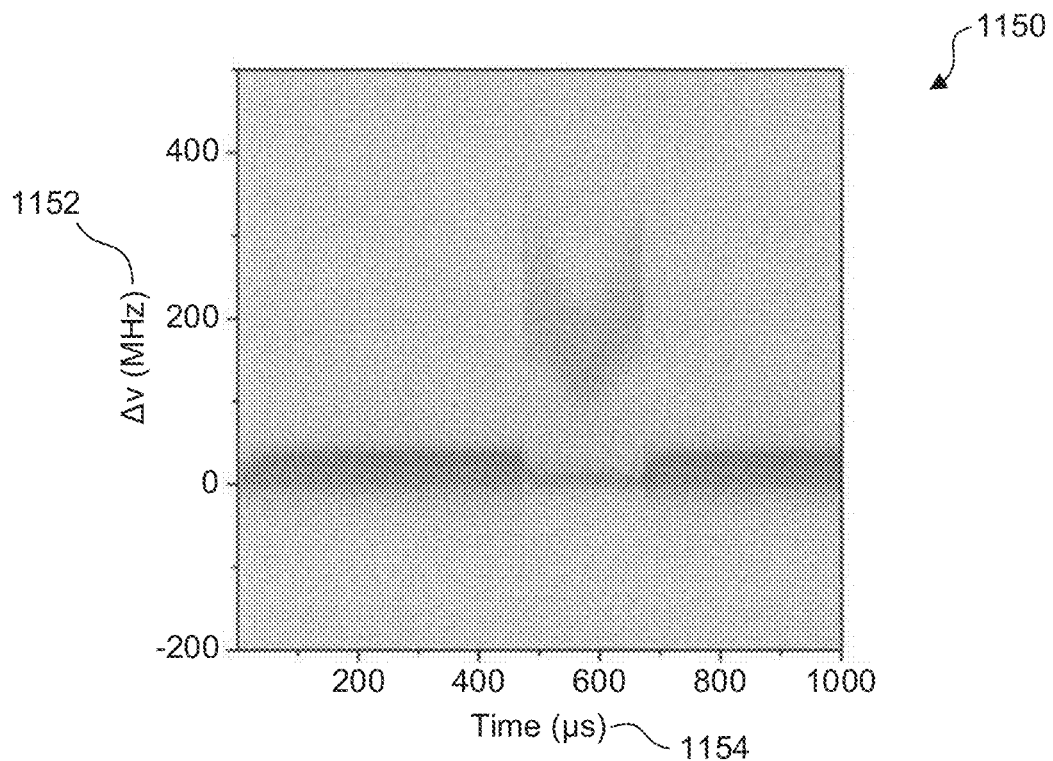
FIG. 11D is a plot of a time domain signal from a readout of the Rydberg field probe shown in FIGS. 11A and 11B, according to an exemplary embodiment.
Figure 11E:
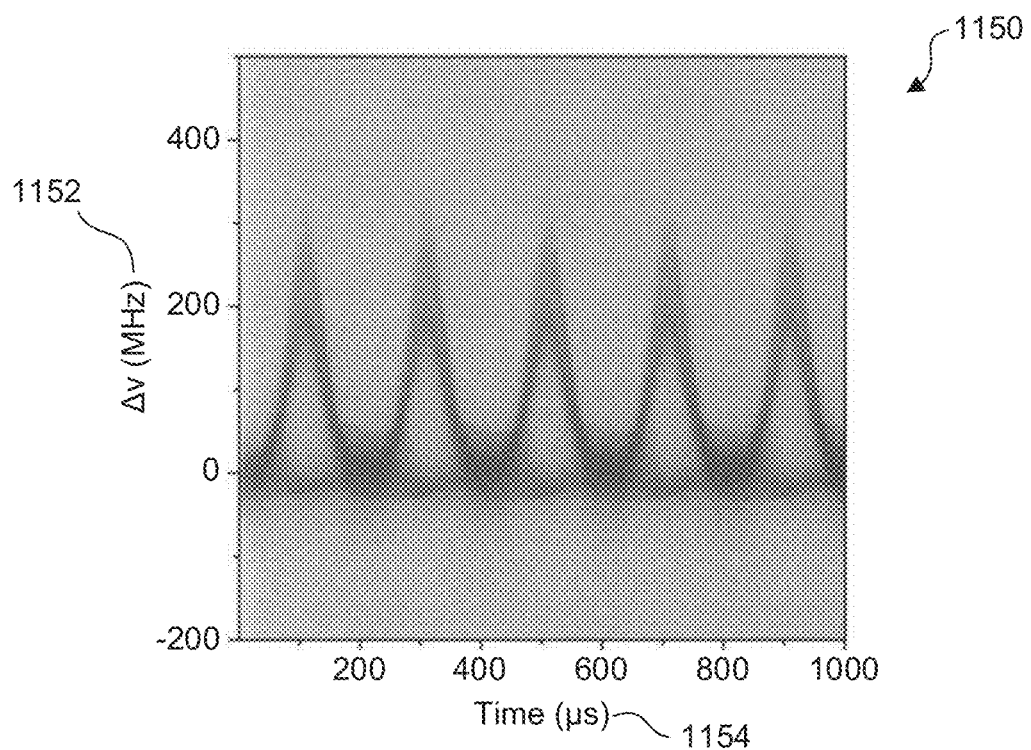
FIG. 11E is a plot of a time domain signal from a readout of the Rydberg field probe shown in FIGS. 11A and 11B, according to an exemplary embodiment.
Figure 11F:
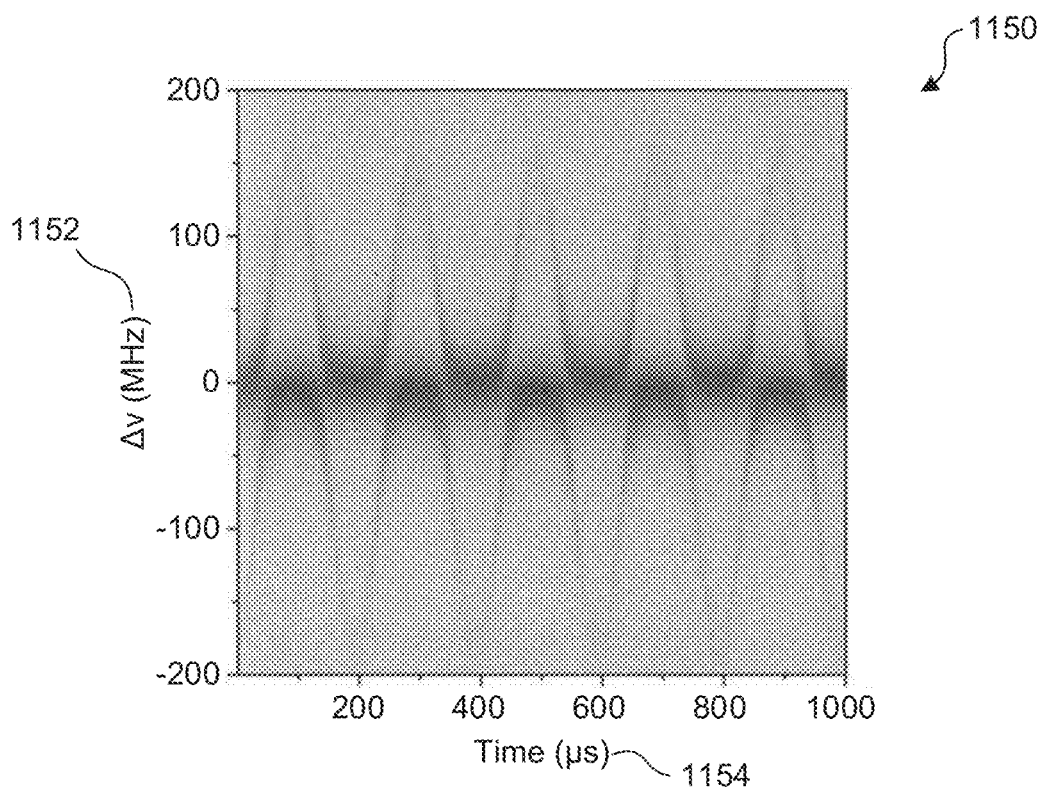
FIG. 11F is a plot of a time domain signal from a readout of the Rydberg field probe shown in FIGS. 11A and 11B, according to an exemplary embodiment.

FIGS. 11C-11F illustrate signal waveforms 1150 collected in the time-domain by Rydberg field probe 1100 for time-dependent RF fields. Signal waveforms 1150 collected are displayed on a linear grayscale (arbitrary units), measured versus time 1154 and laser detuning 1152. FIG. 11C illustrates an EIT AC-Stark-shift response to square pulses of a 2.5 GHz RF signal with varying pulse lengths, from left to right, of 10 s, 100 s, and 200 s with a repetition rate of 1 kHz, with the RF intensity being constant during the pulses. FIG. 11D illustrates an EIT AC-Stark-shift response to a pulsed signal that is AM within the pulse. FIG. 11E illustrates a continuous, AM RF signal, with a carrier frequency of 2.5 GHz and an AM baseband frequency of 5 kHz. FIG. 11F illustrates a continuous, FM RF field near an AT resonance, with a carrier frequency of 12.6 GHz, a FM baseband frequency of 5 kHz, and a FM deviation of 160 MHz.

Exemplary Atomic Waveform Sampler

FIG. 12 illustrates atomic waveform sampler 1200, according to various exemplary embodiments. Atomic waveform sampler 1200 can be configured for RF waveform sampling and/or spectrum analyzing based on atoms, using spatial and/or temporal multiplexing of atomic responses to EM fields (e.g., RF fields). Atomic waveform sampler 1200 can be further configured to provide an instantaneous bandwidth of RF field detection and receiving (e.g., phase, amplitude, frequency, polarization, etc.) beyond 10 MHz based on atoms using spatial and/or temporal multiplexing of atomic responses to EM fields (e.g., RF fields). Atomic waveform sampler 1200 can be further configured to scalable high-speed and high-bandwidth RF waveform sampling over a wide range of carrier frequencies by RF waveform and/or pulse reconstruction and demodulation by electronic signal processing. In some embodiments, atom-based waveform sampler 1600 can comprise an atomic spectrum analyzer.

To date, the instantaneous bandwidth of RF electromagnetic field detection and receiving (including phase, amplitude, frequency, and polarization) with Rydberg EIT has been limited to about 10 MHz, set primarily by the lifetime or decay rate from the electromagnetic (optical) probing transition of the atom. For example, in a ladder Rydberg EIT configuration in Rb, the probing laser (780 nm) connects the $5S_{1/2}$ level to the $5P_{3/2}$ level, and the coupler laser connects the $5P_{3/2}$ to the Rydberg level, which is in turn interacts with the RF electromagnetic radiation. The natural decay rate of the $5P_{3/2}$ to $5S_{1/2}$ probe transition is about 6 MHz and, thus, sets a fundamental limit to the achievable speed of the optical probing readout from the atom interacting with the RF and sets a limit to the detectable instantaneous RF bandwidth.

It is useful in this discussion to explicitly distinguish between the definition of instantaneous RF bandwidth (e.g. baseband bandwidth of a modulated RF carrier, for example, driving an atomic transition) and the bandwidth coverage by RF carriers (e.g. RF carrier fields driving substantially distinct atomic transitions, for example, a 30S to 30P RF carrier transition in a Rydberg atom). While the RF carrier bandwidth coverage with resonant Rydberg transitions is from <1 MHz to THz, the instantaneous RF bandwidth remains limited to about 10 MHz levels due to the relatively long about 10-100 ns lifetime of the intermediate atomic states, as discussed above.

As shown in FIG. 12, atomic waveform sampler 1200 can include modulated waveform 1208 (e.g., modulation baseband of 1 GHz), input signal 1210 (e.g., based on modulated waveform 1208), gradient field 1212 (e.g., atom site-selection), atomic receiver 1220 (e.g., similar to atomic receiver 100 shown in FIG. 1), optic 1030, and/or photodetector 1040 (e.g., atom site-selection). Atomic receiver 1220 can include probe laser beam 1223 (e.g., similar to probe laser beam 103), coupler laser beam 1224 (e.g., similar to coupler laser beam 104), atomic cell 1206 with atoms 1207 (e.g., similar to atomic cell 106 with atoms 107), and optical readout 1228 (e.g., similar to optical readout 134). Photodetector 1040 (e.g., CCD, CMOS, etc.) can include pixel array 1250 (e.g., rastered), forward raster 1252, reverse raster 1254, and sampled waveform 1256.

In some embodiments, Rydberg EIT probe readout 1228 from atomic vapor 1227 can be expanded onto a fast photodetector array 1040 that can provide spatial and temporal information from the optical probing region in the atom sample. For example, atom subgroups or sites can be defined by a spatially-varying perturbation of the atoms, such as an external gradient field 1212, applied across atoms 1227 in the probing region. These sites can then be spatially selected and/or readout by photodetector array 1040 and the temporal responses of each site to the RF field can readout electronically as sampled waveform 1256.

In some embodiments, while each individual site remains speed-limited by an atomic transition lifetime or decay rate Gamma (e.g., in the case of rubidium 5P, lifetime about 100 ns and Gamma about 10 MHz decay rates), the readout 1256 from an N-element array 1250 can be done temporally at high speed for a collective ultra-fast sampling rate of Gamma×N. For example, for Rb and a 10 pixel by 10 pixel array, atomic waveform sampler 1200 can provide up to 10 MHz×100=1 GHz RF waveform sampling, suitable over a wide range of RF carriers (e.g., <1 MHz to THz) afforded by the Rydberg spectrum. In some embodiments, RF waveform and/or pulse reconstruction and demodulation can be achieved by electronic signal processing (e.g., rastered pixel array 1250 of photodetector 1240). In some embodiments, analog signal processing by optical and/or atom-optical means can also be implemented using, for example, optical modulation methods (e.g., quantum-state-space interferometer 500 shown in FIGS. 5A-5C, multi-field conditioning system 1000 shown in FIGS. 10A-10C).

In some embodiments, atomic waveform sampler 1200 can enable scalable high-speed/high-bandwidth RF waveform sampling over a wide range of carrier frequencies, relevant to a wide range of applications (e.g., RF signal reception, analysis, etc.). In some embodiments, atomic waveform sampler 1200 can utilize RF phase, amplitude, frequency, and/or polarization detection schemes. For example, atomic waveform sampler 1200 can utilize hybrid devices (e.g., atomic hybrid detector with stripline 900 shown in FIGS. 9A and 9B), multi-field conditioning of Rydberg levels (e.g., multi-field conditioning system 1000 shown in FIGS. 10A-10C), and/or atom-based closed-loop controls (e.g., PLL, AALC, ABP, etc.). In some embodiments, atomic waveform sampler 1200 can include multiplexing of optical beams (e.g., rastering) for atomic readout.

Exemplary Atomic Raster Imager

FIGS. 13A and 13B illustrate atomic raster imager 1300, according to various exemplary embodiments. Atomic raster imager 1300 can be configured to spatially-scan an O-EM beam to selectively read out a phase and/or an amplitude of one or more RF-EM fields emitted from one or more sources (e.g., an antenna, antenna array, etc.) from Rydberg atoms located in 1D or 2D. Atomic raster imager 1300 can be further configured to provide sub-wavelength spatial imaging over distances and areas larger than that allowed by the O-EM beam sizes (e.g., larger than about 1 mm). Atomic raster imager 1300 can be further configured to provide far-sub-wavelength resolution of microwave phase and/or amplitude within the O-EM beam at selectable regions in space. Atomic raster imager 1300 can be further configured to provide a physical separation between front-end detector atoms and back-end laser-source and other hardware for remote sensing and/or imaging (e.g., microwave measurement and/or imaging inside anechoic chambers, for example, at base-stations or other distant locations). Atom-based electromagnetic field and phase imaging has been previously described in U.S. application Ser. No. 16/222,384, filed Dec. 17, 2018, which is hereby incorporated herein in its entirety by reference.

FIG. 13A illustrates a schematic partial top view of atomic raster imager 1300. FIG. 13B illustrates a schematic cross-sectional view of atomic raster imager 1300. As shown in FIG. 13B, atomic raster imager 1300 can include O-EM laser beam 1303, atomic cell 1306 with atoms 1307 (e.g., Rydberg atoms), input signal 1310 (e.g., RF-EM field), rastering mirror 1320, quarter-wave plate 1330, lens 1340, filter 1350, and/or detector 1360. In some embodiments, a single-spot image area of O-EM laser beam 1303 can be transmitted and adjusted by rastering mirror 1320 into atomic cell 1306. For example, the single-spot image area can be about 2 mm in diameter. In some embodiments, a side length 1308 of atomic cell 1306 can be much larger than an imaging area, for example, atomic cell 1306 can be a rectangular cuboid and side length 1308 can be about 20 mm. In some embodiments, atomic raster imager 1300 can conduct polarization mapping at a selected input signal 1310 frequency. For example, as shown in FIG. 13B, atomic raster imager 1300 can include quarter-wave plate 1330 to polarize O-EM laser beam 1303. In some embodiments, rastering mirror 1320 can scan (e.g., raster) O-EM laser beam 1303 in atomic cell 1306 at a frequency of about 1 Hz to about 10 Hz. In some embodiments, atomic raster imager 1300 can be configured for near-field (e.g., reactive and Fresnel zones) to far-field electric field and/or polarization mapping.

Exemplary Ultra-Sensitive Electrometry with Rydberg Vapors

Figure 14:
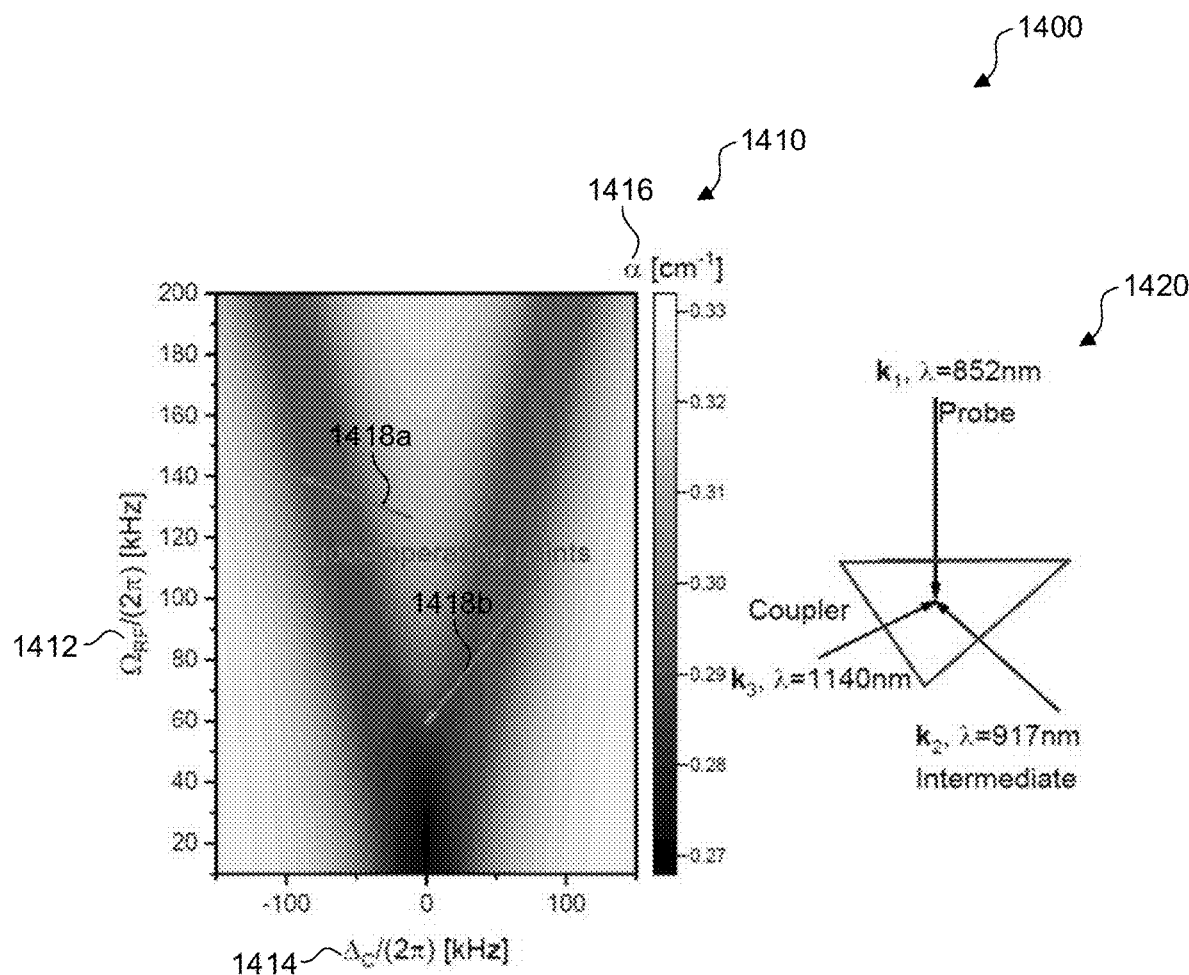
FIG. 14 is a plot of a 3-photon Rydberg electromagnetically induced transparency (EIT) Autler-Townes (AT) spectrum for three in-plane beams, according to exemplary embodiments.
Figure 15:
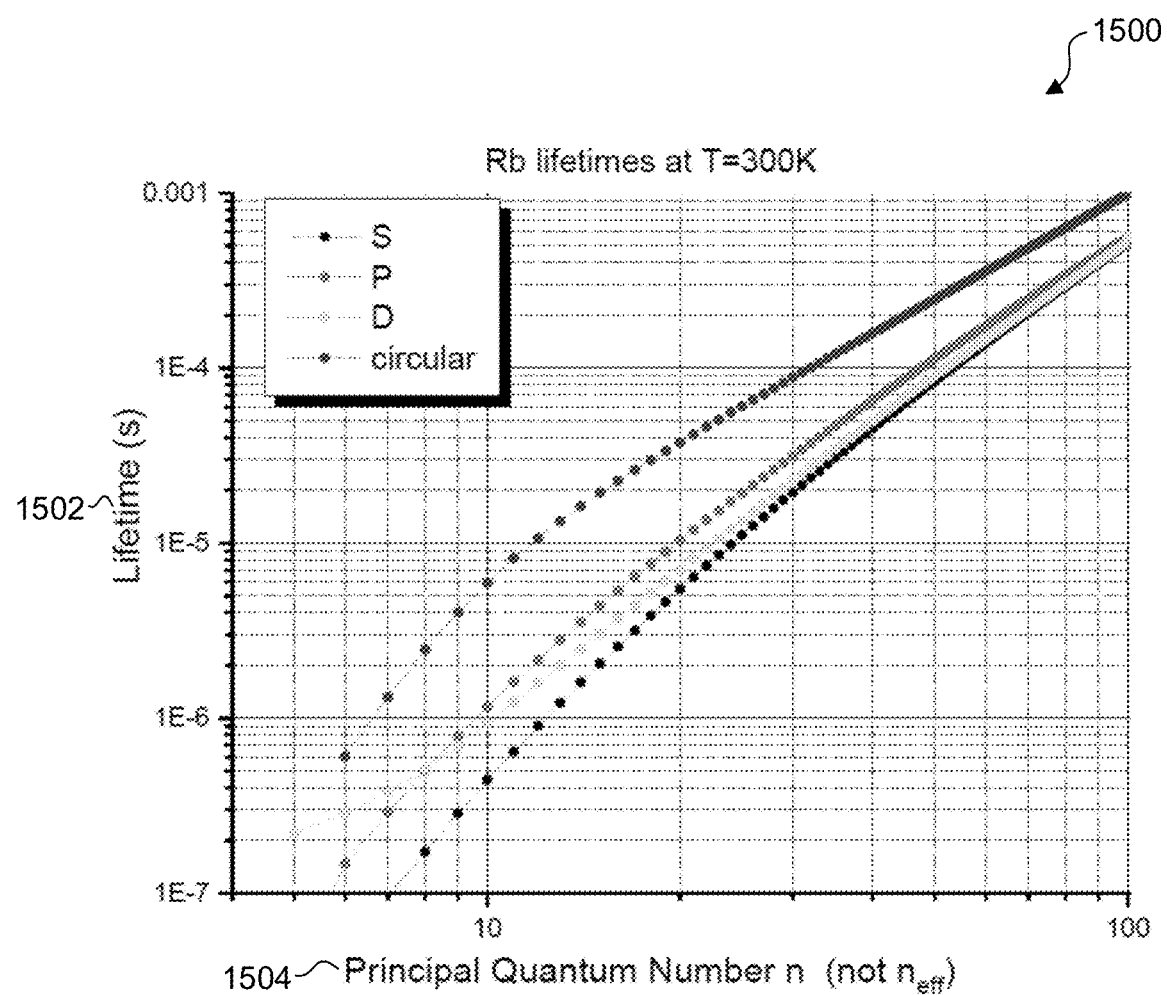
FIG. 15 is a plot of rubidium (Rb) lifetimes as a function of Rydberg states, according to an exemplary embodiment.
Figure 16:
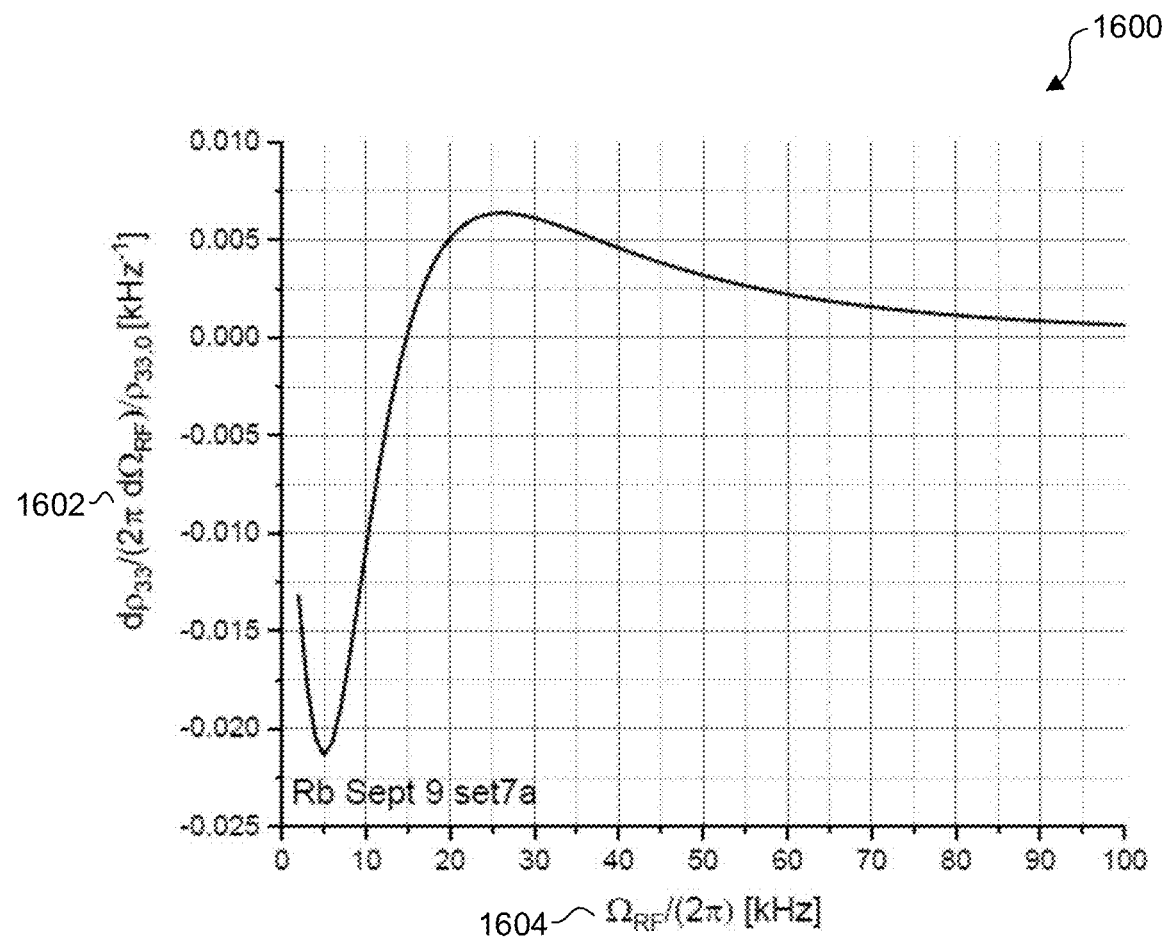
FIG. 16 is a plot of a 4-photon Doppler-corrected Rydberg EIT spectrum, according to an exemplary embodiment.

FIGS. 14-16 illustrate a system and method for ultra-sensitive electrometry with Rydberg vapors, according to various exemplary embodiments. FIG. 14 is a plot 1400 of a 3-photon Rydberg electromagnetically induced transparency (EIT) Autler-Townes (AT) spectrum for three in-plane beams. FIG. 15 is a plot 1500 of rubidium (Rb) lifetimes as a function of Rydberg states. FIG. 16 is a plot 1600 of a 4-photon Doppler-corrected Rydberg EIT spectrum.

Atom-based sensing of RF fields takes advantage of large transition electric dipole moments of Rydberg states, a property that has been known since the early days of quantum mechanics. Vapor-cell technologies as well as quantum-optics methods, such as nonlinear wave mixing in atomic vapors and Rydberg EIT have recently been employed to exploit this property, reaching a level of sensitivity that begins to approach that of traditional antenna and amplifier technology. Atom-based sensing has advantages such as SI-based, absolute and re-calibration-free measurement capability, small sensing elements, EMI- and EMP-proof capabilities, all-optical sensor heads and more.

To describe the potential impact, the final target sensitivity of 0.1 nV/cm at 1 Hz bandwidth for a 10 GHz RF field is considered. As an example, the history-making 1977 Voyager space probes, which, from an RF viewpoint, are sets of science experiments built on the backs of high-gain antennas (HGA) for long-distance space communication. The Voyager probes are currently at a distance of $2.2 \times 10^{13}$ m (about five times the distance to Pluto). The HGAs have 48 dBi gain, transmit in the X-band at 8.42 GHz with several tens of W of power, sufficient to still communicate with Earth. The received field is on the order of 0.3 nV/m, or about 30 times below the ultimate sensitivity of the system and method set out in the present disclosure (at 1 Hz bandwidth). Noting that NASA uses a 70 m, 34.6 dBi gain dish, the field of Voyager's signal in the receiver element maps into about two times the ultimate field limit of the system and method stated in the present disclosure. For further illustration, the power of a 0.1 nV/cm field passing through a 1 cm2 vapor cell is about −200 dBm. This is well below civilian and military receiver standards to date. In short, the impact of instruments reaching the ultimate sensitivity of the system and method of the present disclosure will be transformational in science and technology with disruptive and broad impact in defense and commercial RF applications.

The RF field-sensitivity and band performance metrics in Cs and Rb vapor-cell sensors is reached using multi-photon Rydberg spectroscopy based on EIT, low-light detection and single-photon counting, and heterodyne techniques, among others. Primary improvements in RF sensitivity in Rydberg electrometry from the state-of-the-art today to reach the present disclosure include four new aspects to the sensing approach: (1) multidimensional Doppler-match for true Doppler-free Rydberg spectroscopy in vapors at the homogenous Rydberg linewidth, (2) increased optical beam sizes or atom-light interaction times for reduced transit-time broadening, (3) specialized vapor cell geometries and chemically treated vapor cells for reduced surface perturbations, and (4) laser beam-power stabilization, frequency-comb-based laser-frequency stabilization at the kHz-level, and heterodyne optical and RF sensing techniques.

The interaction of Rydberg atoms with RF electric fields falls into Autler-Townes (AT), AC-shift, and Floquet regimes, in ascending order of field intensity. Here, the AT regime is used to reach the lowest detectable fields at RF frequencies of atom-field resonance. These resonant frequencies follow from the well-known Rydberg-Ritz formula. The field sensitivity can be expressed as a fraction of the AT splitting divided by the transition dipole moment, $h\Omega_{RF}/d$, with the RF Rabi frequency $\Omega_{RF}$, which essentially is the spectroscopically measured AT spitting that is limited by the EIT linewidth. The quantum mechanics to calculate RF transition frequencies and d-values are well-established. In some embodiments, customized programming and codes can be implemented for rapid adaptability to evolving needs, improving quantum-defect data, etc.

The strongest transitions of cesium are nD−(n+1)P, because the non-integer parts of the quantum defects of these states differ by only about 0.1. For these transitions, the system and method's frequency range (100 GHz to 10 GHz) corresponds with a range of the principal quantum number n from 21 to 42, and a range of the radial matrix element d from 500 to $2200ea_0$. These d-values are close to the fundamental limit of $2n^{*2}$ (n* is the effective principal quantum number). In rubidium, the level structure among S, P, and D states is more evenly spaced. As a result, for the Rb nD−(n+1)P transitions the system and method's frequency range corresponds with an n-range from 30 to 60 and a radial-matrix-element range of 1000 to $4500ea_0$. For this class of transitions and at a given approximate frequency, Rb has a higher n-value than Cs, leading to a larger dipole moment. In terms of dipole moment and field sensitivity, Rb is therefore generally better.

One can consider unwanted perturbations, which sometimes favor cesium. Vapor cells have weak stray DC electric fields, black-body thermal fields (BBR), and Rydberg-atom interactions with ground-state and other Rydberg atoms. DC polarizabilities scale as $n^7$, BBR and dipolar interactions in the atomic gas as $n^3$, and van-der-Waals shifts as $n^{11}$. These aspects favor low over high n. The optical Rydberg excitation strengths scale as $n^{-3}$, also favoring lower n. The radiative and BBR lifetimes of low-angular-momentum states scale as $n^3$, favoring high n.

Another important consideration relates to the vapor cell size. Signal-strength and interaction-time broadening require fairly large beam diameters, hence large cell sizes. Here, one may target cell sizes on the order of 1 cm. Therefore, material surface effects will range lower on the scale of perturbations affecting sensitivity.

To reach the Doppler-free homogeneous Rydberg EIT linewidth, $(\Omega_C^2+\Omega_P^2)/\Gamma_2$ with coupler and probe Rabi frequencies $\Omega_C$ and $\Omega_P$, and intermediate-state decay rate $\Gamma_2$, it is necessary to perform a Doppler match in the entire 3-dimensional velocity space. This can be done in a planar geometry, for a wide range of cases of Cs and Rb transitions. For example, as shown in FIG. 14, a sample case in Cs with 3 photons is shown. Note the $2^{nd}$ stage is 1 GHz off-resonant to shift the $k_2$-resonance in velocity space out of the Doppler profile. The two-photon ($k_2k_3$) Rabi frequency is on the order of 200 kHz, and the probe Rabi frequency 500 kHz. To obtain this result, and similar results for other cases, the Lindblad equation can be solved to arrive at EIT absorption coefficients, photon scattering rates, and other observables that can be used in RF field sensing and integrate over the multi-dimensional velocity space.

In some embodiments, as shown in FIG. 14, an EIT AT spectrum 1410 for a sample case in cesium can be calculated for a case of 3-photon Rydberg-EIT with three beams in a plane 1420. Angles can be chosen to eliminate Doppler shifts in all dimensions. The data show the velocity-averaged absorption coefficient at a vapor density near room temperature. In Cs there is at least one accidental solution with all-collinear beam paths. However, this solution has non-favorable wavelengths in the deep IR. Here, a theory in multidimensional velocity space that encompasses both generic and exceptional collinear cases is employed.

FIG. 14 shows plot 1400 of an AT-split Rydberg line 1410 as a function of coupler-frequency detuning (x-axis) 1414 and RF Rabi frequency (y-axis) 1412. One sees the usual pair of AT-split EIT lines. Highest sensitivity to an RF signal wave is achieved by using a RF reference wave or local oscillator (LO) that is offset in frequency from the RF signal to be measured by a few kHz, for example. It must be stressed that in RF detection via AT splitting the purpose of the LO is not to induce heterodyne gain (because a linear response in field negates LO gain). Rather, the purpose of the LO is to (1) enable RF detection at a beat frequency where noise is down, and (2) to shift the operating point away from the x-axis 1414 into a domain with maximal $s=d\alpha/[d\Omega_{RF}/(2\pi)]$ (that is, the y-gradient 1418b in the plot). The two red arrows 1418a, 1418b in FIG. 14 indicate usable operating points. The signal is then extracted by detecting the heterodyne beat amplitude of the signal with the LO using a lock-in amplifier or a spectrum analyzer. The beat amplitude in absorption, $\Delta\alpha$ 1416, then provides the signal RF field strength via $E_{RF}=h \Delta\alpha/(s\,d)$, with dipole moment d and the slope value s.

In some embodiments, as shown in FIG. 15, lifetimes 1502 of several types of Rydberg states 1504 of Rb at room temperature can be calculated. The calculation includes all black-body effects. The downward "curving" of the lifetimes at higher n is due to BBR-driven decay, excitation, and photo-ionization. In FIG. 15, s is calculated to be about 0.6 $cm^{-1}$/MHz, with the RF Rabi frequency in units Hz.

The measured signal is modeled using this atomic-physics input as well as considering technical and shot noise in the detection. The noise floor $\Delta E_{RF}$ follows from the smallest $\Delta\alpha$ that can be detected. In some embodiments, with lock-in detection, $\Delta\alpha/\alpha\sim10^{-5}$. For an estimate, here $\Delta\alpha/\alpha\sim2\times10^{-5}$, $d=1000\,ea_0$ (which includes an angular matrix element), and a background value $\Delta\alpha=0.3\,cm^{-1}$ to arrive at $\Delta E_{RF}\sim10$ nV/cm. In some embodiments, the system and method of the present disclosure can have a noise floor $\Delta E_{RF}$ (e.g., sensitivity) of about 10 nV/cm for 10 GHz and 1 Hz detection bandwidth. In some embodiments, with a factor of ~10× difference in dipole moment for resonant transitions, the system and method of the present disclosure can have a noise floor $\Delta E_{RF}$ (e.g., sensitivity) of about 100 nV/cm for 100 GHz and 1 Hz detection bandwidth.

Before discussing various improvements, a few other important conditions need to be discussed. Since sensitivity necessitates the narrowest possible EIT lines, apart from an effective Doppler match, the interaction-time broadening must be reduced into the range of 10 kHz, meaning beam diameters of interest are in the range of 1 cm. Hence, cells with custom walls and diameters on the order of 1 cm may be implemented. As shown in FIGS. 15 and 16, the 10-kHz target linewidth value follows from the 300-K lifetimes of the atoms due to natural decay and black-body radiation at n-values near 30 and up (e.g., see FIGS. 15 and 16, from which the linewidth follows as 1/lifetime/(2π); note the helpful factor of 2π). In some embodiments, for the lifetime calculations, one can sum over all upward and downward electric-dipole transitions, as well as an integral over BBR-induced photoionization.

A large cell size comparable to RF wavelength requires RF simulations or characterization to address standing-wave effects. Further, the placement of the LO field source is carefully considered. The probe-laser powers are very low, to reach the homogeneous EIT linewidth, and may require APD and SPCM detector modules to approach the optical shot-noise floor. The large beam size may require an optical build-up cavity for the Rydberg excitation optical field. In some embodiments, as an alternate to direct probe-field detection, the second-excited level, $\rho_{33}$, can be probed via fluorescence detection. For example, this can be done with a four-photon scheme. Good candidates for this are fluorescence monitoring of blue decay light and/or monitoring the D1 decay while exciting on the D2 line or vice versa. Any of these methods may require SPCM and interference filters.

In some embodiments, as shown in FIG. 16, four-photon Doppler-corrected Rydberg EIT 1600 in a case of Rb can be plotted by the derivative of $\rho_{33}$ divided by the background $\rho_{33}$ 1602 versus RF Rabi frequency 1604 at zero coupler detuning. For example, highest heterodyne sensitivity can correspond with LO RF Rabi frequencies where this slope is large. In some embodiments, the data can include the velocity average in all dimensions, at a vapor density near room temperature.

In some embodiments, the system and method of the present disclosure can have a 1 Hz detection bandwidth. A higher bandwidth, will help in achieving the high sensitivity, which is expressed in units field per $\sqrt{Hz}$. In some embodiments, various 4-photon cases can be simulated, for example, one of which is for Rb with fluorescence detection. For example, all effective two-photon Rabi frequencies in the simulation of FIG. 16 are in the range of 100 kHz, leading to sub-10-kHz EIT linewidth. A Rydberg decay rate of $2\pi\times10^4 s^{-1}$ is assumed. With $\rho_{33}$ in this simulation of $\sim10^{-4}$, $10^{10}$ atoms in the field, a single-atom scattering rate of $\sim10^7 s^{-1}$, and an SPCM efficiency of $10^{-4}$ including angular collection losses, the photon count rate is $10^9$/s, for which an analog APD would be suitable. One may then expect a $10^{-4}$ sensitivity in $\Delta\rho_{33}/\rho_{33}$, with 1 second detection bandwidth. Using FIG. 16, and $d=2000\,ea_0$ for the target RF Rydberg transition, this maps into a field sensitivity of $\Delta E_{RF}=(d\rho_{33}/\rho_{33}\;d\Omega_{RF})^{-1}\times10^{-4}\times h/d$, which is about 1 nV/cm (at 1 Hz bandwidth). In some embodiments, the system and method of the present disclosure can have a sensitivity of 0.1 nV/cm/$Hz^{0.5}$ for 10 GHz and 1 nV/cm/$Hz^{0.5}$ for 100 GHz RF by, for example, improvements in signal-to-noise, such as an improvement of collection efficiency of light from $10^{-4}$ to $10^{-2}$, which could yield a factor-of-ten improvement, as well as a reduction of laser intensity noise. In some embodiments, a wider range of combinations of possible 4-photon transitions, optical Rabi frequencies, AC-shift cancellations (which were conducted but not discussed), intermediate-state detunings, etc. can be used.

In some embodiments, the RF frequency resolution is automatically achieved via LO and heterodyne detection. The EIT speed (the time scale at which the Rydberg population can reach a quasi-steady-state) is limited by the intermediate-state decay rate and the optical excitation Rabi frequencies. Here, beat RF frequencies at about 1 kHz, at the highest sensitivity, appear reasonable, leading to fractional instantaneous bandwidth $\Delta f/f\sim10^{-7}$. This is an order of magnitude greater than target fractional instantaneous RF bandwidth of $10^{-6}$ (10 kHz at 10 GHz and 100 kHz at 100 GHz). In some embodiments, the bandwidth estimates can reflect the overall reduction of EIT linewidth towards the homogeneous Rydberg-level width.

Appendices A-N: Exemplary Atom-Based Closed-Loop Controls

Appendices A-N, appended herein and described below, illustrate atom-based closed-loop control apparatuses, systems, and methods, according to various exemplary embodiments, which are hereby incorporated herein in their entireties by reference.

Appendix A: "A self-calibrating SI-traceable broadband Rydberg atom-based radio-frequency electric field probe and measurement instrument," David A. Anderson et al., arXiv:1910.07107v2, pages 1-12, published Oct. 18, 2019, is hereby incorporated herein in its entirety by reference.

Appendix B: "Room-temperature Rydberg THz maser," David A. Anderson and Georg Raithel, Internal document, pages 1-6, Nov. 26, 2019, is hereby incorporated herein in its entirety by reference.

Appendix C: "Rydberg-based quantum RF phase detector and receiver," David A. Anderson and Georg Raithel, Internal document, pages 1-4, is hereby incorporated herein in its entirety by reference.

Appendix D: "Optical RF phase sensing and measurement with Rydberg atom vapors," Internal document, pages 1-2, is hereby incorporated herein in its entirety by reference.

Appendix E: "Rydberg atoms for radio-frequency communications and sensing: atomic receivers for pulsed RF field and phase detection," David A. Anderson et al., arXiv:1910.07970v1, pages 1-10, published Oct. 17, 2019, is hereby incorporated herein in its entirety by reference.

Appendix F: "Time dependence of Rydberg EIT in pulsed optical and RF fields," Rachel E. Sapiro et al., J. Phys. B: At. Mol. Opt. Phys. 53, 094003, pages 1-10, published Apr. 3, 2020, is hereby incorporated herein in its entirety by reference.

Appendix G: "Rydberg high-speed, high resolution MMW 2D near-field imager," David A. Anderson, Internal document, page 1, October 2019, is hereby incorporated herein in its entirety by reference.

Appendix H: "Rydberg high-speed, high resolution MMW 2D near-field imager," Internal document, page 1, Feb. 6, 2020, is hereby incorporated herein in its entirety by reference.

Appendix I: "Rydberg Radio Receiver," David A. Anderson, Internal document, page 1, Nov. 21, 2019, is hereby incorporated herein in its entirety by reference.

Appendix J: "Atom-based magnetic field monitor," Internal document, pages 1-12, June 2019, is hereby incorporated herein in its entirety by reference.

Appendix K: "Atom-based optical RF-power/voltage transducer and sensor," Rachel E. Sapiro et al., American Physical Society (APS): Atomic, Molecular, and Optical Physics, Vol. 64, No. 4, Poster abstract (L01.00031), page 1, May 29, 2019, is hereby incorporated herein in its entirety by reference.

Appendix L: "An atomic receiver for AM and FM radio communication," David A. Anderson et al., arXiv:1808.08589v1, pages 1-6, published Aug. 26, 2018, is hereby incorporated herein in its entirety by reference.

Appendix M: "Widely wavelength-tunable narrow-linewidth laser using position-scanned cavity filter," Internal document, page 1, May 1, 2019, is hereby incorporated herein in its entirety by reference.

Appendix N: "Diagram of atomic radio-frequency interferometer for optical RF phase and amplitude sensing: implementation in a Cesium Rydberg vapor," Internal document, page 1, Apr. 1, 2019, is hereby incorporated herein in its entirety by reference.

Appendix A: Exemplary Self-Calibrating SI-Traceable Broadband Rydberg Atom-Based Radio-Frequency Electric Field Probe and Measurement Instrument Appendix A: "A self-calibrating SI-traceable broadband Rydberg atom-based radio-frequency electric field probe and measurement instrument," David A. Anderson et al., arXiv:1910.07107v2, pages 1-12, published Oct. 18, 2019, is hereby incorporated herein in its entirety by reference.

Figure 17A:
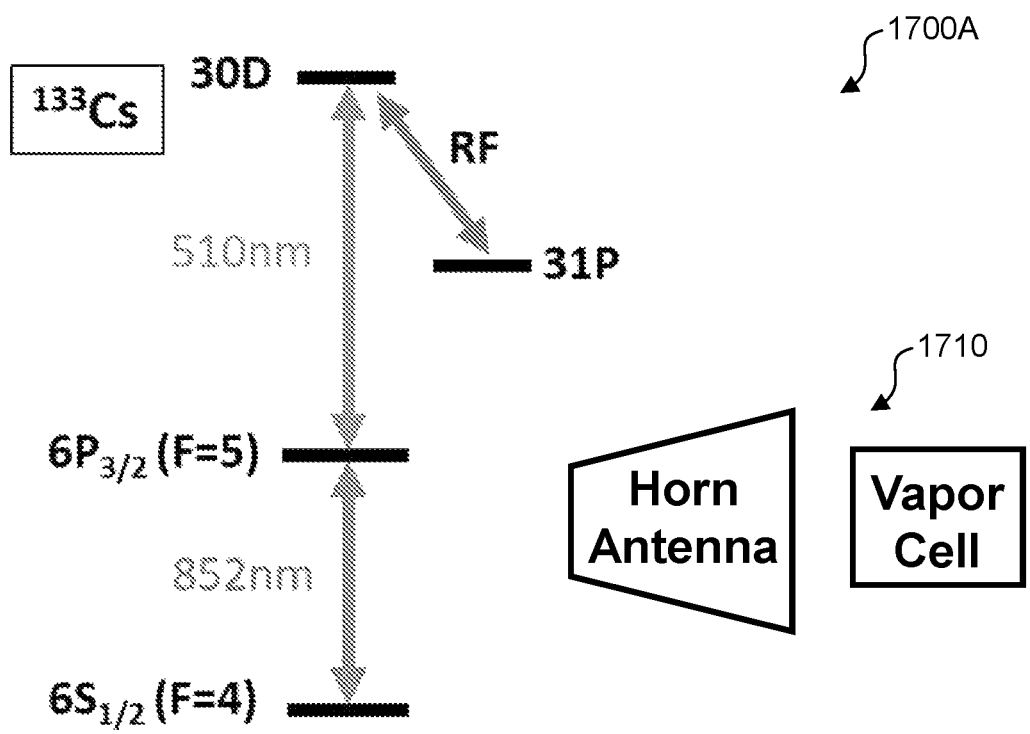
FIG. 17A is a schematic illustration of an atomic energy-level diagram for a two-photon Rydberg EIT optical readout scheme for a cesium vapor, according to an exemplary embodiment.
Figure 17B:
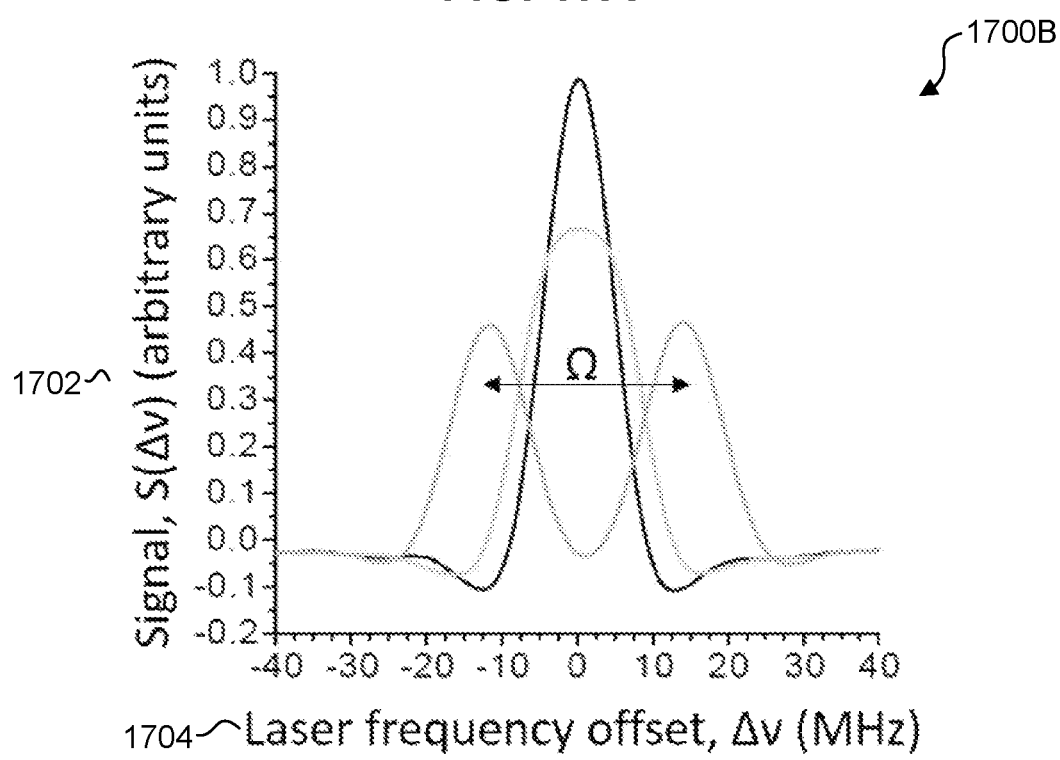
FIG. 17B is a plot of an optical readout from an atomic vapor of a Rydberg EIT resonance as a function of laser frequency offset, according to an exemplary embodiment.

FIGS. 11A-11F and 17A-26 illustrate a self-calibrating SI-traceable broadband Rydberg atom-based RF E-field probe and measurement instrument, according to various exemplary embodiments. FIG. 17A is a schematic illustration of an atomic energy-level diagram 1700A for a two-photon Rydberg EIT optical readout scheme for a cesium vapor. FIG. 17B is a plot 1700B of an optical readout from an atomic vapor of a Rydberg EIT resonance 1702 as a function of laser frequency offset 1704.

Figure 18:
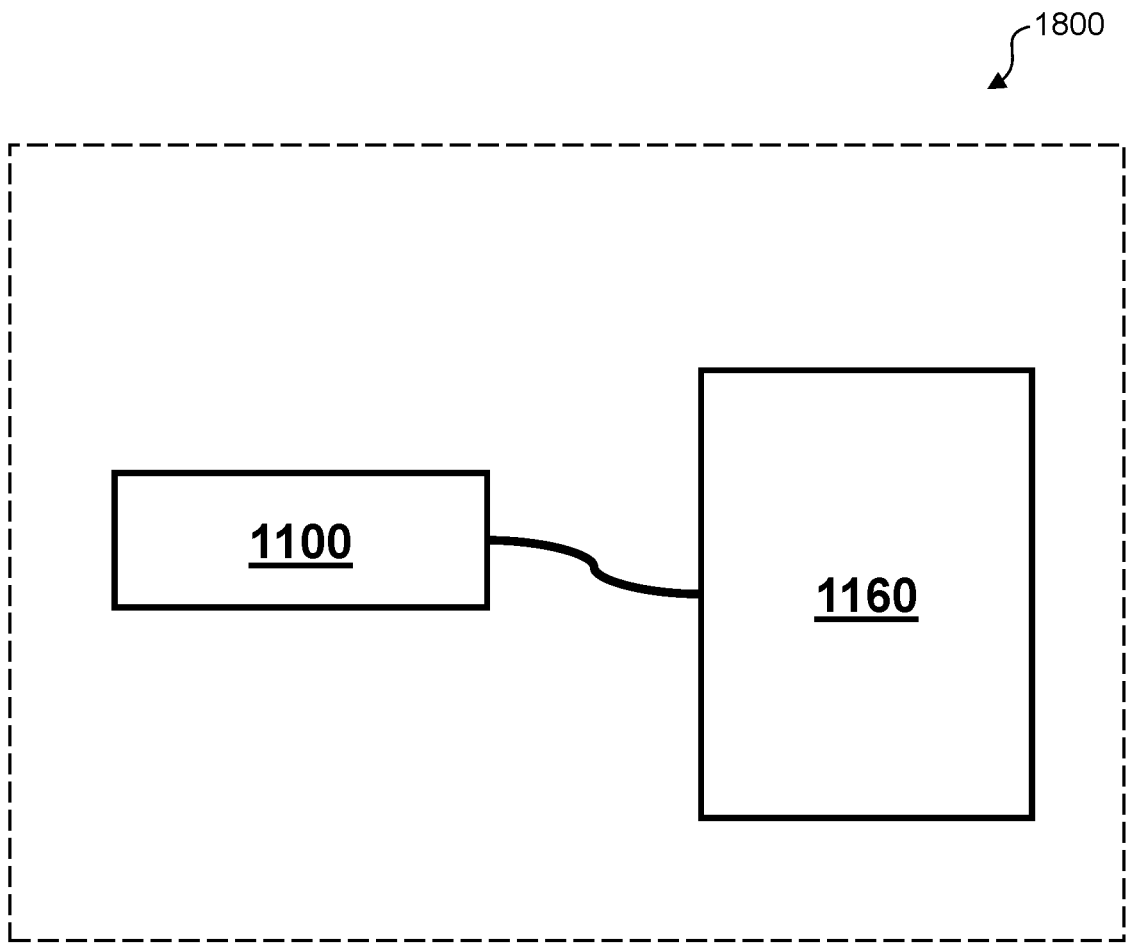
FIG. 18 is a schematic illustration of a Rydberg Field Measurement System (RFMS) with Rydberg field probe (RFP) and mainframe control unit, according to an exemplary embodiment.
Figure 19:
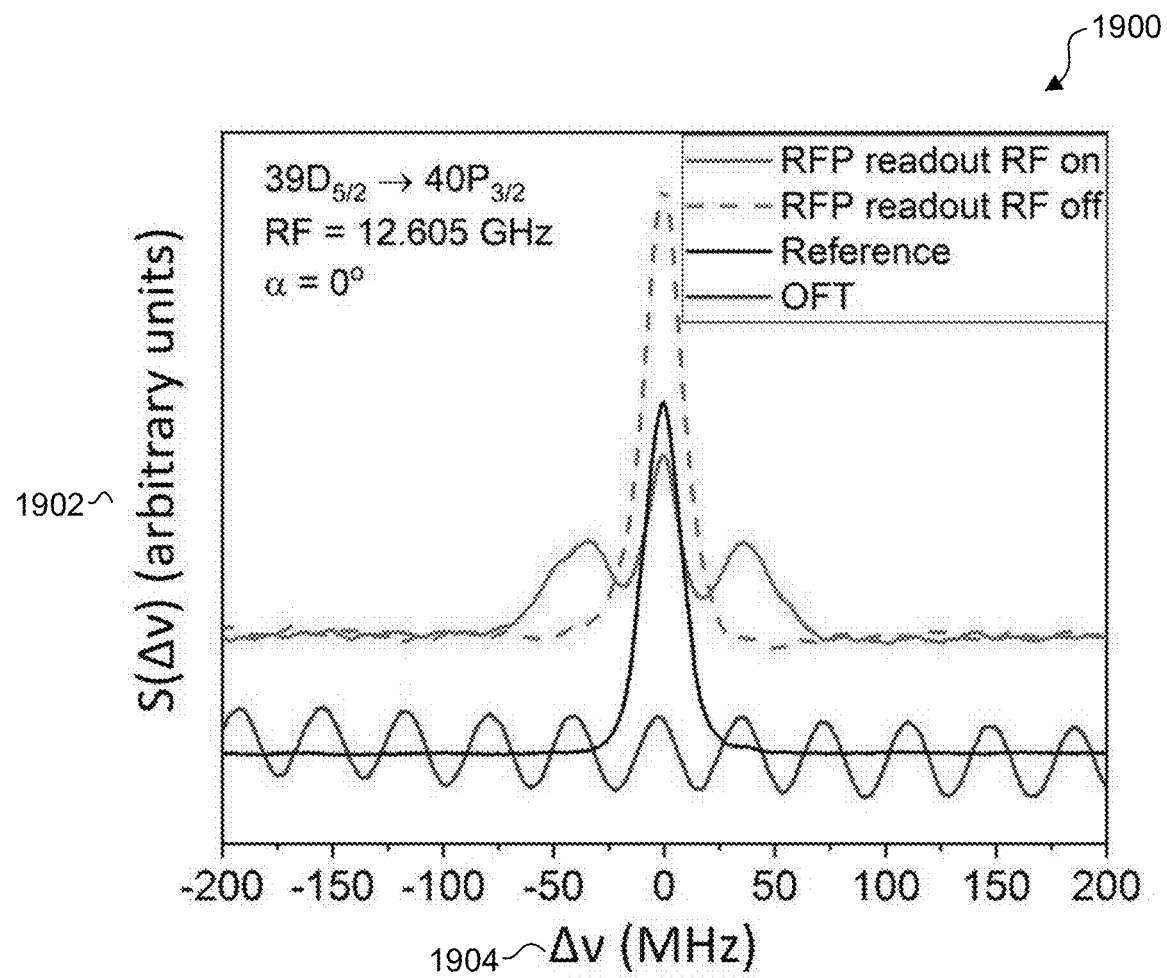
FIG. 19 is a plot of spectroscopic and optical signals as a function of laser-frequency detuning simultaneously collected by the RFMS shown in FIG. 18, according to an exemplary embodiment.
Figure 20A:
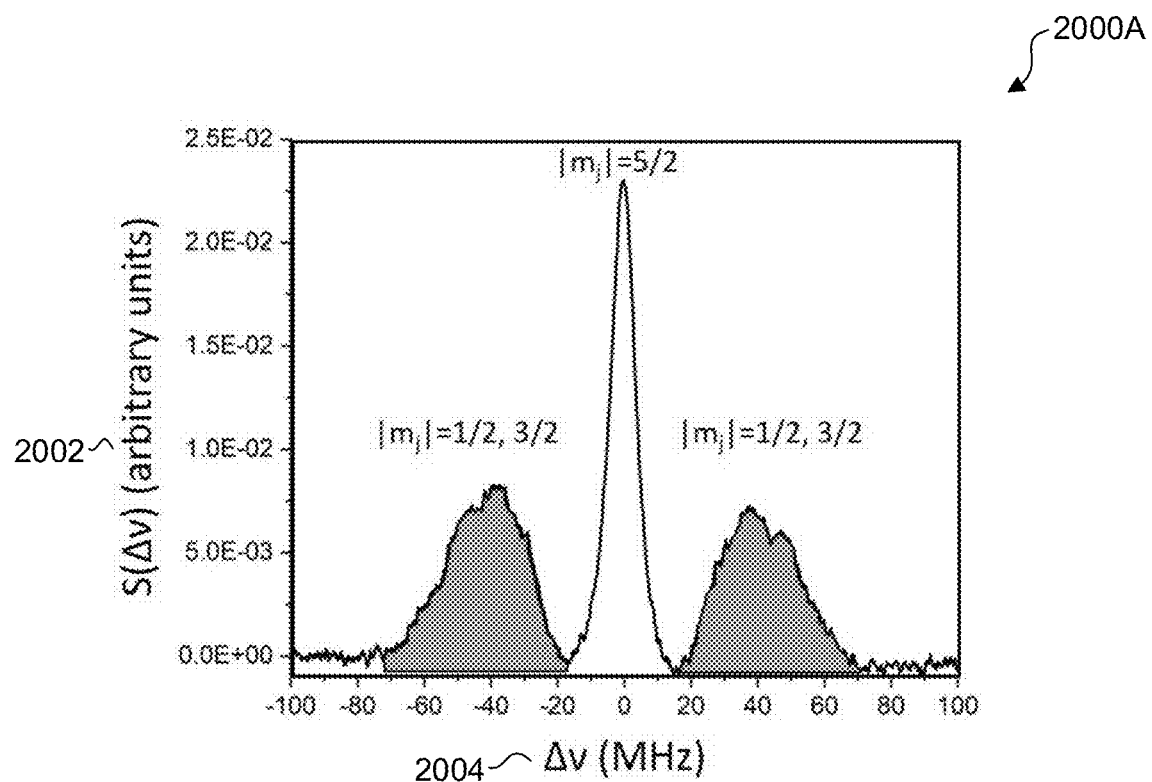
FIG. 20A is a plot of an optical atomic spectrum as a function of laser-frequency detuning for the RFP shown in FIGS. 11A, 11B, and 18, according to an exemplary embodiment.
Figure 20B:
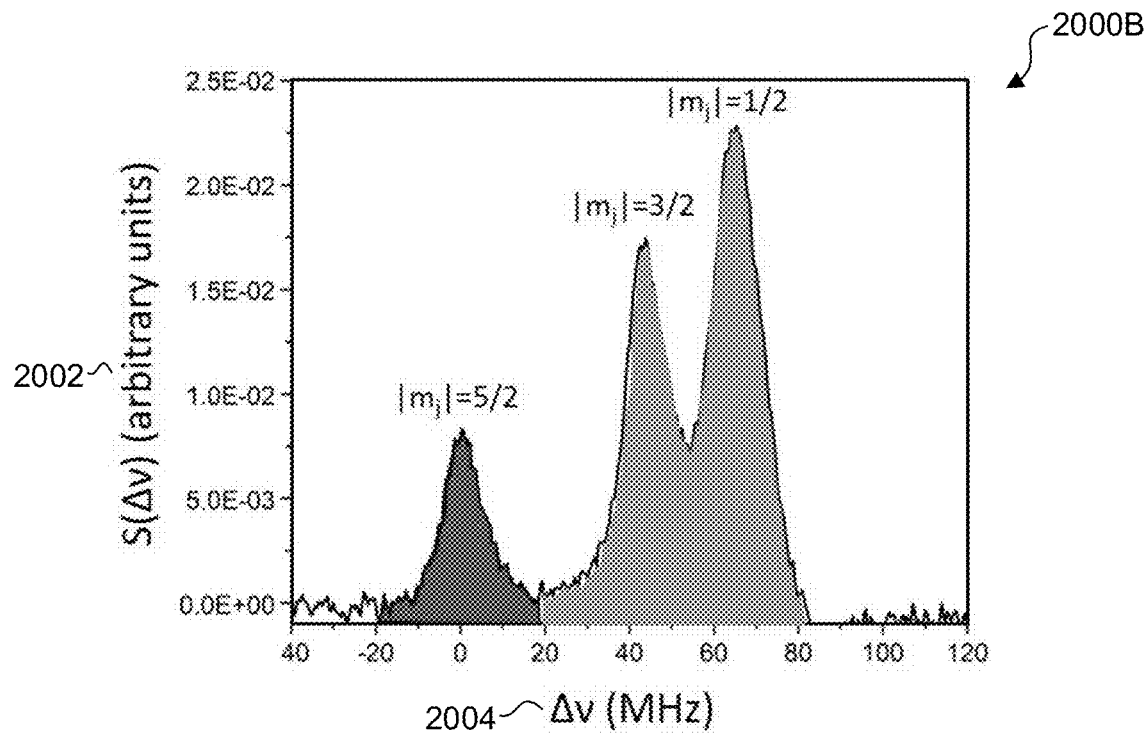
FIG. 20B is a plot of off-resonant AC Stark shifts as a function of laser-frequency detuning for the RFP shown in FIGS. 11A, 11B, and 18, according to an exemplary embodiment.

FIG. 18 is a schematic illustration of a Rydberg Field Measurement System (RFMS) 1800 with Rydberg field probe (RFP) 1100 and mainframe control unit 1160. FIG. 19 is a plot 1900 of spectroscopic and optical signals 1902 as a function of laser-frequency detuning 1904 simultaneously collected by RFMS 1800 shown in FIG. 18. FIG. 20A is a plot 2000A of an optical atomic spectrum 2002 as a function of laser-frequency detuning 2004 for RFP 1100 shown in FIGS. 11A, 11B, and 18. FIG. 20B is a plot 2000B of off-resonant AC Stark shifts 2002 as a function of laser-frequency detuning 2004 for RFP 1100 shown in FIGS. 11A, 11B, and 18.

Figures 21A, 21B, 21C:
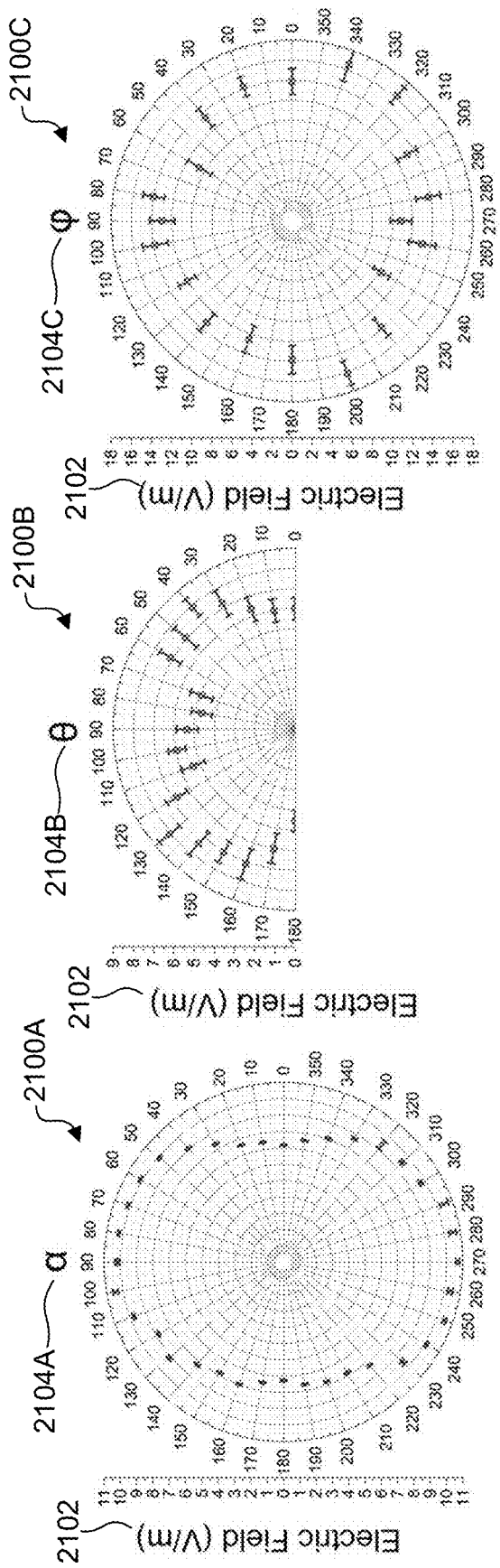
FIGS. 21A-21C are plots of E-field patterns for single-axis rotation angles of the RFP shown in FIGS. 11A, 11B, and 18, according to an exemplary embodiment.
Figures 22A, 22B, 22C:
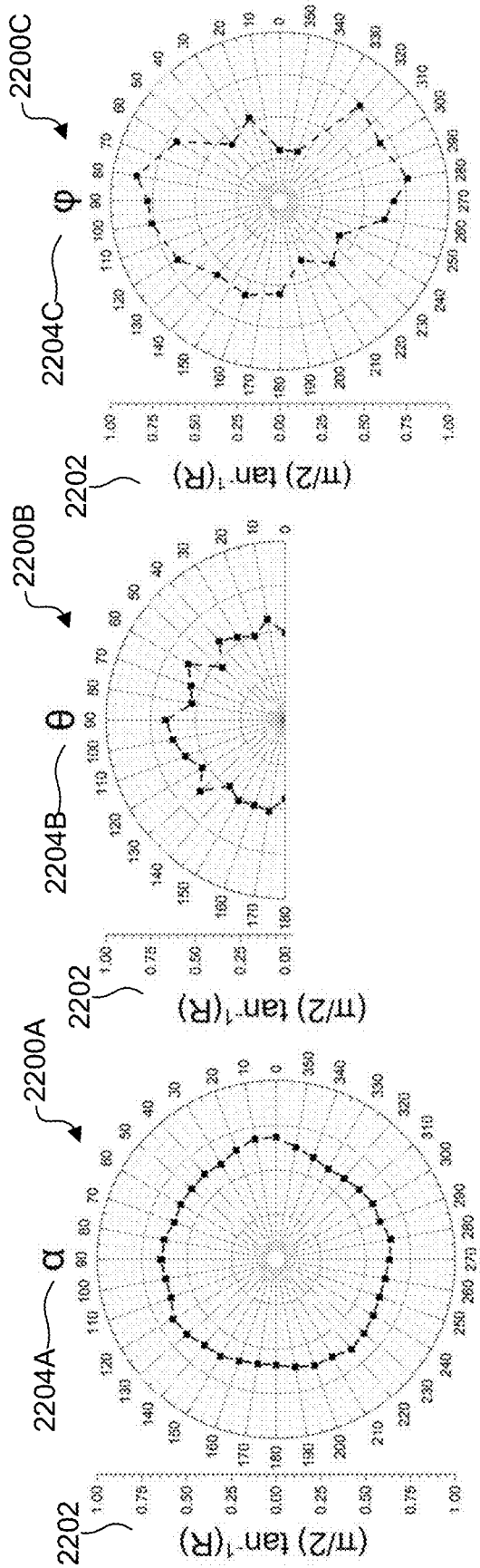
FIGS. 22A-22C are plots of polarization patterns using peak-height ratios R for single-axis rotation angles of the RFP shown in FIGS. 11A, 11B, and 18, according to an exemplary embodiment.
Figures 23A, 23B, 23C:
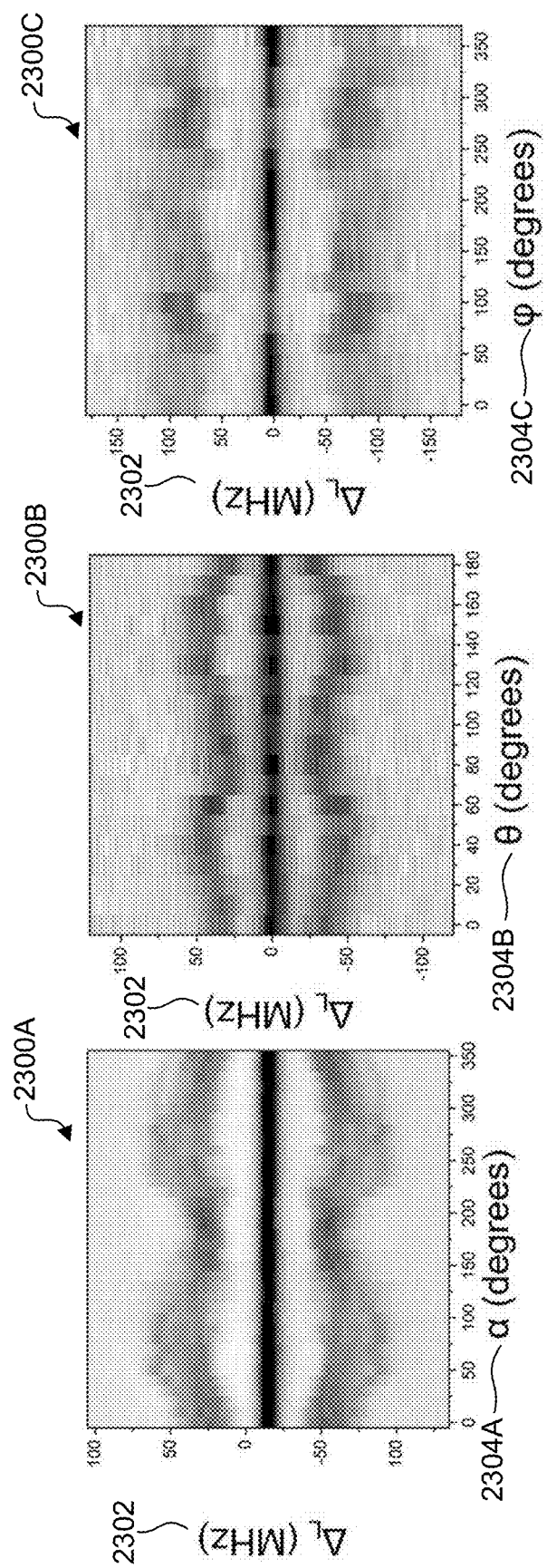
FIGS. 23A-23C are plots of atomic spectral output for single-axis rotation angles of the RFP shown in FIGS. 11A, 11B, and 18, according to an exemplary embodiment.

FIGS. 21A-21C are plots 2100A, 2100B, 2100C of E-field patterns 2102 for single-axis rotation angles 2104A, 2104B, 2104C of RFP 1100 shown in FIGS. 11A, 11B, and 18. FIGS. 22A-22C are plots 2200A, 2200B, 2200C of polarization patterns 2202 using peak-height ratios R for single-axis rotation angles 2204A, 2204B, 2204C of RFP 1100 shown in FIGS. 11A, 11B, and 18. FIGS. 23A-23C are plots 2300A, 2300B, 2300C of atomic spectral output 2302 for single-axis rotation angles 2304A, 2304B, 2304C of RFP 1100 shown in FIGS. 11A, 11B, and 18.

Figure 24A:
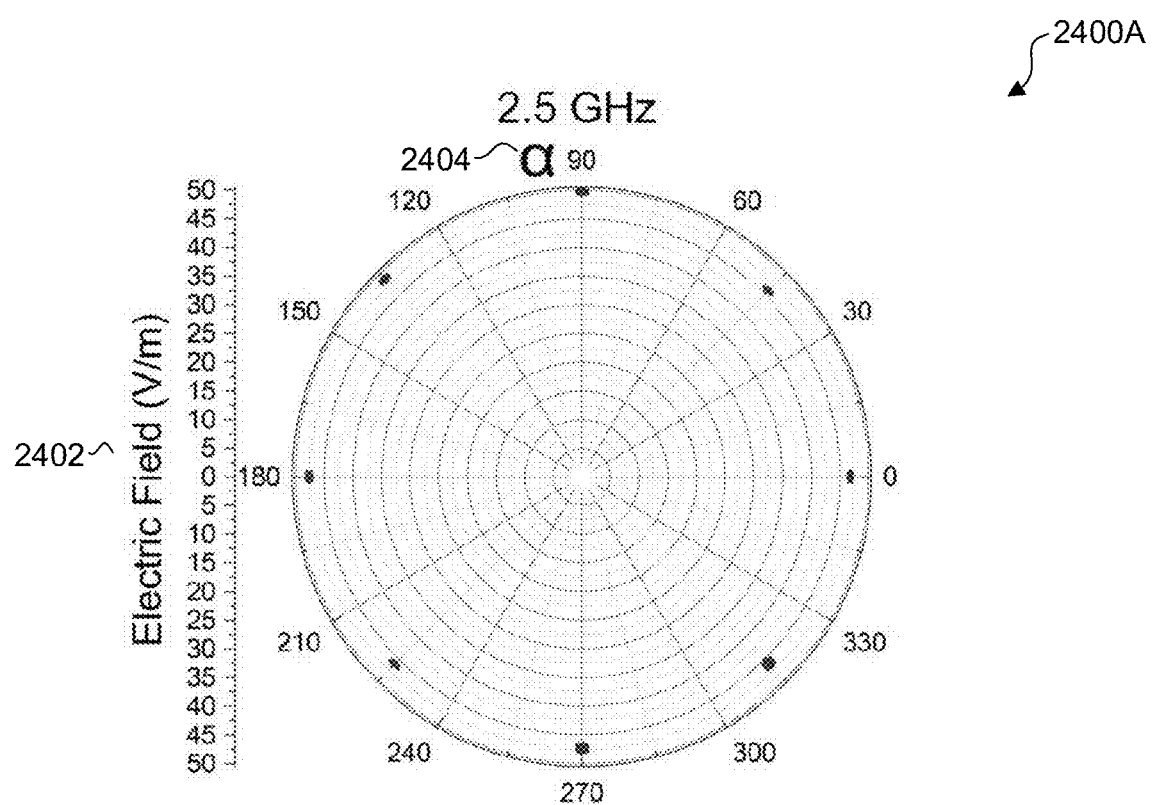
FIGS. 24A and 24B are plots of E-field patterns for a single-axis rotation angle of the RFP shown in FIGS. 11A, 11B, and 18, according to an exemplary embodiment.
Figure 24B:
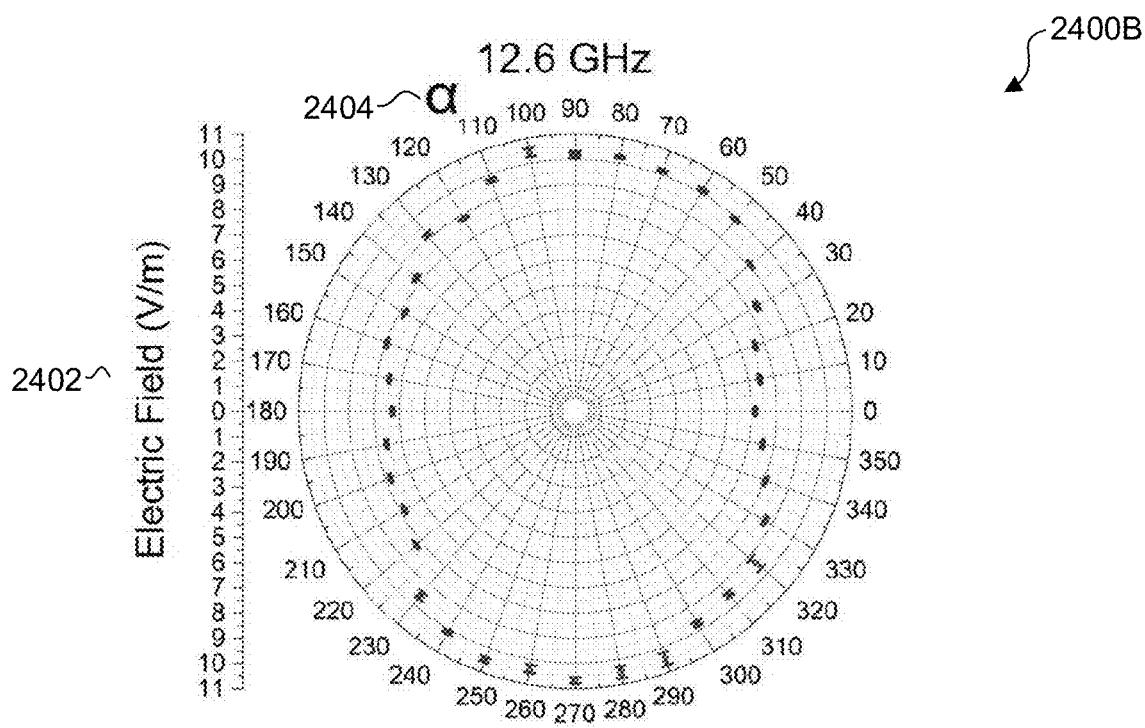
Figures 25A, 25B, 25C:
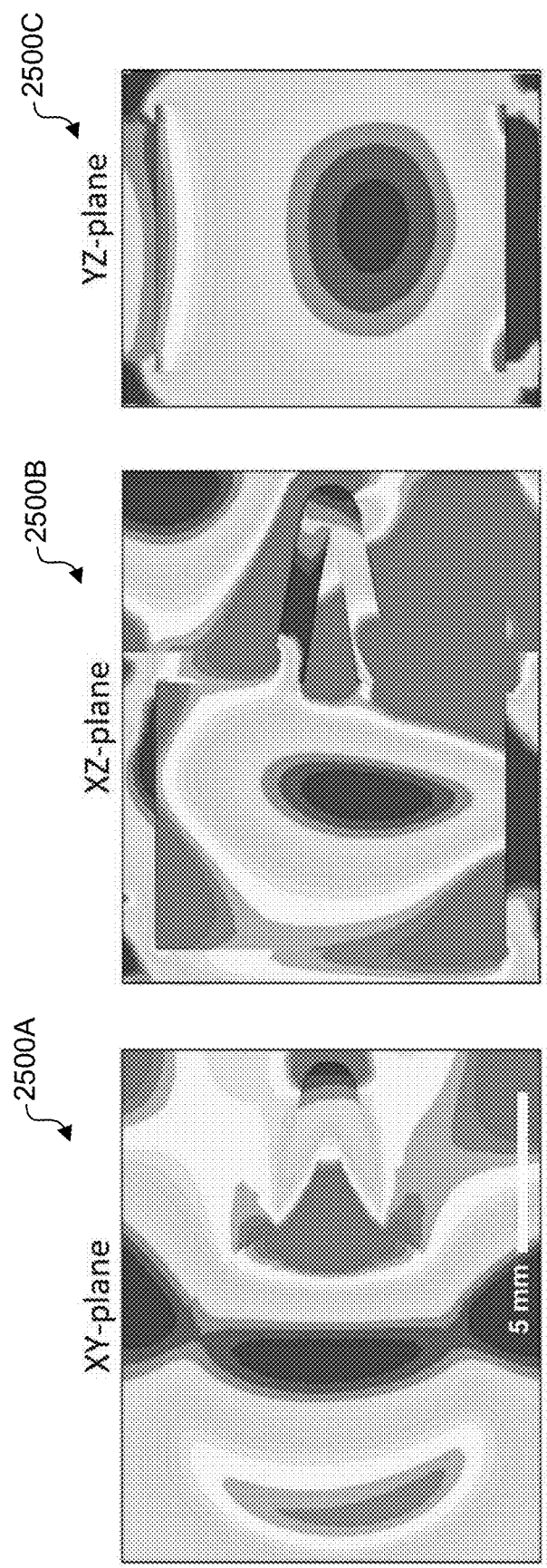
FIGS. 25A-25C are plots of total RF E-field for three planes of the RFP shown in FIGS. 11A, 11B, and 18, according to an exemplary embodiment.
Figure 26:
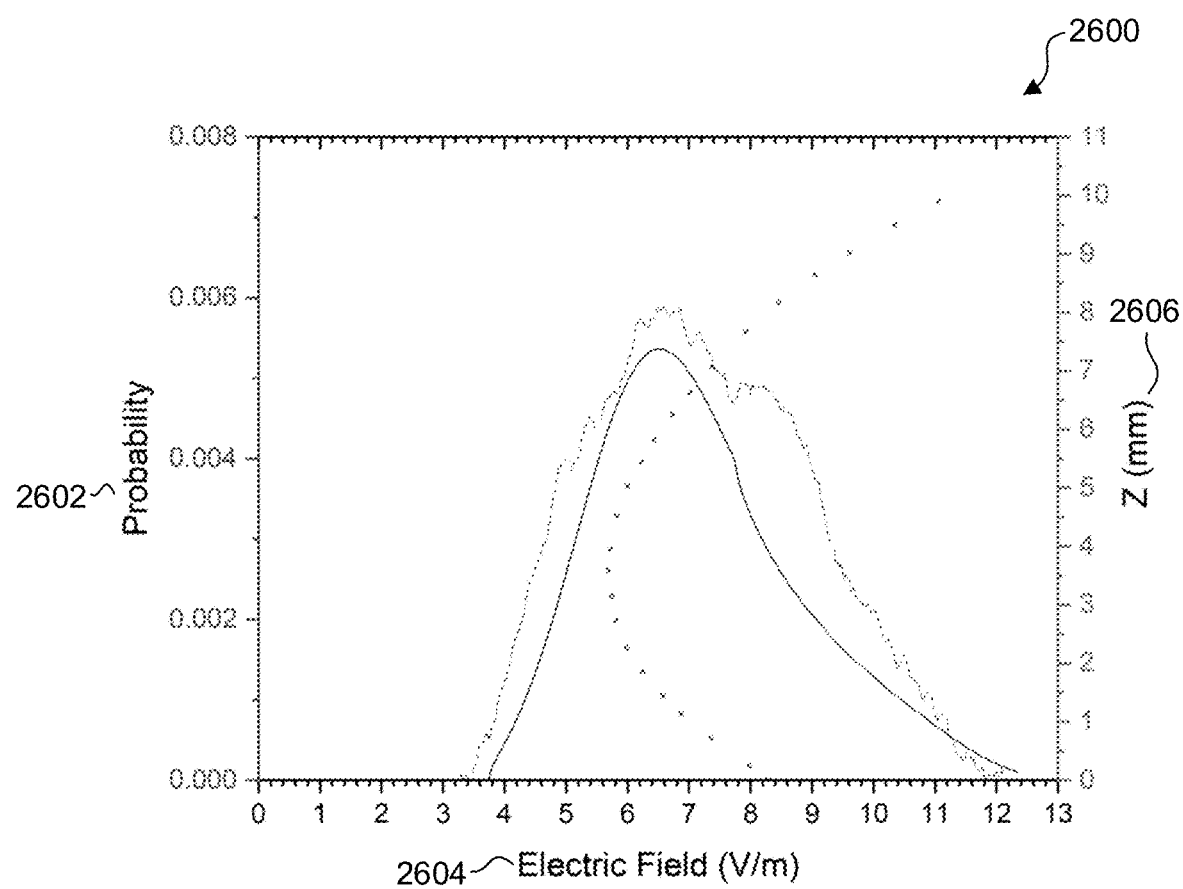
FIG. 26 is a plot of RF E-field probability distribution in the RFP atomic vapor along the optical beam path, according to an exemplary embodiment.

FIGS. 24A and 24B are plots 2400A, 2400B of E-field patterns 2402 for a single-axis rotation angle 2404 of RFP 1100 shown in FIGS. 11A, 11B, and 18. FIGS. 25A-25C are plots 2500A, 2500B, 2500C of total RF E-field for three planes of RFP 1100 shown in FIGS. 11A, 11B, and 18. FIG. 26 is a plot 2600 of RF E-field probability distribution 2602 in the RFP 1100 atomic vapor along the optical beam path 2606.

A self-calibrating, SI-traceable broad-band Rydberg atom-based radio-frequency (RF) electric (E) field probe (the Rydberg Field Probe or RFP 1100) and measurement instrument (Rydberg Field Measurement System or RFMS 1800) is presented. The RFMS 1800 comprises an atomic RF field probe (RFP) 1100, connected by a ruggedized fiber-optic patch cord to a portable mainframe control unit 1160 with a computer software interface for probe RF measurement and analysis including real-time field and measurement uncertainty readout, and spectral RF waveform visualization. The instrument employs all-optical electromagnetically induced transparency (EIT) readout of spectral signatures from RF-sensitive Rydberg states of an atomic vapor for self-calibrated, broadband measurements of continuous, pulsed, and modulated RF fields.

The RFP 1100 exploits resonant and off-resonant Rydberg-field interactions to realize broadband RF E-field measurements at frequencies ranging from ~10 MHz to sub-THz, over a wide electric-field dynamic range, with a single vapor-cell sensing element. The RFMS 1800 incorporates a RF-field-free atomic reference as well as a laser-frequency tracking unit to ensure RFMS reliability and accuracy of the RF E-field measurement. Atomic RF field measurement uncertainties reaching below 1% are demonstrated.

The RFP 1100 is characterized and measure polar field patterns along primary axes of the RFP 1100 at 12.6 GHz RF are measured, obtained by single-axis rotations of the RFP 1100 in the far-field of a standard gain horn antenna. Field pattern measurements at 2.5 GHz are also presented. The measured field patterns are in good agreement with finite-element simulations of the RFP 1100. The data confirm that the atom-based RF E-field probe is well-suited for broadband isotropic RF measurement and reception.

A calibration procedure and an uncertainty analysis are presented that account for deviations from perfectly isotropic response over $4\pi$ solid angle, which arise from asymmetric dielectric structures external to the active atomic measurement volume. The procedure includes contributions from both the fundamental atomic-spectroscopy measurement method and their associated analysis as well as uncertainty contributions due to material, geometry, and hardware design choices. The calibration procedure and uncertainty analysis yields a calibration (C) factor, used to establish absolute-standard SI-traceable calibration of the RFP 1100.

Polarization pattern measurements are also performed, demonstrating RF-polarization detection capability with the instrument that can optionally be implemented simultaneously with E-field measurements. RFP 1100 measurement capability for pulsed and modulated RF fields as well as direct, time-domain RF-pulse waveform imaging are demonstrated. A discussion of the practical use of the Rydberg atom-based RF E-field probe instrumentation in RF metrology towards the establishment of a new absolute (atomic) RF E-field measurement standard, application areas in RF measurement and engineering, and its value as a new quantum technology platform readily adaptable to specialized applications of Rydberg-based devices is discussed.

I. Introduction

Sensors and measurement devices for radio-frequency (RF) radiation at radio, microwave, sub-THz and THz frequencies enable capabilities essential to modern society with wide-ranging impact on industries spanning government and defense, telecommunications, electromagnetic compliance and safety, security, and medicine. To date, RF field sensing and measurement has primarily relied on antenna technology to measure or receive RF electric (E) fields. Advances in antenna technology continue to provide improvements in RF capabilities. Despite continuing advances, the very nature of traditional antenna technology, which is rooted in the driven oscillation of charges in a conductor induced by an incident RF electric field, imposes fundamental limits on the achievable accuracy, precision, and performance of probes and detectors for RF electric field measurement and sensing applications.

Atom-based quantum sensor technologies hold great promise for realizing capabilities beyond those achievable with traditional sensor technologies. Recent advances in exploiting properties of individual atoms in highly-excited Rydberg states using optical electromagnetically induced transparency (EIT) in atomic vapors, has afforded new capabilities in RF sensing, measurement, and imaging. Rydberg atom-based RF electric field (E-field) sensing provides a combination of performance capabilities beyond what is possible with traditional antenna and other solid-state RF detectors. This includes single-sensor ultra-broadband RF detection from HF to sub-THz and dynamic field ranges exceeding 120 dB, from field detection thresholds below 10 mV/m to high-intensity RF fields up to ~10 kV/m, with atomic ionization limits at the MV/m level.

Over a wide range of RF field amplitude and frequency, the Rydberg-based measurement method is rooted in physics models of the atom-field interaction that are dependent only on invariable atomic parameters and fundamental constants. This enables self-calibrated electric field measurements directly traceable to Planck's constant with atomic RF E-field measurement uncertainties reaching below 1%, an improvement of nearly an order of magnitude over existing antenna standards, holding promise to become a new global atomic RF measurement standard at National Metrology Institutes worldwide.

In the present disclosure, the first Rydberg RF E-field probe (Rydberg Field Probe or RFP 1100) and measurement instrument (Rydberg Field Measurement System or RFMS 1800) employing atom-based sensing using electromagnetically induced transparency (EIT) readout of spectral signatures from RF-sensitive Rydberg states in an atomic vapor is presented. The RFMS 1800 is a commercial instrument that comprises an atomic RF field probe (RFP) 1100, which houses a miniature atomic vapor-cell sensing element connected via a ruggedized fiber-optic patch cable to a portable rack-mounted control unit for remote probe operation and RF E-field measurement.

The RFMS 1800 is operated from a software user interface 1160 that provides real-time RF field measurement and uncertainty readout from the RFP 1100, and RF-analysis features that include spectral and RF waveform visualization. The RFMS 1800 measures RF fields by exploiting resonant and off-resonant Rydberg-RF field interactions in the RFP 1100, together with RF-field-free atomic references and active laser-frequency tracking to ensure high reliability and accuracy in atomic RF E-field measurements.

This disclosure is organized into the following sections. Section II provides a brief overview of Rydberg EIT readout in atomic vapors and RF E-field measurement.

Section III presents and describe the RFP instrument 1100 and its operating principle, including the implementation of RF-field-free referencing and optical frequency tracking to achieve high reliability in precision RF E-field measurement and field determination methods for both linear and non-linear regimes of the atomic response with built-in compensation for perturbations of the RF field caused by the RFP-probe materials surrounding the atomic-vapor detection volume.

Section IV characterizes an RFP probe 1100 by performing polar field pattern measurements along three primary axes of the RFP 1100 at 12.6 GHz RF, obtained by single-axis rotations of the RFP 1100 in the far-field of a standard gain horn antenna, as well as field pattern measurements at 2.5 GHz RF. The measured RFP field patterns provide atomic E-field measurement uncertainties below 1%. RF polarization detection and measurement with the RFP is also demonstrated.

In Section V finite-element simulations of the RF field in the RFP 1100 are performed to quantify the effects of the RFP materials and design on the RF fields measured by the atoms, from which a calibration (C) factor is determined. With the C-factor, the RFMS 1800 provides absolute RF E-field measurements SI-traceable to Planck's constant and invariable atomic parameters.

Section VI presents an atomic RF field measurement uncertainty budget and analysis for the RFP 1100 relevant to SI-traceability of atomic RF probes and measurement tools in RF metrology.

Section VII demonstrates RFP pulsed- and modulated-RF field measurement and direct time-domain RF-waveform detection and imaging.

Section VIII concludes with a discussion of the application of the RFP instrument in RF metrology and standards, RF engineering and measurement applications, and its use as a platform technology for other application-specific RF sensing, receiving, and measurement needs.

II. Rydberg Atom-Based RF Field Sensing and Measurement with EIT in Atomic Vapors Rydberg atom-based sensing and measurement of RF fields utilizes optical electromagnetically induced transparency (EIT) readout of spectral changes from Rydberg states of an atomic vapor that are sensitive to electric fields over a widerange of RF-field frequencies, amplitudes, and polarization. FIG. 17A shows an atomic energy-level diagram illustrating a two-photon Rydberg EIT optical readout scheme for a cesium vapor. The atomic (cesium) vapor is typically contained in a hermetically-sealed compartment with ports for optical access to the vapor; see, for example, the miniature glass vapor-cell sensing element in front of a standard horn antenna shown in the inset of the figure. In the basic readout scheme, two optical laser fields couple atomic states to a high-lying Rydberg state (30D in FIG. 17A) with a weak optical probe beam resonant with the first atomic transition between ground and an intermediate state, and a relatively stronger optical coupler beam tuned into resonance with a second atomic transition between the intermediate and Rydberg state.

When the coupler laser frequency is in resonance with the Rydberg state, an electromagnetically induced transparency (EIT) window opens for the probe beam through the vapor. Owing to the sensitivity of the atomic Rydberg levels to RF electric fields, the field-induced shifts and splittings of the Rydberg EIT signal enable an optical measurement for the RF field. An example Rydberg EIT resonance is shown in FIG. 17B (black curve). In the presence of a weak RF field at a frequency near-resonant with an allowed transition between the optically excited Rydberg level and a second Rydberg level of the atom, the EIT-detected atomic Rydberg line splits into a pair of Autler-Townes (AT) lines whose splitting is proportional to the RF electric-field amplitude (FIG. 17B (magneta curve)). In this linear AC Stark effect regime, the E-field is given by $$E = \hbar\Omega/d, \quad (1)$$

where $\Omega$ is the Rabi frequency of the RF-coupled atomic Rydberg transition (near-identical to the AT splitting measured optically in units $2\pi c \times Hz$), d is the electric dipole moment of the Rydberg transition in units Cm, and $h = 6.62606 \ 10^{-34}$ Js ($2\pi$) is Planck's constant.

From Equation 1 one can obtain an absolute, SI-traceable RF E-field measurement that is dependent only on invariable atomic parameters and fundamental constants. Further, by changing the frequency of the coupler laser one can optically access different Rydberg levels that provide different RF field sensitivities and dynamic field ranges. While the AT regime illustrated here provides an illustrative example of SI-traceable RF measurement with Rydberg EIT in vapors, the RFP implements a more generalized method that allows for measurements of RF fields at arbitrary frequencies over wide dynamic ranges, from low (<1 V/m) to high (~10 kV/m) RF fields. The physics principles of this RF measurement method have been described in previous work.

FIG. 17A: Atomic energy-level diagram illustrating a two-photon Rydberg EIT optical readout scheme for a cesium vapor. A miniature glass atomic vapor-cell sensing element in front of a standard horn antenna (inset).

FIG. 17B: Optical readout from the atomic vapor of a Rydberg EIT resonance without RF (black curve) and in the presence of an RF field at a frequency near-resonant with an allowed transition between the optically excited Rydberg level and a second Rydberg level (magenta curve). The Autler-Townes (AT) splitting of the line yields the RF field strength. In RF-fields too weak to AT-split the line, field-induced changes in the line shape can provide a measure for the RF field strength (cyan curve).

III. Rydberg RF Electric-Field Probe (RFP) and Measurement System (RFMS)

A picture of the RFMS 1800, comprising an RFP 1100 and mainframe unit 1160, is shown in FIG. 18. The RFP 1100 houses an atomic cesium vapor-cell sensing element that has a cylindrical geometry and 10-mm diameter and length. The cell is unilaterally fiber-coupled, injecting 852-nm and 510-nm narrow-line laser beams overlapped and counter-propagating through the vapor, and returning the retro-reflected 852-nm light back to the instrument mainframe for optical readout of Rydberg resonances. The RFP 1100 vapor-cell sensing element is mounted on a probe rod and is connected to a portable mainframe 1160 by a ruggedized fiber-linked patch cable that is several meters long for remote operation. The mainframe contains all lasers and hardware that are automated via control software and a computer user-interface for RF field measurement with real-time RF field and uncertainty readout, RF signal analysis and visualization. The RFP 1100 has a removable cap for protection of the sensing element during day-to-day operational use. The RFP 1100 and its fiber-linked cable are fabricated out of hard dielectrics with small RF dielectric constants and loss-tangents to realize both a small footprint in RF field environments and mechanical robustness during operation.

A. Operating Principle for RF E-Field Measurements

The RFP instrument 1100 realizes traceable measurements of RF E-fields by comparison of spectroscopic EIT signatures of RF-field-sensitive Rydberg states of atoms contained in the vapor-cell sensing element (see Section II) to absolute models of the Rydberg-atom response. The method provides measurement capability of RF fields over a wide, continuous range of RF field frequencies, from MHz to sub-THz, and of RF electric field amplitudes, extending from weak fields below 10 mV/m through a regime of moderate fields on the order of tens of V/m to high-intensity RF fields above 10 kV/m.

The present disclosed field measurement method accounts for all non-linearities of the atomic response over the full RF range, which can be substantial for moderate-to-strong fields, thereby providing a self-calibrated linear E-field readout from the RFP 1100 over the full frequency and amplitude range of the RF radiation. It is further noted that the method encompasses other limited approaches commonly implemented in laboratory experiments with Rydberg EIT RF field measurement. These include the linear AC Stark effect, where an Autler-Townes (AT) splitting yields the RF electric field according to Eq. (1). This approach is valid only for RF fields that are near-resonant with an RF-frequency-specific Rydberg-Rydberg transition, and the assumed linear relationship between field and AT splitting is accurate only over a limited dynamic field range, which can be as low as ≤10 dB.

The RFMS 1800 also covers measurement approaches based on quadratic AC Stark shifts, which are suitable for measurements of continuously frequency-tunable RF fields that are off-resonant with any Rydberg-Rydberg transition. The AC shift approach is applicable to a dynamic range from ~1 V/m to >10 kV/m (>80 dB in intensity range), which is of considerable practical relevance, and which is wider than the dynamic range covered by the AT splitting approach. For simplicity and for proof-of-principle demonstrations, in the present disclosure the RFP 1100 RF field measurements, the RFP 1100 field pattern characterizations, the instrument's field determination method, and the measurement uncertainty analysis are primarily performed in the AT and AC Stark shift regimes.

FIG. 18: The Rydberg Field Probe (RFP) 1100 and mainframe control unit 1160 together composing the Rydberg Field Measurement system (RFMS) 1800. The RFP 1100 is shown in the inset next to two traditional horn antennas.

B. Frequency Referencing and Optical Frequency Tracking in the RFMS

The accuracy of the RF E-field measurement with Rydberg EIT spectroscopy relies on the accuracy with which the optical frequency between the RF-altered atomic spectral features can be measured. This is dependent on a laser-scan frequency calibration that is not a standard feature in available laser devices. Further, the nature of the RF-induced spectral features also depends in part on the choice of atomic Rydberg state used for a given RF field measurement; for example, Rydberg S-states and D-states result in different spectral responses for similar RF field frequencies or amplitudes due to their magnetic substructure and other differences. As a general solution, the RFMS employs an RF-field-free atomic reference and a scanning laser-frequency tracker in real-time during RFP operation that provide maximal versatility and ensure high reliability and accuracy in RF E-field measurement.

FIG. 19 shows three example optical readout signals collected simultaneously by the RFP instrument 1100 during an RF E-field measurement. In the measurement, the coupler laser (510-nm laser; see FIG. 17A) is scanned, and the recorded signals are displayed as a function of laser detuning. The signals are: (1) the spectroscopic Rydberg EIT readout from the RFP 1100 in the RF field of interest, (2) an RF-field-free atomic reference spectrum, and (3) periodic optical frequency markers for the laser scan derived from a calibration-free Optical Frequency Tracker (OFT; Rydberg Technologies Model OFT-NIR-19).

The latter two signals are generated by internal devices in the instrument mainframe and ensure high reliability and spectroscopic accuracy for atomic RF E-field measurements, reaching absolute RF E-field measurement uncertainties at the 1% level and below. For illustration purposes, in FIG. 19 the RF field frequency and amplitude measured by the RFP 1100 are selected such that the atomic response is a resonant AT splitting whose value is approximately linear in the RF electric field, allowing for a simple and accurate determination of the RF E-field with low measurement uncertainty. The OFT in the RFMS mainframe 1160 provides a frequency ruler for the scanned 510-nm laser with a calibrated fringe spacing (38.30 0.02 MHz in the present disclosure). The OFT signal tracks the laser frequency in real-time during the coupler (510-nm) laser scans and provides an absolute, high-precision laser-frequency axis calibration. A calibrated laser-frequency axis is an important ingredient that allows the RFMS 1800 operating software to process the Rydberg EIT spectra measured within the RF field, and to report an RF field-amplitude reading to the RFMS user.

FIG. 19: Spectroscopic and optical signals simultaneously collected by the RFMS during a 12.6 GHz RF E-field measurement with the RFP in the far-field of horn antenna emitter. Shown are the EIT readout from the RFP with the RF field on (red, solid) and off (red, dashed), the EIT readout from an RF-field-free Rydberg reference unit housed within the RFMS mainframe (black), and the readout from an optical frequency tracker (OFT) in the RFMS mainframe (blue). The OFT signal provides a "frequency-ruler" with a calibrated period of (38.30+/−0.02) MHz.

C. RF Field Determination Methods

The RFP instrument 1100 measures RF E-fields by converting the optical readout of the field-modified atomic response from the vapor-cell probe to an E-field value. Spectroscopic features (observed as probe-beam transmission changes) are matched to pre-calculated features of the atomic response linked to invariable atomic properties and fundamental constants; as these features are unique, they can be corresponded to an E-field value via this comparison. To perform SI-traceable, self-calibrated broadband RF measurements over a wide dynamic range, the RFP 1100 implements RF E-field determination methods across all atom-field interaction regimes with Floquet that includes AT and AC Stark shifts. The RFMS 1800 implements dedicated spectral analyses for field-determination that account for both the varying atomic response in the different atom-field interaction regimes as well as broadening and alteration of the atomic spectral features in the readout due to RF field inhomogeneities that may be present in the atomic detection volume as a result of perturbations of the field by RFP materials.

FIGS. 20A and 20B show example RFP spectrum readouts for RF E-field measurements performed in the AT and AC-Stark regimes for a 12.6 GHz (FIG. 20A) and 2.5 GHz (FIG. 20B) RF E-field, respectively. The methods for determining the E-field in the AT and AC-Stark regimes are similar. In both cases, a routine auto-locates the peaks in the EIT signals and employs a signal averaging approach to account for line-shape substructure. Here, the spectral EIT signal $S(\Delta v)$ is integrated over the field-altered peak. From this integral, the average frequency shift, $\langle \Delta v \rangle$, of the RF-altered peaks is determined with respect to the field-free EIT spectrum, $$\langle \Delta v \rangle = \frac{\int \Delta v S(\Delta v) d\Delta v}{\int S(\Delta v) d\Delta v}.$$

In the AT regime, the average RF field in the RFP 1100 can be obtained from either side peak using the equation $\langle E \rangle = 2h \langle \Delta v \rangle /(d_{rad} d_{ang})$, where h is Planck's constant, $d_{rad}$ is the radial matrix element of the Rydberg transition, and dang is the angular matrix element. There, E is the amplitude of the RF electric field amplitude, and its average $\langle E \rangle$ is over position within the RFP field-probe volume and over magnetic sub-states of the atoms, as appropriate. The representative measurement example in FIG. 20A is in a low-E-field regime, where the AT-split lines contain known substructure of spectral components belonging to different values of the magnetic quantum number $m_j$ that do not separate. As the angular matrix elements, $d_{ang}$, for $m_j=1/2$ and $m_j=3/2$ differ by 20%, choosing one component for the E-field determination and ignoring the other would give a wrong result. To account for this the RFMS 1800 approximates the angular matrix element by using an average over the relevant cases of $m_j$ ($m_j=1/2$ and $m_j=3/2$ for the case in FIG. 20A).

In the AC-Stark regime, $\langle E^2 \rangle = 4 \times \langle \Delta v \rangle / \alpha_j$, where $\alpha_j$ is the AC polarizability, which depends on the Rydberg level, the $|m_j|$ state, and on the RF frequency. The AC-Stark-induced line shift provides a measurement of, equivalently, $\langle E^2 \rangle$, the RMS value of the RF electric-field amplitude averaged over the RFP 1100 field-probe volume, and the intensity of the RF radiation. The RFMS 1800 field determination method in the AC-Stark regime is implemented similarly to the AT regime. An auto-location and peak integration routine applied to the AC-shifted and AC split spectra again accounts for line-shape substructure and line overlaps that occur over the >80 dB-wide ~1 V/m to >10 kV/m dynamic field range.

In the illustrative example shown in FIG. 20B, the field determination routine is applied to AC-shifted and AC-split spectra of $nD_{5/2}$ Rydberg states of cesium that have $|m_j|=1/2$ and 3/2 lines slightly overlapped and together separated from the $|m_j|=5/2$ line. Here, the field determination routine takes advantage of the higher field sensitivity of the $|m_j|=1/2$, 3/2 lines, which have large and exhibit larger line shifts at low fields, compared to that of the $|m_j|=5/2$ line, which instead exhibits a stronger EIT signal, line changes and shifts at higher fields, for RF field measurement over the wide dynamic range afforded by the AC Stark regime.

The RFMS 1800 peak-integration approach described in this section is generalizable to any other field-detection method that involves comparing observed and calculated spectral features, including the most general case of Floquet calculations. Throughout this discussion the average peak position, $\langle \Delta v \rangle$, has been found and used to determine the average field $\langle E \rangle$ or the average of $\langle E2 \rangle$ (which is proportional to average RF intensity). Another possible field-determination approach would be to locate the Δv values at which the signal S(Δv) peaks, and to use those Δv values to compute the RF electric field. In this method, the Δv values that correspond to the peak positions would be obtained by locating the actual maxima of the signal S(Δv), or by performing local fits over peak regions in the signal and locating the maxima of these local fits.

These most-common peak positions can be misleading, however: if there are field inhomogeneities internal to the RFP due to the RFP's materials and geometry, the most-common field may be a node or anti-node of an internal standing wave rather than a true measure of the RF field incident on the RFP. Such inhomogeneities can arise even in a measurement device much smaller than the RF wavelength due to dielectric boundary conditions. The average field across the entire detection region represents the incident field more faithfully. The average field and the most-common field can differ by as much as 15-20%. Additionally, even when no field inhomogeneities are present, the presence of multiple transitions with different RF-field-shifted values of Δv due to magnetic substructure of the atoms can distort the shape of the spectroscopic peaks in S(Δv). At low RF field levels, separate $|m_j|$ peaks cannot be resolved, but the shape of the unresolved compound peak depends on the detailed widths and strengths of its unresolved sub-components, which may further depend on RF polarization.

Such effects would artificially skew a peak-finding or fitting method toward one of the unresolved sub-components contributing to the compound peak. Finding the average peak position using the above explained integration method, however, and then determining the E-field based on weighting contributions from the different $|m_j|$ components largely ameliorates this skew. Additionally, the averaging method is robust against RF standing-wave effects and inhomogeneities within the cell.

FIG. 20A: Rydberg Field Probe (RFP) optical atomic spectrum S(Δv) versus laser-frequency detuning Δv showing Autler-Townes (AT) splitting for a measurement of a 12.6 GHz RF electric field resonant with the Cs $39D_{5/2} \rightarrow 40P_{3/2}$ transition. The regions over which the AT-split lines are integrated in order to obtain Δv are shaded in blue.

FIG. 20B: off-resonant AC Stark shifts of the Cs 48D5/2 state for the measurement of a 2.5 GHz RF electric field. The two blue-shifted AC-Stark shifted lines belong to the magnetic sub-states $m_j=1/2$ and 3/2 lines and are shaded in blue, while the $m_j=5\ 2$ line is shaded in red.

IV. RFP Field Pattern Measurements

The utility of an RF probe or sensor in measurement and receiving applications relies on calibration and validation of the directional dependence of the detector sensitivity to incident RF waves. In this regard, the RFP 1100 atom-based RF sensing exhibits fundamental differences and performance advantages compared to antennas. First, the RFP 1100 atom-based RF sensing method provides a rare case of a true isotropic receiver. Unlike antennas, which due to electromagnetic boundary conditions cannot be built to radiate or receive in all directions, an atom is sensitive to an RF field incident from any direction. This is due to the fact that the quantum structure of the atomic states is always altered in the presence of an incident RF field, and the RF-sensitive states can be accessed with an optical (or electronic) readout.

Second, the atom-based method 1800 optionally provides the capability of RF polarization detection simultaneously with, but independent of, electric field measurement. This is due to the fact that shifts or splittings of the field-modified spectroscopic lines depend on the amplitude of the RF field, while the relative strengths of the spectroscopic lines depend on the orientation the incident RF field polarization relative to that of the optical polarization. Independent (and simultaneous) RF polarization and field detection is not possible with an antenna, whose sensitivity to the field is intrinsically linked to the orientation of the RF field polarization relative to the conductive antenna structure.

The directional dependence of the RFP 1100 atom-based RF field probe was characterized by performing field and polarization pattern measurements of the RFP 1100. To achieve this, the methods described in Sec. III were employed to determine RF electric fields and their uncertainties for a range of conditions, using AT splittings (Sec. IV and VI) and AC shifts (Secs. VI and VII).

FIG. 11B shows an illustration of the measurement setup. The RFP 1100 is placed at an initial position (X, Y, Z)=(0, 0, 0) mm, with an uncertainty of ±1 mm in each component, defined to be the center of the 10 mm cylindrical vapor cell and optical detection volume. The orientation shown in FIG. 11B corresponds to (α, θ, φ)=(0, 0, 0). Under this condition, the vapor-cell's cylinder axis points along $\hat{z}$, its stem along $-\hat{x}$, and the linear optical polarizations inside the probe cell along $\hat{y}$. The RF source is placed at position (X, Y, Z)=(325, 0, 0) mm, with an uncertainty of ±5 mm in each component. At the location of the probe, the RF field has a propagation vector pointing along $-\hat{x}$ and a linear polarization pointing along $\hat{z}$.

FIG. 11B: Schematic of the RFP field pattern measurement setup (top) and the RFP single-axis rotation angles α, θ, and φ about the primary axes $\hat{z}$, $-\hat{y}$ and $\hat{x}$ (bottom).

FIGS. 21A-23C show RFP 1100 field and polarization pattern measurements performed at 12.6 GHz RF for single-axis rotations of the RFP 1100 about the primary axes with rotation angles α, θ, and φ (see insets in FIG. 11B). FIGS. 23A-C show the spectral outputs S(Δv, *) of the RFP 1100 for *=α, θ, or φ. In the measurement, the range 1800<θ<360° is omitted from the characterization due to the presence of the RFP handle. The electric-field reception patterns of the RFP are obtained by implementing the (E) field determination method described in Sec. III-C. The corresponding RF-polarization patterns are expressed in terms of line-strength ratios, R, of the peaks in S(Δv, *). The results are displayed in FIGS. 21A-21C and FIGS. 22A-22C, respectively.

FIGS. 21A-23C: RFP field patterns measured for single-axis rotations with rotation angles α, θ, and φ about the respective primary axes ẑ, ŷ and x̂ at 12.6 GHz RF. FIGS. 21A-21C: RFP E-field patterns 2100A-2100C; FIGS. 22A-22C: RFP polarization patterns 2200A-2200C using peak-height ratios R; FIGS. 23A-23C: RFP atomic spectral output S(Δv, *) 2300A-2300C from which E-field and polarization patterns are determined. FIGS. 22A-22C display the function (π/2) tan−1(R) of the peak-ratio R.

In all RFP rotation planes field patterns with deviations from 47F isotropy are found due to mild RF-perturbations by RFP material structures surrounding the active atomic vapor. Detailed simulations of the RFP field perturbation, its effect on measurement uncertainties, and RFP self-calibration for SI-traceability using field pattern measurements and simulation results are presented in the subsequent sections.

The RFP polarization patterns are quantified by the ratio R between the average area of the two AT-shifted peaks (blue peaks in FIG. 20A) and the area of the central peak (white peak in FIG. 20A). The underlying physics is briefly explained in the following. The central peak in the AT spectrum in FIG. 20A corresponds to the magnetic sub-state $m_j=5/2$ of the Rydberg level $42D_{5/2}$, where the direction of the RF-field's polarization defines the axis against which the m-value is measured in the quantum-mechanical solution of the problem. The $m_j=5/2$ level is not RF-shifted due to selection rules of the RF transition used in FIG. 20A. The AT-shifted peaks (blue peaks in FIG. 20A) belong to the magnetic sub-levels $m_j=1/2, 3/2$ components, with the AT shift of $m_j=1/2$ being 1.23 times that of $m_j=3/2$. Note that in FIG. 20A the $m_j=1/2$ and $m_j=3/2$ components under the AT-shifted peaks are not resolved. The line strengths of the cental ($m_j=5 2$) and AT-shifted ($m_j=1/2, 3/2$) components in the signal S(Δv, *) are functions of the angle between the RF polarization and the polarization of the optical fields inside the RFP's vapor cell. Thus, the line-strength ratio between the central peak and the AT-shifted peaks, displayed in FIGS. 22A-22C, is a measure for the RF polarization angle relative to the cell's (body-frame) y-axis (i.e., the direction of the optical probe fields). As a result, barring any imperfections in optical and RF polarizations, the line-strength ratio of central and AT-shifted peaks is insensitive in α and θ, while it depends strongly on φ. This behavior, born out in FIGS. 22A-22C, enables RF polarization measurements.

For broadband atom-based RF measurements, the frequency dependence of the RFP response to the incident RF field must also be considered. FIGS. 24A and 24B show RFP field pattern measurements in α for 2.5 GHz RF (FIG. 24A), alongside the corresponding 12.6 GHz RF pattern (FIG. 24B). It is seen that the higher frequency has a stronger dependence on a, as one might expect from the fact that shorter-wavelength RF fields are more prone to forming standing-wave patterns inside the RFP vapor cell. Regardless, even in the 12.6 GHz case the observed dependence is smooth and suitable for calibration.

FIGS. 24A and 24B: Comparison of RFP field patterns for single-axis rotation about the ŷ-axis by angle α at 2.5 GHz (FIG. 24A) and 12.6 GHz (FIG. 24B).

V. Finite-Element Simulations and RFP Si-Traceable Self-Calibration

One of the anticipated advantages of replacing antenna RF standards with Rydberg atom-based RF measurement is the ability to obtain a higher accuracy and reliability in the measurement by eliminating inevitable perturbations of the subject RF fields by the metal antenna probe used to measure the field. The Rydberg atom-based RF sensing method alone provides a clear advantage in this regard, as the atoms represent perfectly frequency-matched quantum receivers for the incident RF, while there is negligible back-action of the atoms onto the incident RF field. However, the practical realization of an SI-traceable, self-calibrated Rydberg atom-based RF primary standard and Rydberg-based RF measurement instrumentation will require atomic RF probes necessarily comprising material structures to encapsulate the alkali vapor, guide and condition optical beams, and provide structural robustness and practical form factors for reliable use of the probe in testing environments. Due to this, field perturbations by an atomic probe and inhomogeneous line broadenings of the atomic spectral signatures in the optical readout are unavoidable at some level over the ultra-wide band of RF frequencies accessible with the large variety of Rydberg-atom states that can be used. As a result, to ensure accurate, traceable RF field measurements, RFPs must be pre-calibrated to account for perturbations of the RF E-field due to RFP geometry and material design choices, and the effect of these perturbations on the Rydberg atom spectral readout when performing atomic RF E-field measurements.

The RFP 1100 presented here is designed with a geometry and low-dielectric-constant materials that afford both a small RF footprint and mechanical robustness for day-to-day use. To characterize the effects of the dielectric material structures surrounding the optical detection region through the atomic vapor in the RFP 1100, one can perform finite-element simulations of the RFP 1100 for test points used in the field pattern measurements in Sec. IV. Simulation results for a 12.6 GHz RF plane wave incident on the RFP are shown in FIGS. 25A-25C. The simulation considers a 12.6 GHz RF plane-wave source linearly-polarized along ẑ that is incident on the center of the cylindrical atomic vapor cell inside the probe (α=0 deg). The simulation accounts for all materials of the RFP 1100 including the rod and external housing (dielectric constant ε=2.6), vapor-cell and embedded optics (ε=5.5), and vacuum (ε=1) defined inside the vapor-cell. All RFP material component dimensions and positions in the simulation model are accurate to better than 1 mm.

FIGS. 25A-25C show simulations of the incident 12.6 GHz RF field inside the RFP 1100. The field inhomogeneity in the optically-interrogated atomic-vapor detection region is due to the vapor-cell compartment being close to the size of the 12.6 GHz RF wavelength, while the asymmetry of the vapor cell geometry, such as its stem, has minimal effect. To experimentally validate the simulation results, FIG. 26 shows simulated and measured 12.6 GHz RF field probability distributions along the optical beams propagating through the atoms in the—axis through the RFP 1100 vapor-cell. A simulated spatial RF field distribution is also plotted. The measured field distribution is extracted from the RF-modified EIT-AT lineshape from the RFP spectrum. The simulation reveals that the measured electric field has a distribution ranging from ~0.55× to 1.1× the incident RF E-field. The simulated and measured distributions are in very good agreement.

FIGS. 25A-25C: Simulated RF E-field internal to the RFP 1100 for a 12.6 GHz incident source as illustrated in FIG. 11B. From left to right: Total RF E-field in the YZ- (FIG. 25A), XZ- (FIG. 25B), and XY-plane (FIG. 25C) through the RFP 1100. The field amplitude is displayed on a linear color scale ranging from 0.5 (blue) to 1.2 (red), in units of the incident plane-wave field amplitude. The "ghost shapes" visible in the images delineate the glass walls of the vapor cell used.

FIG. 26: RF E-field probability distribution 2600 in the RFP 1100 atomic vapor along the optical beam path for a 12.6 GHz incident source. Plotted are measured (black dashed) and simulated distributions (black solid), and the corresponding simulated spatial RF E-field distribution along 2 (red dots) 2606.

To quantify the effect of the enclosure-induced RF perturbation on the atom-based field measurement with the RFP 1100 a housing calibration factor $C = \langle E \rangle / E_{incident}$ is defined, where $\langle E \rangle$ is the average internal field measured by the atoms and $E_{incident}$ is the external, incident RF electric field. From simulations for 12.6 GHz at $\alpha = 0°$ a C-factor of 0.71 is obtained. Using the C-factor and field patterns in FIGS. 22A-22C and FIGS. 23A-23C the RFP 1100 is fully characterized to provide self-calibrated E-field measurements directly SI-traceable to Planck's constant. Following this methodology, RFPs for self-calibrated SI-traceable broadband operation implement angular- and frequency-dependent C-factor tables specific to the RFP model. The initial, one-time characterization process implemented for the RFP model presented here for SI-traceability and self-calibrated operation in RF field measurement is generally applicable to other atom-based RF probes and detector types.

Due to the necessity of a compartment to hold the atomic vapor in RFPs, inhomogeneous line broadening of the atomic spectral signatures in the readout are unavoidable at some level over the ultra-wide band of RF frequencies accessible with Rydberg atoms. In addition to engineering a given RFP probe to ensure minimal perturbations of the RF field over the desired RF field frequency and amplitude operating range, characterization and operation of RFPs require a means to account for changing RF field conditions and inhomogeneities in the detection volume during regular use of the instrument. This is enabled by employing the spectral analysis method presented in Sec. III and employed in Sec. V for determination of the RF E-field in the detection region. RF measurement uncertainties associated with using this and other approaches in atom-based devices and probes such as the RFP is presented in the following section.

VI. Rydberg Atom-Based RF Electric-Field Measurement Uncertainty

For application of the RFP instrument 1100 in RF metrology and the realization of self-calibrated, SI-traceable RF standard devices, an analysis and budget of measurement uncertainties when using a Rydberg-based measurement instrument is required. A preliminary analysis of RF measurement uncertainties considering EIT linewidths and spectral features in the Autler-Townes regime has previously been discussed and characterizations of RF perturbations in the atomic detection volume due to the presence of dielectric vapor-cell materials and geometries have been investigated. Further, an overview of fundamental factors contributing to RF sensitivity limitations using Rydberg EIT in atomic vapors for weak RF field sensing in the sub-Autler-Townes regime is considered. These provide valuable general insights into the limiting factors contributing to uncertainties in low RF E-field measurements with Rydberg EIT and Autler Townes splittings.

However, they are insufficient for the realization of robust and practical Rydberg atom-based probes and instruments as SI-traceable RF standards and measurement tools suitable for use in real-world environments. To this end, it is necessary to establish a general framework for a comprehensive uncertainty budget for atomic RF E-field measurements with real devices that accounts for uncertainty contributions from both the atomic measurement and the implemented analyses of atomic spectral signatures for the determination of the RF E-field, as well as systematics due to physical probe-device design attributes, such as the above-introduced C-factor, and back-end instrument hardware performance.

A comprehensive uncertainty budget and an overview of the factors contributing to uncertainties with an RFP instrument 1100 is presented. A detailed proposal and discussion of an uncertainty budget is provided, intended to be generally applicable to atomic RF probes and devices employing Rydberg atom-based RF E-field measurement encompassing linear Autler-Townes splittings, AC Stark shifts, and other non-linear regimes of the atom-RF interaction for SI-traceable (self-calibrated) RF E-field measurement. Table I presents uncertainty budgets for several cases. The uncertainty budgets are divided into two general classes of uncertainties: 1. Atomic-measurement uncertainties and 2. Probe-device uncertainties arising from external material and geometry design choices, as well as laser hardware stability during measurement.

The first two data columns in Table I are for two different field determination analyses in the AT-splitting regime, as in FIG. 20A, the first based on the expectation value of the field, $\langle E \rangle$, in the atomic detection region, and the second based on finding the dominant AT-shifted peak in the spectrum $S(\Delta v)$ and calculating the E-field for that peak, $E_P$. The uncertainty analysis shows that the first method, which is discussed in some detail in Sec. III and is employed in the measurements performed in Section IV, is more robust. The third column is for measurement of the RMS electric field, $E_{RMS} = \sqrt{\langle E^2 \rangle}$ using the quadratic AC Stark effect, as in FIG. 20B.

There are operational uncertainties that ultimately contribute to any final E-field measurement, but that those are under direct control of the operator and can, in principle, be eliminated. There is, for instance, a field-measurement uncertainty that results from the probe-to-source positioning uncertainty in the setup. These types of systematic uncertainties affect E-field measurements performed with any class of probe device and are not intrinsic to the atomic-probe performance. Therefore, such operational uncertainties are not included in the uncertainty budget in Table I. They are, however, discussed and accounted for in the RFP field pattern measurements presented in Section IV.

TABLE I

UNCERTAINTY BUDGET: RYDBERG ATOM-BASED
RF ELECTRIC FIELD MEASUREMENTS

|  | AT $\langle E \rangle$ | AT $E_P$ | AC Stark $E_{RMS}$ |
|---|---|---|---|
| Pixel | 0.1-0.3% | 0.1-0.3% | 0.3% |
| Integration parameters | 0.7% | NA | 0.3% |
| Lineshape substructure | 0-6% | 4-25% | 1-3% |
| Laser-frequency linearity | 0.2% | 0.2% | 0.2% |
| Probe Calibration (C) factor | 0.71 | 0.71 | |

VII. Pulsed Detection and Time-Domain RF Waveform Imaging

Many RF field detection and measurement applications require measurement of pulsed fields or modulated fields, in addition to continuous-wave (cw) fields that have been presented thus far in this disclosure. In order to meet these needs, the RFMS 1800 provides time-dependent field detection and RF wave-form imaging capability. In this mode of operation, the RFMS 1800 tracks the time-dependence of the atomic response received by the RFP 1100. The time-dependent signal recordings, S (Δv, t), reveal how the RF field depends on time, t.

Field detection of time-dependent fields using the RFMS 1800 and RF waveform imaging is demonstrated in FIGS. 11C-11F. The operating principle implements field determination methods similar to those used in the cw cases explained above, with spectral data recorded as a function of time. A 2.5 GHz carrier wave is incident on the RFP 1100, with intensity varying in time. The time-dependent AC-Stark shift of the $42D_{1/2}$ state is recorded and displayed in real-time with a time resolution of 1 µs. FIG. 11C shows recordings of square RF pulses with pulse lengths, from left to right, of 10 µs, 100 µs, and 200 µs; the pulse frequency is 1 kHz in all displayed cases. The square profile of the pulses is resolved to within the 1-µs time resolution used in the present disclosure. The RFMS 1800 can also resolve sub-structures within RF pulses; for example, FIG. 11D shows a record of an RF square pulse with an overlaid sinusoidal amplitude modulation (10% modulation depth, 5 kHz baseband frequency). FIG. 11E shows a record of an amplitude-modulated cw RF signal (2.5 GHz carrier, 100% modulation depth, 5 kHz baseband frequency). FIG. 11F shows a record of an FM-modulated cw signal (12.6 GHz carrier, FM baseband frequency 5 kHz, 160 MHz peak deviation). The FM signal is probed using the $39D_{5/2}$ $40P_{3/2}$ AT resonance, which is resonant with the carrier.

FIGS. 11C-11F: Records of time-dependent RF fields. The recordings show RFP optical transmission displayed on a linear grayscale (arbitrary units), measured vs time and laser detuning. FIG. 11C: EIT AC-Stark-shift response to square pulses of a 2.5-GHz RF signal with varying pulse lengths, from left to right, of 10 µs, 100 µs, and 200 µs with a repetition rate of 1 kHz. The RF intensity is constant during the pulses. FIG. 11D: EIT AC-Stark-shift response to a pulsed signal that also is amplitude-modulated within the pulse. FIG. 11E: Recording of a continuous, amplitude-modulated RF signal. The carrier frequency is 2.5 GHz and the AM baseband frequency is 5 kHz. FIG. 11F: Recording of a continuous, frequency-modulated RF field near an AT resonance. The carrier frequency is 12.6 GHz, 5 kHz, and the FM deviation is 160 MHz.

VIII. Conclusion

In this present disclosure the first self-calibrating SI-traceable broadband Rydberg atom-based radio-frequency electric field probe (RFP) 1100 and measurement instrument (RFMS) 1800 is presented. The RFMS 1800 is a commercial device comprising an atomic RF field probe (RFP) 1100, connected by a ruggedized fiber-optic patch cord to a portable mainframe control unit 1160, with a computer software interface for probe RF measurement and analysis including real-time field and measurement uncertainty readout and spectral RF waveform visualisation. The RFP 1100 employs atom-based sensing using electromagnetically induced transparency (EIT) readout of spectral signatures from RF-sensitive Rydberg states of atoms in an atomic vapor.

The RFMS 1800 measures RF E-fields from resonant and off-resonant Rydberg-RF field interactions detected by the RFP 1100 probehead, and employs an RF-field-free atomic reference and an optical laser frequency tracker (OFT), which are integrated in the RFMS mainframe 1160 to ensure high reliability and precision in RF E-field measurements using Rydberg EIT spectroscopy in atomic vapors. An overview of Rydberg EIT readout in atomic vapors for RF E-field measurement was provided and the operating principle of the RFP 1100 and RFMS 1800 was described. An approach for the determination of the average RF E-field from spectral signatures in the RFP 1100 atomic-probe head has been introduced and implemented in demonstration RFP measurements of RF E-fields both near- and far-off-resonant from atomic Rydberg transitions.

A complete characterization of an RFP probe 1100 is performed by measuring polar field patterns at 12.6 GHz RF, obtained by single-axis rotations of the RFP 1100 along primary axes in the far-field of a standard gain horn antenna. Field pattern measurements at 2.5 GHz RF were also performed and RF polarization sensitivity demonstrated. Detailed finite-element simulations of the field inside the RFP 1100 at 12.5 GHz (FIGS. 25A-25C) and 2.5 GHz (not shown) were performed to quantify the effect of the probe's component materials and geometry on the RF E-field measurement by the optically-interrogated Rydberg atoms. Simulation results were found to be in good agreement with the RFP field pattern measurements, revealing deviations of the RFP 1100 from a perfect isotropic RF receiver due to its specific materials and geometries.

The measurement and simulation results were in turn used to calibrate the probe 1100 referenced to the SI-traceable atomic RF E-field measurement. A Rydberg atom-based RF E-field measurement uncertainty budget and analyses were introduced and implemented in the RFP operation for SI-traceability of Rydberg atom-based RF probes and measurement tools in RF metrology. Modulated and pulsed RF field measurement and detection capability with the RFP 1100 was also demonstrated and discussed. In some embodiments, broadband RF measurements of 3 MHz (HF-band) to >100 GHz sub-THz RF fields have also been performed.

The RFP instrument 1100 is a stand-alone device and new quantum technology platform with broad application potential. In metrology, the RFP 1100 provides a first instrument suitable for use by metrology institutes worldwide for the establishment of a new atomic primary RF E-field standard by enabling the administration of round robin tests requiring standardized instrumentation and measurement methodology. As a portable, broadband atomic RF E-field probe, the RFP 1100 is a single self-calibrated device that provides RF E-field measurement capability over an RF frequency range otherwise only accessible using multiple receiver antennas. This can at once reduce the operational complexity, improve reliability, and reduce calibration costs in RF testing and measurement applications. As a new platform technology, the RFP 1100 may be readily adapted to other application-specific RF sensing, receiving, and measurement needs and for the implementation of novel Rydberg-atom-based RF capabilities in communications, surveillance, and THz.

Appendix B: Exemplary Room-Temperature Rydberg THz Maser

Appendix B: "Room-temperature Rydberg THz maser," David A. Anderson and Georg Raithel, Internal document, pages 1-6, Nov. 26, 2019, is hereby incorporated herein in its entirety by reference.

Figure 27:
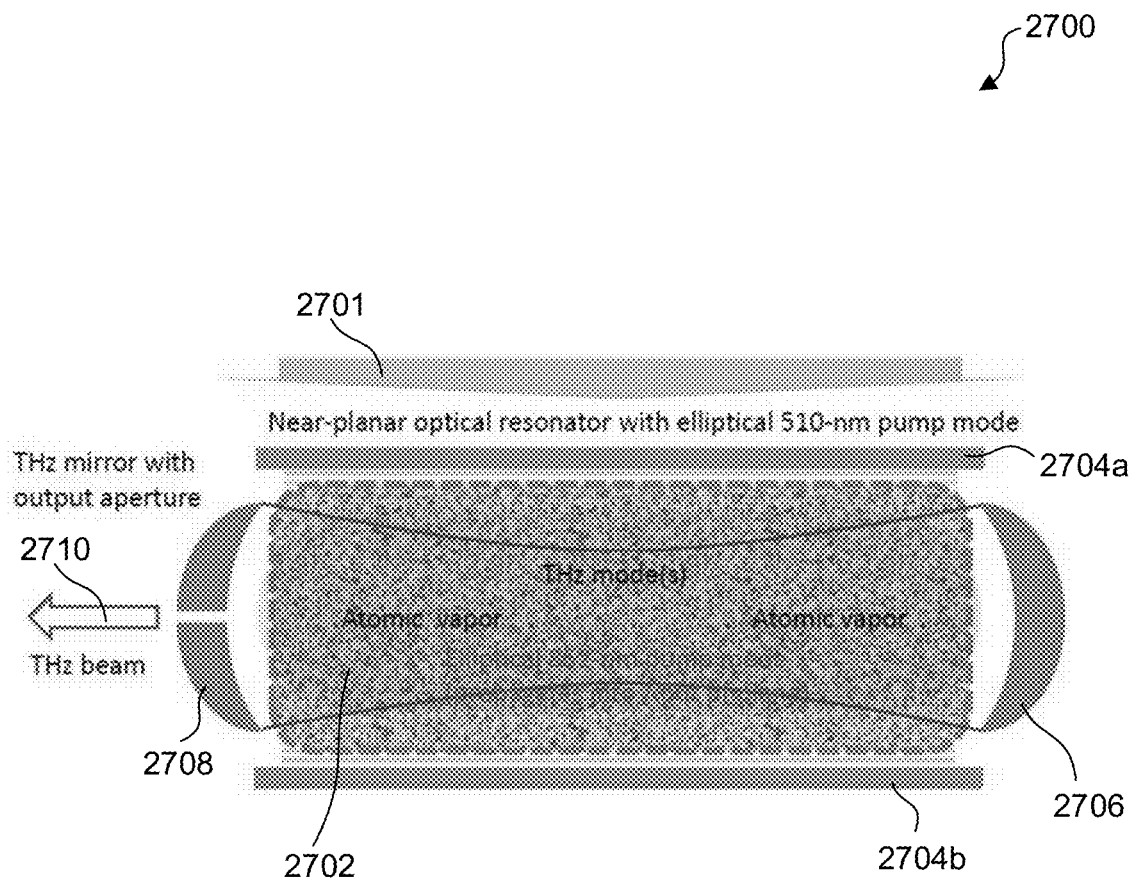
FIG. 27 is a schematic illustration of a Rydberg-atom high-frequency (THz) maser, according to an exemplary embodiment.
Figure 28A:
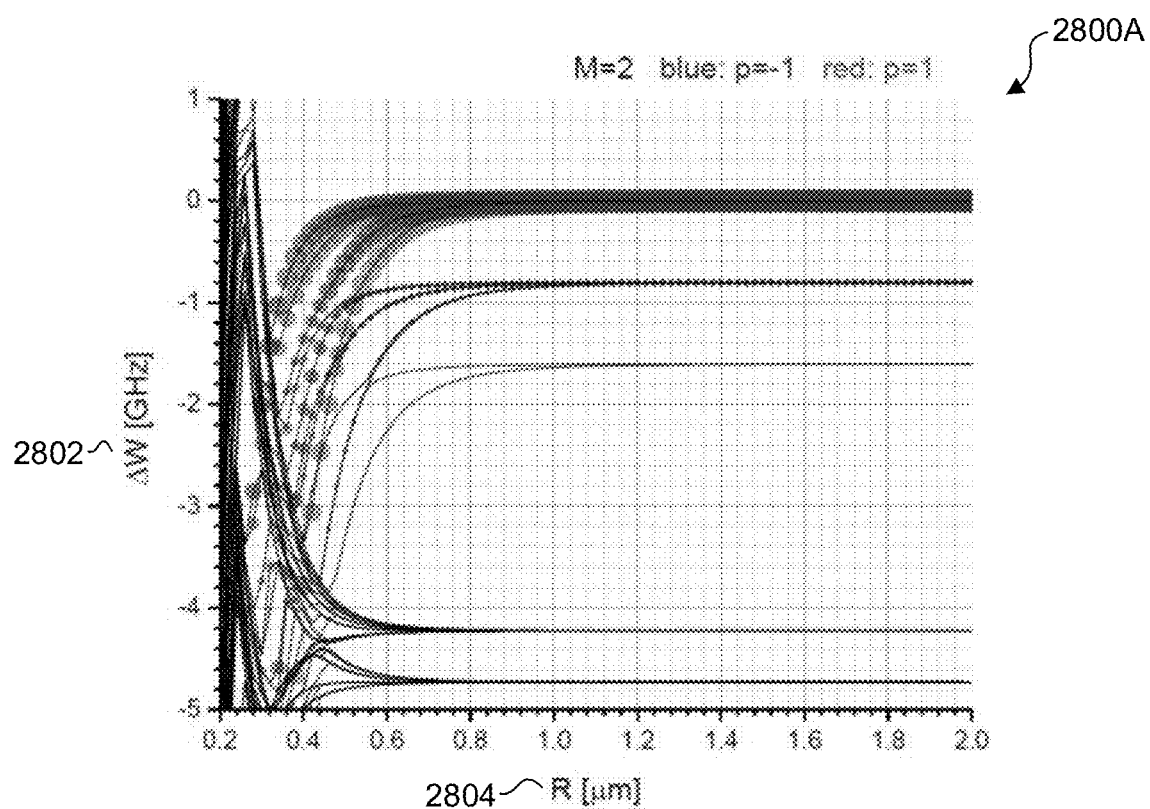
FIGS. 28A and 28B are plots of Rydberg pair potentials as a function of internuclear axis, according to an exemplary embodiment.
Figure 28B:
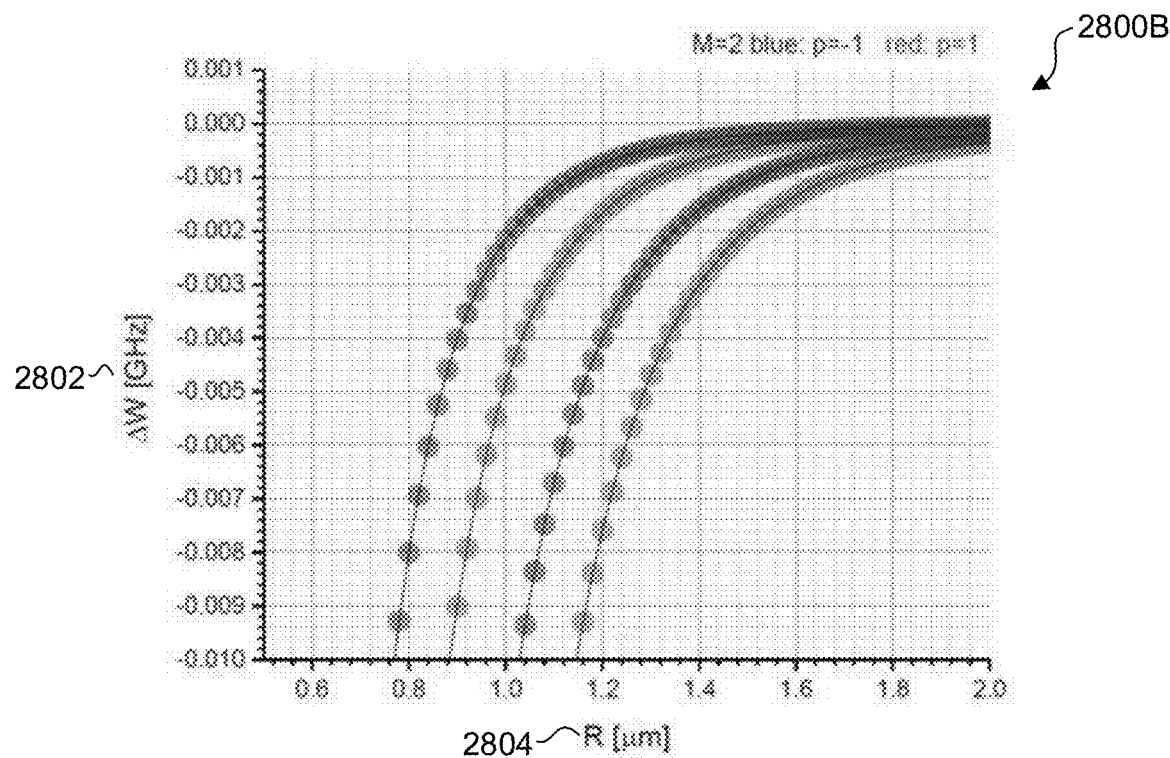
Figure 29A:
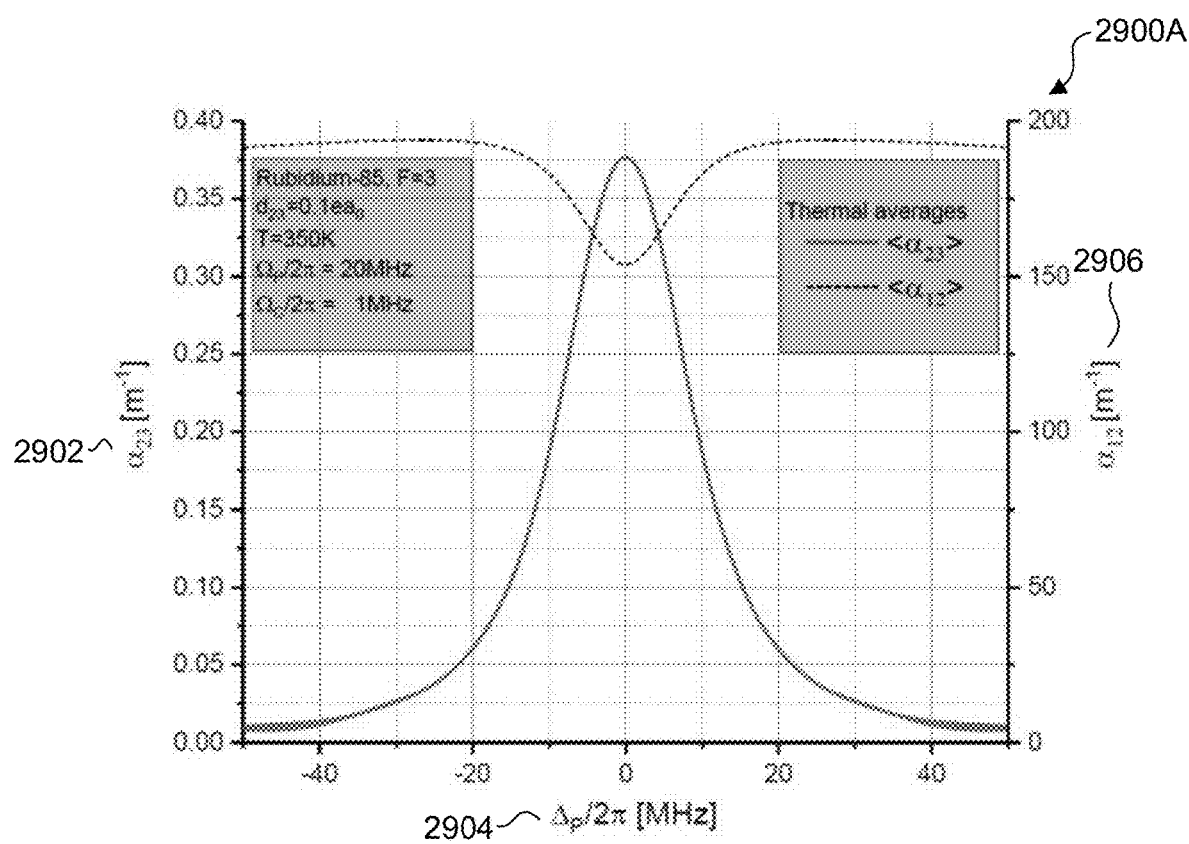
FIGS. 29A and 29B are plots of absorption coefficient as a function of laser-frequency detuning, according to an exemplary embodiment.
Figure 29B:
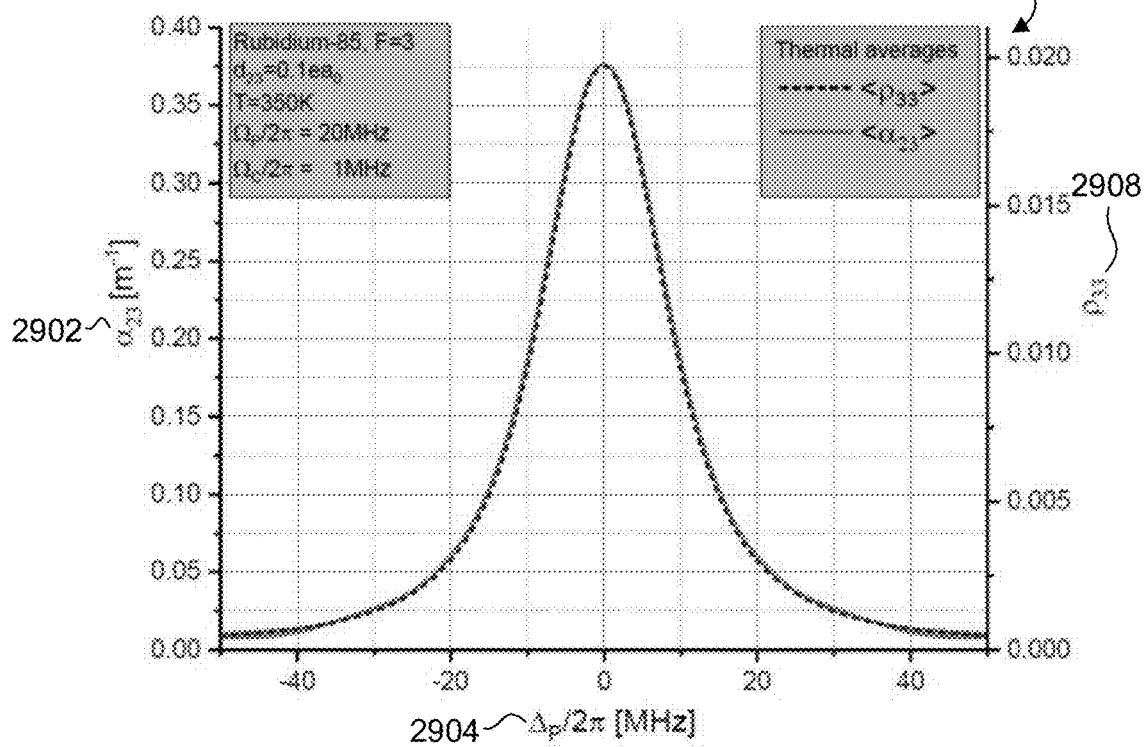
Figure 30:
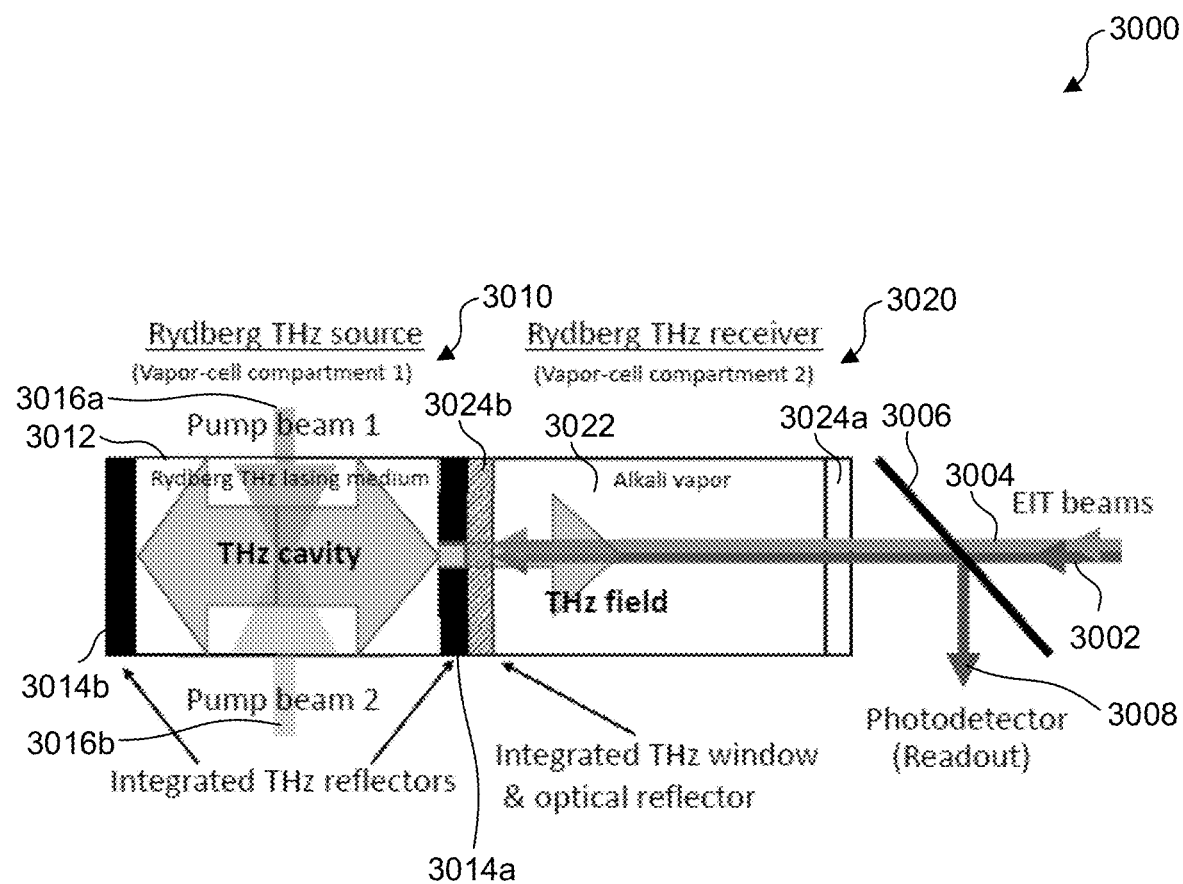
FIG. 30 is a schematic illustration of a Rydberg-atom high-frequency (THz) transceiver, according to an exemplary embodiment.

FIGS. 27-30 illustrate a room-temperature Rydberg THz maser 2700 and a room-temperature Rydberg THz transceiver 3000, according to various exemplary embodiments. FIG. 27 is a schematic illustration of a Rydberg-atom high-frequency (THz) maser 2700. FIGS. 28A and 28B are plots 2800A, 2800B of Rydberg pair potentials 2802 as a function of internuclear axis 2804. FIGS. 29A and 29B are plots 2900A, 2900B of absorption coefficient 2902, 2906 as a function of laser-frequency detuning 2904. FIG. 30 is a schematic illustration of a Rydberg-atom high-frequency (THz) transceiver 3000.

Introduction

Advances in communications technology, THz imaging (especially wide field-of-view THz imaging), security and other applications require progress in high-power, low-SWaP and cost THz sources and detectors. In communications, cellular devices and WLAN occupy bands up to about 2 GHz and 5.8 GHz, respectively. A general squeeze in radio bandwidth is a growing problem, with mobile-device data traffic estimated to be increasing by over 50% every year, as just one example. These applications require efficient THz "flashlights" for THz illumination and focal-plane, pixelated, room-temperature and yet highly sensitive THz receivers.

The present under-utilization of the sub-THz and THz ranges of the electromagnetic spectrum in these fields largely arises from a lack in technology in THz sources and detectors/receivers. At frequencies greater than 30 GHz, current technology includes frequency multiplication using RF circuits, solid-state devices, vacuum electronics devices, difference-frequency generation using lasers and nonlinear optics, and molecular FIR/THz lasers https://www.edinst.com/products/firl-100-pumped-fir-system/.

Despite the availability of these sources, THz technology has not yet found its way into mainstream communications. This is, in part, due to intrinsic power inefficiencies, cost, weight, and size limitations of existing THz sources, detectors and receivers. For instance, frequency multiplication of high-quality microwave signals is very inefficient at higher frequencies and carries a prohibitive price tag. Quantum cascade lasers (QCL) typically operate at higher frequencies (10 to 100 THz); QCLs approaching 1 THz (from above) typically require cryogenic operation. Conversion of laser light into THz by difference-frequency generation is intrinsically inefficient. On the receiver/detector side, standard bolometric sensors lack bandwidth in the baseband, while highly sensitive transition edge sensors require cryogenics, and pixelated devices with thousands of pixels are mostly still in their development stages.

In the present disclosure research and development of atom-based THz sources and detectors is performed. The proposed Rydberg-atom THz laser/maser 2700, 3000 has the potential to generate coherent, narrow band, tunable source of radiation in the range between 0.1 and a few THz. The present disclosure on sources is staged into several phases, progressing from fundamental demonstration of THz emissions from Rydberg-atom vapors towards the realization of efficient THz generation at substantial powers (1 mW and higher). On the receiver side, atom-based field sensors are used to detect and demodulate THz signals emitted from frequency-matched atom-based sources. Both Rydberg-maser transmitters 3010 and receivers 3020 are scalable into pixelated arrays. The matched Rydberg-atom-based transmitter and receiver units 3000 are suitable for generic imaging applications and, when combined with atom-based modulation and demodulation methods, for applications in communications technology.

Rydberg-Atom THz Maser Principles of Operation

FIG. 27: High-frequency (THz) maser 2700 concept for a cesium implementation.

A dense sample of Rydberg atoms presents, in certain limits, an ideal laser gain medium. Here a high-frequency (THz) maser 2700 with a bound-bound masing transition between a pair of Rydberg states is disclosed. FIG. 27 shows the proposed concept of a Rydberg THz source or transmitter (Tx) 2700. The Rydberg gain medium is contained in a thermal vapor cell of cesium or rubidium 2702, and is pumped by lasers 2701 from the ground into a Rydberg state by a suitable one- or multi-photon excitation process. To achieve a reasonable conversion efficiency of laser energy into THz radiation, it is required that a large fraction of the laser light becomes absorbed.

In the most generic case of two-photon excitation, the lower transition can be on the D2 line, for which Beer's absorption coefficient can be easily temperature-tuned into the range of several $cm^{-1}$. This is large enough to ensure efficient absorption. However, the upper (Rydberg) transition will always have absorption coefficients ranging below 1% $cm^{-1}$. This problem can be addressed by injecting the upper-transition pump light 2701 using an optical cavity 2704a, 2704b. The cavity serves two purposes, first to increase the effective absorption length in the medium, and second to increase the upper-transition Rabi frequency while maintaining a small device size. The optical pumping beams 2701 propagate transversely to an elongated cell that contains or is embedded within a tunable THz cavity 2706, 2708 with a moderate Q-value. The THz masing occurs into a longitudinal Gaussian mode of the resonator. Maser radiation 2710 is extracted into free space through a coupling hole 2708 that is impedance-matched by choosing a suitable hole diameter and length (coupling losses=other cavity losses). The coupling-hole geometry and detailed shape also determines the diffraction-limited output mode of the THz maser.

A Rydberg THz receiver (Rx) can be implemented, in many respects, by reversing FIG. 27. The THz field is then detected by Rydberg electromagnetically-induced transparency (Ryderg-EIT) on the lower (852-nm) transition. In Rx mode, the 852-nm beam functions as EIT probe, while the upper transition as EIT coupler. The symmetry in the atomic physics methods and the RF engineering between the proposed Tx and Rx Rydberg-maser and -receiver units ensures considerable effectiveness of the proposed R&D effort, both in terms of the fundamental conception of matched Tx and Rx devices as well as in the use of budgets and resources to realize and to manufacture them. In the following, a selection of details is provided.

Rydberg-Maser Threshold

THz and optical emissions from Rydberg samples cascading through lower-lying levels have been observed, for instance, by C. Adam's group, by T. Pfau's group, and at the CQT (National University of Singapore). The achievement of Rydberg superfluorescence and masing, which leads to coherence of the emitted field, presents a somewhat unexpected challenge. To explain this point, superfluorescence in an elongated pump medium with a length that is much larger than the wavelength and with a cross-sectional area larger than one square-wavelength is considered.

In this case, superfluorescence occurs if the Rydberg-density exceeds the inverse cubic wavelength (item a) times the ratio (item b) between the dipole relaxation rate, $g_{dipole}$, and the spontaneous decay rate of the masing transition, $g_{maser}$. Item a appears deceivingly favorable, as a 300-GHz field corresponds to one Rydberg atom per $mm^3$ (i.e., almost nothing). Item b makes Rydberg superfluorescene and masing challenging. As an example, the 25D level of rubidium in a 300K radiation field has an overall decay rate of $g_{all}$=90,000 per second at 300 K, which includes all spontaneous decays, all upward and downward black-body bound-bound transitions, and black-body ionization. The most favorable masing transition, 25D to 25P, has a spontaneous decay rate $g_{maser}$ of 59 per second (this is calculated at 0K). The resonant field is at 150 GHz and has about 42 thermal photons at 300 K. In a first guess one may set $g_{dipole} \sim g_{all}$. This would suggest a ratio (item b) of about $g_{dipole}/g_{maser} \sim 90,000/60 \sim 10^3$, corresponding to a critical Rydberg-atom density of $10^5$ per $cm^3$ (at 150 GHz).

However, the Rydberg transition is also broadened by interaction-time broadening, Rydberg interactions and stray electric and magnetic fields. These additional broadening mechanisms typically cause a dipole relaxation rate on the order of $g_{dipole} \sim 10^6$ to $10^7$ $s^{-1}$, leading to a ratio (item b) of $g_{dipole}/g_{maser} \sim 10^5$. While the corresponding critical Rydberg-atom density of $10^7$ to $10^8$ per $cm^3$ (at 150 GHz) should be achievable (see below), it is not a trivial task. The fact that the medium is embedded in a moderate-Q cavity will lower the critical (masing) density of Rydberg atoms by a small factor.

Inhomogeneous broadening can be largely eliminated by providing a very low density, collision-less, and cryogenic environment, as well as a very-high-Q superconducting microwave cavity that is resonant with the masing transition. These systems ensure maximal cooperativity and minimal maser field energies (that is, typically, measured in numbers of microwave photons). These systems with cold atoms have been used for high-profile efforts in cavity-QED, quantum-state control and quantum engineering.

Rydberg-Atom Interactions

It is well known that Rydberg atoms interact via long-range multipolar interactions, which lead to attractive and repulsive molecular potentials. From the viewpoint of building a maser, these lead to unwanted level shifts of the optical Rydberg-atom excitation and of the masing transition. In a recent publication [X. Han et al. J. Phys. B 52, 135102 (2019)] it was seen that the equilibrium distance of long-range Rydberg macro-molecules scales as the effective quantum number to the $2.5^{th}$ power, in good agreement with earlier works elsewhere. This scaling appears to hold across several species and quantum states, and gives expected sizes of Rb 25D Rydberg-pair macro-molecules of about 0.3 microns.

FIGS. 30A and 30B show interaction potentials of pair states (Rb 25D5/2)2, for one case of total angular momentum M along the internuclear axis. It is seen that bound molecular states may exist around an internuclear separation of R=0.3 m, and that van-der-Waals shifts drop below 2 MHz at R=1.5 m, corresponding to a Rydberg-atom density in the low-$10^{11}$ $cm^{-3}$ range. Noting that the order of magnitude of the interactions does not depend much on M, the calculation indicates that van-der-Waals shifts should not severely limit maser operation with Rb 25D. Similar results can be expected for Cs systems.

FIGS. 28A and 28B: Rydberg pair potentials 2802 for (Rb 25D$_{5/2}$)$_2$ and total angular momentum M=2 along the internuclear axis 2804, for both parties p of the two-body molecular states. The symbol areas are proportional to excitation rates from 5P$_{3/2}$, averaged over all alignment angles between the circularly polarized excitation-laser direction polarization and the internuclear axis. The zoom-in of FIG. 28B shows the long-range van-der-Waals interactions.

Rydberg-Atom Excitation

For given Rabi frequencies on the lower and upper transitions, one can solve the Lindblad equation to find the Rydberg-atom population averaged over the Maxwell velocity distribution in the cell. FIGS. 29A and 29B show an example for Rb at a cell temperature of 350 K. The absorption on the lower transition (780 nm) is about 1 $cm^{-1}$, which is on the order of the path length of the respective beam through the vapor cell. The upper transition has an absorption coefficient of only 0.3 $m^{-1}$. To ensure reasonable optical-to-THz energy conversion, the present disclosure specifies an optical cavity for the upper-transition light with a finesse on the order of 30. The cavity increases the effective path length of the beam in the medium to near one meter, leading to an improved deposition of upper-transition laser energy into the Rydberg pump medium. Finally, the estimates show that approximately 1% of atoms of all velocity classes in the cell can be promoted into the Rydberg state. For an atom density of about $5 \times 10^{11}$ $cm^{-3}$, the atom density of Rb-85 at 350 K, therefore a Rydberg-atom density on the order of $5 \times 10^9$ $cm^{-3}$ is estimated. This value is more than one order of magnitude higher than the estimated critical density for superfluorescence on the Rb 25D to 26P transition, and more than one order of magnitude lower than the density at which van-der-Waals shifts become important.

FIG. 29A: Absorption coefficient 2902, 2906 on the upper (solid; Dc) and lower (dashed; DP) transitions for the indicated Rabi frequencies vs the detuning of the lower-transition laser from resonance 2904. The upper transition laser is on-resonance and fixed in frequency. The plot shows EIT (dip in dashed curve) as well as the typical absorption levels on the transitions. FIG. 29B: Upper-transition absorption coefficient 2902 and Rydberg-state population 2908 vs lower-transition detuning 2904.

FIG. 30: THz source and matched receiver 3000.

THz Source

Rydberg Technologies Inc. is capable of fabricating miniaturized Rb and Cs vapor cells with inner diameters ranging 3 mm and several cm, with lengths of 5 mm and higher. The THz source cells used for the present disclosure include Pyrex cylinders with anodically bonded float zone (FZ) Si discs in place of the usual optical windows. While Pyrex glass absorbs THz radiation, FZ silicon has low absorption and a high dielectric constant in the THz range, allowing a low-finesse THz cavity to be formed within the cell. Cell fabrication can include anodic bonding for integrated structures, including fabrication of FZ-glass vapor cells for other applications.

In the present disclosure, the THz cavity 2700, 3010 has a fixed-position exit disk 2708, 3014a of FZ silicon with a shape-optimized aperture for directed emission of THz from the cavity. The rear THz cavity mirror 2706, 3014b is a solid disk without an embedded THz exit structure. The outside surfaces of both FZ silicon reflectors 3014a, 3014b are coated with metallic surfaces to ensure minimal radiation losses and a high Q-value of the THz cavity. For frequency tuning of the THz cavity, the rear THz reflector 2708, 3014b may be a position-tunable component that is embedded within the cell and that can be translated back and forth with an external actuation device. It is part of the present disclosure to (a) calculate the best-possible shapes and material choices of the exit port that yield good output coupling, a diffraction-limited beam, impedance matching (cavity absorption losses=coupling losses), and mechanical stability against the exterior atmospheric pressure, and (b) determine the best solution that affords frequency tunability of the THz cavity 2700, 3010.

As seen in FIGS. 27 and 30, the atom sample is transversely pumped. The pumping occurs with counter-aligned lower- and upper-transition laser beams 3016a, 3016b. It is seen in FIG. 29B that the Rydberg population, $\rho_{33}$, reaches values around 2% of all atoms (meaning that resonant atoms that have the correct velocity in pump beam direction have $\rho_{33}$ on the order of 50%). At an atom density of $5 \times 10^{11}$ $cm^{-3}$ (Rb-85 at 350 K), one may therefore expect a Rydberg-atom density of about $10^{10}$ cm$^{-3}$, low enough to avoid interactions and high enough to be well above the above estimated masing threshold.

The achievable output power is limited by the quantum conversion efficiency of optical light into THz and the Rydberg-atom population time scale. The ionization energy of Rb is 4.2 eV, hence the quantum efficiency at 150 GHz is $1.5 \times 10^{-4}$. At a pump intensity of a several tens of mW cm$^{-2}$ and a pump cross section of 10 cm$^2$, one may expect several tens of micro-Watts of output in coherent, narrow-band THz radiation delivered into a diffraction-limited beam. At a location where the main radiation lobe covers 1 m$^2$, the THz electric field is on the order of 0.1 V/m, a value that is well above the sensitivity limit of Rydberg-EIT-based field sensing methods. In some embodiments, one can determine the experimentally achievable output power levels and investigate optimization measures.

One may note that the lower masing levels in Rydberg masers should efficiently deplete through spontaneous decay, which is faster for lower-lying Rydberg states than for higher-lying ones. It is possible to harvest THz emissions from an entire Rydberg cascade whose uppermost rung is the initially populated Rydberg level. This scheme would, obviously, increase the overall optical-to-THz energy conversion efficiency. Finally, in case the lower maser level is found to deplete too slowly to allow for cw THz emissions, the decay rate of the lower level of the Rydberg-maser transition can be accelerated by optical quenching. In this method, the lower Rydberg-maser level is coupled to $5P_{1/2}$ (in Rb) or $6P_{1/2}$ (in Cs) using a quenching laser. The atoms then rapidly decay via spontaneous emission on the D1 line into the ground state. The quenching laser would be an additional auxiliary laser introduced into the source (Tx) cell.

THz Receiver

Perfect matching of source (Tx) and receiver (Rx) frequencies is an inherent advantage of atom-based THz technologies. As indicated in FIG. 30, the Rydberg levels in the Rx cell 3220 are probed with a combination of EIT probe and coupler beams 3002, 3004 that have similar frequencies as the pump beams 3016a, 3016b in the Tx cell 3010. The absorption of the probe beam exhibits an EIT signal when the coupler is resonant with a Rydberg level (cascade EIT). Field-induced level shifts and AT splittings of the sensor Rydberg state are observed by scanning the coupler-laser frequency across the atomic Rydberg resonance and recording the probe transmission. The observed spectrum yields the radio-frequency (RF) electric field. This method of RF field sensing has been investigated and developed towards field-sensing devices and products in this disclosure. Here, a THz Rx cell 3020 will be used to measure THz output 3008 from the Tx cell 3010.

It is noted that the Rydberg Tx and Rx cells 3010, 3020 can be used and tested independently from each other. For instance, standard bolometric broadband THz sensors can be employed to verify the basic THz emission functionality of the atom-based Tx cell. Similarly, the functionality of the atom-based Rx cell 3020 can be verified by measuring THz emissions of a commercial THz source.

Appendix C: Exemplary Rydberg-Based Quantum RF Phase Detector and Receiver

Appendix C: "Rydberg-based quantum RF phase detector and receiver," David A. Anderson and Georg Raithel, Internal document, pages 1-4, is hereby incorporated herein in its entirety by reference.

Figure 31:
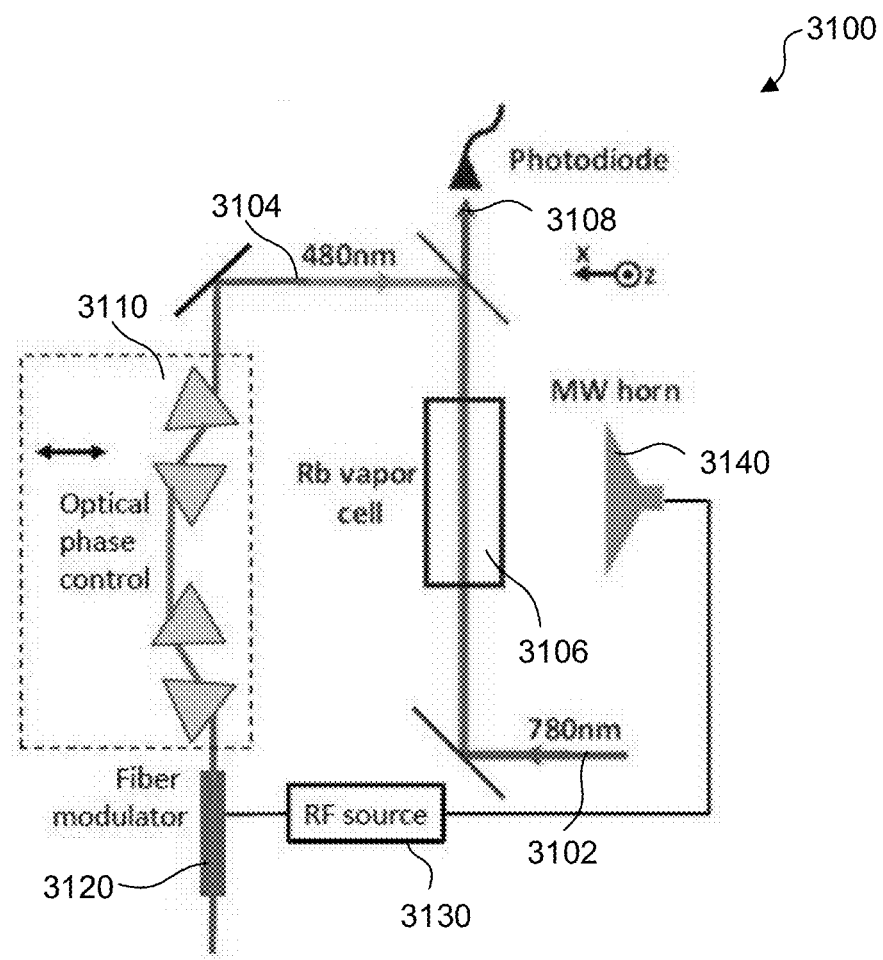
FIG. 31 is a schematic illustration of a Rydberg-atom RF phase detector and receiver, according to an exemplary embodiment.
Figure 32:
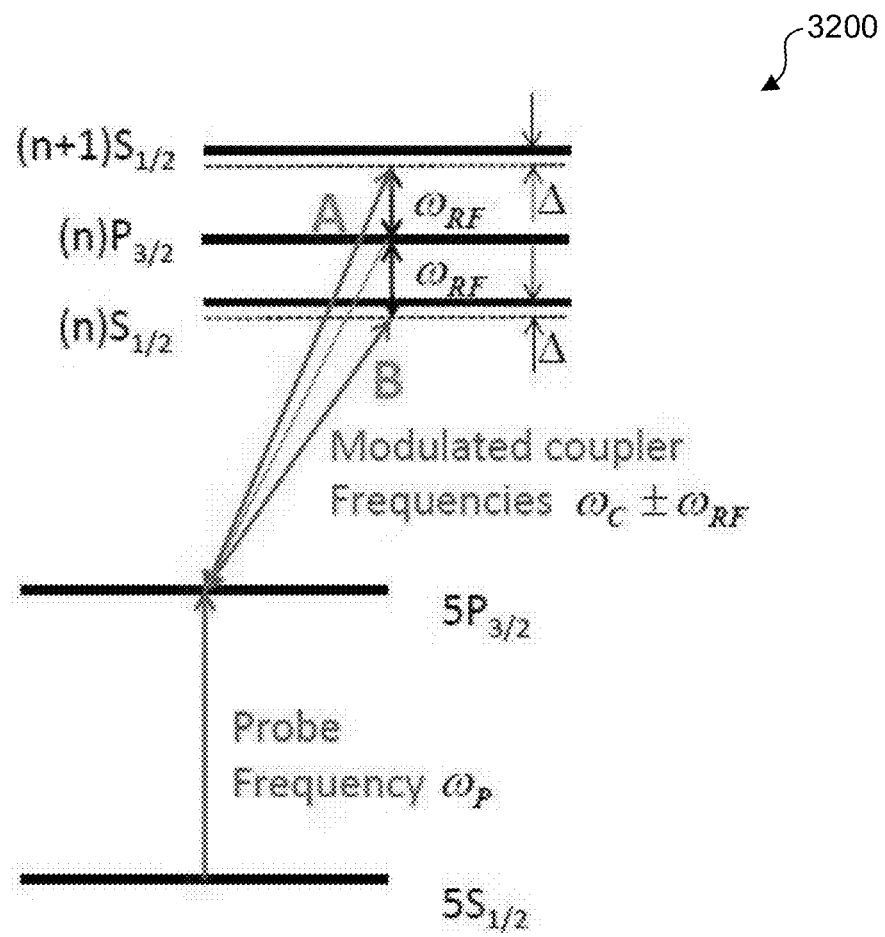
FIG. 32 is a schematic illustration of an atomic energy-level diagram of the Rydberg-atom RF phase detector and receiver shown in FIG. 31, according to an exemplary embodiment.
Figure 33:
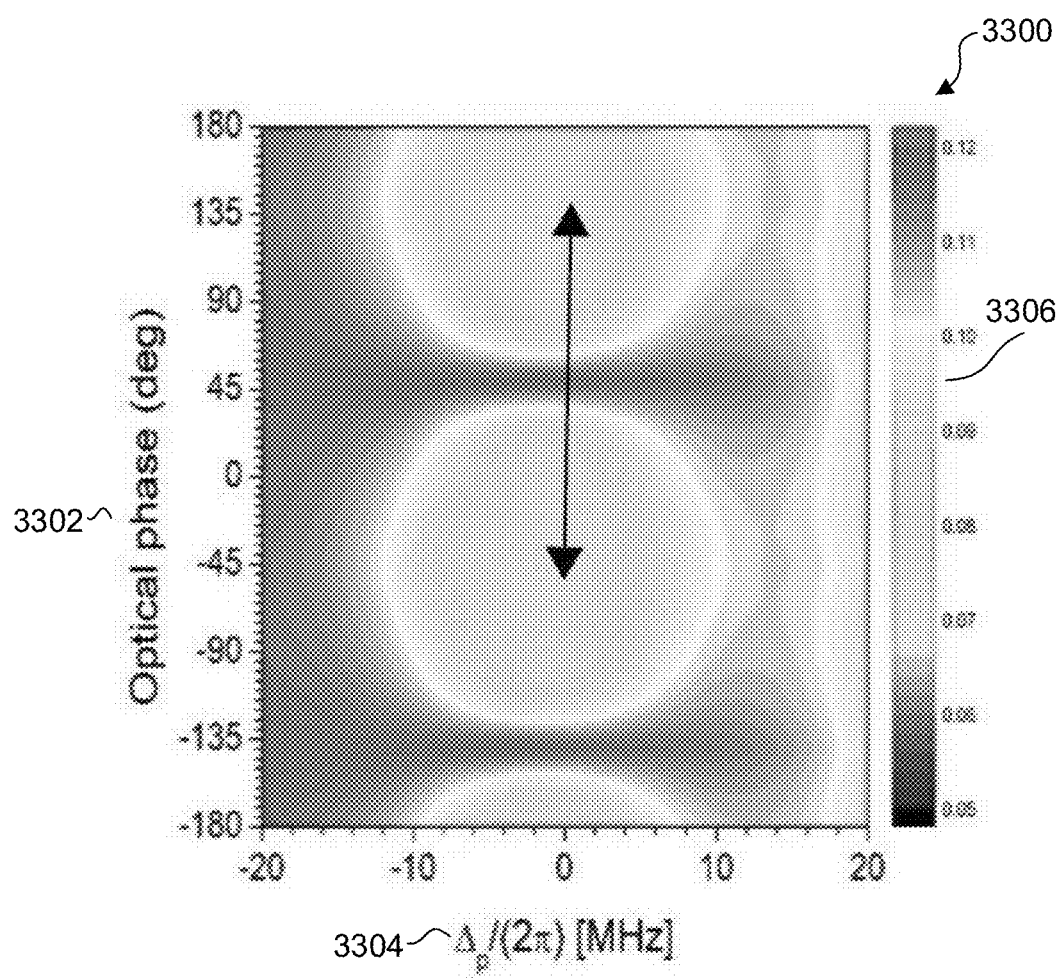
FIG. 33 is a plot of optical phase as a function of laser-frequency detuning for the Rydberg-atom RF phase detector and receiver shown in FIG. 31, according to an exemplary embodiment.

FIGS. 31-33 illustrate Rydberg-atom RF phase detector and receiver 3100, according to various exemplary embodiments. FIG. 31 is a schematic illustration of Rydberg-atom RF phase detector and receiver 3100. FIG. 32 is a schematic illustration of atomic energy-level diagram 3200 of Rydberg-atom RF phase detector and receiver 3100 shown in FIG. 31. FIG. 33 is a plot 3300 of optical phase 3302 as a function of laser-frequency detuning 3304 for Rydberg-atom RF phase detector and receiver 3100 shown in FIG. 31.

2. Relevance

The core thrust of the present disclosure is the development of a novel quantum sensor 3100 for RF phase detection and measurement with Rydberg atoms. The present disclosure addresses existing limitations of Rydberg-based quantum RF field sensing by employing a new capability of RF phase detection using an all-optical super-heterodyning technique. The new quantum sensor 3100 provides substantial improvements in achievable RF phase resolution, detection sensitivity, and bandwidth compared to state-of-the-art antenna technology. With established phase-sensitive technologies, such as synthetic aperture radar (SAR), phase-modulated signal transmission and telecommunications, antenna characterization, as well as emerging trends in phased-array antennas in 5G, the quantum RF phase sensor 3100 enables heretofore impossible applications in RF by virtue of the performance advantages exhibited by Rydberg-based RF sensors compared to antennas. This includes capability for ultra-subwavelength RF detection, wideband frequency, and large dynamic field range with single, sub-wavelength atomic detectors, as well as EMP/EMI-tolerance for use in harsh EM environments, and calibration-free operation for long-term stability and reliability.

In the present disclosure, feasibility studies of the quantum RF phase detector 3100 are performed and demonstrate core capabilities relevant to broad application areas that include communications, security, surveillance and reconnaissance, electronic support measures, navigation, RF powerand antenna engineering. The present disclosure includes the design, development, and laboratory demonstrations of a quantum RF phase detector 3100. A detector characterization is performed to establish viability and baseline performance metrics in sensitivity, spatiotemporal resolution, and dynamic range. Demonstrations of super-resolution wide-band detection, isotropic reception, and enhanced phase-modulated signal communications are also performed. The quantum RF phase detector 3100 has substantial size, weight, power (SWaP) and long-term cost reduction compared to existing long-wavelength antenna receiver and detectors systems used across application areas.

Basic Principle of Rydberg-Based RF Field and Phase Sensing:

Rydberg-atom RF field sensing employs electromagnetically-induced transparency (EIT) as a quantum-optical readout of Rydberg states in an atomic vapor. Parameters of an incident RF field are obtained with optical EIT beams passed through a vapor cell that spectroscopically interrogate electric-field-sensitive Rydberg states of the atoms exposed to the incident RF field. Detected changes in the transmission of the optical probing beam through the atomic vapor provide a direct, atom-mediated RF-to-optical readout and information on the incident RF signal field. Broadband sensing of RF electric fields is afforded by the large electric dipole moments, d, of RF-resonant transitions between Rydberg states, which in a single atom span a wide range of RF frequencies from MHz to sub-THz with minimum field detection levels <1 mV/m. The electric field amplitude of an RF wave is detected via EIT line-shape changes and shifts due to the atom-field coupling strength, $\Omega_{RF}$, where in the limit of small fields the field amplitude may be expressed as $E=\hbar\Omega_{RF}/d$, where h is Planck's constant.

Rydberg-based RF phase sensitivity is realized using a fundamentally new heterodyne detection scheme 3100 based on electro-optical encoding of the RF phase of a local RF oscillator within the optical fields used for quantum-optical field readout (EIT). In this quantum super-heterodyne (quantum superhet) detection scheme 3100, an optical reference RF modulation is injected into the optical coupler laser to imprint an RF reference onto the Rydberg atom that is phase-coherent with the incident RF field to be measured. Here, the coupler beam is frequency- or amplitude-modulated with a signal frequency QRF that is tuned near the frequency of the incident RF field. The resulting effective EIT coupling Rabi frequency, $\Omega_c \sim \cos(\varphi_{FF}+\varphi_{OPT})$, is dependent only on the phase of the incident RF field, $\varphi_{RF}$, the optical phase, $\varphi_{OPT}$, and common factors. A change in the incident RF phase can therefore be detected from the change in optical absorption of the EIT probe beam through the atomic vapor. A detailed example is illustrated in FIGS. 31-33.

3. Technical Objectives 3.1. Detailed Analysis of Physics Principles Underlying Quantum RF Phase Receiving and Measurement.

Parameter space of relevant tuning parameters of the Rydberg-based detector including optical Rabi frequencies and optical modulation parameters will be investigated for optimal performance in super-heterodyne RF detection, ultra-narrowband intermediate frequency (IF) amplification, and RF-signal channel selectivity.

3.2. Development of a Rydberg RF Phase Sensor for Laboratory Demonstrations.

In a second component a laboratory prototype 3100 was designed and built with a miniaturized vapor-cell detector 3106 with optical components for light injection and readout, with back-end optical beam modulation and conditioning for heterodyne RF phase sensing. RF transmission and antenna characterization platforms were designed for testing and application demonstrations.

3.3. Characterization, Validation, Performance Demonstrations.

In a third component of the present disclosure the detector 3100 was validated and characterized with an evaluation of performance metrics including achievable phase sensitivity, spatiotemporal resolution, and dynamic range. Proposed application demonstrations include super-resolution wideband detection, isotropic reception, sub-wavelength near-field antenna field and phase mapping, and enhanced phase-modulated free-space signal reception and communication. Designs of a low-SWAP quantum RF detector and receiver device 3100 were evaluated.

4. Technical Approach to Meet the Objectives

In the present disclosure, technical design and development of a Rydberg-based quantum RF phase detector was performed, and proof-of-principle measurements, detector characterization, and laboratory demonstrations were performed. Studies of fundamental atomic physics for ultra-high sensitivity RF phase detection using all optical RF-heterodyning Rydberg EIT readout schemes was developed and applied. Key components of the present disclosure are described in the following sections.

FIGS. 31 and 32 illustrate the operating principle and basic design of the Rydberg-based quantum RF phase detector 3100. The illustrated laboratory setup in FIG. 31 comprises a miniaturized rubidium vapor cell detector 3100 with probe (780 nm) and coupler (480 nm) laser beams 3102, 3104 counter propagating through the vapor 3106 for a typical scheme in two photon Rydberg EIT quantum-optical readout. (The detector 3100 may also be designed using a cesium vapor with corresponding optical wavelengths.) The probe transmission 3108 is detected by a photodetector for electrical readout of the detector 3100 response to the RF phase and amplitude as the coupler is frequency-tuned to chosen field-sensitive Rydberg levels and phase-modulated at an RF frequency to imprint an RF reference phase onto the detector atoms.

In the setup, the RF phase modulation of the coupler laser 3104 is generated using an electro-optic (fiber) modulator 3120 and an additional optical phase control 3110 is added in-line to allow optional scans across the phase of the incident RF field. The corresponding modified Rydberg EIT ladder scheme 3200 implemented here is shown in FIG. 32, where the two RF phase-modulated coupler frequency components couple the rubidium 5P→nS and 5P→(n+1)S Rydberg levels. The incident RF field couples these S Rydberg levels to the nearby nP Rydberg level, establishing an atom-mediated interferometric relationship between the RF-modulated optical signal and incident RF. The coherent two-photon EIT ladder scheme 3200 converts the relative phase of the incident RF into a probe transmission change.

FIG. 33 shows a simulated RF phase measurement of a 5 GHz RF field incident on a Rydberg based quantum RF phase detector 3100 in a room-temperature vapor cell 3106. The probe signal strength 3300 out of the detector 3100 is shown in a relative color scale 3306 as a function of optical phase delay 3302 and probe frequency 3304 relative to a Rydberg resonance. Here one immediately observes the direct atom-mediated conversion of the phase of the RF wave into the optical signal output from the Rydberg quantum phase detector 3100, where the variation of the optical signal intensity during a linear scan of the optical (RF reference) phase in the detector 3100 reveals the phase of the incident RF wave (black arrows marking a Tc-phase shift).

In applications where the RF signal phase is varying relative to the detector 3100, such as in phase-modulated communications or in spatial field and phase mapping in antenna measurements, the optical signal output 3300 responds real-time to RF-carrier phase changes without a scan of the optical phase. Conversely, the optical phase control enables RF phase detection in applications where the incident signal is not modulated or fixed relative to the optical (RF reference) phase in the detector. Further, the embedded optical (RF reference) phase control allows selectable high-frequency modulation of the RF references enabling the detector to realize all-optical (super)heterodyne RF detection capability with enhanced sensitivity, high spatiotemporal phase resolution, and RF frequency selectivity. Further, this is all done in the analog domain at the atom-field interaction instead of heterodyning and processing on electrical signals as required in antenna-based platforms.

FIG. 31: Illustration of quantum RF phase detector sensing-element back-end and operating principle 3100 for phase-sensitive measurements of RF electric fields. The RF/microwave horn (MW) 3140 stands for any RF signal source 3130, e.g. an antenna under test, RF communications signal, or other object wave(s) of interest. The fiber modulator 3120 phase-coherently imprints an RF reference beat onto the coupler beam 3104 sent to the atoms in the vapor cell 3106. The RF reference beat replaces the reference beam that is normally needed in phase sensitive (holographic or superheterodyne) field detection. The vapor cell 3106 in the atom-based RF sensing element 3100 is small (~1 mm) and has 780 nm and 480 nm laser beams 3102, 3104 counter propagating through the vapor. The fiber modulator 3120 and the optical phase control element 3110 are part of the back-end of the sensing element that includes the lasers, signal readout electronics, and a computational unit for analysis.

FIG. 32: Quantum mechanical level scheme and optical/RF excitation pathways 3200 used in the phase-sensitive RF electric-field detection and measurement 3100.

FIG. 33: Calculated optical signal readout 3300 from the Rydberg-based quantum RF receiver of the phase of a 5 GHz RF field incident on the Rydberg-based as a function of optical phase 3302 and frequency detuning $\Delta_P$ 3304) from a chosen Rydberg state. The optical phase separation between maxima (teal) and minima (red) of the pattern 3306 in the plot along the vertical direction at a fixed $\Delta_P \approx 0$ MHz, indicated by the black double arrow, -shift of the RF field picked up by the quantum RF receiver. For a fixed optical phase and frequency $\Delta_P$, the phase of an incident RF-carrier signal is directly mapped onto the optical signal.

Unlike antenna receivers, the Rydberg-based quantum RF phase detector/receiver 3100 is intrinsically free of stray external radiation and interference from a local reference oscillator due to the local oscillator being imprinted via optical modulation onto field-sensitive Rydberg atoms. The direct optical injection to frequency-matched Rydberg resonances also makes Rydberg-based quantum RF phase receivers 3100 immune to oscillator sideband noise, which is a significant practical limitation and design constraint in antenna systems. The noise immunity arises due to the inherently weak interaction between the atoms and coupling light for higher-order optical side-bands that are generally off-resonant with target atomic transitions. Finally, the presence of image frequencies, another major disadvantage of traditional antenna-based superheterodyne receivers (super-hets), may be entirely avoided by taking advantage of the ultra-narrow IF amplification and high frequency/channel selectivity enabled by narrow-line atomic Rydberg transitions and parametric amplification.

In some embodiments, simulation codes for solving the master equation of four- and five-level systems for Rydberg EIT field and phase sensing can be utilized. In some embodiments, numerical simulations can be performed to model the EIT readout of RF field and phase for chosen resonant and near-resonant RF fields. In some embodiments, theoretical detector performance metrics can be evaluated including baseline performance in sensitivity, spatiotemporal resolution, dynamic range, parametric amplification, and RF frequency selectivity.

Appendix D: Exemplary Optical RF Phase Sensing and Measurement With Rydberg Atom Vapors Appendix D: "Optical RF phase sensing and measurement with Rydberg atom vapors," Internal document, pages 1-2, is hereby incorporated herein in its entirety by reference.

FIGS. 5A-5C illustrate quantum-state-space interferometer 500, according to various exemplary embodiments. FIGS. 5A and 5B are schematic illustrations of quantum-state-space interferometer 500. FIG. 5C is a plot 550 of an optical readout of quantum-state-space interferometer 500 shown in FIGS. 5A and 5B.

Optical RF Phase Sensing and Measurement with Rydberg Atom Vapors

Relevance: Recently there has been a surge in efforts to harness the unparalleled susceptibility of Rydberg atoms to RF electric fields across the electromagnetic spectrum, from DC to THz, to realize new capabilities in RF and novel atom-based quantum RF field sensors and devices. To date, advances in Rydberg atom-based RF field sensing continue to be rooted in the same fundamental method: spectroscopic detection of field-sensitive Rydberg states of atoms that measure the electric (E) field amplitude of the incident RF electromagnetic wave. This was motivated early on in part by a need to replace century-old antennas as RF E-field standards with broadband SI-traceable absolute (atomic) standards for RF electric fields at National Metrology Institutes, and has recently been established as a novel quantum technology platform with broad capabilities maturing into commercial RF detection and measurement instrumentation.

Beyond RF E-field metrology and measurement, most RF applications require phase sensitive detection capability. Examples include antenna near-/far-field mapping, synthetic aperture radar (SAR), communications, phased-array antenna characterization and receivers in 5G, to name a few. To address this, the present disclosure developed and demonstrated a fundamentally new all-optical RF phase detector 500 based on Rydberg atom vapors. The Rydberg quantum-enhanced field sensor 500 as a new device addresses these needs.

Context: Phase sensing and heterodyne methods rely on providing a local oscillator field within the detector for phase referencing and, optionally, parametric amplification. This is common knowledge in many fields, including RF, holography, and nonlinear optics. Ongoing work in Rydberg-based E-field sensing has employed external RF reference fields produced by secondary antennas for this purpose. The all-optical RF phase sensing method 500 presented here employs an effective RF reference via a suitable electro-optic modulation of the laser beams used to read out the Rydberg atoms' response to the field to be measured. The laser fields that are being modulated are already employed in established Rydberg atom RF sensing, providing an efficient means to use these same optical fields as a carrier for the RF reference to the atoms. This optical method 500 removes the need for any an external RF source such as an antenna. While the RF-wave phase referencing method is, conceptually, the easiest to understand and to implement in laboratory tests with external sources, it requires an antenna structure with the atomic detector and in many applications simply cannot deliver a phase-stable, interference-free RF reference wave to the atoms. The optical RF phase referencing method 500 eliminates these shortcomings. Furthermore, the optical RF phase referencing is spatially selective on sub-mm length scales, i.e. a dense grid of sensor atoms can be probed with optical-reference beams that vary from one grid-point to the next. Optical spatial resolution for broadband RF phase and amplitude sensing affords massive parallelization and miniaturization.

All-optical RF phase sensing: In brief, the optical RF phase detection 500 employs a closed, interferometric loop within the internal state space of the atoms. The driving fields are the modulated light fields, which have a known reference phase, and the external RF field of interest, whose phase and amplitude is to be detected or measured. The closed interferometric loop exhibits quantum interference between two optical excitation pathways within the Rydberg state space (see FIG. 5B). The EIT response of the atoms is, therefore, sensitive to signal phase and amplitude, enabling all-optical readout of RF phase and amplitude. A patent application for this method is published (Anderson et al. WO 2019/126038A1). Here the successful test of the method in the laboratory is reported. All-optical readout of RF amplitude and phase will replace the more basic approach. FIG. 5C shows a first demonstration result.

FIG. 5C: Optical RF phase measurement 550 of a 5 GHz RF field. The plot 550 shows the optical (EIT) response of Cs Rydberg atoms in a vapor cell to the applied external 5 GHz RF field versus EIT laser frequency (vertical axis) 552 and optical RF reference phase 554 applied via an electro-optic modulator to the atoms. It is seen that the optical EIT signal at certain fixed frequencies 556 of the EIT laser exhibits a strong modulation that reveals the RF signal field's phase.

Appendix E: Exemplary Rydberg Atoms for
Radio-Frequency Communications and Sensing:
Atomic Receivers for Pulsed RF Field and Phase
Detection Appendix E: "Rydberg atoms for radio-frequency communications and sensing: atomic receivers for pulsed RF field and phase detection," David A. Anderson et al., arXiv: 1910.07970v1, pages 1-10, published Oct. 17, 2019, is hereby incorporated herein in its entirety by reference.

Figure 34:
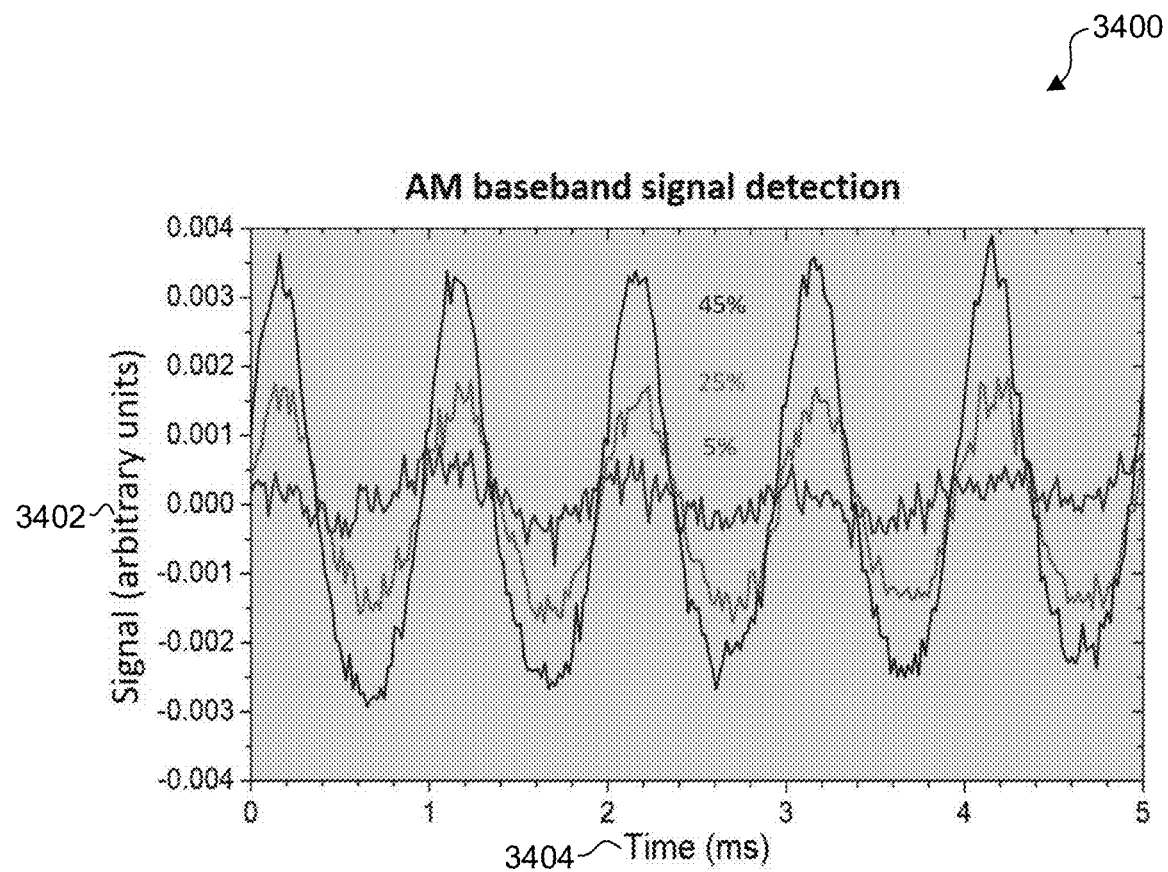
FIG. 34 is a plot of AM baseband signal as a function of time for a Rydberg-based atomic detector, according to an exemplary embodiment.
Figure 35A:
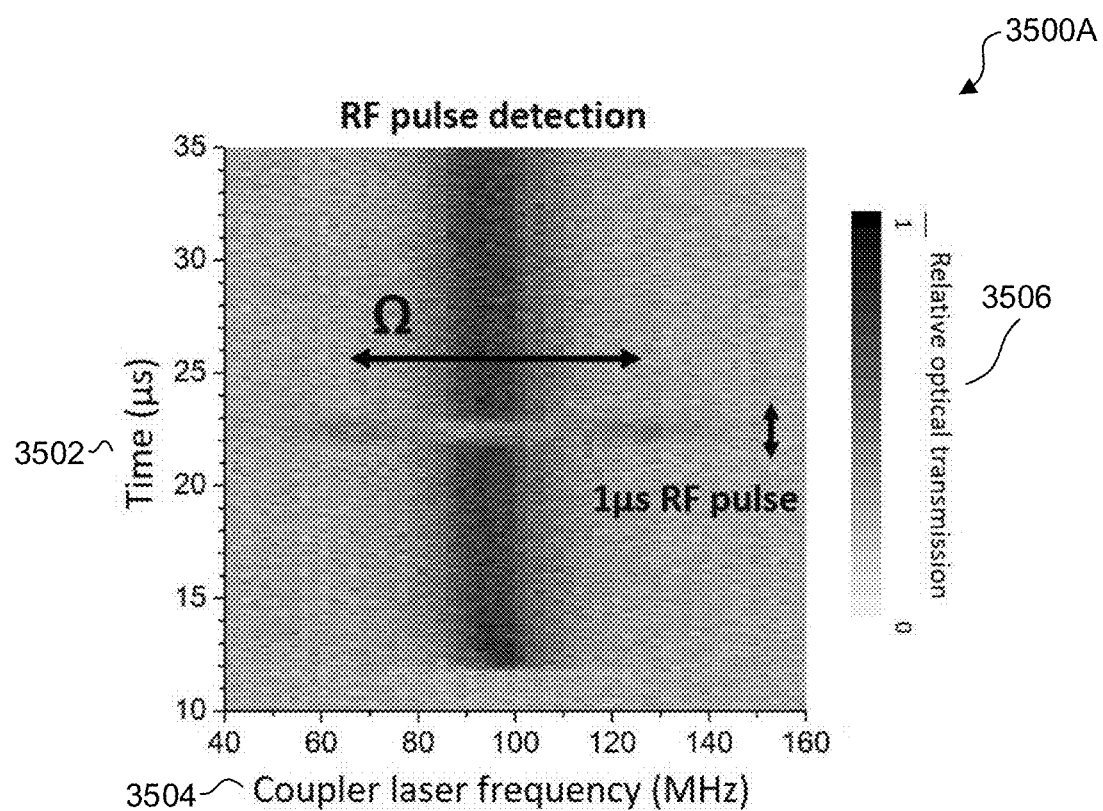
FIGS. 35A and 35B are plots of transmission over time as a function of coupler laser frequency for a Rydberg-based atomic detector, according to an exemplary embodiment.
Figure 35B:
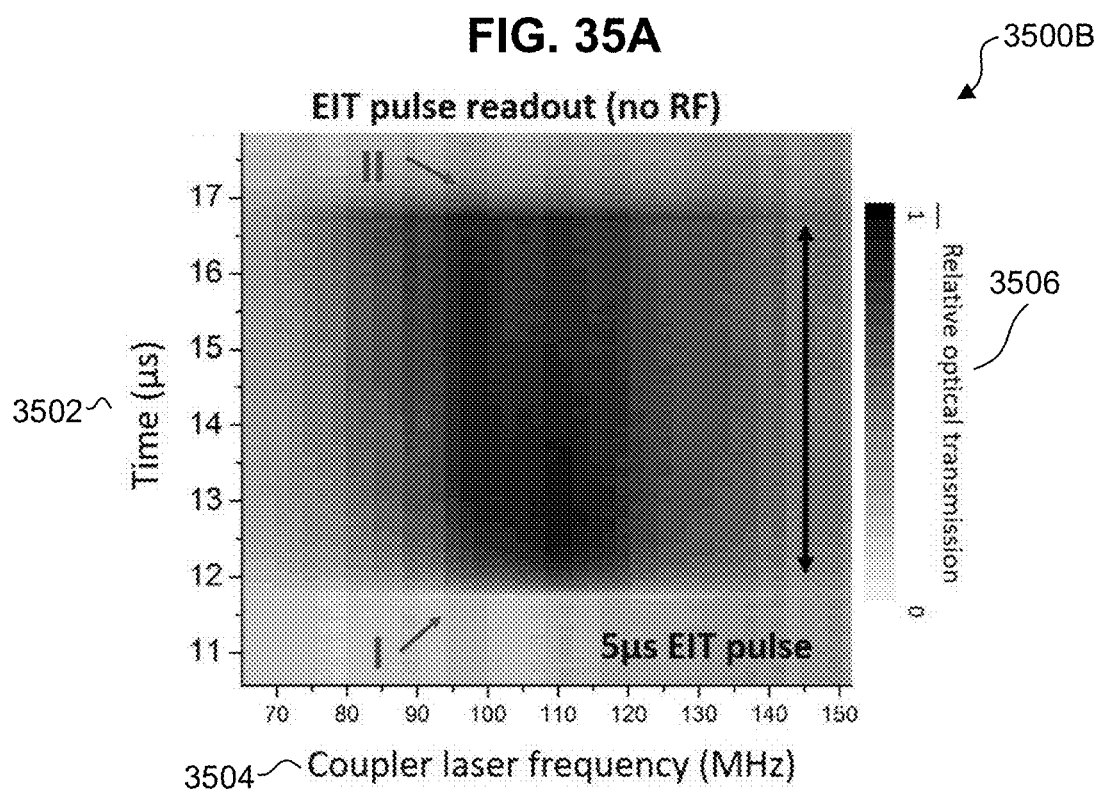

FIGS. 17A, 17B, 31, 32, 34, 35A, and 35B illustrate Rydberg-based atomic receivers (e.g., 1100, 3100) for pulsed RF field and phase detection, according to various exemplary embodiments. FIG. 17A is a schematic illustration of an atomic energy-level diagram 1700A for a two-photon Rydberg EIT optical readout scheme for a cesium vapor. FIG. 17B is a plot 1700B of an optical readout from an atomic vapor of a Rydberg EIT resonance 1702 as a function of laser frequency offset 1704. FIG. 31 is a schematic illustration of Rydberg-atom RF phase detector and receiver 3100. FIG. 32 is a schematic illustration of atomic energy-level diagram 3200 of Rydberg-atom RF phase detector and receiver 3100 shown in FIG. 31. FIG. 34 is a plot 3400 of AM baseband signal 3402 as a function of time 3404 for a Rydberg-based atomic detector. FIGS. 35A and 35B are plots 3500A, 3500B of transmission over time 3502 as a function of coupler laser frequency 3504 for a Rydberg-based atomic detector.

I. Introduction

The emergence of atomic sensor technologies is driving a paradigm shift in modern sensing and measurement by exploiting quantum phenomena to realize fundamentally new detection capabilities unmatched by their classical counterparts. Atomic sensing of radio-frequency (RF) electric fields using Rydberg electromagnetically-induced transparency (EIT) in atomic vapors has been the subject of growing scientific interest. This has been motivated in part by a drive at National Metrology Institutes to replace century-old antennas as RF standards with absolute (atomic) standards for RF electric fields, and has recently been established as a novel quantum technology platform with broad capabilities that has matured into commercial RF detection and measurement instrumentation.

A notable advance in atomic RF devices and measurement tools is the recent realization of the first Rydberg RF field probe (RFP) 1100 and measurement system (RFMS) 1800 for self-calibrated SI-traceable broadband RF measurement and imaging of continuous, pulsed, or modulated fields. Relevant developments include the realization of compact atomic sensing elements capable of broadband RF electric-field measurement from MHz to >100 GHz, fiber-coupled atomic vapor-cell RF field probes, the demonstration of ultra-wide dynamic field ranges spanning sub-10 mV/m up to >10 kV/m (dynamic range >120 dB), and all-optical circuit-free RF sensors for EMP/EMI-tolerant detection and operational integrity in high-intensity RF environments.

Hybrid atomic RF technology that combines atom-based optical sensing with traditional RF circuitry and resonators has also been developed realizing hybrid sensors with augmented performance capabilities such as resonator-enhanced ultra-high sensitivity polarization-selective RF detectors, waveguide-embedded atomic RF E-field measurement for SI-traceable RF power standards, and atom-mediated optical RF-power/voltage transducers and receivers. Recently, Rydberg atom-based field sensing has also been adapted to modulated RF field detection promising new possibilities in RF communications, with demonstrations including a Rydberg-atom transmission system for digital communication, atom radio-over-fiber, and "Atomic Radio" using a multi-band atomic AM and FM radio receiver based on direct atom-mediated RF-to-optical conversion of baseband signals picked up from modulated RF carriers.

In the present disclosure the basic principles of the atomic RF sensing method are described and the development of atomic pulsed RF detection and RF phase sensing establishing capabilities pertinent to applications in communications and sensing is presented. To date advances in Rydberg atom-based RF field sensors have been rooted in a method in which the fundamental physical quantity being detected and measured is the electric field amplitude, E, of the incident RF electromagnetic wave. Sections III and IV are focused on using atom-based E-field measurement for RF field-sensing and communications applications. With established phase-sensitive technologies, such as synthetic aperture radar (SAR) as well as emerging trends in phased-array antennas in 5G, a method is desired that allows robust, optical retrieval of the RF phase using an enhanced atom-based field sensor. Section V is focused on a fundamentally new atomic RF sensor and measurement method for the phase of the RF electromagnetic wave that affords all the performance advantages exhibited by the atomic sensor. The presented phase-sensitive RF field detection capability opens atomic RF sensor technology to a wide array of application areas including phase-modulated signal communication systems, radar, and field amplitude and phase mapping for near-field/far-field antenna characterizations.

II. Atomic-Physics and Field/Phase-Sensing Background

Atom-based field sensors (e.g., 1100, 3100) use Rydberg atoms as an RF-receiver medium. Classically, a Rydberg state is a state of an atom in which a valence electron resides in an orbit far from the atomic core. The weakly-bound, quasi-free electron of a Rydberg atom affords the atom a unique set of physical properties including a high sensitivity to external electric and magnetic fields. The atomic-physics principles of one- and two-electron systems are described by Bethe and Salpeter. Rydberg atoms of alkali, earth alkali and a variety of other species fall within this class of atomic systems. Several textbooks that are specifically focused on the physics of Rydberg atoms include the works by Gallagher and Stebbings and Dunning. For the present disclosure Rydberg atoms may be viewed as quantum oscillators that are fairly easy to prepare via laser excitation, and that are perfectly frequency-matched to a selection of incident RF frequencies. This is because the orbital frequencies of the Rydberg valence electron can be tuned into resonance with RF radiation. The set of highly responsive frequencies is different for every Rydberg state. Since there is a wide variety of different Rydberg states that are accessible by tuning the Rydberg-atom excitation lasers, Rydberg atoms offer broadband RF coverage from the MHz into the THz regime.

A single Rydberg-atom receiver consists of a valence electron of a single atom that has been laser-excited into a Rydberg state, whose orbital frequency allows a (near-) resonant, RF-driven transition into another Rydberg state. The frequency match affords a combination of very small receiver size, and high electric-field sensitivity. A single receiver Rydberg atom has a size on the order of a μm, while an atomic ensemble that is large enough for the construction of a technically viable and robust receiver instrument can range between hundreds of μm and a few cm in size. The response of the atomic ensemble to an incident RF field amounts to quantum-mechanical energy level splittings and level shifts that are observed by the means of EIT laser beams, which present an all-optical, robust tool to measure the atomic response, and to thereby determine the RF field. As the measurement is based on invariable atomic properties that are well known, this method of RF field determination is atom-based and intrinsically calibration-free. Sections III and IV employ a Rydberg-atom field sensor (e.g., 1100, 3100) to measure RF field amplitudes and to receive modulated RF signals.

To achieve phase sensitivity in an atom-based Rydberg receiver, one can employ elements of holographic phase-sensing methodologies. The phase of the signal wave, ϕ, is defined relative to the phase of a reference oscillator or reference wave, $\phi_{ref}$. To enable phase measurement of the signal wave, the signal electromagnetic field has to be brought into an interferometric relationship with the reference field. In practice, the phase reference is often mediated via a reference wave that is physically superimposed with the signal wave on top of a detector that measures field amplitude. Due to the superposition principle, which is common to all wave phenomena that follow the (linear) wave equation, the phase difference, $\phi - \phi_{ref} - \phi_{ofs}$, is obtained from an interference measurement. In its most basic implementation, the net signal is given by the sum of two sine waves with the same frequency, $A\sin(\omega t + \phi) + A_{ref}\sin(\omega t + \phi_{ref} + \phi_{ofs})$, with amplitudes A and a controllable offset phase $\phi_{ofs}$ that is used to tune the interference pattern from constructive to destructive, and to thereby find a value for $\phi - \phi_{ref}$. A measurement of the net wave amplitude versus $\phi_{ofs}$ yields the phase difference between the wave to be tested and the reference wave, $\phi - \phi_{ref}$. This usually sums up the task of phase measurement.

The principle of differential-phase measurement by the means of superposition of object and reference waves is widely used in holography. There, phase- and amplitude-sensitive recordings of interference patterns of signal- and reference waves on a planar recording medium with sub-wavelength spatial resolution allow accurate, three-dimensional reconstruction of the signal wave field. This holography concept can be translated from the optical into the RF domain. Section V describes a method of atom-based RF phase detection, measurement and enhanced receiving that was recently devised. The method is not limited to signal and reference waves of the same RF frequency. Reference waves that are offset in frequency enable heterodyne and superheterodyne signal amplitude and phase detection.

III. Atomic RF Electric Field Sensing

Atomic RF receiver technology employs EIT as a quantum-optical readout of Rydberg states of atoms in a vapor. FIG. 17A shows a picture of a miniature atomic vapor cell sensing element 1710 containing a pure cesium gas next to a standard Kα-band horn antenna. To sense and measure parameters of an incident RF field, optical beams are passed through the vapor cell to interrogate field-sensitive Rydberg states of the atoms exposed to the RF field. Detected changes in the transmission of an optical probing beam through the atomic vapor provide a direct RF-to-optical readout and information on the incident RF signal field. Under typical operating conditions, the atomic vapor has an optical density for the EIT probe laser beam propagated through the cell that is sufficiently high to obtain a robust EIT signal with high signal to noise, as required for RF field detection. Further, the atomic vapor in the cell is dilute enough so that interactions of the Rydberg atoms can be neglected. Therefore, the spectroscopic response of the medium to the fields can be modeled based on a quantum-mechanical picture of a single, isolated atom.

FIG. 17A shows an atomic energy-level diagram illustrating a two-photon Rydberg EIT readout scheme for a cesium vapor. In this basic scheme, two optical laser fields couple atomic states to a high-lying Rydberg state (30D in FIG. 17A) with a weak optical probe beam resonant with the first atomic transition between ground and intermediate states, and a relatively stronger optical coupler beam tuned into resonance with a second atomic transition between intermediate and Rydberg state. When the coupler laser-frequency is in resonance with the Rydberg state, an EIT window opens for the probe beam through the vapor. Owing to the sensitivity of the atomic Rydberg levels to the RF electric field, the Rydberg EIT signal provides an optical readout for the RF field. An example Rydberg EIT resonance is shown in FIG. 17B (black curve). In the presence of a moderate RF field at a frequency near-resonant with an allowed transition between the optically excited Rydberg level and a second Rydberg level of the atom, the EIT-detected atomic Rydberg line splits into a pair of Autler-Townes (AT) lines whose splitting is proportional to the RF electric-field amplitude (FIG. 17B (magneta curve)). In this linear AC Stark effect regime, the E-field is given by $$E = \hbar\Omega/d, \quad (1)$$

where Ω is the Rabi frequency of the RF-coupled atomic Rydberg transition (near-identical to the AT splitting measured optically in units 2π×Hz), d is the electric dipole moment of the Rydberg transition in units Cm, and $h = 6.62606 \times 10^{-34}$ Js/(2π) is Planck's constant.

FIG. 17A: An atomic vapor-cell RF sensing element 1710 in front of a Ka-band horn antenna and atomic energy-level diagram 1700A for RF sensing and measurement using a two-photon Rydberg EIT scheme in cesium. FIG. 17B: Rydberg EIT signal readout 1700B from Rydberg state without RF (black), with on-resonant weak RF field (teal) and moderate RF field exhibiting Autler-Townes splitting (magenta).

From Eq. 1 one obtains a direct, optical measurement of the electric field amplitude E of the RF wave in absolute (atomic) units traceable to fundamental constants. Generally, for low RF field levels, the sensitivity of the atomic receivers is dictated by (1) the electric dipole moment d of the Rydberg-Rydberg transition resonant with the incident RF field and (2) the spectroscopic EIT linewidth in the optical readout which determines the achievable resolution for measuring Ω. For RF-field frequencies in the range of 100 MHz to 500 GHz, resonant dipole moments in alkali atoms typically range from 102 to 105 $ea_0$, where e is the elementary charge and $a_0$ is the Bohr radius, with the principal quantum number n ranging from about 10 to 300, while Rydberg EIT linewidths are typically about 1 MHz or more.

Equation 1 provides a useful approach to RF E-field sensing and measurement with EIT in Rydberg atom vapors, but serves to a large extent as a didactic model because it is valid only within a relatively limited E-field range and for a discrete, albeit large, set of RF field frequencies near-resonant with Rydberg transitions, thereby rendering it impractical in many real-world E-field measurement scenarios. This is addressed by a well-developed measurement method and approach using EIT and exploiting the full quantum response of the Rydberg atom interaction with RF fields that includes off-resonance AC Stark shift readouts, enabling direct $E_{RMS}$ measurement of continuous-frequency RF field frequencies over tens of GHz with a >60 dB dynamic range. A full non-perturbative Floquet treatment allows measurement of the electric-field values and frequencies of even stronger (coherent) RF fields.

IV. Communications and Modulated RF Field Sensing with Atomic Receivers

The adaptation of the Rydberg atom-based RF E-field sensing and measurement approach to the detection of modulated and time-varying RF fields promises to enable new capabilities in RF sensing and communications, for example, as described in U.S. application Ser. No. 16/222,384, filed Dec. 17, 2018 (now issued as U.S. Pat. No. 10,823,775), which is hereby incorporated herein in its entirety by reference. Recent laboratory work has been performed demonstrating modulated RF E-field detection and baseband signal reception with Rydberg EIT in atomic vapors. Highlights include a Rydberg atom-based transmission system for digital communications, atom radio-over-fiber, and a multi-band atomic AM and FM receiver for radio communications recently adapted to two-channel reception using two atomic species. Atomic receivers for communications are a nascent technology prime for advanced development and adaptation to real-world systems.

The basic operating principle of an atomic RF receiver based on Rydberg EIT in vapor cells exploits the large differential dipole moments of Rydberg states of atoms. With an RF carrier wave applied to the atomic sensing volume, the coupler-laser frequency is set to an operating point on one of the inflection points of the EIT spectral line (see, for example, FIGS. 17A and 17B). As the incident modulated RF wave impinges on the atoms, the atoms respond synchronously to the time-varying RF electric field leading to a change in the probe light transmission through the vapor. This realizes a direct Rydberg-atom-mediated optical pick-up and demodulation of the baseband-modulated RF carrier signal, where the demodulation occurs in the atomic vapor cell without need for any demodulation or signal-processing electronics required by traditional antenna-receiver technology.

For the general case of a transmitted AM signal and differential dipole moment d of the target Rydberg states in the atomic receiver, a typical range in AM depth $\delta E/E$ is given by $\delta E/E \sim h \times \delta\Gamma/(Ed)$, where $\delta\Gamma$ is the EIT linewidth. FIG. 34 shows the real-time optical readout from an atomic rubidium vapor-cell receiver detecting and demodulating 1 kHz baseband signals transmitted in free space on an AM-modulated 37.4065 GHz RF carrier wave. Received signals are shown for three different AM modulation depths of the carrier. The modulation depths can typically range from several 10% down to below 1%, depending on exact operating conditions and receiver sensitivity requirements. In addition to being sensitive to changes in RF field amplitude, Rydberg states are also sensitive to changes in RF field frequency, allowing receiver pick-up and demodulation of FM RF carrier signals using a similar approach. This basic approach has been implemented in the reception of both AM and FM radio communications on RF carrier waves over a wide range of carrier bands, with wide-band operation of a single atomic receiver demonstrated for carrier frequencies spanning more than four octaves, from C-band to Q-band.

In addition to radio and digital communications, pulse-modulated RF field detection and measurement with Rydberg atom receivers promises to expand atom-based RF technology for enhanced performance capabilities in application areas including high-intensity pulsed-RF measurement and electromagnetic testing, pulsed radar, surveillance, and electronic support measures (ESM) systems. To this end, in the following the direct detection of pulsed RF fields with an atomic receiver in the time-domain and investigate the behavior and response times of the atomic detector (e.g., 1100, 3100) to both pulsed RF field detection and pulsed Rydberg EIT readout without RF to isolate the atom-optical interaction from the atom-RF interaction under typical EIT operating conditions is discussed.

FIG. 35A shows the time-domain detection and measurement of a 1 μs-long 36.2-GHz narrow-band RF field pulse by a rubidium Rydberg-based atomic detector (e.g., 1100, 3100). The pulse-modulated RF pulse measurement is performed in the weak-field regime where the RF is resonant with rubidium $47S_{1/2}$ to $47P_{1/2}$ transition and AT-splits the EIT line following Eq. 1. One observes in the measured data that the AT-splitting is well-resolved in time for 1 μs-long RF pulses. The temporal resolution in the detection in FIG. 35A approaches the ~10 ns level and is limited primarily by the response time of the photodetector used in the measurements. An extension to shorter RF pulse-width detection is readily achievable and corresponding larger RF detection bandwidths.

In a closely related study of time-dependent effects, the present disclosure investigates the time-dependence of the underlying EIT readout from the atomic vapor for pulsed Rydberg EIT alone, without application of external RF fields. This allows us to distinguish between atom-optical and atom-RF interaction effects contributing to the detection process, and to shed light on the short time-scale response of the Rydberg EIT pulse in a thermal atomic vapor for typical moderate optical Rabi frequencies.

FIG. 35B shows the EIT probe transmission (gray-scale) for a 5 μs-long coupler-light pulse as a function of time (vertical axis) and coupler laser frequency (horizontal axis) near the field-free Rb $5P_{3/2}$ to $30D_{5/2}$ Rydberg state resonance. Here, the coupler pulse is switched on at 11.7 μs and off again at 16.7 μs with a precision <100 ns. When the coupler pulse turns on a sudden decrease in transmission is observed, or equivalently an increase in probe absorption, over a period of about 20 ns (white horizontal stripe in the data, labelled I in FIG. 35B). This is followed by an increase in transmission until reaching a steady-state value over a period of 1 to 2 μs. At the turn-off of the coupler pulse, a sudden increase (gain) in optical transmission is observed, also over about 20 ns (black horizontal stripe in the data, labelled II in FIG. 35B) followed by a decay of the signal to zero over several microseconds.

FIG. 34: Real-time optical readout from the atomic receiver for an AM 1 kHz baseband signal transmitted on a 37.406 GHz RF carrier resonantly driving the cesium $47S_{1/2}$ to $47P_{1/2}$ Rydberg transition. The received signals for three AM modulation depths of 5% (blue), 25% (purple), and 45% (black) are shown for the coupler laser-frequency operating point set to the field-free cesium $47S_{1/2}$ Rydberg line.

FIG. 35A: time-domain detection and measurement of a 36.2-GHz 1 μs-long RF field pulse using a rubidium Rydberg-based atomic detector as a function of time and coupler-laser frequency. The time evolution is along the y-axis. The coupler laser beam is switched on at 11.7 μs and left on, and the RF pulse incident on the sensing element is switched on at 21.7 µs. The RF frequency is resonant with the rubidium $47S_{1/2}$ to $47P_{1/2}$ Rydberg transition (dipole moment d=745 ea$_0$) and produces a splitting (double-sided arrows) of the EIT line proportional to the pulsed RF field amplitude of about 5 V/m.

FIG. 35B: Relative EIT probe transmission for a 5 µs-long coupler laser square-pulse (probe laser on continuously) as a function of time and coupler-laser frequency near the rubidium $30D_{5/2}$ Rydberg state. No RF is applied. The coupler pulse is on at 11.7 µs and off again at 16.7 µs with an uncertainty <100 ns. The probe transmission is in grayscale; coupler-free absorption background is at a level of 0.236; with relative increasing transmission from white to black.

The transients measured at both the beginning and the end of the Rydberg EIT coupler pulse in an atomic vapor have not been observed before. The observed process appears akin to—but distinct from—photon storage and retrieval via EIT-mediated Rydberg polaritons in cold-atom systems, where a probe photon is stored as a collective Rydberg excitation in the medium in presence of the coupler beam and released/retrieved when the coupler is turned off. In the present disclosure, a certain excess amount of probe-pulse energy (contained in the probe light incident on the medium) is stored and released. In this interpretation, the 'stored' 780 nm light is 'retrieved' after an extremely long time (>10 µs-long pulses in other experiments), exceeding the <1 µs transit time of atoms through the EIT beams used. The concept of collective Rydberg-polaritons propagating along the laser-beam direction, through a medium of atoms that are frozen in place (a picture commonly used in cold-atom EIT experiments), is not directly applicable. However, during the short, ~100-ns-long time intervals that follow the light-switching events the atoms are approximately frozen in place, even in the presented case of Rydberg-EIT in a room-temperature vapor cell. This allows us the use of a frozen-atom model to explain the fast transients observed in FIG. 35B.

The transient responses of the Rydberg EIT readout studied here provide a time resolution at the sub-10 ns level. Their implementation in RF field sensing is proposed here to achieve high-bandwidth receiving of modulated RF communications signals, short RF pulse detection, and high-frequency RF noise measurements. In the present disclosure, the Rydberg EIT system dynamics for the conditions in FIG. 35B are modeled which provide Rydberg EIT transient dynamics that reproduce the observed transient behavior in great detail. In some embodiments, Ryberg EIT transient dynamics can be implemented in an ultra-fast RF detection method.

Comparing FIGS. 35A and 35B it is noted that the EIT line widths are quite different. This is due to the use of different laser-beam parameters and Rydberg states, leading to different coupler- and probe-beam Rabi frequencies in the two cases. In FIG. 35A the Rabi frequencies at the laser-beam centers are $\Omega_p=2\pi$ 18 MHz for the probe and $\Omega_c=2\pi$ 2.5 MHz for the coupler. These values are small enough to largely avoid saturation broadening, leading to EIT lines that are less than about 10 MHz wide (in coupler laser frequency). In FIG. 35B the respective Rabi frequencies are $\Omega_p=2\pi$ 44 MHz and $\Omega_c=2\pi$ 10 MHz. In that case, the large probe Rabi frequency causes a larger amount of saturation broadening, leading to EIT lines that are about 20 MHz wide.

V. Atomic RF Phase Detectors

RF electric-field sensing and measurement based on EIT readout of field-sensitive Rydberg states of atoms in thermal vapor cells has made rapid progress towards establishing atomic RF E-field standards. Here an atomic RF phase, amplitude, and polarization sensor 3100 that employs a novel quantum-optical readout scheme from an RF field-sensitive Rydberg vapor 3106 to achieve RF phase sensitivity is described.

The holography concept outlined in Sec. II can be translated from the optical into the RF domain. Measurements have been performed by combining RF signal and reference waves in or close to Rydberg-EIT vapor cells. The magnitude of the coherent electric-field sum of the object and reference RF or microwave fields is measured using vapor-cell Rydbrg-EIT methods within the atomic vapor cell or hybrid atom-cavity cell structure, as described in Sec. III. According to principles of holography, this allows measurement of amplitude and phase of the signal wave, with the reference wave providing the phase reference as well as amplification. Towards practical applications, a phase-sensitive recording of a coherent electromagnetic field on a surface allows the reconstruction of the field in all space. RF-applications of this reconstruction principle are abound and include radars based on interferometric schemes, such as SAR and InSAR, and far-field characterization of antenna radiation patterns based on near-field measurements of amplitude and phase of the field emitted by the antenna under test.

To achieve phase sensitivity in the holographic RF field measurement, the reference wave can be interfered with the waves emitted by or reflected from an object. The generation of a clean RF reference wave presents a considerable problem. In optical holography, the reference wave typically is an expanded, near-perfect plane-wave laser beam that interferes with the object scatter within a layer of photographic emulsion (or an equivalent substance). The purity of the reference wave is important, i.e. it should be free of diffraction rings caused by dust particles and other imperfections. Interference from specular reflections of the reference wave from planar surfaces should also be avoided. In quantitative work, it would also be important that the reference wave has a fixed amplitude or, at least, a well-known, slowly varying amplitude function.

In holographic measurements in the RF domain, equivalent conditions are hard to meet. The preparation of a defect-free RF reference wave that has a smooth amplitude behavior over a large surface presents a great challenge. In some cases, it will be fundamentally impossible to prepare a stationary reference wave. This applies, for instance, to SAR radar applications, where the detector is mounted on a moving platform, like an airplane or a satellite, or in cases where a mm-wave or microwave field needs to be fully characterized over a large surface in space. In another class of applications, the object waves are located within close quarters where multiple reflecting surfaces cannot be covered with anechoic material ("urban radar"); there, reflections from unknown surfaces spoil the reference wave.

The cited previous implementations of holographic RF phase detection with atoms have required an antenna or similar for the generation of the reference RF wave, precluding the approach from providing a stand-alone atomic detector solution for RF waves propagating in free space. In the present disclosure, the holographic scheme in which an RF reference signal is provided via phase modulation of one of the EIT laser beams is presented. The presented approach removes the need for RF reference waves, and therefore eliminates the aforementioned shortcomings of RF reference waves.

For RF phase measurement using RF-modulated optical beams, one can consider a phase modulation imprinted on an optical coupling laser beam via an electro-optic modulation technique. Using a fiber-optic high-frequency modulator 3120, which is commercially available, the coupler beam 3104 is frequency- or amplitude-modulated with a signal at frequency $\omega_{RF}$ that is near the frequency of the RF field to be measured, and that is phase-coherent with the RF field to be measured. For the purpose of describing the basic concept, in the following one can consider a rubidium atom and a case where the (optical) coupler field is phase-modulated at a frequency that is identical with the RF signal frequency $\omega_{RF}$.

Here, $\omega_{RF}$ also approximately equals half the separation between two neighboring Rydberg levels of rubidium, $nS_{1/2}$ and $(n+1)S_{1/2}$, as shown in FIG. 32. The carrier frequency of the coupler laser beam is resonant with the forbidden transition $5P_{3/2} \to nP_{3/2}$. Due to the quantum defects in rubidium, the $nP_{3/2}$ level is approximately at the midpoint between the $nS_{1/2}$ and $(n+1)S_{1/2}$ levels, and the electric-dipole matrix elements for the allowed microwave transitions, $d_A$ and $d_B$, are about the same. Also, the detunings of $\omega_{RF}$ from the respective atomic transition frequencies, $\Delta_A$ and $\Delta_B$, are approximately equal in magnitude and opposite in sign (see FIG. 32) For the simplified discussion presented here, one can assume that the detunings AA and AB have magnitudes on the order of 100 MHz, which is much larger than the Rabi frequencies of any of the involved transitions. Hence, the two-photon Rabi frequencies that describe the transitions from $5P_{3/2}$ into $nP_{3/2}$ via the absorption of one coupling-laser sideband photon and the absorption (channel B in FIG. 32) or the stimulated emission (channel A in FIG. 32) of an RF photon are given by $$\Omega_A = \frac{\Omega_{5P(n+1)S} \Omega_{(n+1)SnP}}{2\Delta_A} \exp(i(\phi_{5P(n+1)S} - \phi_{RF})) \quad (2)$$

$$\Omega_B = \frac{\Omega_{5PnS} \Omega_{nSnP}}{2\Delta_B} \exp(i(\phi_{5PnS} + \phi_{RF}))$$

FIG. 32: Quantum mechanical level scheme and optical/RF excitation pathways 3200 used in an implementation of the phase-sensitive RF electric-field measurement method 3100.

FIG. 31: Setup illustration of the phase-sensitive measurement implementation 3100. The microwave horn (MW) 3140 stands for any antenna under test or other object wave of interest. The fiber modulator 3120 phase-coherently imprints an RF reference beat onto the coupler beam 3104 sent to the atoms in the vapor cell 3106. The RF reference beat replaces the reference beam that is normally used in phase sensitive (holographic) field measurement. The vapor cell 3106 in the atom-based RF sensing element 3100 can be very small (~1 mm), fiber-coupled to the 780-nm and 480-nm laser beams 3102, 3104. The phase of the optical reference beat is scanned via a mechanical optical delay line, as shown, or by an electro-optic control element 3110.

There, $\Omega_{5PnS}$ and $\Omega_{P(n+1)S}$ are the Rabi frequencies of the optical coupler-laser transitions into the S Rydberg levels, $\Omega_{nSnP}$ and $\Omega_{(n+1)/SnP}$ are the Rabi frequencies of the RF transitions from the S Rydberg levels into the $nP_{3/2}$ Rydberg level, and ORF is the phase of the RF field. Also, $\phi_{5PnS}$ and $\phi_{5P(n+1)S}$ are the phases of the modulation sidebands of the coupling laser. Note there is an important difference in sign in front of the $\phi$RF in the above equations. Further, the RF field amplitude, E, is included in the RF Rabi frequencies. It is, for instance, $\Omega_{5PnS}=Ed_B/h$. The net coupling, $\Omega_C$, due to the coupler lasers is given by the coherent sum of $\Omega_A$ and $\Omega_B$. Noting that $\Omega_{5PnS} \approx \Omega_{5P(n+1)S}$ and $\Omega_{nSnP} \approx \Omega_{(n+1)SnP}$, and noting that a suitable choice of levels allows us to set $\Delta_B = \Delta_A =: \Delta$, for the present simplified discussion $$\Omega_B = \frac{\Omega_{5PnS} \Omega_{nSnP}}{2\Delta}(\exp(i(\phi_{5P(n+1)} - \phi_{RF})) - \exp(i(\phi_{5PnS} + \phi_{RF}))) \quad (3)$$

The approximations made to arrive at this expression are not crucial; they serve to simplify the math to better elucidate the important aspects of the method. The optical phases $\phi_{5PnS}$ and $\phi_{5P(n+1)S}$ are well-defined and are not prone to drift, because all frequency components of the modulated coupling laser beam follow the exact same geometrical path. An optical delay line in the beam path of the FM-modulated coupler laser is used to control the difference between the optical phases $\phi_{5PnS}$ and $\phi_{5P(n+1)S}$. A translation or adjustment (see FIG. 31) causes a phase shift of $$\frac{4L}{c}\omega_{RF}.$$

For RF frequencies in the 10-GHz range, a translation of about 1 cm will scan the optical-phase difference $\phi_{5PnS} - \phi_{5P(n+1)S}$ over a range of $2\pi$. It is seen from the previous equation that the net EIT coupling takes the form $$\Omega_c = \Omega_{c0} \cos(\phi_{RF} + \phi_{opt}), \quad (4)$$

with a (complex) factor $\Omega_{c0}$ that neither depends on $\phi_{RF}$ nor on the delay-line-controlled optical phase $\phi_{opt}$. It is thus seen that net EIT coupling Rabi frequency $\Omega_c$ can be tuned between zero and $\Omega_{c0}$ by adjusting the optical phase $\phi_{opt}$ with the coupler-beam delay line 3310 (see FIG. 31). The presented analysis shows that the optical phase $\phi_{opt}$ is equivalent with the tunable offset phase $\phi_{ofs}$ in the introductory discussion II. Also, $\phi_{RF}$ corresponds with the frequency difference $\phi - \phi_{ref}$ that is to be measured.

Since the strengths of the Rydberg-EIT lines observed in the spectra are generally proportional to $|\Omega_c|^2$, the EIT line strength is proportional to $\cos^2(\phi_{RF} + \phi_{opt})$. The EIT line strength, measured as a function of the optical phase, $\phi_{opt}$, allows one to measure the phase $\phi_{RF}$. The microwave phase $\phi_{RF}$ can therefore be retrieved as long as it remains stable over the time scale needed to scan the optical delay line over a range of $2\pi$. Using mechanical delay lines, the dynamic range of this RF phase measurement method will be at about $10s^{-1}$, while electro-optic phase shifters will allow a phase measurement bandwidth ranging into the MHz-range.

In the presented scheme the $5P_{3/2}$ to $nP_{3/2}$ transition is forbidden; therefore, the coupler-beam carrier (thin blue line in FIG. 32) does not introduce an additional term in the analysis. In more general cases, such a term could, of course, be included. Further, the magnitude of the pre-factor $\Omega_{c0}$ can be determined by finding the peak EIT line strength while varying $\phi_{opt}$. The obtained peak value for $\Omega_{c0}$ then reveals the RF electric field, E, via the known electric dipole moments of the RF transitions. In this way, both E and the phase $\phi_{RF}$ can be measured. This capability enables the aforementioned applications in antenna characterization, phase-sensitive radar, communications, and sensing.

VI. Conclusion

In the present disclosure the capability of pulsed RF field detection and measurement with an atomic receiver (e.g., 1100, 3100) has been demonstrated. Pulsed RF field detection was performed in the time-domain with a temporal resolution at the 10 ns-level, limited by photodetector bandwidths. The behavior and response times of the atomic detector to both pulsed RF field detection and pulsed Rydberg EIT readout without RF have been investigated to isolate the atom-optical interaction from the atom-RF interaction under typical EIT operating conditions. In pulsed Rydberg EIT readout from the atomic vapor, transient behavior was experimentally observed resulting in a drop in optical transmission at the onset of the coupler pulse and gain in optical transmission at the turn-off of the coupler pulse with dynamics on a 10 ns timescale, also limited by photodetector bandwidth. Modeling of these system dynamics has separately been performed reproducing the observed transient behavior in great detail and affirming the physical existence of the phenomenon, with underlying physics distinct from the interpretation of collective Rydberg-excitation polaritons propagating in the medium.

Fast quantum-optical transient dynamics in Rydberg EIT readout at time-scales on the sub-10 ns level have been studied, and their implementation in RF field sensing has been proposed to enable, for example, reception of modulated RF communications signals approaching 100 MHz bandwidth, short RF pulse detection, and high-frequency RF noise measurements. In the present disclosure, a new method for atomic RF phase sensing and measurement to realize atomic sensors for phase-sensitive detection of RF fields critical to a wide range of application areas such as antenna near-field characterizations, radar based on interferometric schemes, and phase-modulated signal transmission and telecommunications is described. The atomic RF phase sensor development enables the realization of atomic sensors, receivers and measurement tools capable of RF phase, amplitude, and polarization detection with a single, vapor-cell sensing element. Atomic RF sensors and receivers based on Rydberg atom-mediated RF-to-optical transduction hold promise as a basic technology platform to realize advanced passive radar and electronic support measures (ESM) systems. Implementation of coherent conversion between microwave optical photons in Rydberg gases, for example, may be implemented in the Rydberg atom-based detector platform to realize coherent RF-to-optical transducers in quantum communications schemes and radar.

Appendix F: Exemplary Time Dependence of Rydberg EIT in Pulsed Optical and RF Fields Appendix F: "Time dependence of Rydberg EIT in pulsed optical and RF fields," Rachel E. Sapiro et al., J. Phys. B: At. Mol. Opt. Phys. 53, 094003, pages 1-10, published Apr. 3, 2020, is hereby incorporated herein in its entirety by reference.

Figure 36A:
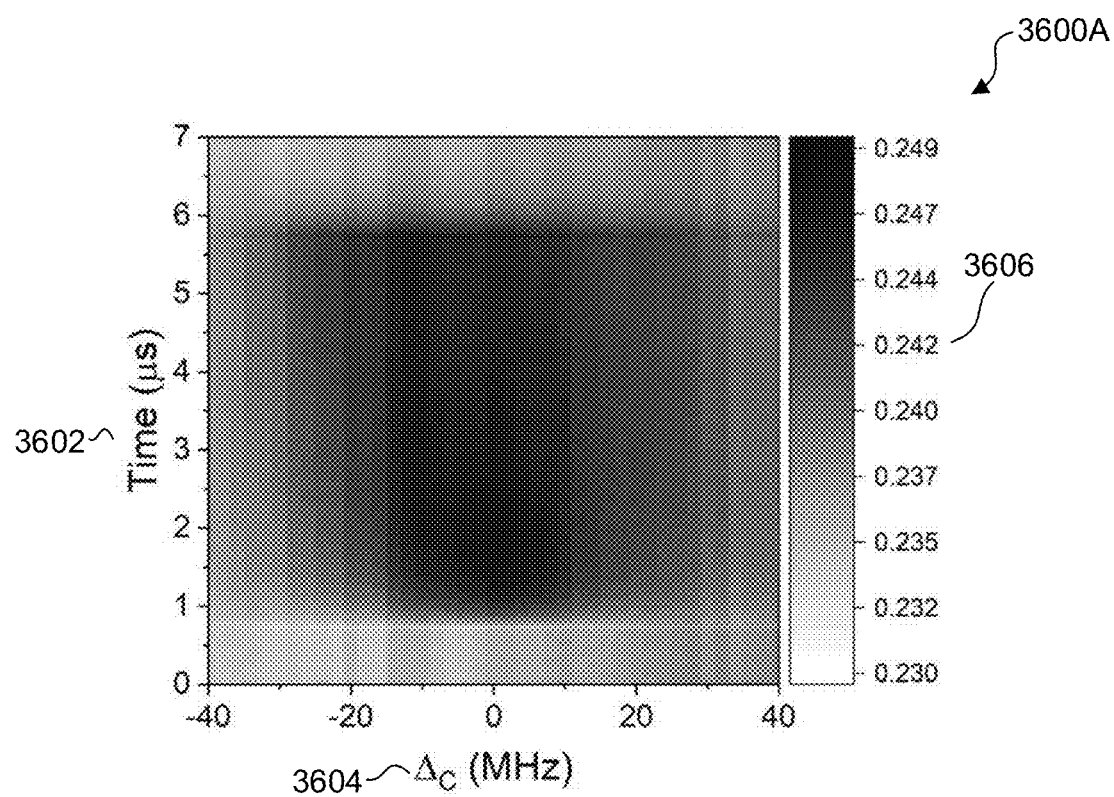
FIG. 36A is a plot of measured EIT probe transmission over time as a function of relative coupler-laser frequency, according to an exemplary embodiment.
Figures 43A, 43B:
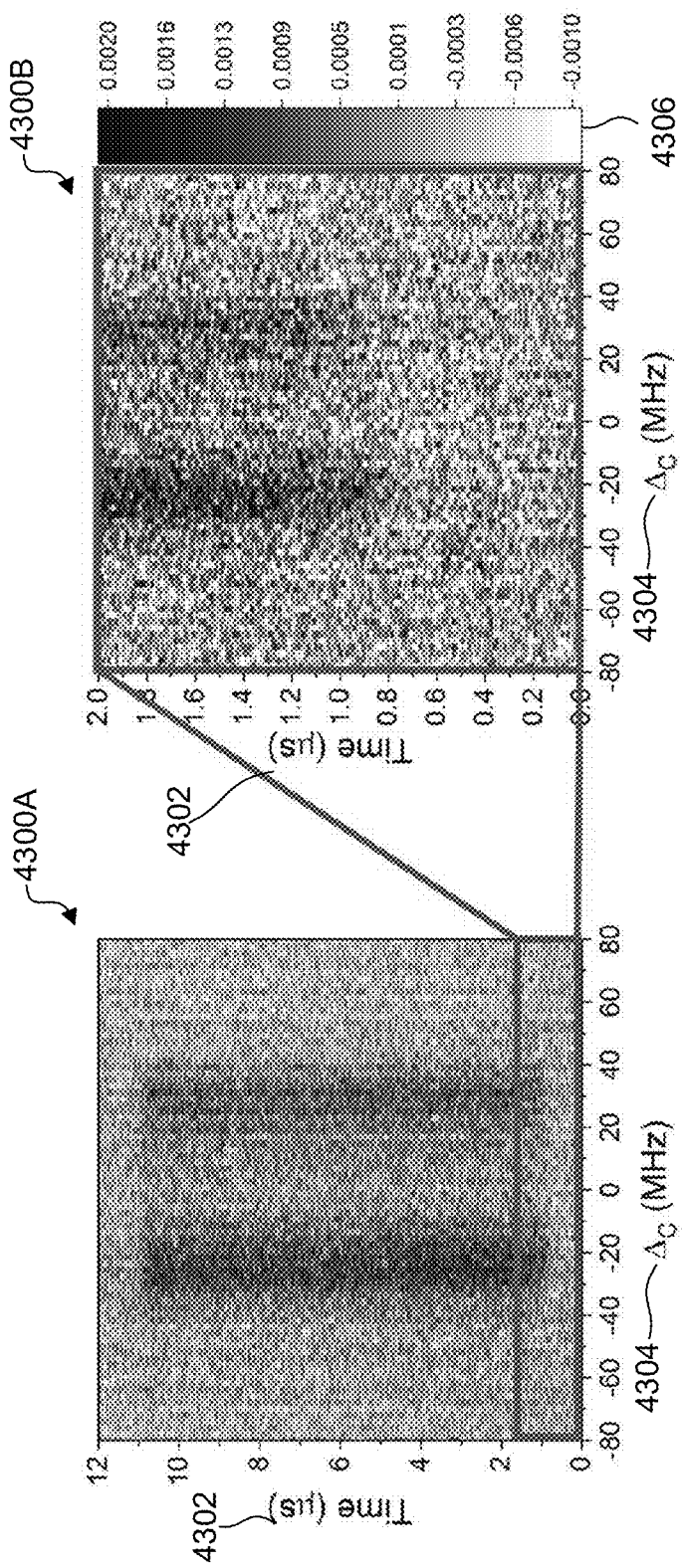
FIGS. 43A and 43B are plots of EIT transmission overtime as a function of coupler-laser frequency for an EIT pulse and an RF pulse, according to an exemplary embodiment.

FIGS. 36A-43B illustrate time dependence of Rydberg EIT in pulsed optical and RF fields, according to various exemplary embodiments. FIG. 36A is a plot 3600A of measured EIT probe transmission over time 3602 as a function of relative coupler-laser frequency 3604. FIG. 36B is a schematic illustration of an EIT level diagram 3600B. FIGS. 37A and 37B are plots 3700A, 3700B of EIT signals 3702 as a function of time 3704. FIGS. 38A and 38B are plots 3800A, 3800B of EIT transmission over time 3802 as a function of coupler-laser frequency 3804 with varied probe laser power. FIGS. 39A and 39B are plots 3900A, 3900B of EIT transmission over time 3902 as a function of coupler-laser frequency 3904 with varied cell temperature. FIGS. 40A and 40B are plots 4000A, 4000B of EIT transmission over time 4002 as a function of coupler-laser frequency 4004 with varied cell temperature. FIGS. 41A-41C are plots 4100A, 4100B, 4100C of EIT formation over time 4102 as a function of coupler-laser frequency 4104 for a constant probe and pulsed coupler. FIGS. 42A and 42B are plots 4200A, 4200B of EIT transmission over time 4202 as a function of coupler-laser frequency 4204 for an RF pulse on resonance. FIGS. 43A and 43B are plots 4300A, 4300B of EIT transmission over time 4302 as a function of coupler-laser frequency 4304 for an EIT pulse and an RF pulse.

1. Introduction

Electromagnetically-induced transparency (EIT) in Rydberg atoms is rapidly becoming technologically relevant. Even in room temperature atomic vapours, EIT has allowed the sensitivity of Rydberg atoms to electromagnetic fields to be harnessed in novel types of atom-based sensing that has in turn promoted the advent of new quantum technologies and devices. Such Rydberg-atom-based sensors have a broad array of applications including ultra-broadband radio-frequency (RF) detection, low- and high-intensity RF field detection beyond the range and capabilities of traditional RF field and power sensors, receivers, antennas, and measurement tools.

Hybrid devices combining traditional RF technologies with Rydberg atom-based EIT detection for enhanced capabilities and novel application in RF sensing and metrology have also been realized. Of particular interest is the emerging field of Rydberg-EIT-based communications, including both analog amplitude and frequency modulation and digital communication, as well as pulsed RF detection and measurement. (Throughout the related literature, and in this present disclosure, RF is taken to mean the spectrum of frequencies below the infrared regime, including millimeter-wave, microwave, and radio.)

In order to move from laboratory experiments to realizing high-bandwidth receivers and devices, it is important to properly account for time-dependent behavior and transients in Rydberg EIT. The formation time and behavior of the EIT itself in the atom-light interaction, as well as the EIT response to sudden changes in external (RF) electric fields, determine the fundamental bandwidth limits of EIT-based sensors and receivers for communications and pulse detection. In the present disclosure the time dependence of atom-light and atom-RF field interactions in Rydberg EIT in a room-temperature and heated vapour cell was investigated. Quantum-optical transients are observed with rapid onset and dissolution of EIT at the 10 ns level induced by coupler-light pulses. The time-dependent response of EIT to RF fields resonant with a Rydberg-Rydberg transition are studied. The results provide insight into the physics of quantum-optical dynamics in the transient EIT regime and establish an upper limit to the fundamental atom-RF field response time and RF measurement bandwidth with EIT-based sensors and receivers.

2. Experimental Setup

The experiment is performed on $^{85}$Rb in a 4 mm cubic glass vapour cell. Two counter-propagating and overlapped laser beams generate EIT: a 780 nm (probe) laser is locked to near-resonance with the $5S_{1/2}$ (F=3)→$5P_{3/2}$ (F=4) transition, and a ~480 nm (coupler) laser frequency is scanned across either the $5P_{3/2}$ (F=4)→$30D_{5/2}$ or the $5P_{3/2}$ (F=4)→$47S_{1/2}$ transition. In the cell, the probe and coupler beam full-width at half maximum are, respectively, 186 μm and 192 μm. The transmission of the probe beam through the cell is measured using a photodiode (Thorlabs PDA10A, bandwidth 150 MHz). The coupler laser frequency is locked to a Fabry-Perot cavity and held at a fixed frequency, while the probe transmission signal is recorded over a time period of interest, in which an electric-field pulse or change is applied to the system. The coupler laser frequency is scanned in steps of 100 kHz across the $5P_{3/2}$ to Rydberg-state transition. The acquired data are represented as grey-scale maps of the probe transmission as a function of coupler-laser frequency and time. Coupler-beam pulses are generated using an acousto-optic modulator modulated with an arbitrary waveform generator. RF pulses are generated using a microwave signal generator feeding a horn antenna directed towards the vapour cell. The optical and RF pulses are both triggered using the same waveform generator and synchronized with the laser-frequency scan and data acquisition.

3. Pulsed EIT

The time dependence of EIT formation and transient EIT dynamics are studied by pulsing the coupler laser while the probe laser is on continuously. The coupler laser pulse has a rise time of 20 ns and a fall time of 12 ns. To isolate the atom-light interaction, no RF is applied in this study. FIG. 36A shows the EIT probe transmission on an arbitrary linear grey-scale for a 5 μs coupler pulse, as a function of time and coupler-laser detuning, $\Delta_C$, from the $5P_{3/2}$ to $30D_{5/2}$ Rydberg transition. The coupler laser power is 52 mW, corresponding to a coupler Rabi frequency at the beam center of $\Omega_C$=10 MHz. The probe-laser power is 105 W, corresponding to a probe Rabi frequency at the beam center of $\Omega_P$=37 MHz. In some of the presented disclosures the probe Rabi frequency is chosen to be larger than that of the coupler in part for improved signal-to-noise in the EIT readout. The EIT linewidth is saturation-broadened in these cases. When the coupler pulse is first turned on, there is a transient enhancement in probe absorption lasting ~20 ns with a full width at half maximum of 67 MHz, considerably wider than the EIT linewidth but consistent with initial interaction time broadening.

In FIG. 36A, this transient manifests as a narrow horizontal bright line at about 0.8 μs. The transmission then increases with a time constant of T≈200 ns before reaching steady-state. When the coupler is turned off, there is a sudden spike in transmission lasting again ~20 ns before the transmission returns to pre-EIT levels. The dynamics can be seen more clearly in FIG. 36B, which shows the relative EIT transmission signal as a function of time for the signal averaged over coupler frequency (left) and at a fixed, near-resonance coupler frequency (right). The EIT formation time τ varies with both coupler and probe Rabi frequency. Higher $\Omega_P$ leads to slower EIT formation (higher τ), while higher $\Omega_C$ leads to faster EIT formation (lower τ). Changes in $\Omega_C$ dominate: an increase in $\Omega_C$ from 4 to 10 MHz, at fixed $\Omega_P$=41 MHz, leads to a change in τ from 300 to 210 ns. An increase in $\Omega_P$ from 14 to 41 MHz, at fixed $\Omega_C$=10 MHz, in contrast, only leads to a change in τ from 180 to 210 ns. EIT, its formation time, and trends in the EIT formation time have been reviewed in. While the speed of EIT detection is tied to τ, suggesting a bandwidth under most circumstances of 3-5 MHz, a sufficiently sensitive detector can push that bandwidth limit by detecting EIT early in its rise. However, consideration of the initial rise time to a steady-state EIT signal indicates a detection bandwidth limit at ~10 MHz.

FIG. 36A shows a red-shift of the peak transmission during the first 1-2 μs of the coupler-light pulse. This shift is also responsible for the decrease in transmission a few microseconds after the pulse is turned on in FIGS. 37A and 37B. The shift is attributed in part to interactions involving excited Rydberg atoms. To explore the dependence of this shift on Rydberg atom density, the density is varied using two independent parameters: $\Omega_P$ and temperature.

Figure 36B:
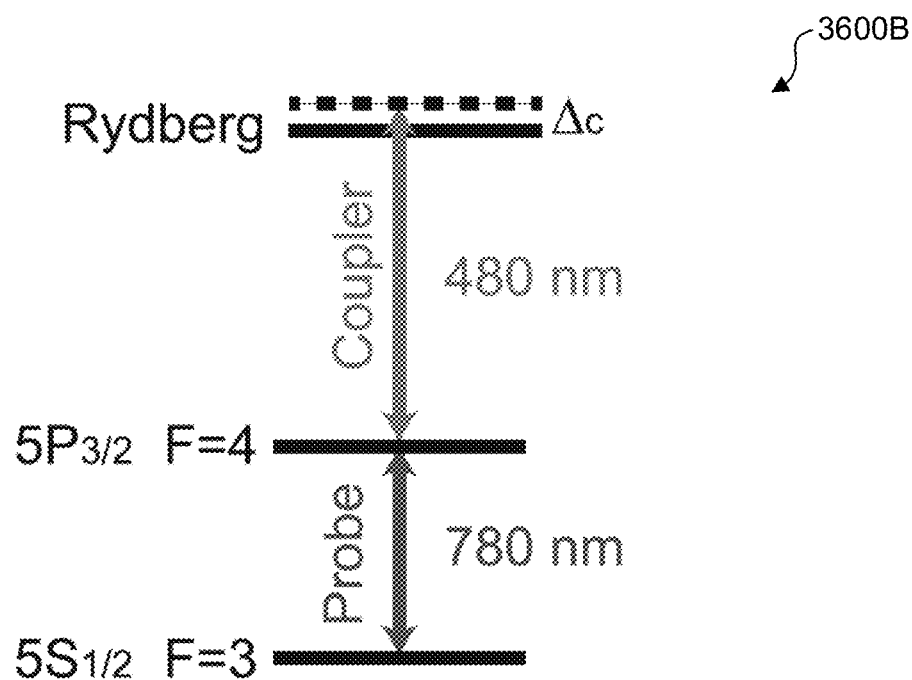
FIG. 36B is a schematic illustration of an EIT level diagram, according to an exemplary embodiment.

FIG. 36A: Measured EIT probe transmission for a 5 μs EIT pulse plotted as a function of time and relative coupler-laser frequency, $\Delta_C$. There, $\Delta_C$=0 marks the location of the Rydberg-EIT resonance under conditions where there are no Rydberg-level shifts due to electromagnetic fields and atomic collisions. The transmission of the probe laser is represented by a linear grayscale. FIG. 36B: EIT level diagram.

Figure 37A:
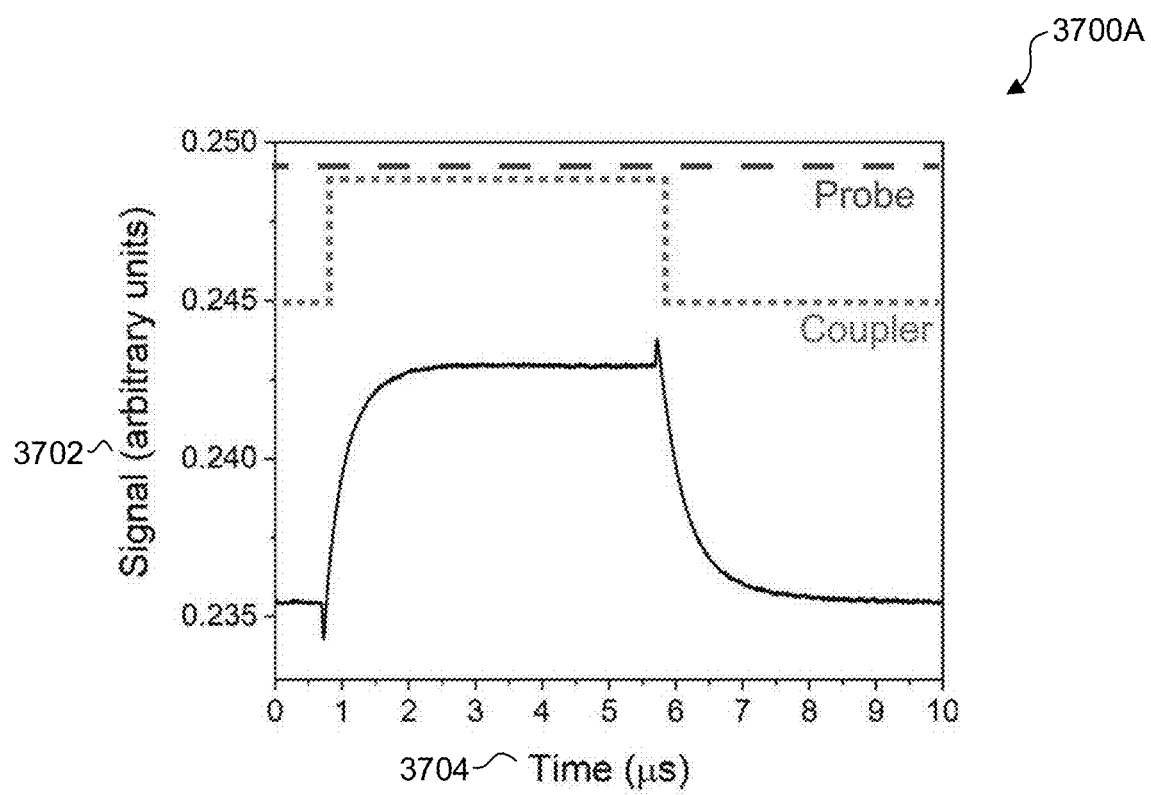
FIGS. 37A and 37B are plots of EIT signals as a function of time, according to an exemplary embodiment.
Figure 37B:
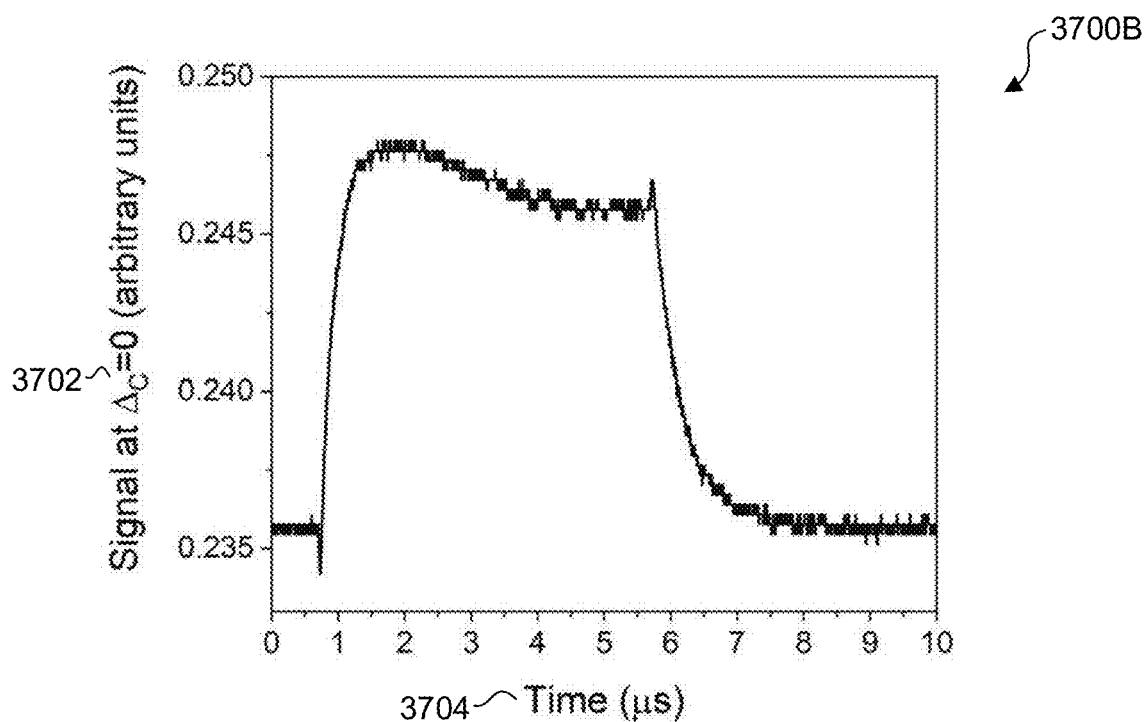

FIGS. 37A and 37B: EIT as a function of time, averaged over coupler-laser frequency (FIG. 37A) and at a fixed frequency of $\Delta_C$=2 (FIG. 37B). FIG. 37A also shows the timing of the constant probe (red, dashed) and pulsed coupler (blue, dotted) with respect to the EIT signal.

Figure 38A:
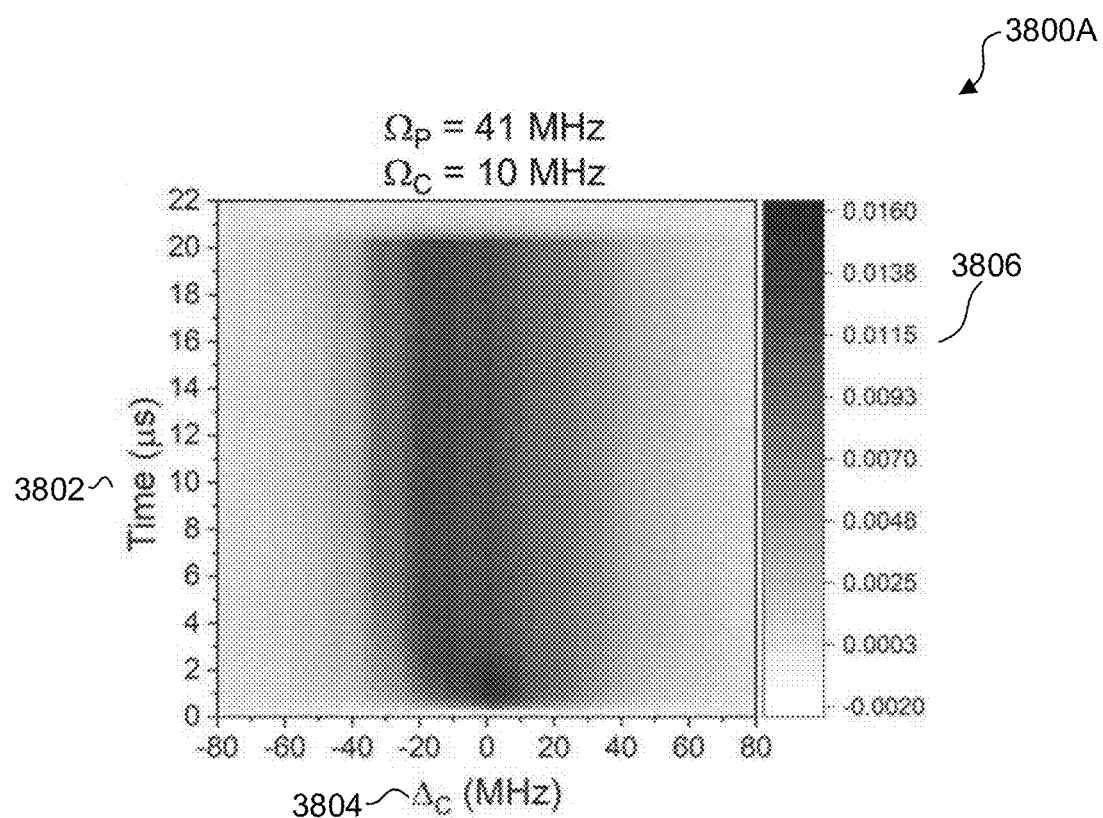
FIGS. 38A and 38B are plots of EIT transmission overtime as a function of coupler-laser frequency with varied probe laser power, according to an exemplary embodiment.
Figure 38B:
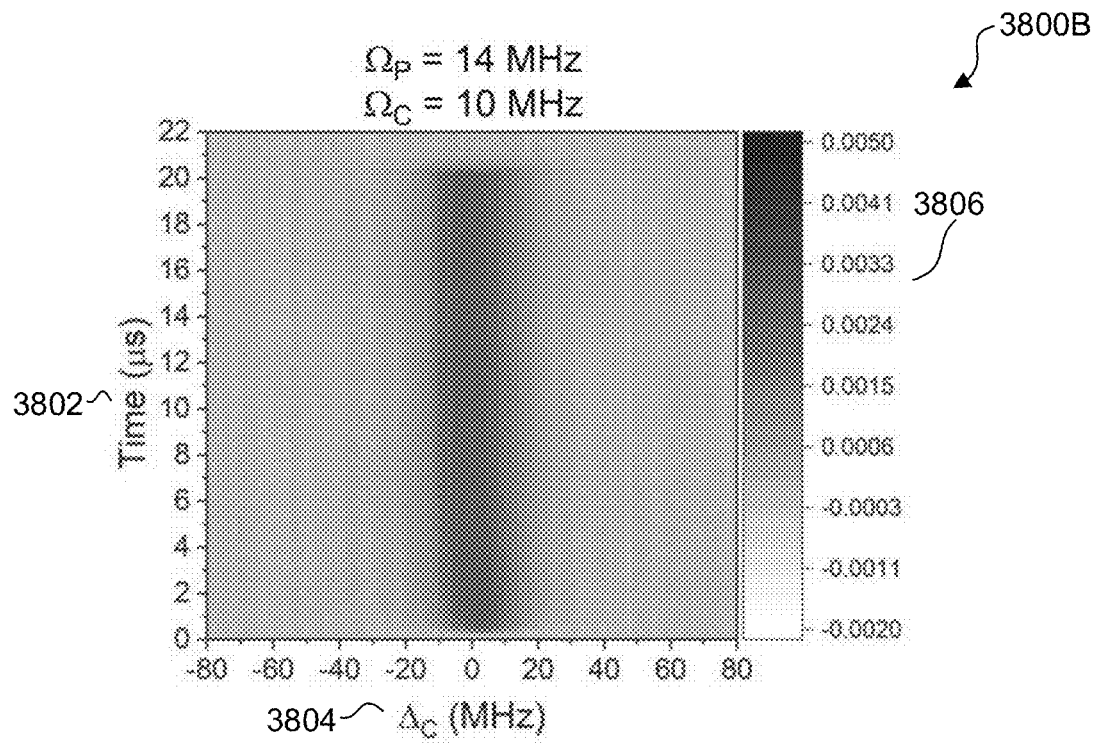
Figure 39A:
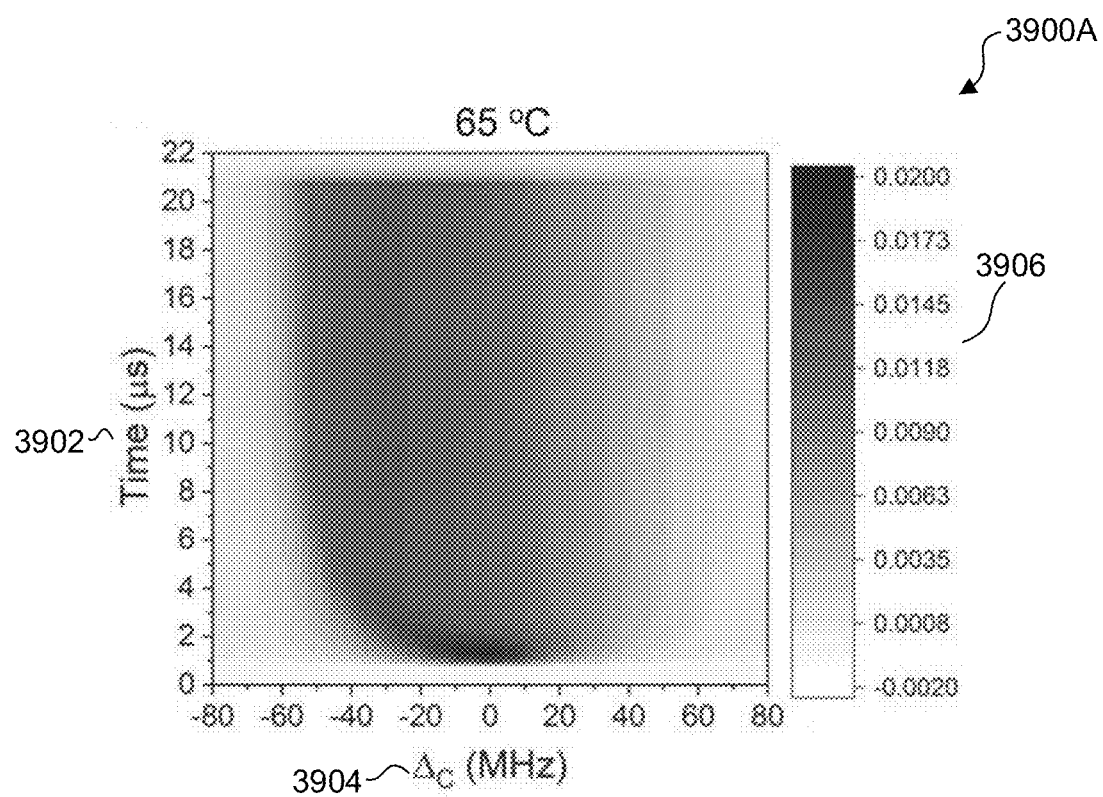
FIGS. 39A and 39B are plots of EIT transmission overtime as a function of coupler-laser frequency with varied cell temperature, according to an exemplary embodiment.
Figure 39B:
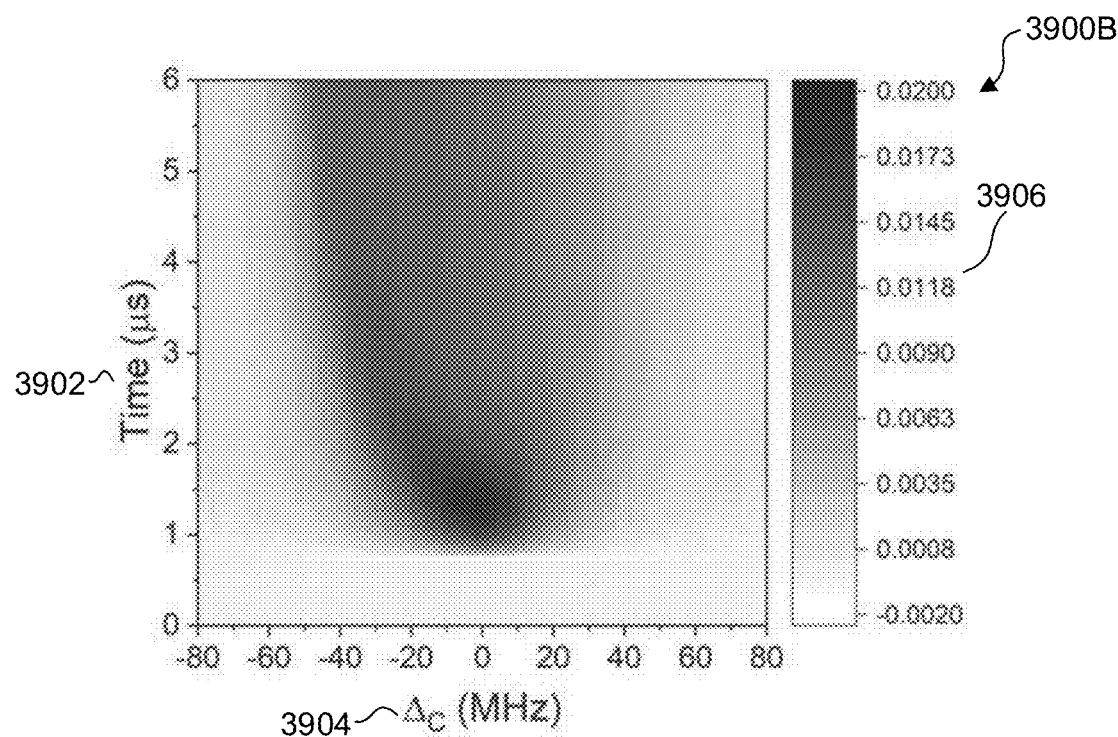

FIGS. 38A and 38B illustrate how the EIT formation depends on $\Omega_P$. In FIG. 38A, a probe laser power of 130 μW is applied, corresponding to $\Omega_P$=41 MHz; in FIG. 38B, the probe laser power is 15 μW, corresponding to an $\Omega_P$ of 14 MHz. In both cases $\Omega_C$=10 MHz. As seen in FIGS. 38A and 38B, not only does the lower $\Omega_P$ case show the expected lower absolute signal and narrower EIT linewidth, it also does not show the shift seen in the higher $\Omega_P$ case. In FIGS. 39A-40B, where the temperature of the vapour cell is varied from 46° C. to 65° C., corresponding to a variation in background rubidium density of $1\times10^{11}$ to $3\times10^{11}$ cm$^{-3}$, while the laser powers are kept constant with $\Omega_P$=41 MHz and $\Omega_C$=10 MHz, a similar pattern emerges. At lower temperatures, the strength of the EIT signal decreases and the frequency shift at later times disappears, while higher temperatures exaggerate the shift. These results provide strong evidence that the observed shift is Rydberg-atom density dependent and therefore likely due to level shifts caused by Rydberg-Rydberg interactions, or by interactions between Rydberg atoms and ionization charges. The EIT spectral line also broadens over time, taking several microseconds to reach steady-state in the 65° C. case, but with a smaller visible time dependence in the 46° C. case; however, this time dependence is mostly absent in the low $\Omega_P$ case in FIGS. 38A and 38B.

4. Simulations and Discussion

Figure 40A:
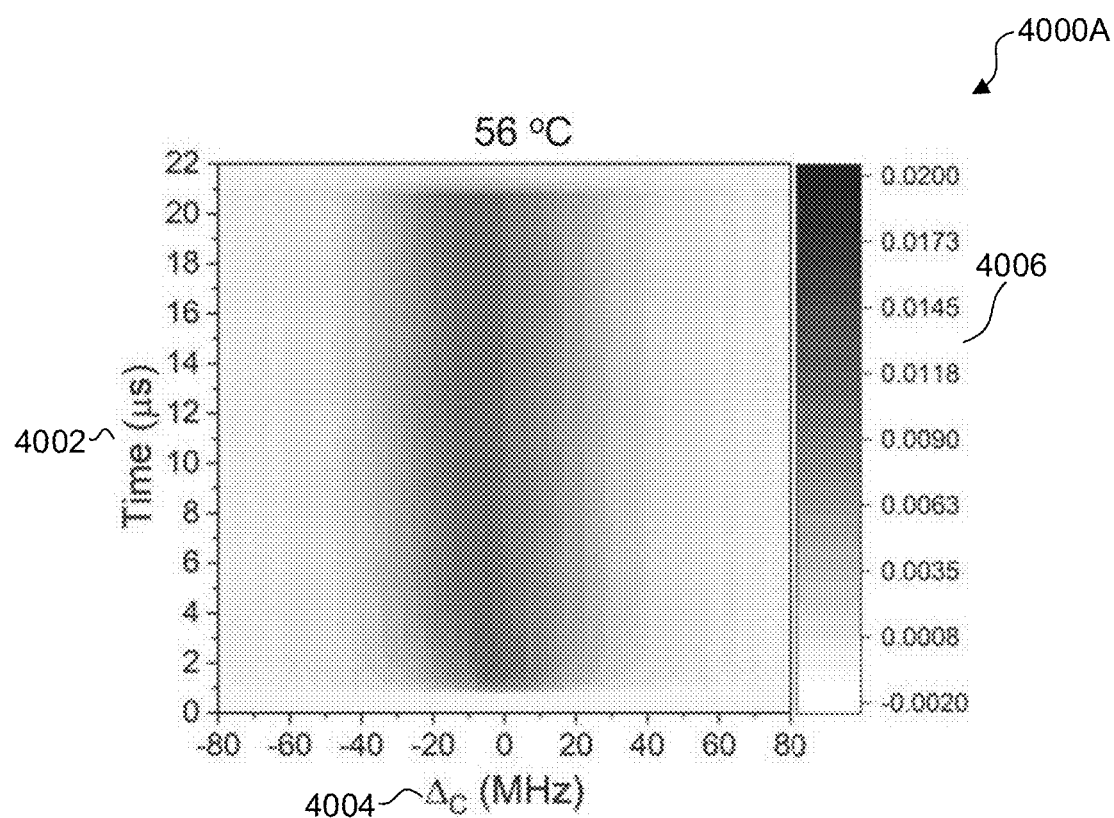
FIGS. 40A and 40B are plots of EIT transmission over time as a function of coupler-laser frequency with varied cell temperature, according to an exemplary embodiment.
Figure 40B:
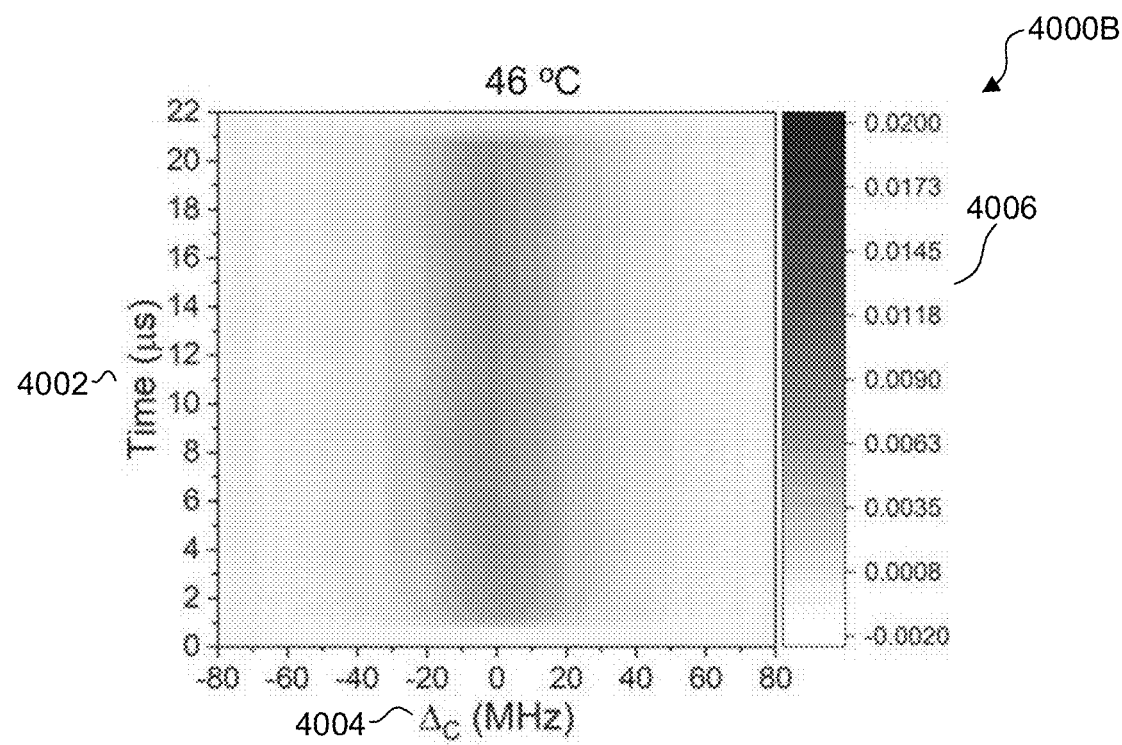
Figures 41A, 41B, 41C:
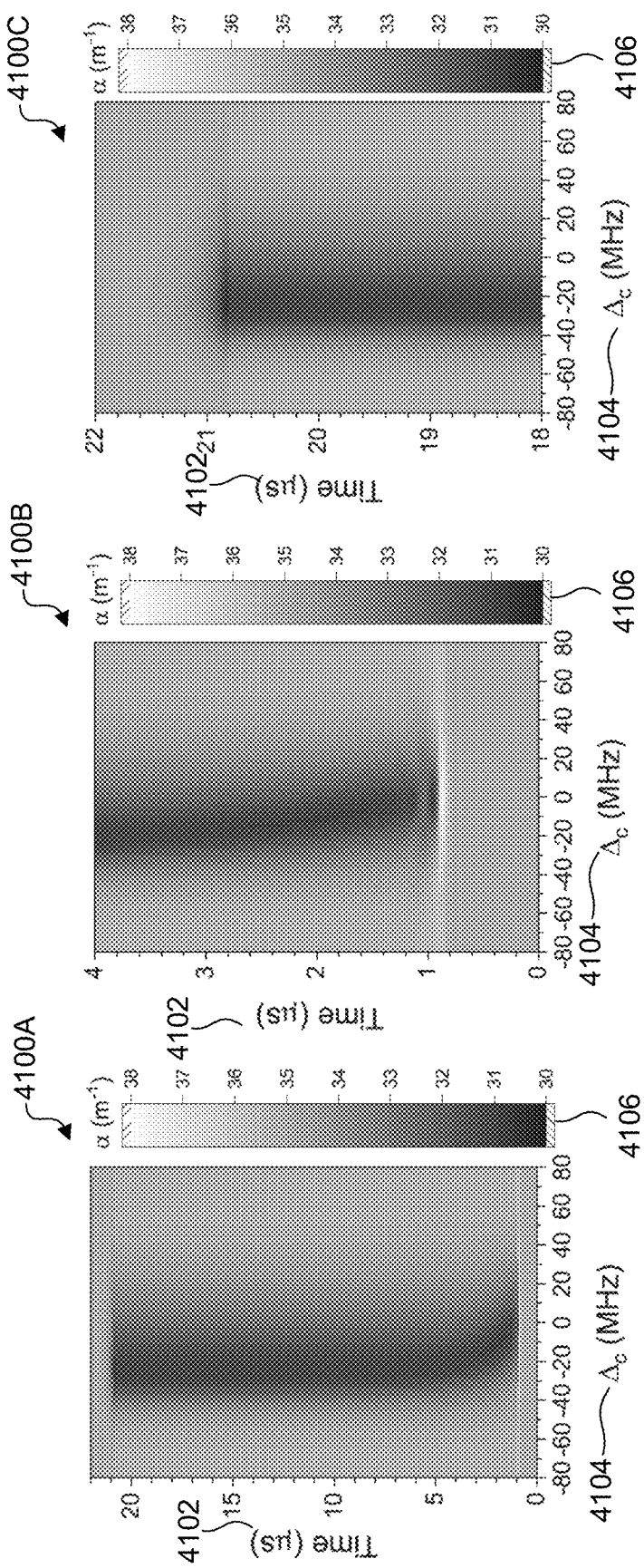
FIGS. 41A-41C are plots of EIT formation over time as a function of coupler-laser frequency for a constant probe and pulsed coupler, according to an exemplary embodiment.

The measurements in FIGS. 36A-40B are in good qualitative agreement with the discussion and the numerical simulations shown in FIGS. 41A-41C, described in detail in this section. The EIT timescales are generally on the order of the intermediate-state decay time, which is 26 ns in the present case, and that transients in the EIT response are quite common. On a qualitative level, these findings can be explained by optical pumping of the atoms into a less-absorbing superposition state. The optical-pumping rate, which scales with the intermediate-state decay rate, then sets the equilibration time scale. Transients are also expected due to the strong-drive conditions that exist throughout the EIT pulse.

FIGS. 38A-40B: EIT formation as a function of time and coupler-laser frequency with an arbitrary linear greyscale indicating probe transmission through the vapour cell. FIGS. 38A and 38B: Probe laser power is varied, with high power ($\Omega_P$=41 MHz) in FIG. 38A and low power ($\Omega_P$=14 MHz) in FIG. 38B. The coupler Rabi frequency is kept constant at 10 MHz. The greyscale scaling is different between the two plots because changing probe power significantly changes absolute spectroscopic signal. FIGS. 39A-40B: Cell temperature is varied from high (FIG. 39A) to low (FIG. 40B). The Rabi frequencies are kept constant at $\Omega_P$=41 MHz and $\Omega_C$=10 MHz across all temperatures. The greyscale scaling is the same across all three plots. FIG. 39B: An inset of the 65° C. plot in FIG. 39A showing the onset of EIT.

To gain further quantitative insight into the time dependence of EIT formation and dissolution, a theoretical model and simulation is presented. In the theoretical model, the time dependence of EIT is studied by direct (time-dependent) integration of the three-level master equation $$\dot{\hat{\rho}} = \frac{i}{\hbar}[\hat{\rho}, \hat{H}] + L(\hat{\rho}) \quad (1)$$

with density operator, $\hat{\rho}$ and Hamiltonian, $\hat{H}$. In the two-color field picture, the Hamiltonian matrix $$\hat{H} = \hbar \begin{pmatrix} 0 & \Omega_P/2 & 0 \\ \Omega_P/2 & -\Delta_2 & \Omega_C/2 \\ 0 & \Omega_C/2 & -\Delta_3 \end{pmatrix} \quad (2)$$

with ground-state $5S_{1/2}=|1\rangle$ intermediate state $5P_{3/2}=|2\rangle$, and Rydberg state $|3\rangle$. The probe and coupler Rabi frequencies generally depend on time; here, one can choose approximately square-shaped pulse functions, with on-values close to the peak Rabi frequencies along the beam axes in the experiment and linear ramps at the beginnings and the ends. The detunings are $$\Delta_2 = -\Delta_P + k_P v/(2\pi)$$

$$\Delta_3 = -\Delta_P - \Delta_C + v(k_P - k_C)/(2\pi). \quad (3)$$

Here, $\Delta_P$ is the probe-laser detuning from resonance, which is fixed at zero in the experiment, $\Delta_C$ is the scanned coupler-laser detuning, $k_P$ and $k_C$ are the respective laser wave-numbers, and $v$ is the atom velocity in probe-beam direction. The Lindblad operator $L(\hat{\rho})$ is where the decay rates are $\Gamma_{21}=2\pi\times 6$ MHz and $\Gamma_{32}\sim=2\pi+10$ kHz. The exact size of $\Gamma_{32}$ is irrelevant because of its overall small value. The decays proportional to $\Gamma_{31}$ are explained further below.

$$L(\hat{\rho}) = \begin{pmatrix} \Gamma_{21}\rho_{22} + \Gamma_{31}\rho_{33} & -\frac{1}{2}\Gamma_{21}\rho_{12} & -\frac{1}{2}(\Gamma_{31}+\Gamma_{32})\rho_{13} \\ -\frac{1}{2}\Gamma_{21}\rho_{21} & -\Gamma_{21}\rho_{22} + \Gamma_{32}\rho_{33} & -\frac{1}{2}(\Gamma_{21}+\Gamma_{31}+\Gamma_{32})\rho_{23} \\ -\frac{1}{2}(\Gamma_{31}+\Gamma_{32})\rho_{31} & -\frac{1}{2}(\Gamma_{21}+\Gamma_{31}+\Gamma_{32})\rho_{32} & -(\Gamma_{31}+\Gamma_{32})\rho_{33} \end{pmatrix} \quad (4)$$

To determine the absorption on the probe transition, one can compute the velocity-averaged imaginary part of the density matrix element between the ground and intermediate state, $\rho_{i12,av}$, as a function of time and coupler detuning $$\rho_{i12,av}(t,\Delta_C) = \int P(v)\text{Im}(\rho_{12}(t,\Delta_C))dv$$

There, $P(v)$ is the normalized one-dimensional Maxwell velocity distribution in the room-temperature vapour cell. The cell temperature, needed to take the average over the Maxwell velocity distribution, is chosen to be 335 K (similar to FIGS. 39A-40B). The absorption coefficient is then given by $$\alpha(t, \Delta_C) = \frac{\omega_P}{c} \frac{2n_V d_{eg}}{\varepsilon_0 E_P} \rho_{i12,av}(t, \Delta_C) \quad (5)$$

Here, $\omega_P = k_P c$, $n_V$ denotes the atom volume density, $d_{12}$ the probe electric-dipole matrix element, and $E_P$ the probe-laser electric-field amplitude. In the $n_V$-value, one can account for the natural abundance of 85Rb in the cell (72%) and the statistical weight of $^{85}$Rb F=3 (58.3%). For the probe electric-dipole matrix element averaged over the magnetic transitions one can use d12=1.9 ea$_0$. For given $\Omega_P$, the probe field $E_P = \hbar\Omega_P/d_{12}$.

One can account for the line shift due to Rydberg-Rydberg interactions using a mean-field model, in which the Rydberg level energy is shifted by $$\Delta_r(t, \Delta_C) = s \int_v \left( \frac{1}{\tau_{mf}} \int_{t'=0}^{\infty} \rho_{33}(v, t-t') \times \exp(-t'/\tau_{mf}) dt' \right) P(v) dv \quad (6)$$

There, $\rho_{33}(v,t-t')$ is the Rydberg-atom population, which depends on atom velocity, time, and all detuning and Rabi-frequency parameters. Under the inner integral, where one can integrate over $t'$, one can take an exponential time average of $\rho_{33}(v,t-t')$ with a decay time $T_{mf}$. With this integration one can take account of the observation that the mean-field shift takes a considerably longer time to build up than the EIT itself. The mean-field time constant, $T_{mf}$, is on the order of a μs, while the time for EIT to occur is on the order of 100 ns. The time delay $T_{mf}$ is attributed to Rydberg atoms undergoing transitions into uncoupled states, which become detached from the EIT dynamics. The accumulation of Rydberg-atom population in uncoupled states leads to the gradual build-up of the mean-field shifts. The transitions into uncoupled states are, at least in part, driven by thermal black-body radiation and by Rydberg-atom collisions. The origin of the mean-field shifts is in long-range multipolar Rydberg-atom interactions (such as van-der-Waals interactions) between the optically coupled $30D_{5/2}$ Rydberg atoms, which cause the EIT, with other $30D_{5/2}$ atoms and with Rydberg atoms in uncoupled states.

The multipolar interaction potentials between 30D5/2-states of Rb were calculated and the long-range behavior was found to be attractive, corresponding to red shifts of the Rydberg levels. However, Stark shifts of $nD_{5/2}$-type Rydberg states in electric fields can be both positive or negative, corresponding to a mix of blue-shifted and red-shifted states. Since the shifts observed in the present study are negative (see FIGS. 38A-40B), the shifts are due Rydberg-Rydberg interactions, and not to time-dependent electric fields from surface and volume charges. Under different conditions shifts due to free charges have been observed.

In the outer integral in the equation (6), the Rydberg atom density is averaged over the one-dimensional Maxwell velocity distribution of the atoms in the laser-beam direction; any given Rydberg atom should experience mean-field shifts from all other Rydberg atoms, regardless of their velocity. The strength of the mean-field interaction is given by an interaction-strength parameter s that depends on atomic states and atom density. Higher cell temperatures correspond to higher atom densities and larger nonlinear-shift parameters s.

In the model one can further account for the fact that the atom sample within the probe region undergoes a constant replacement of 'inside' with 'outside' atoms due to atom migration into and out of the probe region. This is accounted for by a decay term $\Gamma_{31}$ from the Rydberg into the ground state. While in the Lindblad operator, equation (4), the spatial population migration is treated like an atomic decay from the Rydberg into the ground level, the migration has nothing in common with an electromagnetic decay. (Incidentally, direct decay from nD into $5S_{1/2}$ states is dipole-forbidden.) Spatial migration of $5P_{3/2}$ atoms is neglected due to the short 27 ns lifetime of the $5P_{3/2}$ state. In the calculation the turn-on and turn-off of the optical fields are included by assuming a linear rise and fall of the Rabi-frequency pulses over a time of 100 ns.

To reproduce the experimental data in FIGS. 39A-40B, where the mean-field shift is strongest, a mean-field time constant $T_{mf}$=1.5 s and an interaction-strength of s=800 MHz are used. This value is chosen because the velocity averaged Rydberg-atom probability is about 4% for conditions such as in FIGS. 39A-40B, which for s=800 MHz leads to an asymptotic mean-field shift of about 30 MHz (as observed in FIGS. 39A-40B). For the given laser-beam radii and room temperature velocities, one can model spatial Rydberg-atom migration by setting $\Gamma_{31}$=5×10$^6$ s$^{-1}$ in equation (6).

The values of $\rho_{i2,av}(t,\Delta c)$ yield Beer's absorption coefficient, $\alpha(t,\Delta_C)$, according to equation (5). The result of the sample calculation is shown in FIGS. 41A-41C with zoom-ins that show the turn-on and turn-off behavior of the EIT. The calculation reproduces the experimentally observed EIT formation time as well as the short features of enhanced absorption and transmission at the beginning and the end of the coupler-laser pulse, respectively. The calculation further reproduces the mean-field-induced time-dependent shift of the EIT line to lower frequencies, observed after turning on the coupler. Finally, the calculation also reproduces the asymmetric line shape of the red-shifted EIT line that is observed at high density several microseconds after turning the coupler beam on. The shifted EIT lines have a relatively sharp edge on the red side, and a smoother drop-off on the blue side.

The calculation reveals transients (FIG. 41B) that are likely washed out in the experimental measurements due to averaging over the transverse mode profiles of the coupler and probe beams in the experimental detection scheme. The averaging is also expected to have an effect on the exact shape of the features of enhanced absorption and transmission at the beginning and the end of the pulse, respectively.

FIG. 41A: Numerical calculation showing EIT formation as a function of time and coupler-laser frequency for a constant probe and pulsed coupler. FIGS. 41B and 41C are insets showing the coupler turn-on and turn-off at 1 μs and 21 μs, respectively, with greater time resolution. The calculated probe absorption coefficient α 4106 is represented by the linear greyscale. The Rabi frequencies are $\Omega_P$=40 MHz and $\Omega_C$=10 MHz.

The transient enhanced absorption and transmission depends mainly on the coupler laser frequency and intensity. The duration of the transients is longer near the EIT resonance, and with lower coupler intensity. Higher coupler intensity leads to a stronger enhancement effect over a shorter duration. This trend bears out in both the experimental data and the simulation. The observation of the short, ≤20 ns long transients is somewhat unexpected. The observed process appears superficially similar to photon storage and retrieval in EIT-mediated Rydberg polaritons in cold-atom systems. There, a probe photon is stored as a collective Rydberg excitation in the medium in the presence of a reduced-power coupler beam and retrieved when the coupler is turned back on.

In the present disclosure, energy from the probe is seemingly 'stored' and 'retrieved'. This interpretation would suggest that the 'stored' probe light is 'retrieved' after an extremely long time: up to 20 μs pulses have been tested and no diminishment of the 'retrieval' portion of this effect has been seen. However, the duration of the pulses far exceeds the <1 μs transit time of atoms through the EIT beams. The physics of collective, coherent atom-field states (Rydberg-excitation polaritons) is not compatible with the long time scales, short atom-field interaction times and high atomic velocities in the room-temperature cell experiments. Instead, the simpler picture of transient single-atom dynamics, with an added nonlinear mean-field shift, seems sufficient to explain these transients. In this description, the transients reflect phases of enhanced probe-energy absorption and probe-energy release at the beginning and the end of the pulse. However, the excitations implanted into the atom sample at the beginning of the probe pulse and extracted at the end of the pulse are not the same.

The atoms move, on average, at about 100 ms$^{-1}$ transversely to the beams. The resultant time dependence of the Rabi frequency in the frame of reference of the atoms is not included in the model. Further, the magnetic substructure of the involved $5S_{1/2}$ and $5P_{3/2}$ hyperfine states and of the nD$_{5/2}$ fine-structure states causes the Rabi frequency to vary among various allowed magnetic transitions. These are several reasons why some transients seen in the calculation are not observed in the measurements. An improved model, which would also include optical-pumping effects, could be implemented with quantum Monte-Carlo simulations, in which the highly-dimensional Master equation is solved using a stochastic quantum trajectory approach.

It is also useful to consider the implications of the mean field model. The vapour-cell atom density of $^{85}$Rb F=3 at 65° C. is about 2×10$^{17}$ m$^{-3}$, and the velocity-averaged steady-state relative Rydberg-atom population, $\rho_{33,av}$, is about 4%, leading to an average nearest-neighbor atom distance of about 3 μm. In calculations of multipolar Rydberg-atom interaction potentials between pairs of 30D$_{5/2}$ Rb Rydberg atoms, a h×30 MHz level shift requires a distance of about 1.5 μm, corresponding to about a factor of ten higher Rydberg atom density than what is estimated from pure singe-atom dynamics. The aforementioned (unidirectional) population transport of Rydberg atoms into long-lived, uncoupled states may explain the discrepancy. In this process, Rydberg population would accumulate in a group of long-lived states and cause enhanced shifts.

5. Pulsed RF

Among the many practical uses of Rydberg EIT is its implementation in atom-based sensing and measurement of electric fields by exploiting the high sensitivity of Rydberg-Rydberg transitions to RF fields and the large number of available Rydberg transitions spanning an RF-field frequency range from MHz to THz (including radio, microwave, and millimeter-wave bands). In many applications of Rydberg EIT atom-based sensing, such as in RF metrology, RF testing and engineering, and communications, the detection or measurement of time-varying RF fields is required. The Rydberg EIT response time to RF fields determines detection speed and measurement bandwidth limits of an EIT-based RF detector. To test this, a 37.505 GHz microwave pulse was applied, resonant with the 47S→47P transition, which induces Autler-Townes (AT) splitting from which the RF electric field can be inferred. The EIT-AT signals are overall less pronounced than the microwave-free EIT signal due to the distribution of oscillator strength between the two AT dressed states. A higher-gain photodiode is therefore used (Thorlabs PDA10A2) to obtain a higher resolution of the spectral features at the expense of a slightly smaller detection bandwidth of 50 MHz.

Two cases are examined: a microwave pulse applied to steady-state Rydberg EIT, shown in FIGS. 42A and 42B, and a microwave pulse synced with a Rydberg EIT pulse (performed by pulsing the coupler laser, as in the previous sections), shown in FIGS. 43A and 43B. In both cases, the EIT AT-splitting by the microwave pulse is instantaneous to within the resolution of the photodetector. The measurable atom-RF interaction thus occurs well-ahead of the longer timescale to reach a steady-state EIT-AT signal. This fast atom-RF response is shown in the inset of FIGS. 42A and 42B, where the microwave pulse's turn-on results in immediate AT-peak formation within the 20 ns time resolution of the photo-detector. The probe transmission signal of the AT-split peaks then continues to increase to steady-state over the subsequent ~200 ns while the transmission at the microwave-free EIT location decays to the background over approximately the same timescale.

When the EIT and the microwave are pulsed on synchronously, as shown in FIGS. 43A and 43B, the effect is similarly instantaneous to within the 20 ns resolution of the photodetector. A fundamental lower limit has not been reached to the EIT response time to time-dependent microwave fields that would set an upper limit to microwave field detection bandwidths using EIT in atomic vapors. For detection of microwave pulses in the transient regime, here shorter than 200 ns, limitations include the reduced visibility of the AT peaks due, in part, to the distribution of signal strength between three EIT lines, namely the pair of AT-split states and the decaying remnant line at the microwave-free EIT line position (inset of FIGS. 42A and 42B). The presence of the remnant line and its decay may be attributed to migrating Rydberg atoms that are not coupled by the microwave field.

FIGS. 42A and 42B: An RF pulse on resonance with the 47S→47P Rydberg transition, applied after the EIT has reached steady-state. FIG. 42B shows the RF turn-on at higher time resolution. FIGS. 43A and 43B: An EIT pulse and an RF pulse switched on and off synchronously. FIG. 43B shows the EIT and RF turn-on at higher time resolution. Greyscale is probe transmission 4206, 4306 in arbitrary units.

6 Conclusion

The time-dependent properties of atom-light and atom-RF field interactions with Rydberg EIT in a hot vapour cell have been investigated. Time-domain transient EIT dynamics at the 10 ns level and a longer steady-state EIT formation at a timescale of ~200 ns are observed, dependent on both probe and coupler Rabi frequencies. In some embodiments, an extended study of EIT and RF response times and mean-field time scales on all Rabi frequencies, beam geometry, and vapour density can be conducted. Under the present disclosure, a density-dependent evolution of the apparent coupler-frequency Rydberg-excitation resonance shift is found to develop on a scale of 1-2 µs prior to reaching steady-state.

The transient EIT features establish the achievable time-resolution and detection bandwidths of Rydberg EIT in applications that require the EIT to be pulsed, including laser-modulated lock-in detection schemes. For applications in field sensing and measurement, the EIT response time to RF in the atom-RF field interaction establishes the relevant limit. The RF response time is found to be substantially faster than the steady-state EIT formation time, with an upper limit established at the 10 ns level, limited by photodetector bandwidth in the present disclosure. The fast transient RF response time suggests that high-speed field detection and RF communications bandwidths greater than 50 MHz are achievable. For pulsed RF field detection applications, a challenge is the reduced EIT signal strength. By pulsing the EIT synchronously with the RF it is possible to avoid splitting the EIT signal between RF-coupled and uncoupled states, boosting signal. In the present disclosure the temporal resolution of the EIT response to RF-field pulses has been limited only by photodetector resolution; a fundamental limitation has not been reached.

Appendix G: Exemplary Rydberg High-Speed, High Resolution MMW 2D Near-Field Imager Appendix G: "Rydberg high-speed, high resolution MMW 2D near-field imager," David A. Anderson, Internal document, page 1, October 2019, is hereby incorporated herein in its entirety by reference.

FIGS. 13A and 13B illustrate atomic raster imager 1300, according to various exemplary embodiments.

In some embodiments, atomic raster imager 1300 can include an active imaging area test and evaluation unit. In some embodiments, atomic raster imager 1300 can include an antenna array (e.g., 60 GHz) adjacent to the vapor cell. In some embodiments, spot displacement can be represented by x.

In some embodiments, the present disclosure includes (I) design, build test MMW near-field imager, and (II) characterize, performance evaluation, target design and performance specifications. In some embodiments, atomic raster imager 1300 can include a vapor cell geometry (DC to 60 GHz). For example, the vapor cell can include a rectangular cuboid, a side length SL>>imaging area to minimize RF footprint, and/or a depth $<\lambda_{MMW}/2$. In some embodiments, atomic raster imager 1300 can include 1-10 Hz raster scan speed. In some embodiments, atomic raster imager 1300 can include E=10-100 V/m dynamic range. In some embodiments, atomic raster imager 1300 can include RF E-field and polarization mapping at select MMW frequency.

In some embodiments, atomic raster imager 1300 can include RF image aberration correction analysis. For example, atomic raster imager 1300 can include inhomogenous EIT line broadening from spatially-varying Rabi frequency, spot displacement < >CCD mapping function determination, material dispersion and imperfections, and/or spatial RF footprint and C-factor determination.

In some embodiments, the present disclosure includes (III) MMW analysis of near-field imager and performance evaluation. In some embodiments, atomic raster imager 1300 can include an imager MMW reflection/back-action (spectrum analyzer on array pick-up). In some embodiments, atomic raster imager 1300 can include chip-to-imager distance and angle dependence. In some embodiments, atomic raster imager 1300 can include near-field (reactive and Fresnel zones) to far-field mapping with E and polarization maps.

Appendix H: Exemplary Rydberg High-Speed, High Resolution MMW 2D Near-Field Imager Appendix H: "Rydberg high-speed, high resolution MMW 2D near-field imager," Internal document, page 1, Feb. 6, 2020, is hereby incorporated herein in its entirety by reference. In some embodiments, the present disclosure also includes WIPO Publication No. 2019/126038, filed Dec. 17, 2018, which is hereby incorporated herein in its entirety by reference.

FIGS. 13A and 13B illustrate atomic raster imager 1300, according to various exemplary embodiments.

The present disclosure includes calibration and characterization of short-wavelength RF/THz arrays, chip-sets, etc. The present disclosure includes current tools/approaches based on standard antenna characterization in anechoic chamber. Current methods include large and low resolution (antennas), slow (mechanical translations; 6 minutes current record for single chip characterization), require calibration, susceptible to antenna-antenna near-field coupling. In some embodiments, atomic raster imager 1300 can include a Rydberg-based near-field imager that provides RF/THz measurements over-the-air with high-speed (<<1 second), high-resolution (optical diffraction-limited), and SI-traceability/self-calibration.

Appendix I: Exemplary Rydberg Radio Receiver

Appendix I. "Rydberg Radio Receiver," David A. Anderson, Internal document, page 1, Nov. 21, 2019, is hereby incorporated herein in its entirety by reference.

Figure 44A:
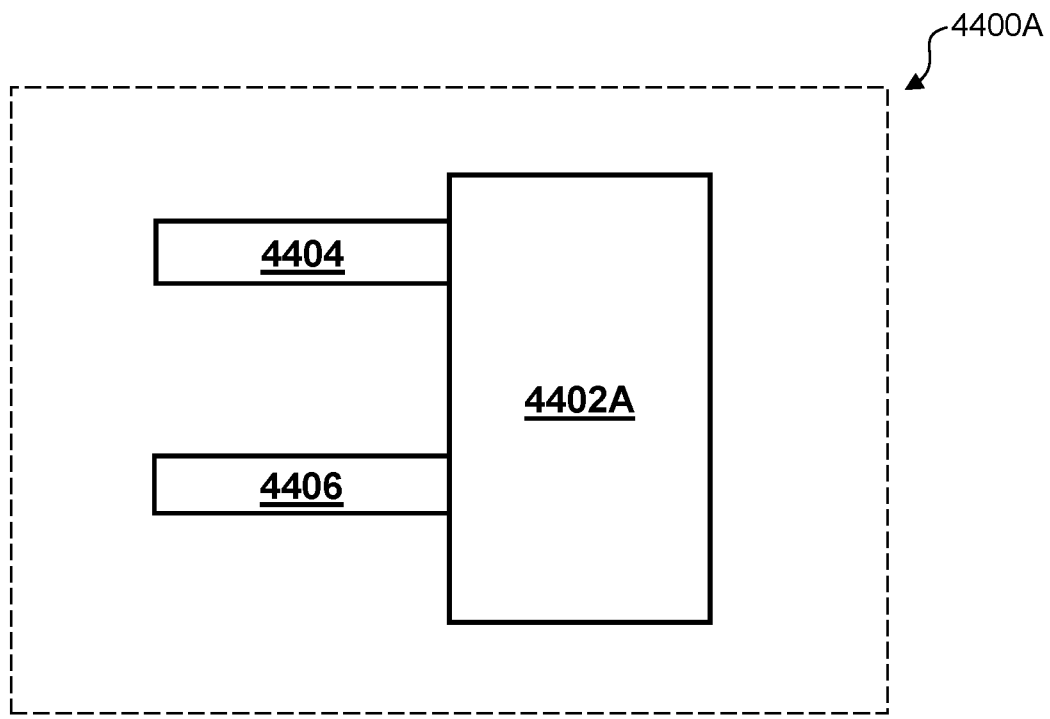
FIG. 44A is a schematic illustration of a Rydberg radio receiver, according to an exemplary embodiment.
Figure 44B:
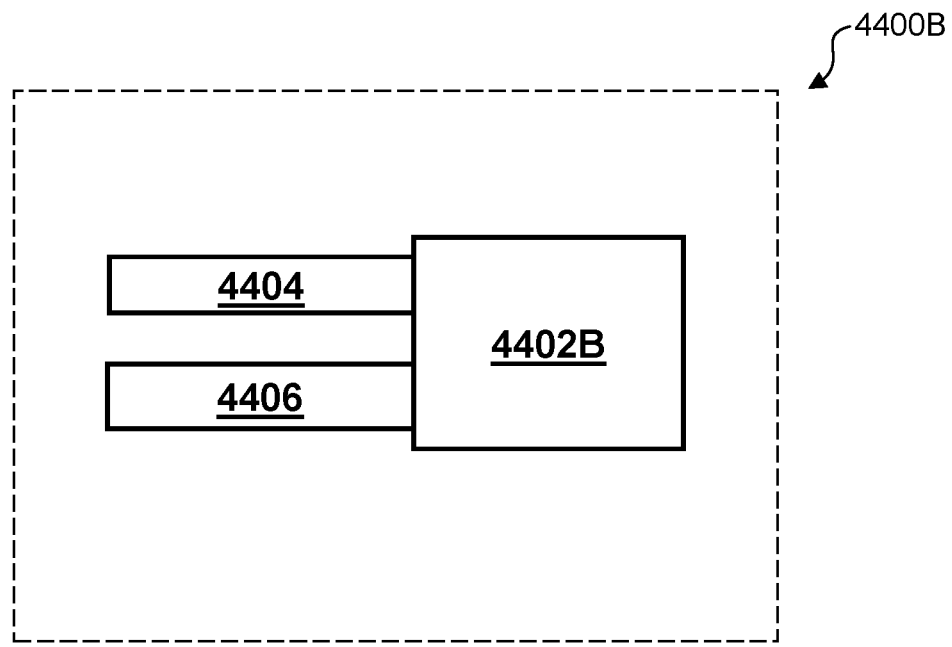
FIG. 44B is a schematic illustration of a Rydberg radio receiver, according to an exemplary embodiment.

FIGS. 44A and 44B illustrate Rydberg radio receivers (R3), according to various exemplary embodiments. FIG. 44A is a schematic illustration of Rydberg radio receiver 4400A. FIG. 44B is a schematic illustration of Rydberg radio receiver 4400B. In some embodiments, Rydberg radio receivers 4400A, 4400B can include specific device form factors, for example, atom-based spectrum analyzer, aperture, receiver, power/field-meter, voltage standard, transducer control unit, or a combination thereof.

In some embodiments, for example, as shown in FIGS. 44A and 44B, Rydberg radio receivers 4400A, 4400B can be an exemplary stand-alone instrument that can provide a basic platform for realizing derivative atom-based devices, for example, RF receivers based on vapor cell EIT readout (e.g., atomic receiver 100, AM and FM radio receiving in C-band and Q-band carriers, etc.), atomic RF power/voltage transducers (e.g., atomic transducer 600 shown in FIGS. 6A-6D), and/or hybrid atom-based devices (e.g., atomic hybrid detector with stripline 900 shown in FIGS. 9A and 9B).

In some embodiments, for example, as shown in FIG. 44A, Rydberg radio receiver 4400A can include body 4402A, hybrid port 4404, and over-air port 4406. In some embodiments, Rydberg radio receiver 4400A can include a dual-option hybrid/over-air R3 EMP-tolerant module. In some embodiments, Rydberg radio receiver 4400A can have a size of 2U, a weight of 20 kg, and power of 100 W. In some embodiments, Rydberg radio receiver 4400A can include SWaP reduction, R3 laser development, hardware integration, capability demo, and/or performance testing. In some embodiments, Rydberg radio receiver 4400A can include channel tenability, channel selectivity, channel isolation, dynamic (linear) range, and/or phase demodulation.

In some embodiments, Rydberg radio receiver 4400A can include miniature vapor-cell over-the-air and RF-feed vapor cell hybrid detector elements. In some embodiments, Rydberg radio receiver 4400A can include a miniature optoelectronic board, miniature Rydberg Technologies lasers, micro-optics and electro-optics, A/D, a microprocessor, electronics, and/or software. In some embodiments, Rydberg radio receiver 4400A can include integration of components, mainframe, and software. In some embodiments, Rydberg radio receiver 4400A can include packaging and/or EM shielding.

In some embodiments, for example, as shown in FIG. 44B, Rydberg radio receiver 4400B can include body 4402B, hybrid port 4404, and over-air port 4406. In some embodiments, Rydberg radio receiver 4400B can include a dual-option hybrid/over-air R3 EMP-tolerant module. In some embodiments, Rydberg radio receiver 4400B can have a size of 3"×8"×9", a weight of 5 kg, and power of 50 W. In some embodiments, Rydberg radio receiver 4400B can include additional SWaP reduction, hardening, packaging, and/or platform interfacing (e.g., air, land, sea, space). In some embodiments, Rydberg radio receiver 4400B can be light weight, compact, EMI/EMP-tolerant, and/or environment-resistant.

In some embodiments, Rydberg radio receiver 4400B can include hermetic packaging and environmental isolation for operation in hard environments. In some embodiments, Rydberg radio receiver 4400B can include environmental testing and validation (e.g., temperature, humidity, vibration, shock, radiation, etc.). In some embodiments, Rydberg radio receiver 4400B can include OEM software controls and interfacing with external shell-, air-, sea-, land-system platforms. In some embodiments, Rydberg radio receiver 4400B can include firmware and/or security.

Appendix J: Exemplary Atom-Based Magnetic Field Monitor

Appendix J: "Atom-based magnetic field monitor," Internal document, pages 1-12, June 2019, is hereby incorporated herein in its entirety by reference.

Figure 45:
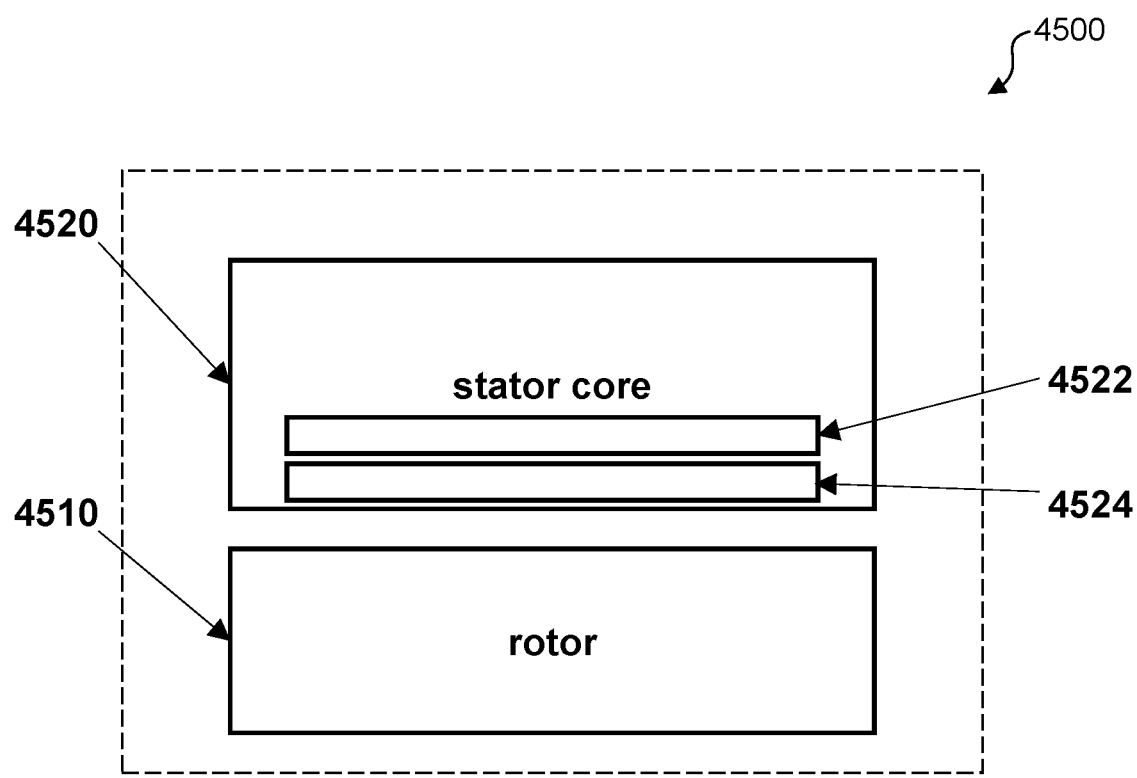
FIG. 45 is a schematic illustration of a MVA air-cooled generator, according to an exemplary embodiment.
Figure 46A:
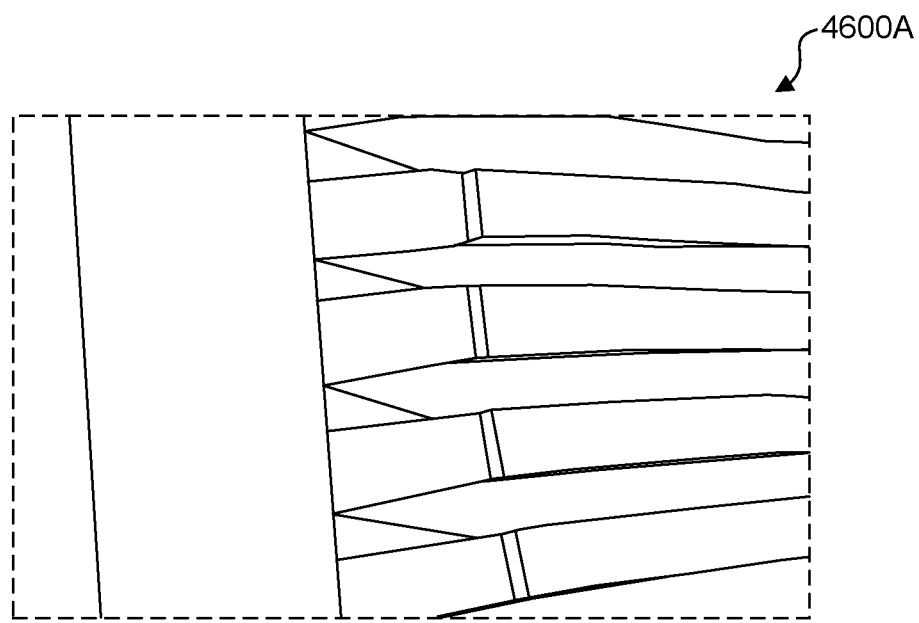
FIGS. 46A and 46B are schematic illustrations of overflux damage in the MVA air-cooled generator shown in FIG. 45, according to an exemplary embodiment.
Figure 46B:
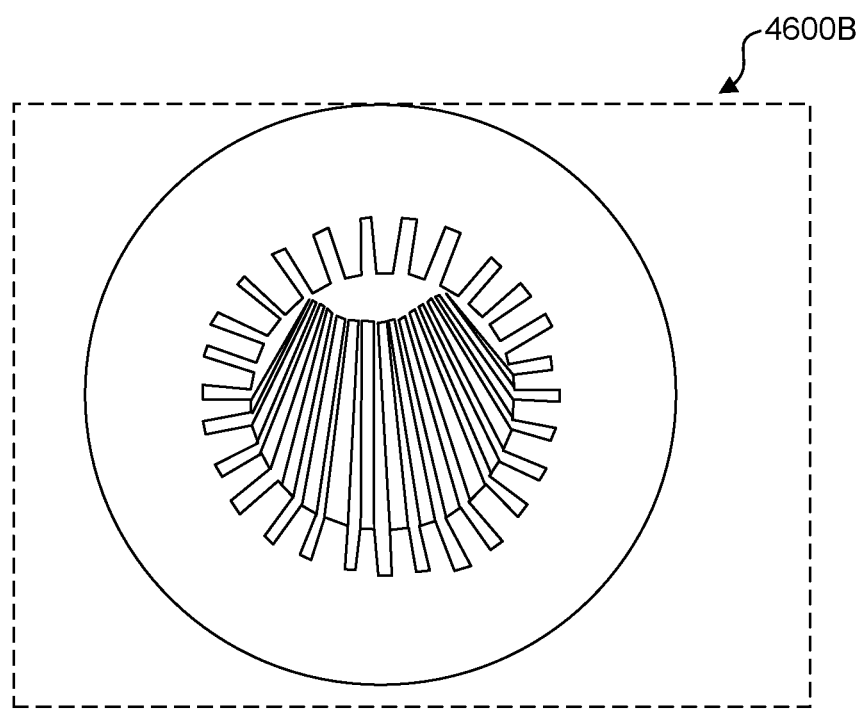
Figure 47A:
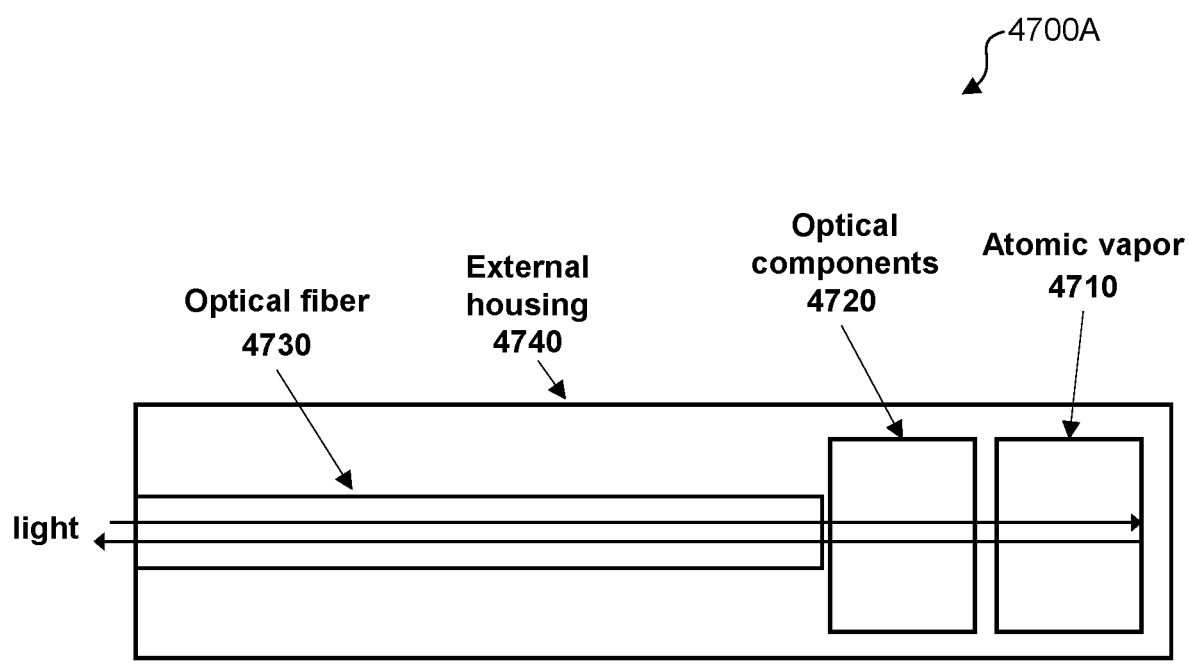
FIGS. 47A and 47B are schematic illustrations of an atomic probe and a control unit, according to an exemplary embodiment.
Figure 47B:
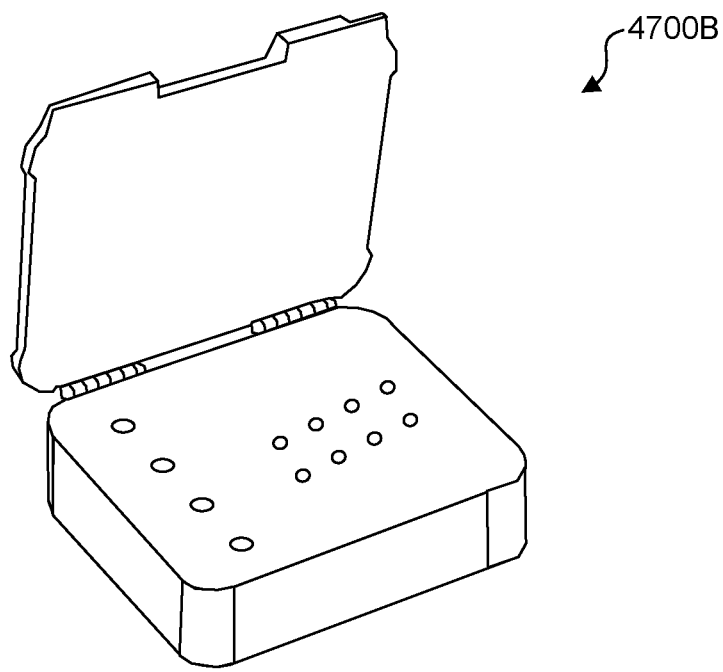

FIGS. 45-47B illustrate an atom-based magnetic field monitor for over-flux detection in generators, according to various exemplary embodiments. FIG. 45 is a schematic illustration of MVA air-cooled generator 4500. FIGS. 46A and 46B are schematic illustrations of over-flux damage in MVA air-cooled generator 4500 shown in FIG. 45. FIGS. 47A and 47B are schematic illustrations of atomic probe 4700A and control unit 4700B. In some embodiments, for example, as shown in FIG. 45, MVA air-cooled generator 4500 can include rotor 4510 and stator core 4520, with stator core 4520 including lamination 4522 and air gap 4524. In some embodiments, for example, as shown in FIG. 47A, atomic probe 4700A can include atomic vapor cell 4710, optical components 4720, optical fiber 4730, and/or external housing 4740.

2.1 Atom-Based Magnetic Field Monitor

At present, no instrumentation exists that provides direct and non-invasive monitoring of magnetic fields for reliable over-flux fault protection in large motors and generators. An indirect measurement consisting of monitoring motor rotation frequency and output voltage, known as ANSI24 protective relay, is currently used as a proxy for detecting over-fluxing. The issue with this method is that it is an indirect, secondary electrical measurement that can also be triggered by other, less critical electrical faults during generator operation, rendering it less reliable. The dependence on multiple input signals also makes the method highly dependent on the attention and expertise of the operator, who must discern the over-fluxing event from other possible relay tripping causes. Combined with the lack of highly-reliable indicators, the plant operators are unable to reliably detect possible initial over-fluxing and over-fluxing damage before it becomes critical.

In the present disclosure an atom-based magnetic field monitor for over-flux detection in generator fault protection was developed to address this need. The atom-based probes in the monitoring system provide a dedicated over-flux monitoring system capable of direct detection of magnetic fields from 0.01 to several Tesla in and around rotating machinery using low-profile sensor heads that remain immune to EMI and peripheral events in the generator electrical system. The monitor will enable diagnostics and detection of over-fluxing allowing operators to anticipate and plan maintenance shut-downs prior to the occurrence of critical generator damage.

2.2 Physics Principles and Features

Field measurement using the spectra of atoms as a remote-sensing method dates back into the early days of virtually all fields that overlap with spectroscopy, including atomic physics, astronomy and astrophysics, and plasma physics. Atom-based magnetic-field measurement builds on ideas and successes, both in fundamental physics and in applied science. Zeeman spectroscopy, the observation of the anomalous Zeeman effect, and the Stern-Gerlach experiment played critical roles in the discovery of the electron spin, one of the pillars on which modern quantum mechanics is built. Atom-based magnetic-field measurement plays a critical role in NASA missions in the planetary system, for instance in the Europa Clipper mission that aims at testing whether Jupiter's moon Europa could have conditions suitable for life.

In applications that involve large magnets, such as in national labs (accelerators, rare-ion physics, plasma fusion machines etc.), industrial motors and generators, customer needs extend to measuring small magnetic-field variations on a large magnetic-field background with robust, calibration- and maintenance-free, radiation-resistant instruments with a long service life. This gap in quantum-enhanced, atom-based magnetic-field measurement capabilities is addressed in the present disclosure.

2.2.1. Zeeman Absorption Spectroscopy in Vapor Cells

To explain the basic idea behind Zeeman spectroscopy, one can consider the interaction of a laser beam of well-defined polarization that excites atoms in an atomic vapor cell from a ground into an excited atomic level that both have magnetic sub-states. The ground- and excited levels are split due to the Zeeman effect. One can use this formalism to obtain the atomic energies and states in an applied magnetic field, for both the ground (5S) and excited (5P3/2) levels of rubidium, by solving the respective sums of the hyperfine $H_{hfs}$ and magnetic-interaction Hamiltonian $H_B$, $$H_{hfs} = A_{hfs} I \cdot J + B_{hfs} \frac{3(I \cdot J)^2 + \frac{3}{2}(I \cdot J) - I(I+1)J(J+1)}{2I(2I-1)J(2J-1)}$$

$$H_B = \frac{\mu_B}{\hbar}(g_S S + g_L L + g_I I) \cdot B$$

The theory allows the calculation of the laser-induced coupling amplitudes between the Zeeman-shifted ground and excited states in the cell. The magnitude-squares of the amplitudes, the natural atomic linewidth, and the spectral density function of the laser allow us to calculate the excitation rates according to Fermi's Golden Rule. The excitation rates are averaged over the known Maxwell atomic velocity distribution of the atoms in the vapor cell, a process that is known as Doppler averaging because it accounts for the Doppler effect of the atoms in the cell. To calculate the Beer's absorption coefficient of the atomic vapor in the cell, alkali vapor pressure curves are used.

The numerical procedure yields a quantitative model for the absorption coefficient of the laser light in the vapor cell as a function of laser frequency, magnetic field amplitude and direction, laser polarization, cell length, vapor type (Rb85, Rb87, Cs133 etc.), and cell temperature, etc. In typical magnetic-field measurement applications, most parameters are fixed, while the magnetic-field dependence of the spectrum allows the determination of magnitude and direction of the field. A suite of computer programs developed for this analysis is used by Rydberg Technologies Inc. to generate banks of sample spectra, which provide the atomic-physics input that allows us to measure the magnetic field. In the utilized signal processing method, the measured sensor data are compared with banks of theoretical sample spectra, with the best match yielding the magnetic field. Examples are provided in the present disclosure.

The Doppler-broadened absorption spectrum is obtained with a single, low-power (1 mW or less) 780-nm diode-laser beam, which is sent through a vapor cell and is scanned over a range of a few tens of GHz. The spectrum exhibits a series of Doppler-broadened lines with a linewidth on the order of 500 MHz in laser frequency. The line centers can be determined with an uncertainty on the order of several tens of MHz. Since the Zeeman shift of the strongest-shifting lines is about 2.3 MHz/Gauss, Doppler-broadened spectroscopy has a field resolution and accuracy on the order of 10 Gauss. This is sufficient for magnetic-field monitoring applications in which the fields range into the Tesla regime, and in which the main interest relies in measuring the field at a 100- to 1000-ppm level with a simple, low-cost, robust, wire-free, all-optical, calibration- and maintenance-free sensor head. Applications with these requirements include motor and generator over-flux monitoring, the core topic in this proposal. Other areas of use include magnetic-flux leakage (MFL) detection of steel structures.

2.2.2. Saturated-Absorption Spectroscopy in Vapor Cells

Magnetic-field monitoring in high-precision applications at national labs and facilities require accuracy and precision below the 100-ppm level. To reach this level, the Doppler effect must be eliminated from the spectra using Doppler-free saturation spectroscopy. In essence, two laser beams of the same frequency counter-propagate through the cell, one called the pump and the other the probe. At certain frequencies, both beams interact with the same velocity class of atoms in the cell, leading to a reduced absorption on the probe. For pump- and probe-beam intensities below the saturation intensity (about 4 mW/cm$^2$ for rubidium atoms probed with 780-nm laser light), the width of these so-called "Lamb dips" in the absorption spectrum is on the order of the natural linewidth of the transition (6 MHz). In a saturated-spectroscopy Zeeman spectrum of Rb atoms in a vapor cell there are on the order of twenty Lamb dips, all of which mark the center frequencies of Zeeman-shifted transitions with an uncertainty in the sub-MHz regime. The resultant uncertainty in the magnetic-field measurement is well below one Gauss, allowing field measurement precision and accuracy at the 10 to 100-ppm level, in a field on the order of one Tesla. This is achieved with a sensor head that is only slightly more complicated than that employed in plain (single-beam) Doppler-broadened absorption measurements. The present disclosure includes detailed designs for the sensor heads (e.g., 4700A) that are suitable for both Doppler-broadened and saturated Zeeman spectroscopy.

2.2.3. Key Features

In addition to the above summarized performance metrics, atomic field sensors 4700A are electromagnetic-interference (EMI)-free due to the fact that the vapor cells are optically probed with laser light propagating through optical fibers. The sensor control package is located remotely, at a distance that can range into hundreds of meters (depending on customer needs). This design eliminates EMI from the vicinity of the probe head, which may be embedded in an electromagnetically dirty environment. The EMI-free characteristics of the atomic probe presents an advantage over other sensors that require wiring between the control package 4700B and the sensor head 4700A (such as NMR, induction and Hall probes). Moreover, the atomic sensor 4700A is robust, calibration-free and radiation-resistant.

These features are conducive to maintenance-free operation over many years of service life. This is important, for instance, in power-plant operation, where maintenance down-times are costly and disruptive. The atomic sensor 4700A can have a signal response time below 1 $m_s$, corresponding to a bandwidth of >1 kHz. This feature, matched with its dynamic range from about 25 dB (Doppler-broadened spectroscopy) to 45 dB (saturated absorption spectroscopy), makes the atomic sensor 4700A preferable in applications with a rapid signal response time. Last not least, the atomic sensor head 4700A allows implementations of low size, weight and power (SWaP), and cost. As explained in the present disclosure, sensor head volumes and weights range in sub-cm$^3$ and sub-one-gram, respectively. The control pack 4700B can range in volume below one cubic-foot, including lasers and electronics, and total powers in the range of tens of Watts.

2.3. Prototype Instrument Concept and Design

The present disclosure includes a control unit 4700B and four sensor cords with atomic probe heads 4700A. In some embodiments, control unit 4700B is housed in a portable hard plastic case with external dimensions 18.5"×14.06"× 6.93", with fiber-optic jacks for up to four simultaneously driven atomic probes 4700A. Control unit 4700B contains the laser chip with temperature, current and scan controls, optical components for beam shaping, a laser frequency referencing system composed of a miniature saturation spectroscopy unit (miniSPEC), an optical frequency tracker (OFT) for scan linearization, and photodiodes with transimpedance amplifiers to read the signal from the probes. Further, the laser light is distributed inside the control unit 4700B among the four probes 4700A using a combination of optical elements, with each probe 4700A having a dedicated photodetector of the returned light that carries the absorption information from the atomic vapor (which allows us to determine the magnetic field). The electrical controls and signals of the laser, reference units and photodiodes are generated and processed by a central processor, which also performs the data processing and magnetic-field rendering. FIG. 47B shows a layout of the control unit and a probe head (FIG. 47A). FIG. 47A shows a picture of one of several vapor-cell types that may be used for the present disclosure (manufactured by Rydberg Technologies Inc.).

FIGS. 47A and 47B: Atomic probe with the internal elements exposed (FIG. 47A) and control unit (FIG. 47B). The inset shows a vapor cell manufactured by Rydberg Technologies.

The atomic probe 4700A is made of an optical fiber 4730 that guides the light to the atomic vapor cell 4710 at the tip of the probe. The light is coupled into the fiber inside the control unit 4700B, behind the fiber jacks, and it is guided to the tip of the probe where it passes through several standard pieces of optics 4720 for beam collimation. The collimated beam traverses the cell 4710, is retro-reflected back, traverses the cell 4710 a second time, and is coupled back into the fiber tip 4730. The reflected light that contains the information about the absorption spectrum of the atoms within the vapor cell travels back through the fiber 4730 into the control unit 4700B, where it is read by photodiodes. Multiple channels (e.g., four channels) may be operated simultaneously.

The central processor reads the analog signals from the photodiodes, pre-processes the data and interfaces with several standard signal outputs and with a USB connection to an external computer (optional). The unit 4700A, 4700B has a standard and an expert operation mode. In standard mode, the unit 4700A, 4700B is running stand-alone and renders the magnetic-field information via several 4-20 mA closed-current loops, an analog industry standard for process control, and via a MODBUS interface, which is a digital industry standard for process control. Field-detection ranges are selected by front panel switches. In expert mode, a visual interface on the control computer 4700B allows the user to diagnose and service the field measurement unit 4700A, to fine-tune parameters of the unit that need to be set only once (or infrequently), and render the measured magnetic-field information in formats that are suitable for graphic display and advanced scientific purposes.

Miniature Vapor-Cell Detector for Operation in 10° C. to 100° C. Environments

Vapor-Cell Anodic Bonder and Filling Station Upgrade

In the present disclosure, an existing ultra-high-vacuum pumping station will be upgraded with a vacuum chamber for in-vacuum cell filling and anodic bonding. The steel chamber includes several peripheral components (vacuum gauge, gate valve, windows for bonder inspection, several manipulators for tool and sample placement, and electric feedthroughs). At the core of the chamber is a cell processing station that accommodates prefabricated vapor cell(s). The in-vacuum bonder has a differential temperature control on the bottom and the top of the cell(s), with the top held at near 400° C. for anodic bonding and the bottom at a lower temperature (anticipated at 200° C.). The vacuum bonder includes several thermocouples, resistive heaters and temperature control elements that stabilize the bonding-phase temperature distribution according to these specifications. Further, standard mechanical linear-motion manipulators allow relative placement of the sample holder parts and rubidium getter used for filling. One manipulator is used to compress the cell once filled. During the bonding, the cell body and top window are compressed against a silicon washer. The bonder further includes electrodes and feedthroughs that connect to a 1-kV high-voltage power supply.

Fabrication of Stemless Miniature Vapor-Cells

Rydberg Technologies already has the capability to fabricate small anodically boded cells (see FIG. 47A, atomic vapor cell 4710). Cells are filled with atomic vapor and sealed off using specialized glassware and glass-blowing methods. Final cells mostly have the desired cylindrical shape with high-quality flat windows, but there is a filling-stem remnant left on the side of the cell. The stem typically has a small amount of metallic rubidium left in it. Most commercially available alkali vapor cells have this generic structure. Here it is desired to fabricate cells that lack the undesirable stem piece. This will reduce the footprint of the cell, allowing the fabrication of smaller probes that fit into air gaps and venting holes in smaller-scale generators and motors. Further, the virtual absence of metallic rubidium in the stemless cells will reduce the risk of fogging cell windows with a metal layer, a problem that sometimes occurs and that is typically mitigated by heating the windows.

To fill the stemless cells, the vapor cells are anodically bonded with one window and one silicon washer on one side of the cylindrical, stem-free cell body. This occurs outside the vacuum in an existing standard anodic bonder station. The half-finished cells are placed on the bottom unit of the sample holder in the vacuum bonder, with the cell window facing down and the open-ended side up. A matching silicon disk is mounted in the top unit of the sample holder. The system is pumped to about $10^{-8}$ Torr. Initially, the sample holder and the cell parts in it are baked out and brought back to room temperature. A rubidium getter near the cell top is activated and used to distill a small amount of rubidium into the cell. The manipulators are used to position the cell parts and the getter relative to each other to ensure efficient filling. Visual inspection allows us to determine when to stop the distillation.

The top rim of the cell is brought up to about 100° C. to evaporate the rubidium off the top rim. The bottom of the cell, held in the bottom sample-holder unit, is kept below room temperature to ensure the rubidium remains trapped in the cell. Once the top rim is clean, the silicon disk mounted in the top unit of the sample holder is lowered onto the bottom, with a constant force of several Newtons applied. At this point, the heaters are engaged, and the above described temperature equilibrium is established. When the top reaches 400° C., the bonding voltages are applied to the cylindrical cell body and the silicon cap. Here it is important that the region in-between the electrodes is at 400° C. As is common practice already, the bonding proceeds via a gradual rise of the bonding voltage to about 1 kV, while monitoring the current. The bonding is complete when the current drops to a stationary value and when a given amount of charge per area has been deposited into the bonding interface. Once complete, the temperatures are ramped down in a controlled fashion. The cells are then retrieved and tested.

In the present disclosure, stem-less vapor cells with diameters ranging from 3 to 5 mm, and lengths up to 10 mm can be fabricated.

Low-Profile Fiber-Optic Laser Beam Injection and Extraction

In the present disclosure, established methods are employed to integrate 3-mm OD cells with GRIN lenses, optical fibers, fiber ferrules and capillaries into a compact sensor head that is collinear with the fiber. The light from the fiber is collimated by the GRIN lens, passed through the atomic vapor in the cell, and retro-reflected from the silicon disk on the far end of the cell. The retro-reflected light is coupled back into the fiber and transmitted back to the control unit for spectral analysis. It is also noted that this scheme is suitable for both plain absorption spectroscopy and saturation spectroscopy for magnetic-field analysis. In the company-owned procedures, care is taken to align the optical components (fiber, connecting parts, coupler lens, vapor cell) such that efficient back-coupling of light is achieved after the gluing process is complete. Also, the gluing procedure occurs in an established sequence of steps (not all gluing is done at once.)

Probe Packaging and Hardening

In the present disclosure, the product of the low-profile fiber-optic laser beam injection and extraction is integrated into a probe-head enclosure that provides stability and resilience against mechanical impacts. The fiber is routed through commercially available robust tubing. Rubber boots are used to stabilize and stress-relieve the fiber jack that connects to the control unit, as well as the interface between the probe head and the fiber cord.

Optional Heating for Increased Temperature Range

In the present disclosure, a secondary multi-mode fiber is routed through the fiber cord to heat the cell with infrared light that does not interact with the atoms but merely heats the glass and silicon parts. The present disclosure involves a modification of the optics and fiber layout to accommodate the diffuse, un-focused heating beam. This option will only be implemented if a customer requires operation at low environmental temperatures, where the vapor cells must be heated to sustain a rubidium vapor pressure that is high enough for spectroscopic analysis and magnetic-field determination. The present disclosure includes a parallel modification of the optics unit (item 3 in 2.4.2) to inject a plain, low-power broadband infrared beam into the heater fiber.

Atom-Based Magnetic Field Monitor Control Unit

The present disclosure includes the development of the control unit for the high magnetic field sensor. The control unit is assembled in a portable hard-plastic case with a hermetic seal and pressure equalization valve. The case also meets the standards regulations for IP67, DEF_STAN_81-41 and R52570 certifications. Assembly and functionality testing can be performed in an easy-access laboratory enclosure, such as a 2U 18" rack mount. After testing is complete, the components of the control unit can be ported into the hard-plastic case. This provides a sturdy, environmentally resilient instrument for stand-alone operation with industry-standard field-information delivery (4-20 mA analog, MODBUS digital), and well as a USB interface to connect to a laptop. The latter will allow expert controls and specialized/scientific data rendering.

With internal dimensions of 16.75"×11.18"×6.12" and volume of 0.7 ft$^3$, the hard case has enough room for the laser chip and controls, optic components for beam shaping and preparation, the laser frequency scanning and referencing systems, composed of a saturation spectroscopy unit (miniSPEC) and an optical frequency tracker (OFT), the photodiodes to read the signal from the probes, and the electronic circuit to control the laser, acquire the signals and evaluate the magnetic field at the probe head. All the electrical control signals are interfaced inside the hard case unit, including the necessary wiring to the central processor, which controls laser parameters, such as output power, current control and chip temperature. Further, the reference signals from the miniSPEC and the OFT, and the read-outs from the photodiodes of all probes are also interfaced with the central control circuit. The photodiodes currents are amplified via transimpedance circuits with variable gain and offset controls.

The central processor reads the analog signals, pre-processes the data and calculates the magnetic field automatically. The results are interfaced with transmitters/drivers that feed the 4-20 mA output lines, the digital MODBUS output and the USB connection. The GUI on the control computer allows the user to set parameters of the unit that need to be set only once (or in infrequent service intervals). Computer access will also allow specialized rendering, visualization and analysis of the magnetic-field readings for scientific purposes and functions that are not needed in standard operation.

Appendix K: Exemplary Atom-Based Optical RF-Power/Voltage Transducer and Sensor

Appendix K: "Atom-based optical RF-power/voltage transducer and sensor," Rachel E. Sapiro et al., American Physical Society (APS): Atomic, Molecular, and Optical Physics, Vol. 64, No. 4, Poster abstract (L01.00031), page 1, May 29, 2019, is hereby incorporated herein in its entirety by reference.

The present disclosure includes an atom-based optical RF-power/voltage transducer and sensor, according to various exemplary embodiments.

New technologies for atomic vapor cells enable experiments and applications that require a small footprint. A detector comprises an atomic vapor cell with integrated electrodes embedded in an RF circuit to serve as a RF-to-optical transducer. In the present disclosure, an RF electrical signal collected by an antenna is converted into intra-cell electric fields, which are then optically read out via spectroscopy of field-sensitive atomic states. By direct conversion of RF electrical signals to an atom-mediated optical readout, the atom-based transducer provides ultra-high bandwidth from DC to THz, absolute (atomic) measurement of RF power or voltage in a compact unit. Here, such a detector consisting of a cesium vapor cell with integrated electrodes connected directly to a microwave horn antenna via an SMA cable is demonstrated. Optical readout is facilitated by EIT spectroscopy of the cesium vapor. The acquired EIT spectra exhibit Autler-Townes line splittings that yield the power-equivalent field of the microwaves collected by the horn.

Appendix L: Exemplary Atomic Receiver for AM and FM Radio Communication

Appendix L: "An atomic receiver for AM and FM radio communication," David A. Anderson et al., arXiv: 1808.08589v1, pages 1-6, published Aug. 26, 2018, is hereby incorporated herein in its entirety by reference. In some embodiments, the present disclosure also includes U.S. Pat. No. 10,823,775, issued Nov. 3, 2020, which is hereby incorporated herein in its entirety by reference.

Appendix M: Exemplary Widely Wavelength-Tunable Narrow-Linewidth Laser Using Position-Scanned Cavity Filter Appendix M: "Widely wavelength-tunable narrow-linewidth laser using position-scanned cavity filter," Internal document, page 1, May 1, 2019, is hereby incorporated herein in its entirety by reference.

The present disclosure includes a widely wavelength-tunable narrow-linewidth laser using an angle/position-scanned cavity filter, according to various exemplary embodiments.

Wavelength tuning of narrow-linewidth laser sources over nanometer ranges in a controlled, continuous, and rapid manner, is of immediate importance to Rydberg-based devices and other applications. The present disclosure includes a method to realize a widely wavelength-tunable narrow-linewidth laser based on a tunable filter in an external-cavity laser design. In a typical cat's eye external-cavity laser, the wavelength is selected by choosing a diode emitter at the appropriate wavelength and fixing a filter etalon after the laser diode at a well-defined, fixed angle to create a narrow linewidth external-cavity diode laser (ECDL) source. The present disclosure includes a method to develop a widely wavelength tunable (>>30 GHz, up to many nanometers) narrow-linewidth (typically MHz or below) laser by controlled positioning and rotating of the filter element in a cats-eye laser design.

In order to achieve suitably fine tuning for Rydberg devices, the precision and repeatability of the rotation of the filter must be better than 17 micro-radians. Typically, a rotation of 1 degree corresponds approximately to a wavelength tuning of 1 nm, or ~290 GHz. Existing lasers have a typical mode-hop-free scan range of ~30 GHz. This corresponds to 1.7 milli-radians to tune across a mode. A filter rotation resolution and repeatability at 17 micro-radians corresponds to a ~50 MHz step size, which is well within the mod-hop-free scan range of the laser. With feedback on the diode current and/or temperature synchronized with filter position, this configuration enables seamless and continuous wavelength-tuning of the narrow-linewidth laser source across nanometers. An electronic control of the filter position/rotation scan further provides repeatability in beam deflection and long-term stability and reliability.

Appendix N: Exemplary Atomic Radio-Frequency Interferometer for Optical RF Phase and Amplitude Sensing: Implementation in a Cesium Rydberg Vapor Appendix N: "Diagram of atomic radio-frequency interferometer for optical RF phase and amplitude sensing: implementation in a Cesium Rydberg vapor," Internal document, page 1, Apr. 1, 2019, is hereby incorporated herein in its entirety by reference.

FIGS. 5A-5C and 48A-48C illustrate an atomic RF interferometer for optical RF phase and amplitude sensing, according to various exemplary embodiments.

Figures 48A, 48B, 48C:
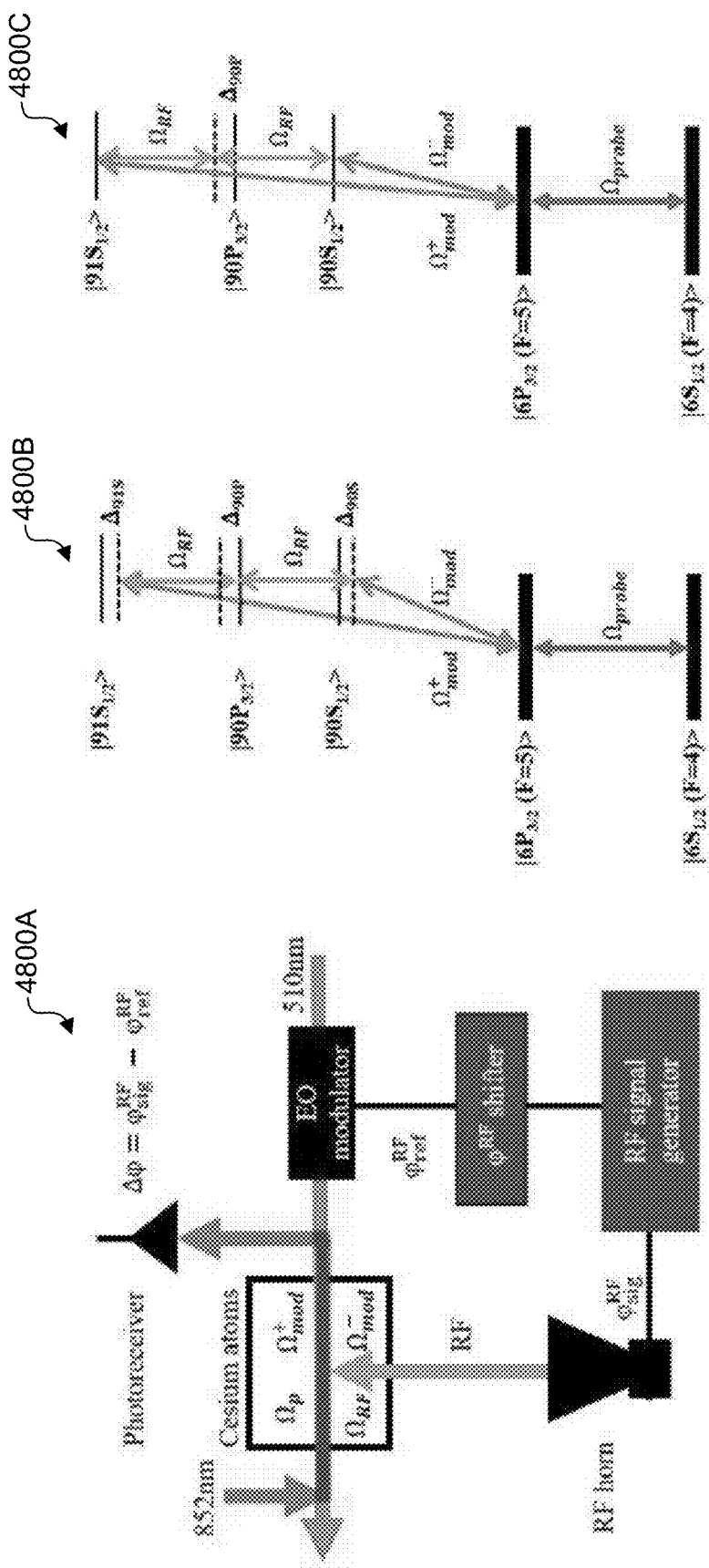
FIGS. 48A-48C are schematic illustrations of an atomic RF interferometer for optical RF phase and amplitude sensing, according to an exemplary embodiment.

FIG. 48A: Diagram of experimental setup. FIGS. 48B and 48C: Energy-level diagrams for two interferometric RF loops in cesium Rydberg atoms with optical EIT readout. FIG. 5C: Optical measurement of the phase of a 5.092 GHz RF field using interferometric loop II (FIG. 48C). The plot shows the measured optical probe (852 nm laser) power from the atomic cesium vapor with an external 5.092 GHz RF signal field applied to the atoms as a function of probe laser frequency (vertical axis) and optical 5.092 GHz RF reference phase (horizontal axis).

It is to be understood that the phraseology or terminology herein is for the purpose of description and not of limitation, such that the terminology or phraseology of the present specification is to be interpreted by those skilled in relevant art(s) in light of the teachings herein.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific embodiments have been described above, it will be appreciated that the embodiments may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the embodiments and the appended claims in any way.

The embodiments have been described above with the aid of functional building blocks illustrating the implementation of specified functions and relationships thereof. The boundaries of these functional building blocks have been arbitrarily defined herein for the convenience of the description.

Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the embodiments. Therefore, such adaptations and modifications are intended to be within the meaning and range of equivalents of the disclosed embodiments, based on the teaching and guidance presented herein.

The breadth and scope of the embodiments should not be limited by any of the above-described exemplary embodiments, but should be defined only in accordance with the following claims and their equivalents.

What is claimed is:

1. An atom-based closed-loop control system comprising:
   a compartment enclosing a gas of excited atoms comprising one or more Rydberg states;
   a device configured to apply an input signal to the one or more Rydberg states;
   a detector configured to detect a response of the one or more Rydberg states due to an interaction of the one or more Rydberg states with electromagnetic radiation;
   a controller configured to adjust a characteristic of the applied input signal based on, at least in part, the detected response of the one or more Rydberg states to the electromagnetic radiation; and
   a multiplexer configured to parallelize or multiplex one or more combinations of optical and RF electromagnetic fields, interferometric pathways, and/or interferometric signals of the one or more Rydberg states.

2. The system of claim 1, wherein the controller is further configured to adjust the characteristic of the applied input signal based on a characteristic of the electromagnetic radiation.

3. The system of claim 2, wherein the characteristic of the electromagnetic radiation comprises a frequency, an amplitude, a phase, a polarization, a power, a direction of arrival, an angle of arrival, and/or a combination thereof.

4. The system of claim 1, wherein the controller is further configured to adjust a control signal and/or a processing signal based on the detected response of the one or more Rydberg states to the electromagnetic radiation.

5. The system of claim 1, wherein the controller is further configured to adjust the characteristic based on differential feedback between the detected response and a set point.

6. The system of claim 1, wherein the controller is further configured to adjust the characteristic based on one or more detector sensitivity parameters.

7. The system of claim 1, wherein the detected response of the one or more Rydberg states is further based on a temperature of the gas, a pressure of the gas, an electric field applied to the gas, a magnetic field applied to the gas, and/or an auxiliary RF waveform applied to the gas.

8. The system of claim 1, wherein the device comprises a mechanical device, an electrical device, and/or an optical device.

9. The system of claim 1, wherein:
   the applied input signal comprises an electromagnetic field, an electric field, and/or magnetic field, and
   the characteristic comprises a parameter of the applied electromagnetic, electric, and/or magnetic field.

10. The system of claim 1, wherein the controller is further configured to automatically adjust the characteristic based on the detected response.

11. The system of claim 1, wherein the controller comprises hardware or software configured to automatically adjust the characteristic to a set point.

12. The system of claim 1, wherein:
    the device comprises an RF generator or source, and
    the applied input signal comprises an RF electromagnetic wave, an RF electronic signal, an electric field, and/or a magnetic field.

13. The system of claim 1, wherein the detected response comprises an optical transmission, an optical absorption, or a scattered signal from the excited atoms.

14. The system of claim 1, wherein the device is further configured to apply a fiduciary RF electromagnetic wave or a reference local oscillator wave.

15. The system of claim 1, wherein the applied input signal comprises a plurality of fields for multi-field conditioning of the one or more Rydberg states.

16. The system of claim 1, wherein:
    the applied input signal comprises a laser beam, and
    the characteristic comprises a parameter of the laser beam.

17. The system of claim 1, wherein the characteristic and the detected response comprises phase-encoded signals.

18. The system of claim 1, wherein the characteristic and the detected response are electronically synchronized, frequency-locked, and/or phase-locked.

19. The system of claim 1, wherein the controller is further configured to determine an electromagnetic spectrum.

20. The system of claim 1, wherein the detected response is further based on a multi-dimensional Doppler-match of parameters of a plurality of laser beams for Doppler-free Rydberg spectroscopy in the gas of excited atoms at or near the homogenous Rydberg linewidth.

21. A system for detecting a radio frequency (RF) signal, the system comprising:
    a stripline configured to receive an input RF signal and a reference signal;
    a device configured to apply the reference signal;
    a gas of excited atoms comprising one or more Rydberg states and disposed within the stripline in a vacuum enclosure;
    a detector configured to detect a response of the one or more Rydberg states due to an interaction of the one or more Rydberg states with electromagnetic radiation inside or adjacent to the stripline based on the input RF signal and/or the applied reference signal;
    a controller configured to:
       determine a parameter of the input RF signal based on, at least in part, the detected response of the one or more Rydberg states to the electromagnetic radiation, and
       adjust a characteristic of the applied reference signal based on, at least in part, the detected response of the one or more Rydberg states to the electromagnetic radiation, and
    a multiplexer configured to parallelize or multiplex one or more combinations of optical and RF electromagnetic fields, interferometric pathways, and/or interferometric signals of the one or more Rydberg states.

22. The system of claim 21, wherein the controller is further configured to adjust the characteristic of the applied reference signal based on a second characteristic of the electromagnetic radiation, the input RF signal, and/or the applied reference signal.

23. The system of claim 22, wherein the second characteristic of the electromagnetic radiation, the input RF signal, and/or the applied reference signal comprises a frequency, an amplitude, a phase, a polarization, a power, a direction of arrival, an angle of arrival, and/or a combination thereof.

24. The system of claim 21, wherein the controller is further configured to adjust a control signal and/or a processing signal based on the detected response of the one or more Rydberg states to the electromagnetic radiation.

25. The system of claim 21, wherein the applied reference signal comprises a reference RF signal.

26. The system of claim 21, wherein the input RF signal comprises an electrical signal, an optical signal, and/or an electromagnetic wave.

27. The system of claim 21, wherein the stripline comprises one or more electrodes, a waveguide, and/or a vapor cell compartment.

28. The system of claim 21, wherein the device comprises a controller configured to vary the parameter of the input RF signal.

29. The system of claim 21, wherein the reference signal comprises a reference RF signal contained in a modulation of a parameter of a laser beam interacting with the one or more Rydberg states.

30. The system of claim 21, wherein the stripline is further configured to receive one or more conditioning RF signals for multi-field conditioning of the one or more Rydberg states.

31. The system of claim 21, wherein the multiplexer is configured to apply spatial, temporal, and/or frequency multiplexing.

32. The system of claim 21, wherein the multiplexer is configured to provide increased detected RF bandwidth.

33. The system of claim 21, wherein the stripline comprises a pair of electrodes and the parameter of the input RF signal is power or a field-equivalent voltage across the pair of electrodes.

34. The system of claim 21, wherein the parameter of the input RF signal is the characteristic of the applied reference signal.

35. The system of claim 21, wherein the controller is further configured to determine an electromagnetic spectrum.

36. The system of claim 35, wherein the controller is further configured to determine a power, a voltage, a communication signal, a direction of arrival, and/or a combination thereof.

37. The system of claim 21, wherein the detected response is further based on a multi-dimensional Doppler-match of parameters of a plurality of laser beams for Doppler-free Rydberg spectroscopy in the gas of excited atoms at or near the homogenous Rydberg linewidth.

38. The system of claim 37, wherein the multi-dimensional Doppler-match of parameters of the plurality of laser beams comprises at least two laser beams arranged with angles to suppress Doppler shifts in one, two, and/or three dimensions.

39. The system of claim 38, wherein three laser beams are non-collinear to achieve a Doppler-match in two degrees of freedom or four laser beams are non-collinear to achieve a Doppler-match in three degrees of freedom.

40. An atom-based closed-loop control system comprising:
- a compartment enclosing a gas of excited atoms comprising one or more Rydberg states, wherein the compartment is configured to be exposed to electromagnetic radiation;
- a device configured to apply an input signal to the one or more Rydberg states, wherein the input signal comprises a plurality of laser beams;
- a detector configured to detect a response of the one or more Rydberg states due to an interaction of the one or more Rydberg states with the electromagnetic radiation; and
- a controller configured to adjust a characteristic of the applied input signal based on, at least in part, the detected response of the one or more Rydberg states to the electromagnetic radiation,
- wherein the detected response is based on a multi-dimensional Doppler-match of parameters of the plurality of laser beams, and
- wherein the multi-dimensional Doppler-match of parameters of the plurality of laser beams comprises at least two laser beams arranged with angles to suppress Doppler shifts in one, two, and/or three dimensions.

41. The system of claim 40, wherein the plurality of laser beams comprises: three laser beams are non-collinear to achieve a Doppler-match in two degrees of freedom, or four laser beams are non-collinear to achieve a Doppler-match in three degrees of freedom.

* * * * *

UNITED STATES PATENT AND TRADEMARK OFFICE
CERTIFICATE OF CORRECTION

PATENT NO. : 11,592,469 B2
APPLICATION NO. : 17/333503
DATED : February 28, 2023
INVENTOR(S) : Anderson et al.

It is certified that error appears in the above-identified patent and that said Letters Patent is hereby corrected as shown below:

In the Specification

Column 21, Line 22, "RE" should be --RF--.

Column 23, Line 61, "(k)" should be --($\lambda$)--.

Column 23, Line 62, "(k)" should be --($\lambda$)--.

Column 24, Line 4, "200 m" should be --200 µm--.

Column 27, Line 65, "[$\theta_r$t" should be --[$\omega_r$t--.

Column 27, Line 66, "$2\pi_r k_r V_r(t)$" should be --$2\pi k_r V_r(t)$--.

Column 28, Line 13, "$A_{in} = A(E_s E_r)^{1/2}$" should be --$A_{in} = A \cdot (E_s E_r)^{1/2}$--.

Column 28, Line 25, "cos[(D(t)]" should be --cos[$\Phi$(t)]--.

Column 32, Line 60, "(k)" should be --($\lambda$)--.

Column 32, Line 62, "$6_{1/2}$" should be --$6S_{1/2}$--.

Column 40, Line 28, "10 s, 100 s, and 200 s" should be --10 µs, 100 µs, and 200 µs--.

Column 43, Line 63, "h$\Omega_{RF}$/d," should be --$\hbar\Omega_{RF}$/d,--.

Column 45, Line 14, "$\Delta$a" should be --$\Delta\alpha$--.

Column 46, Line 30, "$\Delta E_{RF}=(d\rho_{33}/\rho_{33}\ d\Omega_{RF})^{-1}\times 10^{-4}\times h/d$" should be
--$\Delta E_{RF}=(d\rho_{33}/[\rho_{33}\ d\Omega_{RF}])^{-1}\times 10^{-4}\times h/d$--.

Signed and Sealed this
Sixteenth Day of May, 2023

Katherine Kelly Vidal
*Director of the United States Patent and Trademark Office*

Column 51, Line 38, "$E=h\Omega/d$," should be --$E=\hbar\Omega/d$,--.

Column 51, Line 41, "2πc×Hz" should be --2π×Hz--.

Column 51, Line 43, "Js (2π)" should be --Js/(2π)--.

Column 55, Line 27, "Av" should be --Δv--.

Column 55, Line 28, "Av" should be --Δv--.

Column 56, Line 5, "$m_j$ = 5 2" should be --$m_j$ = 5/2--.

Column 56, Line 46, "(a, θ, φ)=(0, 0, 0)" should be --(α, θ, φ)=(0, 0, 0)--.

Column 57, Line 14, "47F" should be --4π--.

Column 57, Line 28, "m-value" should be --$m_j$-value--.

Column 59, Line 9, "along 2" should be --along $\hat{z}$--.

Column 61, Line 13, "$42D_{1/2}$" should be --$42D_{5/2}$--.

Column 61, Line 62, "probehead" should be --probe head--.

Column 65, Line 43, "R=0.3 m" should be --R=0.3 μm--.

Column 65, Line 44, "R=1.5 m" should be --R=1.5 μm--.

Column 66, Line 19, "Dc" should be --Ωc--.

Column 66, Line 19, "DP" should be --Ωp--.

Column 68, Lines 37-38, "powerand" should be --power and--.

Column 69, Line 3, "$E=h\Omega_{RF}/d$, where h" should be --$E=\hbar\Omega_{RF}/d$, where $\hbar$--.

Column 69, Line 14, "QRF" should be --$\Omega_{RF}$--.

Column 69, Line 16, "$\varphi_{FF}$" should be --$\varphi_{RF}$--.

Column 70, Line 37, "Tc-phase" should be --π-phase--.

Column 76, Line 36, "$E=h\Omega/d$," should be --$E=\hbar\Omega/d$,--.

Column 76, Line 58, "Q" should be --Ω--.

Column 76, Line 60, "102 to 105" should be --$10^2$ to $10^5$--.

Column 85, Line 28, "105 W" should be --105 µW--.

Column 88, Line 13, "$E_p=h\Omega_p/d_{12}$" should be --$E_p=\hbar\Omega_p/d_{12}$--.

Column 88, Line 44, "30D5/2" should be --$30D_{5/2}$--.

Column 89, Line 25, "$\rho_{i2,av}(t,\Delta c)$" should be --$\rho_{i12,av}(t,\Delta c)$--.

Column 93, Line 23, "Appendix I." should be --Appendix I:--.